(12) United States Patent
Ono et al.

(10) Patent No.: US 11,101,303 B2
(45) Date of Patent: Aug. 24, 2021

(54) IMAGING ELEMENT, LAMINATED IMAGING ELEMENT, AND SOLID-STATE IMAGING DEVICE

(71) Applicants: SONY CORPORATION, Tokyo (JP); SONY SEMICONDUCTOR SOLUTIONS CORPORATION, Kanagawa (JP)

(72) Inventors: Hideki Ono, Tokyo (JP); Yukio Kaneda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/639,406

(22) PCT Filed: May 11, 2018

(86) PCT No.: PCT/JP2018/018284
§ 371 (c)(1),
(2) Date: Feb. 14, 2020

(87) PCT Pub. No.: WO2019/035252
PCT Pub. Date: Feb. 21, 2019

(65) Prior Publication Data
US 2020/0258923 A1 Aug. 13, 2020

(30) Foreign Application Priority Data
Aug. 16, 2017 (JP) .............................. JP2017-157143

(51) Int. Cl.
*H01L 27/146* (2006.01)
(52) U.S. Cl.
CPC .... *H01L 27/1461* (2013.01); *H01L 27/14667* (2013.01)

(58) Field of Classification Search
CPC ........... H01L 27/1461; H01L 27/14667; H01L 51/4213; H01L 51/442; H01L 27/307;
(Continued)

(56) References Cited

U.S. PATENT DOCUMENTS 9,202,839 B2 * 12/2015 Miyanami ........... H01L 27/1464
2017/0162807 A1 6/2017 Moriwaki
(Continued)

FOREIGN PATENT DOCUMENTS

| JP | 2011138927 A | 7/2011 |
| JP | 2014017374 A | 1/2014 |

(Continued)

OTHER PUBLICATIONS

International Search Report for Application No. PCT/JP2018/018284, dated Jul. 31, 2018.

*Primary Examiner* — Selim U Ahmed
(74) *Attorney, Agent, or Firm* — K&L Gates LLP

(57) ABSTRACT

An imaging element (photoelectric conversion element) includes a photoelectric conversion unit formed by laminating a first electrode 21, a photoelectric conversion layer 23A, and a second electrode 22. Between the first electrode 21 and the photoelectric conversion layer 23A, a composite oxide layer 23B containing indium-gallium-zinc composite oxide is formed. The composite oxide layer 23B includes a first layer $23B_1$ adjacent to the first electrode 21 and a second layer $23B_2$ adjacent to the photoelectric conversion layer 23A. The first layer $23B_1$ has a higher indium composition than the second layer $23B_2$, or the first layer $23B_1$ has a higher gallium composition than the second layer $23B_2$, or the first layer $23B_1$ has a higher zinc composition than the second layer $23B_2$.

15 Claims, 78 Drawing Sheets

(58) Field of Classification Search
CPC ....... H01L 31/10; H01L 27/30; H01L 27/146; Y02E 10/549; H04N 5/369
See application file for complete search history.

(56) References Cited

U.S. PATENT DOCUMENTS

2019/0103431 A1* 4/2019 Murata ............. H01L 27/14665
2019/0115384 A1* 4/2019 Ikehara ................ H01L 51/448

FOREIGN PATENT DOCUMENTS

| | | |
|---|---|---|
| JP | 2016063165 A | 4/2016 |
| JP | 2018046039 A | 3/2018 |
| WO | 2016009693 A1 | 1/2016 |

* cited by examiner

IMAGING ELEMENT, LAMINATED IMAGING ELEMENT, AND SOLID-STATE IMAGING DEVICE

TECHNICAL FIELD

The present disclosure relates to an imaging element, a laminated imaging element, and a solid-state imaging device.

BACKGROUND ART

In recent years, a laminated imaging element has attracted attention as an imaging element constituting an image sensor and the like. The laminated imaging element has a structure in which a photoelectric conversion layer (light receiving layer) is sandwiched between two electrodes. In addition, the laminated imaging element requires a structure in which signal charges generated in the photoelectric conversion layer on the basis of photoelectric conversion are accumulated and transferred. A conventional structure requires a structure in which signal charges are accumulated in and transferred to a floating drain (FD) electrode, and requires high-speed transfer such that the signal charges are not delayed.

An imaging element (photoelectric conversion element) for solving such a problem is disclosed in, for example, Japanese Patent Application Laid-Open No. 2016-63165. This imaging element includes:

an accumulation electrode formed on a first insulating layer;

a second insulating layer formed on the accumulation electrode;

a semiconductor layer formed so as to cover the accumulation electrode and the second insulating layer;

a collecting electrode formed in contact with the semiconductor layer and apart from the accumulation electrode;

a photoelectric conversion layer formed on the semiconductor layer; and an upper electrode formed on the photoelectric conversion layer.

An imaging element using an organic semiconductor material for the photoelectric conversion layer can photoelectrically convert a specific color (wavelength band). In addition, because of such a characteristic, in a case where the imaging element is used as an imaging element in a solid-state imaging device, it is possible to obtain a structure having sub-pixels laminated (laminated imaging element), not possible with a conventional solid-state imaging device in which each of sub-pixels includes a combination of an on-chip color filter layer (OCCF) and an imaging element and the sub-pixels are arrayed two-dimensionally (see, for example, Japanese Patent Application Laid-Open No. 2011-138927). Furthermore, there is an advantage that a false color is not generated because demosaic processing is not required. In the following description, an imaging element including a photoelectric conversion unit disposed on or above a semiconductor substrate may be referred to as "first type imaging element" for convenience, a photoelectric conversion unit constituting the first type imaging element may be referred to as "first type photoelectric conversion unit" for convenience, an imaging element disposed in the semiconductor substrate may be referred to as "second type imaging element" for convenience, and a photoelectric conversion unit constituting the second type imaging element may be referred to as "second type photoelectric conversion unit" for convenience.

FIG. 78 illustrates a configuration example of a conventional laminated imaging element (laminated solid-state imaging device). In the example illustrated in FIG. 78, a third photoelectric conversion unit 343A and a second photoelectric conversion unit 341A which are second type photoelectric conversion units constituting a third imaging element 343 and a second imaging element 341 which are second type imaging elements, respectively, are laminated and formed in a semiconductor substrate 370. Furthermore, above the semiconductor substrate 370 (specifically, above the second imaging element 341), a first photoelectric conversion unit 310A which is a first type photoelectric conversion unit is disposed. Here, the first photoelectric conversion unit 310A includes a first electrode 321, a photoelectric conversion layer 323 including an organic material, and a second electrode 322, and constitutes a first imaging element 310 which is a first type imaging element. In the second photoelectric conversion unit 341A and the third photoelectric conversion unit 343A, for example, blue light and red light are photoelectrically converted due to a difference in absorption coefficient, respectively. Furthermore, in the first photoelectric conversion unit 310A, for example, green light is photoelectrically converted.

Charges generated by photoelectric conversion in the second photoelectric conversion unit 341A and the third photoelectric conversion unit 343A are temporarily accumulated in the second photoelectric conversion unit 341A and the third photoelectric conversion unit 343A, then transferred to a second floating diffusion layer (floating diffusion) $FD_2$ and a third floating diffusion layer $FD_3$ by a vertical transistor (a gate portion 345 is illustrated) and a transfer transistor (a gate portion 346 is illustrated), and further output to an external readout circuit (not illustrated), respectively. These transistors and floating diffusion layers $FD_2$ and $FD_3$ are also formed in the semiconductor substrate 370.

Charges generated by photoelectric conversion in the first photoelectric conversion unit 310A are accumulated in the first floating diffusion layer $FD_1$ formed in the semiconductor substrate 370 via a contact hole portion 361 and a wiring layer 362. Furthermore, the first photoelectric conversion unit 310A is also connected to a gate portion 352 of an amplification transistor for converting a charge amount into a voltage via the contact hole portion 361 and the wiring layer 362. In addition, the first floating diffusion layer $FD_1$ constitutes a part of a reset transistor (a gate portion 351 is illustrated). Reference numeral 371 represents an element isolation region, reference numeral 372 represents an oxide film formed on a surface of the semiconductor substrate 370, reference numerals 376 and 381 represent interlayer insulating layers, reference numeral 383 represents an insulating layer, and reference numeral 314 represents an on-chip micro lens.

CITATION LIST

Patent Document

Patent Document 1: Japanese Patent Application Laid-Open No. 2016-63165

Patent Document 2: Japanese Patent Application Laid-Open No. 2011-138927

SUMMARY OF THE INVENTION

Problems to be Solved by the Invention

By the way, the above-described technique disclosed in Japanese Patent Application Laid-Open No. 2016-63165 cites, for example, IGZO as a material constituting the semiconductor layer. However, in a case where a semiconductor layer containing IGZO is used, there is a large difference between the state density of an organic semiconductor material constituting the photoelectric conversion layer and the state density of IGZO constituting the semiconductor layer. For example, the state density of the organic semiconductor material is about $1 \times 10^{21}$ cm$^{-3}$, and the state density of IGZO is about $1 \times 10^{18}$ cm$^{-3}$. Therefore, when carriers (for example, photoelectrons) generated by photoelectric conversion flow into the semiconductor layer from the photoelectric conversion layer, carrier stagnation is likely to occur at an interface between the photoelectric conversion layer and the semiconductor layer. As a result, photoresponsiveness of the imaging element (photoelectric conversion element) is adversely affected disadvantageously.

Therefore, an object of the present disclosure is to provide an imaging element having a configuration and a structure that hardly adversely affect photoresponsiveness, that is, an imaging element having excellent transfer characteristics of charges accumulated in the photoelectric conversion layer, and a laminated imaging element and a solid-state imaging device each including the imaging element.

Solutions to Problems

In order to achieve the object described above, an imaging element (photoelectric conversion element) according to a first aspect of the present disclosure includes a photoelectric conversion unit formed by laminating a first electrode, a photoelectric conversion layer, and a second electrode, between the first electrode and the photoelectric conversion layer, a composite oxide layer containing indium composite oxide is formed, the composite oxide layer includes a first layer adjacent to the first electrode and a second layer adjacent to the photoelectric conversion layer, and the first layer has a higher indium composition than the second layer.

In order to achieve the object described above, an imaging element (photoelectric conversion element) according to a second aspect of the present disclosure includes a photoelectric conversion unit formed by laminating a first electrode, a photoelectric conversion layer, and a second electrode, between the first electrode and the photoelectric conversion layer, a composite oxide layer containing indium-gallium-zinc composite oxide is formed, the composite oxide layer includes a first layer adjacent to the first electrode and a second layer adjacent to the photoelectric conversion layer, the first layer has a higher indium composition than the second layer, or the first layer has a higher gallium composition than the second layer, or the first layer has a higher zinc composition than the second layer. Alternatively, the oxygen atom content in the first layer is lower than that in the second layer.

In order to achieve the object described above, an imaging element (photoelectric conversion element) according to a third aspect of the present disclosure includes a photoelectric conversion unit formed by laminating a first electrode, a photoelectric conversion layer, and a second electrode, between the first electrode and the photoelectric conversion layer, a composite oxide layer containing indium composite oxide (indium-gallium-zinc composite oxide) is formed, the composite oxide layer includes a first layer adjacent to the first electrode and a second layer adjacent to the photoelectric conversion layer, and the first layer has a higher carrier mobility than the second layer.

In order to achieve the object described above, an imaging element (photoelectric conversion element) according to a fourth aspect of the present disclosure includes a photoelectric conversion unit formed by laminating a first electrode, a photoelectric conversion layer, and a second electrode, between the first electrode and the photoelectric conversion layer, a composite oxide layer containing indium composite oxide (indium-gallium-zinc composite oxide) is formed, the composite oxide layer includes a first layer adjacent to the first electrode and a second layer adjacent to the photoelectric conversion layer, and the first layer has a lower state density than the second layer.

The laminated imaging element of the present disclosure for achieving the object described above includes at least one of the imaging elements according to the first to fourth aspects of the present disclosure.

The solid-state imaging device according to the first aspect of the present disclosure for achieving the object described above includes a plurality of the imaging elements according to the first to fourth aspects of the present disclosure. Furthermore, the solid-state imaging device according to the second aspect of the present disclosure for achieving the object described above includes a plurality of the laminated imaging elements of the present disclosure.

Effects of the Invention

In the imaging element and the like (described later) according to the first and second aspects of the present disclosure, the composition of each layer is defined in the composite oxide layer having at least two layers. In the imaging element and the like (described later) according to the third and fourth aspects of the present disclosure, a relationship of carrier mobility or state density between the layers is defined in the composite oxide layer having at least two layers. Therefore, when carriers (for example, photoelectrons) generated by photoelectric conversion flow into the composite oxide layer from the photoelectric conversion layer, carrier stagnation hardly occurs at an interface between the photoelectric conversion layer and the composite oxide layer. Furthermore, carrier transport capability of the photoelectric conversion layer and the composite oxide layer as a whole can be improved. Therefore, it is possible to provide an imaging element having no adverse effect on photoresponsiveness of the imaging element and having excellent transfer characteristics of charges accumulated in the photoelectric conversion layer. In addition, the imaging element and the like of the present disclosure (described later) have a two-layer structure of the composite oxide layer and the photoelectric conversion layer. Therefore, recombination during charge accumulation can be prevented, transfer efficiency of charges accumulated in the photoelectric conversion layer to the first electrode can be increased, and generation of a dark current can be suppressed. Note that effects described here are merely illustrative, and are not restrictive. Furthermore, an additional effect may be present.

MODE FOR CARRYING OUT THE INVENTION

Figure 1:
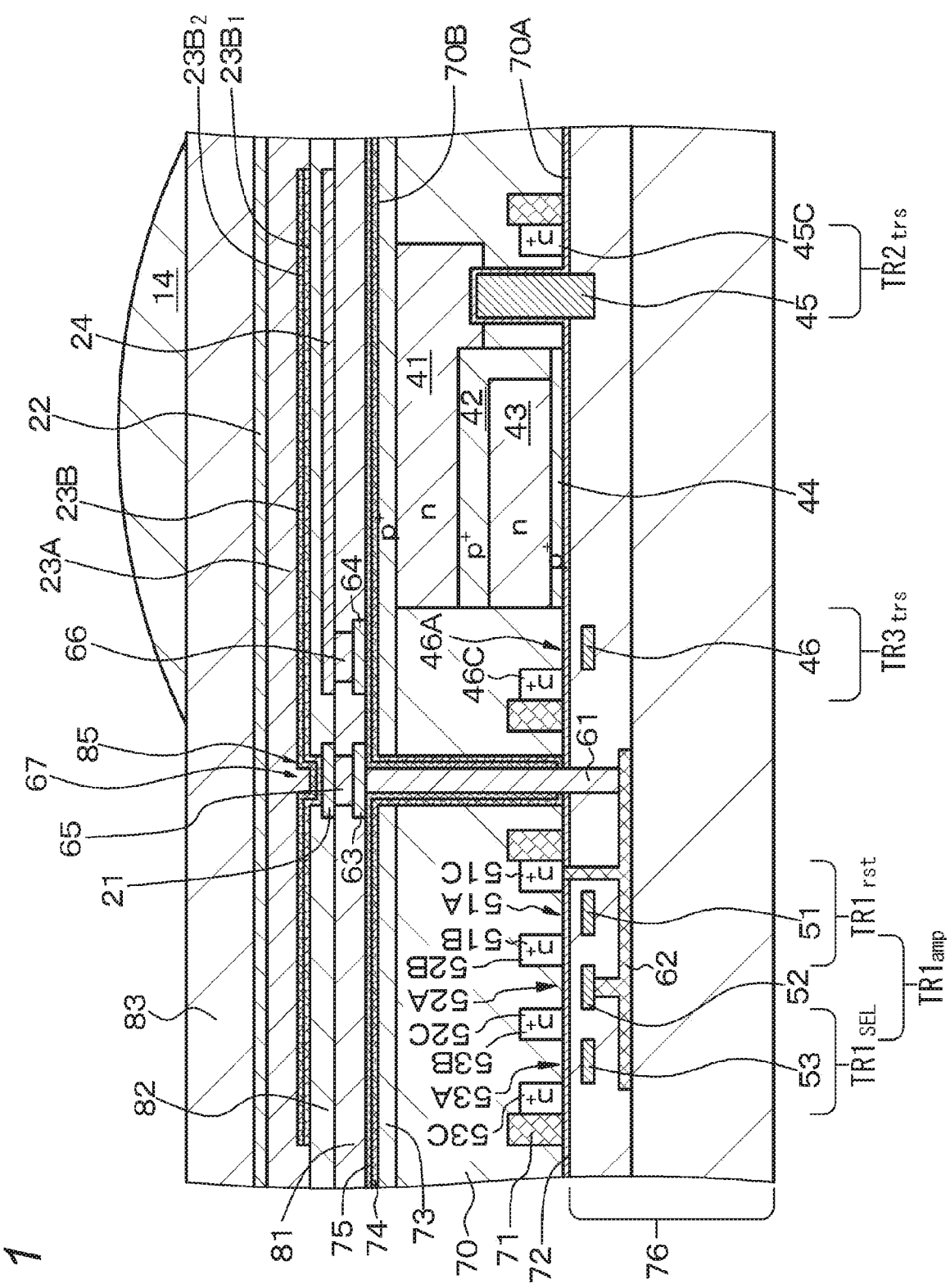
FIG. 1 is a schematic partial cross-sectional view of an imaging element of Example 1.

Hereinafter, the present disclosure will be described on the basis of Examples with reference to the drawings. However, the present disclosure is not limited to Examples, and various numerical values and materials in Example are illustrative. Note that description will be made in the following order.

1. General description on imaging elements according to first to fourth aspects of the present disclosure, laminated imaging element of the present disclosure, and solid-state imaging devices according to first and second aspects of the present disclosure 2. Example 1 (imaging elements according to first to fourth aspects of the present disclosure, laminated imaging element of the present disclosure, and solid-state imaging device according to second aspect of the present disclosure)

3. Example 2 (modification of Example 1)

4. Example 3 (modification of Examples 1 and 2, and solid-state imaging device according first aspect of the present disclosure)

5. Example 4 (modification of Examples 1 to 3, and imaging element including transfer control electrode)

6. Example 5 (modification of Examples 1 to 4, and imaging element including charge discharge electrode)

7. Example 6 (modification of Examples 1 to 5, and imaging element including a plurality of charge accumulation electrode segments)

8. Example 7 (imaging elements of first and sixth configurations)

9. Example 8 (imaging elements of second and sixth configurations of the present disclosure)

10. Example 9 (imaging element of third configuration)
11. Example 10 (imaging element of fourth configuration)
12. Example 11 (imaging element of fifth configuration)
13. Example 12 (imaging element of sixth configuration)
14. Example 13 (solid-state imaging devices of first and second configurations)
15. Example 14 (modification of Example 13)
16. Others <General description on imaging elements according to first to fourth aspects of the present disclosure, laminated imaging element of the present disclosure, and solid-state imaging devices according to first and second aspects of the present disclosure>

An imaging element according to a first aspect of the present disclosure, an imaging element according to the first aspect of the present disclosure, constituting a laminated imaging element of the present disclosure, and an imaging element according to the first aspect of the present disclosure, constituting solid-state imaging devices according to first and second aspects of the present disclosure may be collectively referred to as "imaging element and the like according to the first aspect of the present disclosure" for convenience. Furthermore, an imaging element according to a second aspect of the present disclosure, an imaging element according to the second aspect of the present disclosure, constituting a laminated imaging element of the present disclosure, and an imaging element according to the second aspect of the present disclosure, constituting solid-state imaging devices according to first and second aspects of the present disclosure may be collectively referred to as "imaging element and the like according to the second aspect of the present disclosure" for convenience. Moreover, an imaging element according to a third aspect of the present disclosure, an imaging element according to the third aspect of the present disclosure, constituting a laminated imaging element of the present disclosure, and an imaging element according to the third aspect of the present disclosure, constituting solid-state imaging devices according to first and second aspects of the present disclosure may be collectively referred to as "imaging element and the like according to the third aspect of the present disclosure" for convenience. Furthermore, an imaging element according to a fourth aspect of the present disclosure, an imaging element according to the fourth aspect of the present disclosure, constituting a laminated imaging element of the present disclosure, and an imaging element according to the fourth aspect of the present disclosure, constituting solid-state imaging devices according to first and second aspects of the present disclosure may be collectively referred to as "imaging element and the like according to the fourth aspect of the present disclosure" for convenience. Moreover, the imaging elements and the like according to the first to fourth aspects of the present disclosure may be collectively referred to as "imaging element and the like of the present disclosure" for convenience.

In the imaging element and the like according to the second aspect of the present disclosure, when the indium-gallium-zinc composite oxide is represented by $(ZnO)_X(Ga_2O_3)_{1-X}$, $(Ga_2O_3)_Y(In_2O_3)_{1-Y}$, and $(In_2O_3)_Z(ZnO)_{1-Z}$, a value of X in the first layer can be larger than a value of X in the second layer, or a value of Y in the first layer can be lower than a value of Y in the second layer, or a value of Z in the first layer can be higher than a value of Z in the second layer. Note that, there are the following seven cases.

(1) Case where a value of X in the first layer is higher than a value of X in the second layer (2) Case where a value of Y in the first layer is lower than a value of Y in the second layer (3) Case where a value of Z in the first layer is higher than a value of Z in the second layer (4) Case where a value of X in the first layer is higher than a value of X in the second layer, and a value of Y in the first layer is lower than a value of Y in the second layer (5) a value of X in the first layer is higher than a value of X in the second layer, and a value of Z in the first layer is higher than a value of Z in the second layer (6) Case where a value of Y in the first layer is lower than a value of Y in the second layer, and a value of Z in the first layer is higher than a value of Z in the second layer (7) Case where a value of X in the first layer is higher than a value of X in the second layer, a value of Y in the first layer is lower than a value of Y in the second layer, and a value of Z in the first layer is higher than a value of Z in the second layer In addition, in this case, $0<X<0.875$, $0<Y<0.875$, and $0.125<Z<0.875$ (where $X+Y+Z=1.000$) are satisfied. For the first layer, $Y<0.5$ is preferably satisfied. For the second layer, $X<0.5$ and $Y>0.5$ are preferably satisfied.

In the imaging element and the like according to the third aspect of the present disclosure, $1\times10^{-6} \le$ (carrier mobility of second layer)/(carrier mobility of first layer)$\le 0.1$ is preferably satisfied. Furthermore, the carrier mobility of the first layer is not limited, but is preferably 10 cm²/V·s or more.

In the imaging element and the like of the present disclosure, the composite oxide layer is desirably amorphous (for example, amorphous without a local crystal structure). Whether or not the composite oxide layer is amorphous can be determined on the basis of X-ray diffraction analysis.

In the imaging element and the like according to the first aspect, the third aspect, or the fourth aspect of the present disclosure including the preferable forms and configurations described above, the composite oxide layer (inorganic oxide semiconductor material layer) can contain indium-gallium-zinc composite oxide (IGZO). Furthermore, in the imaging element and the like of the present disclosure including the preferable forms and configurations described above, the composite oxide layer generally contains a conductive inorganic oxide semiconductor material that is transparent to incident light. Alternatively, in the imaging element and the like according to the first aspect, the third aspect, or the fourth aspect of the present disclosure including the preferable forms and configurations described above, the composite oxide layer (inorganic oxide semiconductor material layer) can contain at least two elements selected from the group consisting of indium, tungsten, tin, and zinc. That is, specifically, the composite oxide layer (inorganic oxide semiconductor material layer) can contain indium-tungsten oxide (IWO) which is a material obtained by adding tungsten (W) to indium oxide, indium-tungsten-zinc oxide (IWZO) which is a material obtained by adding tungsten (W) and zinc (Zn) to indium oxide, indium-tin-zinc oxide (ITZO) which is a material obtained by adding tin (Sn) and zinc (Zn) to indium oxide, or zinc-tin oxide (ZTO). More specifically, the composite oxide layer contains In—W oxide, In—Sn oxide, In—Zn oxide, W—Sn oxide, W—Zn oxide, Sn—Zn oxide, In—W—Sn oxide, In—W—Zn oxide, In—Sn—Zn oxide, or In—W—Sn—Zn oxide. In IWO, when the total mass of indium oxide and tungsten oxide is 100% by mass, the mass ratio of tungsten oxide is preferably 10% by mass to 30% by mass. Moreover, in IWZO, when the total mass of indium oxide, tungsten oxide, and Zn oxide is 100% by mass, the mass ratios of tungsten oxide and Zn oxide are preferably 2% by mass to 15% by mass and 1% by mass to 3% by mass, respectively. Furthermore, in ITZO, when the total mass of indium oxide, Zn oxide, and Sn oxide is 100% by mass, the mass ratios of tungsten oxide and tin oxide are preferably 3% by mass to 10% by mass and 10% by mass to 17% by mass, respectively. However, the present disclosure is not limited thereto. Note that in a case where the composite oxide layer (inorganic oxide semiconductor material layer) contain at least two elements selected from the group consisting of indium, tungsten, tin, and zinc, it is only required to form the first layer and the second layer constituting the composite oxide layer on the basis of composition modulation.

In the imaging element and the like of the present disclosure, the composite oxide layer includes the first layer adjacent to the first electrode and the second layer adjacent to the photoelectric conversion layer. The first layer and the second layer can be laminated, or an intermediate layer can be formed between the first layer and the second layer.

The imaging element and the like having an intermediate layer according to the second aspect of the present disclosure can have a form in which, a value of X in the first layer is higher than a value of X in the intermediate layer, and a value of X in the intermediate layer is higher than a value of X in the second layer, or a value of Y in the first layer is lower than a value of Y in the intermediate layer, and a value of Y in the intermediate layer is lower than a value of Y in the second layer, or a value of Z in the first layer is higher than a value of Z in the intermediate layer, and a value of Z in the intermediate layer is higher than a value of Z in the second layer.

Furthermore, the oxygen atom content in the first layer can be lower than that in the intermediate layer, and the oxygen atom content in the intermediate layer can be lower than that in the second layer.

The intermediate layer can have a configuration in which two or more layers having different values of X, Y, Z, and the like are laminated (that is, a layer configuration in which values of X, Y, Z, and the like become different stepwise) or a configuration in which values of X, Y, Z, and the like gradually become different (change).

Alternatively, the imaging element and the like having an intermediate layer according to the first aspect of the present disclosure can have a configuration in which the indium composition in the first layer is higher than that in the intermediate layer, and the indium composition in the intermediate layer is higher than that in the second layer. In addition, the intermediate layer can have a configuration in which two or more layers having different indium compositions are laminated (that is, a layer configuration in which the indium composition becomes different stepwise) or a configuration in which the indium composition gradually becomes different (changes).

Analysis of indium composition (indium atom content), analysis of gallium composition (gallium atom content), analysis of zinc composition (zinc atom content), and analysis of oxygen atom content in the composite oxide layer can be performed on the basis of Rutherford backscattering spectrometry (RBS) or a combination of Rutherford backscattering spectrometry and nuclear reaction analysis.

Alternatively, the imaging element and the like having an intermediate layer according to the third aspect of the present disclosure can have a form in which the first layer has a higher carrier mobility than the intermediate layer, and the intermediate layer has a higher carrier mobility than the second layer. In addition, the intermediate layer can have a configuration in which two or more layers having different carrier mobilities are laminated (that is, a layer configuration in which the carrier mobility becomes different stepwise) or a configuration in which the carrier mobility gradually becomes different (changes).

A value of carrier mobility can be determined on the basis of Hall measurement or a Time-of-Flight method.

Alternatively, the imaging element and the like having an intermediate layer according to the fourth aspect of the present disclosure can have a form in which the first layer has a lower state density than the intermediate layer, and the intermediate layer has a lower state density than the second layer. In addition, the intermediate layer can have a configuration in which two or more layers having different state densities are laminated (that is, a layer configuration in which the state density becomes different stepwise) or a configuration in which the state density gradually becomes different (changes).

A value of the state density in the intermediate layer can be determined on the basis of inverse photoelectron spectroscopy.

The composite oxide layer can have a single-layer configuration (constituted by one material) or a multilayer configuration (constituted by two or more materials). Alternatively, a material constituting the composite oxide layer located above a charge accumulation electrode described later may be different from a material constituting the composite oxide layer located above the first electrode.

The composite oxide layer can be formed, for example, on the basis of a sputtering method for performing sputtering a plurality of times using different targets, on the basis of a co-sputtering method, on the basis of the sputtering method by changing an oxygen gas flow rate at the time of film formation, or on the basis of a pulse laser deposition method. Specifically, a parallel plate sputtering apparatus or a DC magnetron sputtering apparatus is used as a sputtering apparatus. In addition, a sputtering method using an argon (Ar) gas and an oxygen ($O_2$) gas as a process gas and using a desired sintered body such as an IGZO sintered body, an InZnO sintered body, or an InWO sintered body as a target can be exemplified.

Note that the energy level of the composite oxide layer can be controlled by controlling the amount of oxygen gas introduced (oxygen gas partial pressure) when the composite oxide layer is formed on the basis of the sputtering method. Specifically, a value of oxygen gas partial pressure $<=(O_2$ gas pressure)/(total pressure of Ar gas and $O_2$ gas)$>$ when the composite oxide layer is formed on the basis of the sputtering method is preferably set to 0 to 0.25.

Moreover, in the imaging element and the like of the present disclosure including the preferable forms and configurations described above, for example, the thickness $T^1$ of the first layer is $1.5 \times 10^{-8}$ m to $3 \times 10^{-8}$ m, and the thickness $T_2$ of second layer is $5 \times 10^{-8}$ m to $5 \times 10^{-7}$ m.

Moreover, the imaging element and the like according to the first to fourth aspects of the present disclosure including the preferable forms and configurations described above can have a form in which light is incident from the second electrode, surface roughness Ra of the composite oxide layer at an interface between the photoelectric conversion layer and the composite oxide layer is 1.5 nm or less, and a value of root mean square roughness Rq of the composite oxide layer is 2.5 nm or less. Values of surface roughness Ra and Rq are determined on the basis of the provisions of JIS B0601:2013. Such smoothness of the composite oxide layer at the interface between the photoelectric conversion layer and the composite oxide layer can suppress surface scattering reflection in the composite oxide layer and improve bright current characteristics in photoelectric conversion. A form can be adopted in which surface roughness Ra of the charge accumulation electrode described later is 1.5 nm or less, and a value of root mean square roughness Rq of the charge accumulation electrode is 2.5 nm or less.

In the imaging element and the like of the present disclosure, the composite oxide layer preferably has light transmittance of 65% or more with respect to light having a wavelength of 400 nm to 660 nm. Furthermore, the charge accumulation electrode described later also preferably has light transmittance of 65% or more with respect to light having a wavelength of 400 nm to 660 nm. The charge accumulation electrode preferably has a sheet resistance value of $3 \times 10 \Omega/\square$ to $1 \times 10^3 \Omega/\square$.

Figure 78:
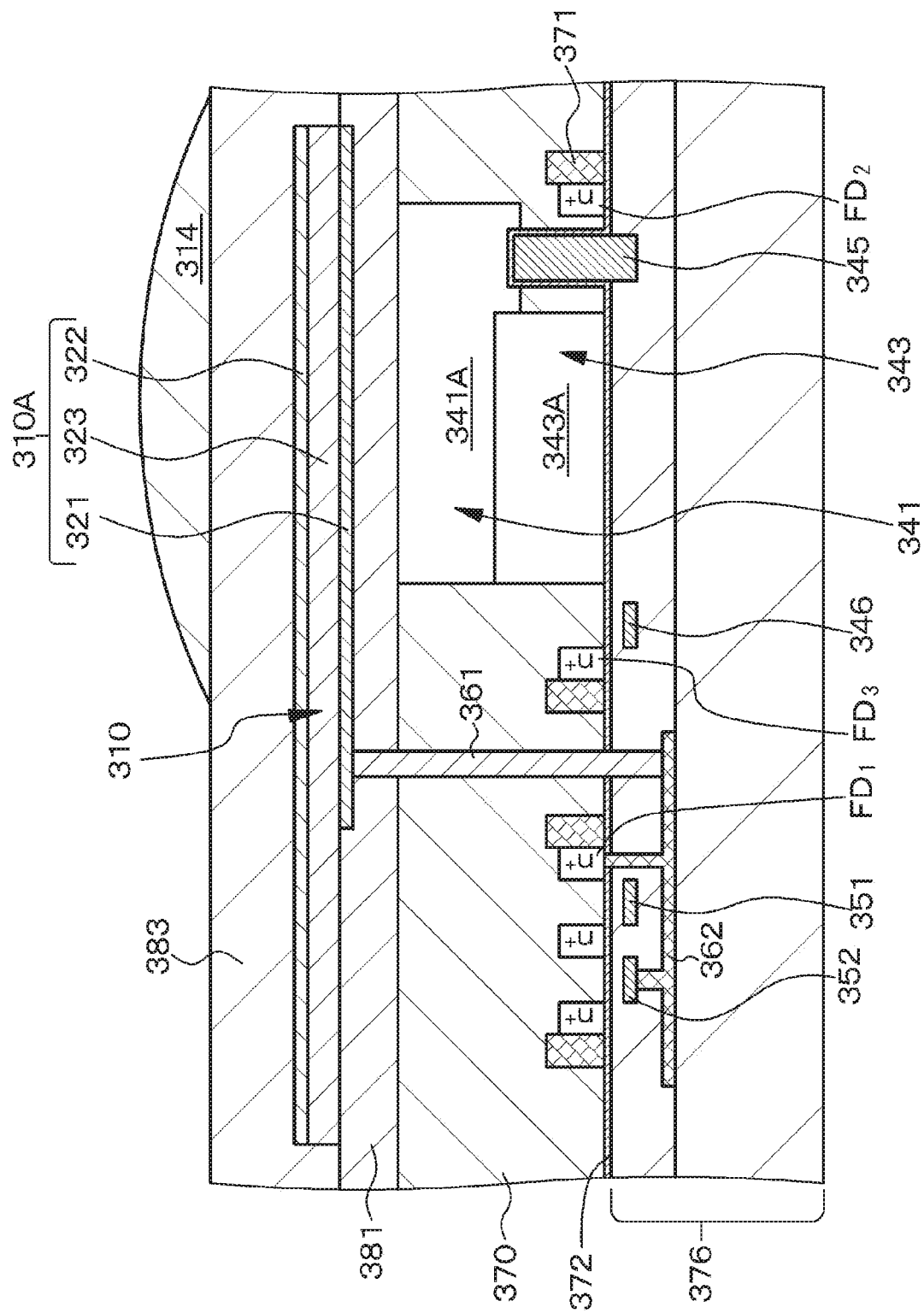
FIG. 78 is a conceptual diagram of a conventional laminated imaging element (laminated solid-state imaging device).

In a conventional imaging element illustrated in FIG. 78, charges generated by photoelectric conversion in the second photoelectric conversion unit 341A and the third photoelectric conversion unit 343A are temporarily accumulated in the second photoelectric conversion unit 341A and the third photoelectric conversion unit 343A, and then transferred to the second floating diffusion layer $FD_2$ and the third floating diffusion layer $FD_3$, respectively. Therefore, the second photoelectric conversion unit 341A and the third photoelectric conversion unit 343A can be completely depleted. However, charges generated by photoelectric conversion in the first photoelectric conversion unit 310A are directly accumulated in the first floating diffusion layer $FD_1$. Therefore, it is difficult to completely deplete the first photoelectric conversion unit 310A. In addition, as a result, a kTC noise increases, a random noise deteriorates, and the quality of an imaged image may deteriorate.

In the imaging element and the like of the present disclosure including the preferable forms and configurations described above, the photoelectric conversion unit can further include an insulating layer and a charge accumulation electrode disposed apart from the first electrode so as to face the composite oxide layer via the insulating layer. Note that such an imaging element may be referred to as "imaging element and the like of the present disclosure including a charge accumulation electrode" hereinafter.

In this way, by inclusion of the charge accumulation electrode which is disposed apart from the first electrode so as to face the composite oxide layer via an insulating layer, when the photoelectric conversion unit is irradiated with light, and the light is photoelectrically converted in the photoelectric conversion unit, charges can be stored in the composite oxide layer (or the composite oxide layer and the photoelectric conversion layer). Therefore, at the time of start of exposure, a charge accumulation portion can be completely depleted and the charge can be erased. As a result, it is possible to suppress occurrence of a phenomenon that a kTC noise increases, a random noise deteriorates, and the quality of an imaged image deteriorates. In the following description, the composite oxide layer, or the composite oxide layer and the photoelectric conversion layer may be collectively referred to as "composite oxide layer and the like".

The imaging element and the like of the present disclosure including a charge accumulation electrode can have a form in which
a semiconductor substrate is further included, and
the photoelectric conversion unit is disposed above the semiconductor substrate. Note that the first electrode, the charge accumulation electrode, and the second electrode are connected to a drive circuit described later.

The second electrode located on a light incident side may be common to a plurality of imaging elements. That is, the second electrode can be a so-called solid electrode. The photoelectric conversion layer may be common to a plurality of imaging elements. That is, one photoelectric conversion layer may be formed in the plurality of imaging elements, or may be disposed for each of the imaging elements. The composite oxide layer is preferably disposed for each of the imaging elements.

Moreover, the imaging element and the like of the present disclosure including a charge accumulation electrode, including the various preferable forms and configurations described above, can have a form in which the first electrode extends in an opening formed in the insulating layer to be connected to the composite oxide layer. Alternatively, a form can be adopted in which the composite oxide layer extends in an opening formed in the insulating layer to be connected to the first electrode. In this case,
a form can be adopted in which an edge of a top surface of the first electrode is covered with the insulating layer,
the first electrode is exposed on a bottom surface of the opening, and
when a surface of the insulating layer in contact with the top surface of the first electrode is referred to as a first surface, and a surface of the insulating layer in contact with a portion of the composite oxide layer facing the charge accumulation electrode is referred to as a second surface, a side surface of the opening has an inclination widening from the first surface toward the second surface. Moreover, a form can be adopted in which the side surface of the opening having an inclination widening from the first surface toward the second surface is located on the charge accumulation electrode side.

Moreover, the imaging element and the like of the present disclosure including a charge accumulation electrode, including the various preferable forms and configurations described above, can have a configuration in which
a control unit disposed on a semiconductor substrate and having a drive circuit is further included,
the first electrode and the charge accumulation electrode are connected to the drive circuit,
in a charge accumulation period, the drive circuit applies a potential $V_{11}$ to the first electrode and applies a potential $V_{12}$ to the charge accumulation electrode, and charges are accumulated in the composite oxide layer (or the composite oxide layer and the photoelectric conversion layer), and
in a charge transfer period, the drive circuit applies a potential $V_{21}$ to the first electrode and applies a potential $V_{22}$ to the charge accumulation electrode, and the charges accumulated in the composite oxide layer (or the composite oxide layer and the photoelectric conversion layer) are read out by the control unit via the first electrode. However, in a case where the potential of the first electrode is higher than that of the second electrode,
$V_{12} \geq V_{11}$ and $V_{22} < V_{21}$ are satisfied, and
in a case where the potential of the first electrode is lower than that of the second electrode,
$V_{12} \leq V_{11}$ and $V_{22} > V_{21}$ are satisfied.

Moreover, the imaging element and the like of the present disclosure including a charge accumulation electrode, including the various preferable forms and configurations described above, can further include a transfer control electrode (charge transfer electrode) disposed apart from the first electrode and the charge accumulation electrode so as to face the composite oxide layer via an insulating layer between the first electrode and the charge accumulation electrode. The imaging element and the like of the present disclosure including a charge accumulation electrode, having such a form, are referred to as "imaging element and the like including the transfer control electrode of the present disclosure" for convenience.

In addition, the imaging element and the like of the present disclosure including a transfer control electrode can have a configuration in which a control unit disposed on a semiconductor substrate and having a drive circuit is further included, the first electrode, the charge accumulation electrode, and the transfer control electrode are connected to the drive circuit, in a charge accumulation period, the drive circuit applies a potential $V_{11}$ to the first electrode, applies a potential $V_{12}$ to the charge accumulation electrode, and applies a potential $V_{13}$ to the transfer control electrode, and charges are accumulated in the composite oxide layer (or the composite oxide layer and the photoelectric conversion layer), and in a charge transfer period, the drive circuit applies a potential $V_{21}$ to the first electrode, applies a potential $V_{22}$ to the charge accumulation electrode, and applies a potential $V_{23}$ to the transfer control electrode, and the charges accumulated in the composite oxide layer (or the composite oxide layer and the photoelectric conversion layer) are read out by the control unit via the first electrode. However, in a case where the potential of the first electrode is higher than that of the second electrode, $V_{12} > V_{13}$ and $V_{22} \leq V_{23} \leq V_{21}$ are satisfied, and in a case where the potential of the first electrode is lower than that of the second electrode, $V_{12} < V_{13}$ and $V_{22} \geq V_{23} \geq V_{21}$ are satisfied.

Moreover, the imaging element and the like of the present disclosure including a charge accumulation electrode, including the various preferable forms and configurations described above, can further include a charge discharge electrode connected to the composite oxide layer and disposed apart from the first electrode and the charge accumulation electrode. The image imaging element and the like of the present disclosure including a charge accumulation electrode, having such a form, are referred to as "imaging element and the like including the charge discharge electrode of the present disclosure" for convenience. In addition, the imaging element and the like of the present disclosure including a charge discharge electrode can have a form in which the charge discharge electrode is disposed so as to surround the first electrode and the charge accumulation electrode (that is, in a frame shape). The charge discharge electrode can be shared by (common to) a plurality of imaging elements. In addition, in this case, a form can be adopted in which the composite oxide layer extends in a second opening formed in the insulating layer to be connected to the charge discharge electrode, an edge of a top surface of the charge discharge electrode is covered with the insulating layer, the charge discharge electrode is exposed on a bottom surface of the second opening, and when a surface of the insulating layer in contact with the top surface of the charge discharge electrode is referred to as a third surface, and a surface of the insulating layer in contact with a portion of the composite oxide layer facing the charge accumulation electrode is referred to as a second surface, a side surface of the second opening has an inclination widening from the third surface toward the second surface.

Moreover, the imaging element and the like of the present disclosure including a charge discharge electrode can have a configuration in which a control unit disposed on a semiconductor substrate and having a drive circuit is further included, the first electrode, the charge accumulation electrode, and the charge discharge electrode are connected to the drive circuit, in a charge accumulation period, the drive circuit applies a potential $V_{11}$ to the first electrode, applies a potential $V_{12}$ to the charge accumulation electrode, and applies a potential $V_{14}$ to the charge discharge electrode, and charges are accumulated in the composite oxide layer (or the composite oxide layer and the photoelectric conversion layer), and in a charge transfer period, the drive circuit applies a potential $V_{21}$ to the first electrode, applies a potential $V_{22}$ to the charge accumulation electrode, and applies a potential $V_{24}$ to the charge discharge electrode, and the charges accumulated in the composite oxide layer (or the composite oxide layer and the photoelectric conversion layer) are read out by the control unit via the first electrode. However, in a case where the potential of the first electrode is higher than that of the second electrode, $V_{14} > V_{11}$ and $V_{24} < V_{21}$ are satisfied, and in a case where the potential of the first electrode is lower than that of the second electrode, $V_{14} < V_{11}$ and $V_{24} > V_{21}$ are satisfied.

Moreover, in the various preferable forms and configurations described above in the imaging element and the like of the present disclosure including a charge accumulation electrode, the charge accumulation electrode can include a plurality of charge accumulation electrode segments. The imaging element and the like of the present disclosure including a charge accumulation electrode, having such a form, are referred to as "imaging element and the like including the plurality of charge accumulation electrode segments of the present disclosure" for convenience. The number of charge accumulation electrode segments only needs to be two or more. In addition, the imaging element and the like of the present disclosure including a plurality of charge accumulation electrode segments can have a form in which, in a case where different potentials are applied to N charge accumulation electrode segments, in a case where the potential of the first electrode is higher than that of the second electrode, in a charge transfer period, a potential applied to a charge accumulation electrode segment located closest to the first electrode (first photoelectric conversion unit segment) is higher than a potential applied to a charge accumulation electrode segment located farthest from the first electrode (N-th photoelectric conversion unit segment), and in a case where the potential of the first electrode is lower than that of the second electrode, in the charge transfer period, the potential applied to the charge accumulation electrode segment located closest to the first electrode (first photoelectric conversion unit segment) is lower than the potential applied to the charge accumulation electrode segment located farthest from the first electrode (N-th photoelectric conversion unit segment).

The imaging element and the like of the present disclosure including a charge accumulation electrode, including the various preferable forms and configurations described above, can have a configuration in which on the semiconductor substrate, at least a floating diffusion layer and an amplification transistor constituting a control unit are disposed, and the first electrode is connected to the floating diffusion layer and a gate portion of the amplification transistor. In addition, in this case, moreover, a configuration can be adopted in which on the semiconductor substrate, a reset transistor and a selection transistor constituting the control unit are further disposed, the floating diffusion layer is connected to one source/drain region of the reset transistor, and one source/drain region of the amplification transistor is connected to one source/drain region of the selection transistor, and the other source/drain region of the selection transistor is connected to a signal line.

Moreover, the imaging element and the like of the present disclosure including a charge accumulation electrode, including the various preferable forms and configurations described above, can have a form in which the charge accumulation electrode is larger than the first electrode. When the area of the charge accumulation electrode is represented by $S_1'$, and the area of the first electrode is represented by $S_1$, $$4 \leq S_1'/S_1$$

is preferably satisfied although not limited.

Alternatively, examples of a modification of the imaging element and the like of the present disclosure including a charge accumulation electrode, including the various preferable forms described above, include imaging elements of the first to sixth configurations described below. That is, in each of the imaging elements of the first to sixth configurations in the imaging element and the like of the present disclosure including a charge accumulation electrode, including the various preferable forms described above, the photoelectric conversion unit includes N (where N≥2) photoelectric conversion unit segments, the composite oxide layer and the photoelectric conversion layer include N photoelectric conversion layer segments, the insulating layer includes N insulating layer segments, in each of the imaging elements of the first to third configurations, the charge accumulation electrode includes N charge accumulation electrode segments, in each of the imaging elements of the fourth and fifth configurations, the charge accumulation electrode includes N charge accumulation electrode segments disposed apart from one another, the n-th (where n=1, 2, 3 ... N) photoelectric conversion unit segment includes the n-th charge accumulation electrode segment, the n-th insulating layer segment, and the n-th photoelectric conversion layer segment, and a photoelectric conversion unit segment with a larger value of n is located farther from the first electrode. Here, the "photoelectric conversion layer segment" refers to a segment formed by laminating the photoelectric conversion layer and the composite oxide layer.

In addition, in the imaging element of the first configuration, the thickness of an insulating layer segment gradually changes from the first photoelectric conversion unit segment to the N-th photoelectric conversion unit segment. Furthermore, in the imaging element of the second configuration, the thickness of a photoelectric conversion layer segment gradually changes from the first photoelectric conversion unit segment to the N-th photoelectric conversion unit segment. Note that in a photoelectric conversion layer segment, the thickness of the photoelectric conversion layer segment may be changed by changing the thickness of the photoelectric conversion layer portion and keeping the thickness of the composite oxide layer portion constant. Furthermore, the thickness of the photoelectric conversion layer segment may be changed by keeping the thickness of the photoelectric conversion layer portion constant and changing the thickness of the composite oxide layer portion. Furthermore, the thickness of the photoelectric conversion layer segment may be changed by changing the thickness of the photoelectric conversion layer portion and changing the thickness of the composite oxide layer portion. Moreover, in the imaging element of the third configuration, materials constituting an insulating layer segment are different between adjacent photoelectric conversion unit segments. Furthermore, in the imaging element of the fourth configuration, materials constituting a charge accumulation electrode segment are different between adjacent photoelectric conversion unit segments. Moreover, in the imaging element of the fifth configuration, the area of a charge accumulation electrode segment is gradually reduced from the first photoelectric conversion unit segment to the N-th photoelectric conversion unit segment. The area may be reduced continuously or stepwise.

Alternatively, in the imaging element of the sixth configuration in the imaging element and the like of the present disclosure including the various preferable forms described above, if a lamination direction of the charge accumulation electrode, the insulating layer, the composite oxide layer, and the photoelectric conversion layer is defined as a Z direction, and a direction of separating from the first electrode is defined as an X direction, when a laminated portion where the charge accumulation electrode, the insulating layer, the composite oxide layer, and the photoelectric conversion layer are laminated is cut with a YZ virtual plane, the cross-sectional area of the laminated portion changes depending on a distance from the first electrode. The change in the cross-sectional area may be a continuous change or a step-like change.

In each of the imaging elements of the first and second configurations, the N photoelectric conversion layer segments are disposed continuously, the N insulating layer segments are also disposed continuously, and the N charge accumulation electrode segments are also disposed continuously. In each of the imaging elements of the third and fifth configurations, the N photoelectric conversion layer segments are disposed continuously. Furthermore, in each of the imaging elements of the fourth and fifth configurations, the N insulating layer segments are disposed continuously. Meanwhile, in the imaging element of the third configuration, the N insulating layer segments are disposed so as to correspond to the respective photoelectric conversion unit segments. Moreover, in each of the imaging elements of the fourth and fifth configurations, and in some cases, in the imaging element of the third configuration, the N charge accumulation electrode segments are disposed so as to correspond to the respective photoelectric conversion unit segments. In addition, in each of the imaging elements of the first to sixth configurations, the same potential is applied to all the charge accumulation electrode segments. Alternatively, in each of the imaging elements of the fourth and fifth configurations, and in some cases, in the imaging element of the third configuration, different potentials may be applied to the N charge accumulation electrode segments.

In the imaging element and the like of the present disclosure including the imaging elements of the first to sixth configurations, the thickness of an insulating layer segment is defined, or the thickness of a photoelectric conversion layer segment is defined, or the materials constituting the insulating layer segments are different, or the materials constituting the charge accumulation electrode segments are different, or the area of the charge accumulation electrode segment is defined, or the cross-sectional area of the laminated portion is defined. Therefore, a kind of charge transfer gradient is formed, and charges generated by photoelectric conversion can be transferred to the first electrode more easily and reliably. In addition, as a result, it is possible to prevent generation of afterimages and transfer residuals.

In each of the imaging elements of the first to fifth configurations, a photoelectric conversion unit segment with a larger value of n is located farther from the first electrode, but it is determined on the basis of the X direction whether or not a photoelectric conversion unit segment is located apart from the first electrode. Furthermore, in the imaging element of the sixth configuration, the direction of separating from the first electrode is defined as the X direction, and the "X direction" is defined as follows. That is, a pixel region in which a plurality of imaging elements or laminated imaging elements is arrayed includes pixels regularly arrayed two-dimensionally, that is, in the X and Y directions. In a case where the planar shape of the pixel is rectangular, a direction in which a side closest to the first electrode extends is defined as the Y direction, and a direction orthogonal to the Y direction is defined as the X direction. Alternatively, in a case where the planar shape of the pixel is an arbitrary shape, the overall direction including a line segment or a curve closest to the first electrode is defined as the Y direction, and a direction orthogonal to the Y direction is defined as the X direction.

Hereinafter, regarding the imaging elements of the first to sixth configurations, a case where the potential of the first electrode is higher than that of the second electrode will be described.

In the imaging element of the first configuration, the thickness of an insulating layer segment gradually changes from the first photoelectric conversion unit segment to the N-th photoelectric conversion unit segment. However, the thickness of an insulating layer segment preferably increases gradually, thereby forming a kind of charge transfer gradient. Then, when a state of $|V_{12}| \geq |V_{11}|$ is reached in a charge accumulation period, the n-th photoelectric conversion unit segment can accumulate more charges than the (n+1)-th photoelectric conversion unit segment, a stronger electric field is applied to the n-th photoelectric conversion unit segment than to the (n+1)-th photoelectric conversion unit segment, and a flow of charges from the first photoelectric conversion unit segment to the first electrode can be reliably prevented. Furthermore, when a state of $|V_{22}| < |V_{21}|$ is reached in a charge transfer period, a flow of charges from the first photoelectric conversion unit segment to the first electrode, and a flow of charges from the (n+1)-th photoelectric conversion unit segment to the n-th photoelectric conversion unit segment can be reliably ensured.

In the imaging element of the second configuration, the thickness of a photoelectric conversion layer segment gradually changes from the first photoelectric conversion unit segment to the N-th photoelectric conversion unit segment. However, the thickness of a photoelectric conversion layer segment preferably increases gradually, thereby forming a kind of charge transfer gradient. Then, when a state of $|V_{12}| > |V_{21}|$ is reached in a charge accumulation period, a stronger electric field is applied to the n-th photoelectric conversion unit segment than to the (n+1)-th photoelectric conversion unit segment, and a flow of charges from the first photoelectric conversion unit segment to the first electrode can be reliably prevented. Furthermore, when a state of $V_{22} < V_{21}$ is reached in a charge transfer period, a flow of charges from the first photoelectric conversion unit segment to the first electrode, and a flow of charges from the (n+1)-th photoelectric conversion unit segment to the n-th photoelectric conversion unit segment can be reliably ensured.

In the imaging element of the third configuration, materials constituting an insulating layer segment are different between adjacent photoelectric conversion unit segments, and this forms a kind of charge transfer gradient. A value of the relative dielectric constant of a material constituting an insulating layer segment preferably decreases gradually from the first photoelectric conversion unit segment to the N-th photoelectric conversion unit segment. Then, by adopting such a configuration, in a charge accumulation period, when a state of $V_{12} \geq V_{11}$ is reached, the n-th photoelectric conversion unit segment can accumulate more charges than the (n+1)-th photoelectric conversion unit segment. Furthermore, when a state of $V_{22} < V_{21}$ is reached in a charge transfer period, a flow of charges from the first photoelectric conversion unit segment to the first electrode, and a flow of charges from the (n+1)-th photoelectric conversion unit segment to the n-th photoelectric conversion unit segment can be reliably ensured.

In the imaging element of the fourth configuration, materials constituting a charge accumulation electrode segment are different between adjacent photoelectric conversion unit segments, and this forms a kind of charge transfer gradient. A value of the work function of a material constituting an insulating layer segment preferably increases gradually from the first photoelectric conversion unit segment to the N-th photoelectric conversion unit segment. In addition, by adopting such a configuration, a potential gradient which is advantageous for signal charge transfer can be formed without depending on whether the voltage is positive or negative.

In the imaging element of the fifth configuration, the area of a charge accumulation electrode segment is gradually reduced from the first photoelectric conversion unit segment to the N-th photoelectric conversion unit segment, and this forms a kind of charge transfer gradient. Therefore, when a state of $V_{12} \geq V_{11}$ is reached in a charge accumulation period, the n-th photoelectric conversion unit segment can accumulate more charges than the (n+1)-th photoelectric conversion unit segment. Furthermore, when a state of $V_{22} < V_{21}$ is reached in a charge transfer period, a flow of charges from the first photoelectric conversion unit segment to the first electrode, and a flow of charges from the (n+1)-th photoelectric conversion unit segment to the n-th photoelectric conversion unit segment can be reliably ensured.

In the imaging element of the sixth configuration, the cross-sectional area of the laminated portion changes depending on a distance from the first electrode, and this forms a kind of charge transfer gradient. Specifically, by adopting a configuration in which the thickness of the cross section of the laminated portion is constant and the width of the cross section of the laminated portion becomes narrower as the laminated portion goes away from the first electrode, as described in the imaging element of the fifth configuration, when a state of $V_{12} \geq V_{11}$ is reached in a charge accumulation period, a region close to the first electrode can accumulate more charges than a region far from the first electrode. Therefore, when a state of $V_{22} < V_{21}$ is reached in a charge transfer period, a flow of charges from a region close to the first electrode to the first electrode and a flow of charges from a region far from the first electrode to a region close to the first electrode can be reliably ensured. Meanwhile, by adopting a configuration in which the width of the cross section of the laminated portion is constant, and the thickness of the cross section of the laminated portion, specifically, the thickness of an insulating layer segment gradually increases, as described in the imaging element of the first configuration, when a state of $V_{12} \geq V_{11}$ is reached in a charge accumulation period, a region close to the first electrode can accumulate more charges than a region far from the first electrode, a stronger electric field is applied to the region close to the first electrode than to the region far from the first electrode, and a flow of charges from the region close to the first electrode to the first electrode can be reliably prevented. Then, when a state of $V_{22}<V_{21}$ is reached in a charge transfer period, a flow of charges from a region close to the first electrode to the first electrode and a flow of charges from a region far from the first electrode to a region close to the first electrode can be reliably ensured. Furthermore, by adopting a configuration in which the thickness of the photoelectric conversion layer segment gradually increases, as described in the imaging element of the second configuration, when a state of $V_{12} \geq V_{11}$ is reached in a charge accumulation period, a stronger electric field is applied to the region close to the first electrode than to the region far from the first electrode, and a flow of charges from the region close to the first electrode to the first electrode can be reliably prevented. Then, when a state of $V_{22}<V_{21}$ is reached in a charge transfer period, a flow of charges from a region close to the first electrode to the first electrode and a flow of charges from a region far from the first electrode to a region close to the first electrode can be reliably ensured.

A modification of the solid-state imaging devices according to the first and second aspects of the present disclosure can be a solid-state imaging device including a plurality of the imaging elements of the first to sixth configurations, in which the plurality of imaging elements constitutes an imaging element block, and the first electrode is shared by the plurality of imaging elements constituting the imaging element block. A solid-state imaging device having such a configuration is referred to as "solid-state imaging device of first configuration" for convenience. Alternatively, a modification of the solid-state imaging devices according to the first and second aspects of the present disclosure can be, a solid-state imaging device including a plurality of the imaging elements of the first to sixth configurations or a plurality of laminated imaging elements each including at least one of the imaging elements of the first to sixth configurations, the plurality of imaging elements or laminated imaging elements constitutes an imaging element block, and the first electrode is shared by the plurality of imaging elements or laminated imaging elements constituting the imaging element block. A solid-state imaging device having such a configuration is referred to as "solid-state imaging device of second configuration" for convenience. In addition, if the first electrode is shared by the plurality of imaging elements constituting the imaging element block in this way, the configuration and structure in a pixel region in which a plurality of imaging elements is arrayed can be simplified and miniaturized.

In each of the solid-state imaging devices of the first and second configurations, one floating diffusion layer is disposed for a plurality of imaging elements (one imaging element block). Here, the plurality of imaging elements disposed for one floating diffusion layer may be constituted by a plurality of first type imaging elements described later, or may be constituted by at least one first type imaging element and one or more second type imaging elements described later. In addition, by appropriately controlling the timing of a charge transfer period, a plurality of imaging elements can share one floating diffusion layer. The plurality of imaging elements is operated in cooperation to be connected as an imaging element block to a drive circuit described later. That is, the plurality of imaging elements constituting the imaging element block is connected to one drive circuit. However, the charge accumulation electrode is controlled for each of the imaging elements. Furthermore, the plurality of imaging elements can share one contact hole portion. As for an arrangement relationship between the first electrode shared by the plurality of imaging elements and the charge accumulation electrodes of the imaging elements, there is also a case where the first electrode is disposed adjacent to the charge accumulation electrodes of the imaging elements. Alternatively, there is also a case where the first electrode is disposed adjacent to some of the charge accumulation electrodes of the plurality of imaging elements, and is not disposed adjacent to the remaining charge accumulation electrodes of the plurality of imaging elements. In this case, transfer of charges from the rest of the plurality of imaging elements to the first electrode is transfer via some of the plurality of imaging elements. A distance between a charge accumulation electrode constituting an imaging element and a charge accumulation electrode constituting an imaging element (referred to as "distance A" for convenience) is preferably longer than a distance between the first electrode and a charge accumulation electrode in an imaging element adjacent to the first electrode (referred to as "distance B" for convenience) in order to ensure transfer of charges from each of the imaging elements to the first electrode. Furthermore, a value of the distance A is preferably longer as an imaging element is located farther from the first electrode.

Moreover, the imaging element and the like of the present disclosure including the various preferable forms and configurations described above can have a form in which light is incident from the second electrode side, and a light shielding layer is formed on the light incident side of the second electrode. Alternatively, a form can be adopted in which light is incident from the second electrode side, and light is not incident on the first electrode (in some cases, the first electrode and the transfer control electrode). In addition, in this case, a configuration can be adopted in which a light shielding layer is formed above the first electrode (in some cases, the first electrode and the transfer control electrode) on the light incident side of the second electrode. Alternatively, a configuration can be adopted in which an on-chip micro lens is disposed above the charge accumulation electrode and the second electrode, and light incident on the on-chip micro lens is collected by the charge accumulation electrode. Here, the light shielding layer may be disposed above the light incident side surface of the second electrode, or may be disposed on the light incident side surface of the second electrode. In some cases, a light shielding layer may be formed in the second electrode. Examples of a material constituting the light shielding layer include chromium (Cr), copper (Cu), aluminum (Al), tungsten (W), and a resin that does not transmit light (for example, polyimide resin).

Specific examples of the imaging element and the like of the present disclosure include: an imaging element including a photoelectric conversion layer or a photoelectric conversion unit that absorbs blue light (light of 425 nm to 495 nm) (referred to as "first type blue light photoelectric conversion layer" or "first type blue light photoelectric conversion unit" for convenience) and sensitive to blue light (referred to as "first type blue light imaging element" for convenience); an imaging element including a photoelectric conversion layer or a photoelectric conversion unit that absorbs green light (light of 495 nm to 570 nm) (referred to as "first type green light photoelectric conversion layer" or "first type green light photoelectric conversion unit" for convenience) and sensitive to green light (referred to as "first type green light imaging element" for convenience); and an imaging element including a photoelectric conversion layer or a photoelectric conversion unit that absorbs red light (light of 620 nm to 750 nm) (referred to as "first type red light photoelectric conversion layer" or "first type red light photoelectric conversion unit" for convenience) and sensitive to red light (referred to as "first type red light imaging element" for convenience). Furthermore, a conventional imaging element not including a charge accumulation electrode and sensitive to blue light is referred to as "second type blue light imaging element" for convenience, a conventional imaging element not including a charge accumulation electrode and sensitive to green light is referred to as "second type green light imaging element" for convenience, a conventional imaging element not including a charge accumulation electrode and sensitive to red light is referred to as "second type red light imaging element" for convenience, a photoelectric conversion layer or a photoelectric conversion unit constituting the second type blue light imaging element is referred to as "second type blue light photoelectric conversion layer" or "second type blue light photoelectric conversion unit" for convenience, a photoelectric conversion layer or a photoelectric conversion unit constituting the second type green light imaging element is referred to as "second type green light photoelectric conversion layer" or "second type green light photoelectric conversion unit" for convenience, and a photoelectric conversion layer or a photoelectric conversion unit constituting the second type red light imaging element is referred to as "second type red light photoelectric conversion layer" or "second type red light photoelectric conversion unit" for convenience.

Specific examples of the laminated imaging element including a charge accumulation electrode include:

[A] a configuration and a structure in which the first type blue light photoelectric conversion unit, the first type green light photoelectric conversion unit, and the first type red light photoelectric conversion unit are laminated in the vertical direction, and the control units of the first type blue light imaging element, the first type green light imaging element, and the first type red light imaging element are disposed on a semiconductor substrate;

[B] a configuration and a structure in which the first type blue light photoelectric conversion unit and the first type green light photoelectric conversion unit are laminated in the vertical direction, the second type red light photoelectric conversion unit is disposed below the two first type photoelectric conversion units, and the control units of the first type blue light imaging element, the first type green light imaging element, and the second type red light imaging element are disposed on a semiconductor substrate;

[C] a configuration and a structure in which the second type blue light photoelectric conversion unit and the second type red light photoelectric conversion unit are disposed below the first type green light photoelectric conversion unit, and the control units of the first type green light imaging element, the second type blue light imaging element, and the second type red light imaging element are disposed on a semiconductor substrate; and

[D] a configuration and a structure in which the second type green light photoelectric conversion unit and the second type red light photoelectric conversion unit are disposed below the first type blue light photoelectric conversion unit, and the control units of the first type blue light imaging element, the second type green light imaging element, and the second type red light imaging element are disposed on a semiconductor substrate. The photoelectric conversion units of these imaging elements are preferably disposed in the vertical direction in order of the blue light photoelectric conversion unit, the green light photoelectric conversion unit, and the red light photoelectric conversion unit from the light incident direction, or in order of the green light photoelectric conversion unit, the blue light photoelectric conversion unit, and the red light photoelectric conversion unit from the light incident direction. This is because light having a shorter wavelength is more efficiently absorbed on an incident surface side. Since red has the longest wavelength among the three colors, the red light photoelectric conversion unit is preferably located in the lowermost layer as viewed from the light incident surface. A laminated structure of these imaging elements constitutes one pixel. Furthermore, a first type near-infrared photoelectric conversion unit (or an infrared photoelectric conversion unit) may be included. Here, preferably, the photoelectric conversion layer of the first type infrared photoelectric conversion unit includes, for example, an organic material, and is disposed as the lowermost layer of the laminated structure of the first type imaging elements above the second type imaging element. Alternatively, a second type near-infrared photoelectric conversion unit (or an infrared photoelectric conversion unit) may be disposed below the first type photoelectric conversion unit.

In the first type imaging element, for example, the first electrode is formed on an interlayer insulating layer disposed on a semiconductor substrate. An imaging element formed on a semiconductor substrate can be a backside irradiation type or a frontside irradiation type.

In a case where the photoelectric conversion layer includes an organic material, the photoelectric conversion layer can have any one of the following four forms.

(1) The photoelectric conversion layer is constituted by a p-type organic semiconductor.

(2) The photoelectric conversion layer is constituted by an n-type organic semiconductor.

(3) The photoelectric conversion layer is constituted by a laminated structure of p-type organic semiconductor layer/n-type organic semiconductor layer. The photoelectric conversion layer is constituted by a laminated structure of p-type organic semiconductor layer/mixed layer (bulk heterostructure) of p-type organic semiconductor and n-type organic semiconductor/n-type organic semiconductor layer. The photoelectric conversion layer is constituted by a laminated structure of a mixed layer (bulk heterostructure) of a p-type organic semiconductor layer/p-type organic semiconductor and an n-type organic semiconductor. The photoelectric conversion layer is constituted by a laminated structure of a mixed layer (bulk heterostructure) of an n-type organic semiconductor layer/p-type organic semiconductor and an n-type organic semiconductor.

(4) The photoelectric conversion layer is constituted by a mixture (bulk heterostructure) of a p-type organic semiconductor and an n-type organic semiconductor.

However, the laminating order can be arbitrarily exchanged.

Examples of the p-type organic semiconductor include a naphthalene derivative, an anthracene derivative, a phenanthrene derivative, a pyrene derivative, a perylene derivative, a tetracene derivative, a pentacene derivative, a quinacridone derivative, a thiophene derivative, a thienothiophene derivative, a benzothiophene derivative, a benzothienobenzothiophene derivative, a triallylamine derivative, a carbazole derivative, a perylene derivative, a picene derivative, a chrysene derivative, a fluoranthene derivative, a phthalocyanine derivative, a subphthalocyanine derivative, a subporphyrazine derivative, a metal complex having a heterocyclic compound as a ligand, a polythiophene derivative, a polybenzothiadiazole derivative, and a polyfluorene derivative. Examples of the n-type organic semiconductor include a fullerene and a fullerene derivative <for example, C60, a fullerene such as C70 or C74 (higher fullerene), an endohedral fullerene, or the like, or a fullerene derivative (for example, a fullerene fluoride, a PCBM fullerene compound, a fullerene multimer, or the like)>, an organic semiconductor with larger (deeper) HOMO and LUMO than a p-type organic semiconductor, and a transparent inorganic metal oxide. Specific examples of the n-type organic semiconductor include a heterocyclic compound containing a nitrogen atom, an oxygen atom, or a sulfur atom. Examples thereof include an organic molecule and an organic metal complex containing a pyridine derivative, a pyrazine derivative, a pyrimidine derivative, a triazine derivative, a quinoline derivative, a quinoxaline derivative, an isoquinoline derivative, an acridine derivative, a phenazine derivative, a phenanthroline derivative, a tetrazole derivative, a pyrazole derivative, an imidazole derivative, a thiazole derivative, an oxazole derivative, an imidazole derivative, a benzimidazole derivative, a benzotriazole derivative, a benzoxazole derivative, a benzoxazole derivative, a carbazole derivative, a benzofuran derivative, a dibenzofuran derivative, a subporphyrazine derivative, a polyphenylenevinylene derivative, a polybenzothiadiazole derivative, a polyfluorene derivative, and the like in a part of a molecular skeleton thereof, and a subphthalocyanine derivative. Examples of a group and the like contained in the fullerene derivative include a halogen atom; a linear, branched, or cyclic alkyl group or phenyl group; a group having a linear or condensed aromatic compound; a group having a halide; a partial fluoroalkyl group; a perfluoroalkyl group; a silylalkyl group; a silylalkoxy group; an arylsilyl group; an arylsulfanyl group; an alkylsulfanyl group; an arylsulfonyl group; an alkylsulfonyl group; an arylsulfide group; an alkylsulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a group having a chalcogenide; a phosphine group; a phosphone group, and derivatives thereof. The thickness of the photoelectric conversion layer including an organic material (also referred as "organic photoelectric conversion layer") is not limited, but is for example, $1 \times 10^{-8}$ m to $5 \times 10^{-7}$ m, preferably $2.5 \times 10^{-8}$ m to $3 \times 10^{-7}$ m, more preferably $2.5 \times 10^{-8}$ m to $2 \times 10^{-7}$ m, and still more preferably $1 \times 10^{-7}$ m to $1.8 \times 10^{-7}$ m. Note that the organic semiconductor is often classified into a p-type and an n-type. The p-type means that holes are easily transported, and the n-type means that electrons are easily transported without being limited to interpretation that the organic semiconductor has holes or electrons as many thermally-excited carriers like an inorganic semiconductor.

Alternatively, examples of a material constituting the organic photoelectric conversion layer that photoelectrically converts green light include a rhodamine-based dye, a melacyanine-based dye, a quinacridone derivative, a subphthalocyanine dye (subphthalocyanine derivative), and the like. Examples of a material constituting the organic photoelectric conversion layer that photoelectrically converts blue light include a coumarinic acid dye, tris-8-hydryxyquinolialuminium (Alq3), a melacyanine-based dye, and the like. Examples of a material constituting the organic photoelectric conversion layer that photoelectrically converts red light include a phthalocyanine-based dye and a subphthalocyanine-based dye (subphthalocyanine derivative).

Alternatively, examples of the inorganic material constituting the photoelectric conversion layer include crystalline silicon, amorphous silicon, microcrystalline silicon, crystalline selenium, amorphous selenium, a chalcopyrite compound such as CIGS(CuInGaSe), CIS(CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, or AgInSe$_2$, a group III-V compound such as GaAs, InP, AlGaAs, InGaP, AlGaInP, or InGaAsP, and a compound semiconductor such as CdSe, CdS, In$_2$Se$_3$, In$_2$S$_3$, Bi$_2$Se$_3$, Bi$_2$S$_3$, ZnSe, ZnS, PbSe, or PbS. In addition, quantum dots including these materials can also be used for the photoelectric conversion layer.

A single-plate color solid-state imaging device can be constituted by each of the solid-state imaging devices according to the first and second aspects of the present disclosure and the solid-state imaging devices of the first and second configurations.

In the solid-state imaging device including a laminated imaging element according to the second aspect of the present disclosure, unlike a solid-state imaging device including Bayer-array imaging elements (that is, spectroscopy of blue, green, and red light is not performed using a color filter layer), one pixel is constituted by laminating imaging elements sensitive to light having a plurality of wavelengths in a light incident direction within the same pixel, and therefore it is possible to improve sensitivity and a pixel density per unit volume. Furthermore, an organic material has a high absorption coefficient. Therefore, the film thickness of the organic photoelectric conversion layer can be thinner than that of a conventional Si-based photoelectric conversion layer, and restriction on leakage of light from an adjacent pixel and an incident angle of light is alleviated. Moreover, in the conventional Si-based imaging element, a false color is generated because interpolation processing is performed among pixels of three colors to generate a color signal. However, the solid-state imaging device including a laminated imaging element according to the second aspect of the present disclosure can suppress generation of a false color. The organic photoelectric conversion layer itself also acts as a color filter layer. Therefore, color separation can be performed even without disposing the color filter layer.

Meanwhile, in the solid-state imaging device according to the first aspect of the present disclosure, use of a color filter layer can alleviate demands on the spectral characteristics of blue, green, and red light, and a mass production property is high. Examples of an array of imaging elements in the solid-state imaging device according to the first aspect of the present disclosure include a Bayer array, an interline array, a G stripe RB checkered array, a G stripe RB complete checkered array, a checkered complementary color array, a stripe array, a diagonal stripe array, a primary color chrominance array, a field chrominance sequential array, a frame chrominance sequential array, a MOS-type array, an improved MOS-type array, a frame interleaved array, and a field interleaved array. Here, one imaging element constitutes one pixel (or sub-pixel).

Examples of the color filter layer (wavelength selection means) include a filter layer that transmits not only red, green, and blue light but also light having a specific wavelength, such as cyan, magenta, or yellow light in some cases. The color filter layer can be constituted not only by an organic material-based color filter layer using an organic compound such as a pigment or a dye but also by a thin film containing an inorganic material such as a photonic crystal, a wavelength selection element that applies a plasmon (color filter layer having a conductor lattice structure with a lattice-like hole structure in a conductive thin film, for example, see Japanese Patent Application Laid-Open No. 2008-177191), or amorphous silicon.

A pixel region in which a plurality of imaging elements and the like of the present disclosure is arrayed includes a plurality of pixels regularly arrayed two-dimensionally. The pixel region usually includes an effective pixel region that actually receives light, amplifies signal charges generated by photoelectric conversion, and reads out the signal charges to a drive circuit, and a black reference pixel region that outputs optical black serving as a black level reference (also referred to as an optical black pixel region (OPB)). The black reference pixel region is usually disposed on an outer periphery of an effective pixel region.

The imaging element and the like of the present disclosure including the various preferable forms and configurations described above are irradiated with light, photoelectric conversion occurs in the photoelectric conversion layer, and holes and electrons are carrier-separated. In addition, an electrode from which holes are extracted is referred to as a positive electrode, and an electrode from which electrons are extracted is referred to as a negative electrode. The first electrode may constitute a negative electrode, and the second electrode may constitute a positive electrode. Conversely, the first electrode may constitute a positive electrode, and the second electrode may constitute a negative electrode.

The first electrode, the charge accumulation electrode, the transfer control electrode, the charge discharge electrode, and the second electrode can each contain a transparent conductive material. The first electrode, the charge accumulation electrode, the transfer control electrode, and the charge discharge electrode may be collectively referred to as "first electrode and the like". Alternatively, in a case where the imaging elements and the like of the present disclosure are disposed in a plane like a Bayer array, for example, the second electrode can contain a transparent conductive material, and the first electrode and the like can contain a metal material. In this case, specifically, the second electrode located on the light incident side can contain a transparent conductive material, and the first electrode and the like can contain, for example, Al—Nd (alloy of aluminum and neodymium) or ASC (alloy of aluminum, samarium, and copper). An electrode containing a transparent conductive material may be referred to as "transparent electrode". Here, here, the band gap energy of the transparent conductive material is 2.5 eV or more, and preferably 3.1 eV or more. Examples of the transparent conductive material constituting the transparent electrode include a conductive metal oxide. Specific examples thereof include indium oxide, indium-tin oxide (ITO, including Sn-doped $In_2O_3$, crystalline ITO, and amorphous ITO), Indium-zinc oxide (IZO) obtained by adding indium as a dopant to zinc oxide, indium-gallium oxide (IGO) obtained by adding indium as a dopant to gallium oxide, indium-gallium-zinc oxide (IGZO, In—$GaZnO_4$) obtained by adding indium and gallium as a dopant to zinc oxide, indium-tin-zinc oxide (ITZO) obtained by adding indium and tin as a dopant to zinc oxide, IFO (F-doped $In_2O_3$), tin oxide ($SnO_2$), ATO (Sb-doped $SnO_2$), FTO (F-doped $SnO_2$), zinc oxide (including ZnO doped with another element), aluminum-zinc oxide (AZO) to which aluminum is added to zinc oxide as a dopant, gallium-zinc oxide (GZO) to which gallium is added to zinc oxide as a dopant, titanium oxide ($TiO_2$), niobium-titanium oxide (TNO) to which niobium is added to titanium oxide as a dopant, antimony oxide, a spinel type oxide, and an oxide having a $YbFe_2O_4$ structure. Alternatively, examples of the transparent electrode include a transparent electrode containing gallium oxide, titanium oxide, niobium oxide, nickel oxide, and the like as a base layer. The thickness of the transparent electrode may be $2\times10^{-8}$ m to $2\times10^{-7}$ m, and preferably $3\times10^{-8}$ m to $1\times10^{-7}$ m. In a case where the first electrode needs to be transparent, the charge discharge electrode also preferably contains a transparent conductive material from a viewpoint of simplifying a manufacturing process.

Alternatively, in a case where transparency is not necessary, as a conductive material constituting a positive electrode functioning as an electrode for extracting holes, the positive electrode is preferably constituted by a conductive material having a high work function (for example, $\varphi=4.5$ eV to 5.5 eV). Specific examples thereof include gold (Au), silver (Ag), chromium (Cr), nickel (Ni), palladium (Pd), platinum (Pt), iron (Fe), iridium (Ir), germanium (Ge), osmium (Os), rhenium (Re), and tellurium (Te). Meanwhile, as a conductive material constituting a negative electrode functioning as an electrode for extracting electrons, the negative electrode is preferably constituted by a conductive material having a low work function (for example, $\varphi=3.5$ eV to 4.5 eV). Specific examples thereof include an alkali metal (for example, Li, Na, K, or the like), a fluoride thereof, an oxide thereof, an alkaline earth metal (for example, Mg, Ca, or the like), a fluoride thereof, an oxide thereof, aluminum (Al), zinc (Zn), tin (Sn), thallium (Tl), a sodium-potassium alloy, an aluminum-lithium alloy, a magnesium-silver alloy, a rare earth metal such as indium or ytterbium, and an alloy thereof. Alternatively, examples of a material constituting the positive electrode or the negative electrode include a metal such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), or molybdenum (Mo), an alloy containing these metal elements, a conductive particle containing these metals, a conductive particle of an alloy containing these metals, a polysilicon containing impurities, a carbon material, an oxide semiconductor material, and a conductive material such as a carbon nanotube or graphene. A laminated structure of layers containing these elements can be also used. Moreover, examples of the material constituting the positive electrode or the negative electrode include an organic material (conductive polymer) such as poly(3,4-ethylenedioxythiophene)/polystyrene sulfonic acid [PEDOT/PSS]. Furthermore, these conductive materials may be mixed with a binder (polymer) to form a paste or an ink, and the paste or the ink may be cured to be used as an electrode.

As a method for forming a film of the first electrode and the like or the second electrode (negative electrode or positive electrode), a dry method or a wet method can be used. Examples of the dry method include a physical vapor deposition method (PVD method) and a chemical vapor deposition method (CVD method). Examples of a film formation using the principle of the PVD method include a vacuum vapor deposition method using resistance heating or high frequency heating, an electron beam (EB) vapor deposition method, various sputtering methods (magnetron sputtering method, RF-DC coupled bias sputtering method, ECR sputtering method, opposing target sputtering method, or high frequency sputtering method), an ion plating method, a laser ablation method, a molecular beam epitaxy method, and a laser transfer method. Furthermore, examples of the CVD method include a plasma CVD method, a thermal CVD method, an organic metal (MO) CVD method, and an optical CVD method. Meanwhile, examples of the wet method include an electrolytic plating method, an electroless plating method, a spin coating method, an ink jet method, a spray coating method, a stamping method, a micro contact printing method, a flexographic printing method, an offset printing method, a gravure printing method, and a dipping method. Examples of a patterning method include chemical etching such as shadow masking, laser transfer, or photolithography and physical etching using an ultraviolet ray, a laser, and the like. Examples of a technique for planarizing the first electrode and the like or the second electrode include a laser planarization method, a reflow method, and a chemical mechanical polishing (CMP) method.

Examples of a material constituting the insulating layer include not only an inorganic insulating material exemplified by a metal oxide high dielectric insulating material such as a silicon oxide material; silicon nitride ($SiN_Y$); or aluminum oxide ($Al_2O_3$), but also include an organic insulating material (organic polymer) exemplified by a straight chain hydrocarbon having a functional group capable of bonding to a control electrode at one end, such as polymethyl methacrylate (PMMA); polyvinyl phenol (PVP); polyvinyl alcohol (PVA); polyimide; polycarbonate (PC); polyethylene terephthalate (PET); polystyrene; a silanol derivative (silane coupling agent) such as N-2 (aminoethyl) 3-aminopropyltrimethoxysilane (AEAPTMS), 3-mercaptopropyltrimethoxysilane (MPTMS), or octadecyl trichlorosilane (OTS); a novolac type phenol resin; a fluorine-based resin; octadecanethiol, or dodecyl isocyanate. A combination thereof can be also used. Examples of the silicon oxide material include silicon oxide ($SiO_X$), BPSG, PSG, BSG, AsSG, PbSG, silicon oxynitride (SiON), spin on glass (SOG), low dielectric constant insulating material (for example, polyaryl ether, cyclo perfluorocarbon polymer and benzocyclobutene, a cyclic fluorocarbon resin, polytetrafluoroethylene, fluorinated aryl ether, fluorinated polyimide, amorphous carbon, and organic SOG). The insulating layer can have a single-layer configuration or a configuration in which a plurality of layers (for example, two layers) is laminated. In the latter case, by forming an insulating layer/lower layer at least on the charge accumulation electrode and in a region between the charge accumulation electrode and the first electrode, and planarizing the insulating layer/lower layer, the insulating layer/lower layer only needs to be left at least in the region between the charge accumulation electrode and the first electrode, and an insulating layer/upper layer only needs to be formed on the remaining insulating layer/lower layer and the charge accumulation electrode. As a result, planarization of the insulating layer can be achieved reliably. Materials constituting the various interlayer insulating layers and insulating material films only need to be appropriately selected from these materials.

The configuration and structure of the floating diffusion layer, amplification transistor, reset transistor, and selection transistor constituting the control unit can be similar to the configuration and structure of the conventional floating diffusion layer, amplification transistor, reset transistor, and selection transistor. The drive circuit can also have a well-known configuration and structure.

The first electrode is connected to the floating diffusion layer and a gate portion of the amplification transistor, and a contact hole portion only needs to be formed in order to connect the first electrode to the floating diffusion layer and the gate portion of the amplification transistor. Examples of a material constituting the contact hole portion include polysilicon doped with impurities, a high melting point metal such as tungsten, Ti, Pt, Pd, Cu, TiW, TiN, TiNW, $WS_2$, or $MoS_2$, a metal silicide, and a laminated structure of layers containing these materials (for example, Ti/TiN/W).

A first carrier blocking layer may be disposed between the composite oxide layer and the first electrode, and a second carrier blocking layer may be disposed between the organic photoelectric conversion layer and the second electrode. Furthermore, a first charge injection layer may be disposed between the first carrier blocking layer and the first electrode, and a second charge injection layer may be disposed between the second carrier blocking layer and the second electrode. Examples of a material constituting an electron injection layer include an alkali metal such as lithium (Li), sodium (Na), or potassium (K), a fluoride thereof, an oxide thereof, an alkaline earth metal such as magnesium (Mg) or calcium (Ca), a fluoride thereof, and an oxide thereof.

Examples of a method for forming films of various organic layers include a dry film formation method and a wet film formation method. Examples of the dry film formation method include a vacuum vapor deposition method using resistance heating, high frequency heating, or electron beam heating, a flash vapor deposition method, a plasma vapor deposition method, an EB vapor deposition method, various sputtering methods (a bipolar sputtering method, a direct current sputtering method, a direct current magnetron sputtering method, a high frequency sputtering method, a magnetron sputtering method, an RF-DC coupled bias sputtering method, an ECR sputtering method, a counter target sputtering method, a high frequency sputtering method, and an ion beam sputtering method), a direct current (DC) method, an RF method, a multi-negative electrode method, an activation reaction method, an electric field vapor deposition method, various ion plating methods such as a high frequency ion plating method and a reactive ion plating method, a laser ablation method, a molecular beam epitaxy method, a laser transfer method, and a molecular beam epitaxy method (MBE method). Furthermore, examples of the CVD method include a plasma CVD method, a thermal CVD method, an MOCVD method, and an optical CVD method. Meanwhile, specific examples of the wet method include a spin coating method; an immersion method; a casting method; a micro-contact printing method; a drop casting method; various printing methods such as a screen printing method, an inkjet printing method, an offset printing method, a gravure printing method, and a flexographic printing method; a stamping method; a spraying method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method. In the coating method, examples of a solvent include an organic solvent having a no polarity or low polarity, such as toluene, chloroform, hexane, or ethanol. Examples of a patterning method include chemical etching such as shadow masking, laser transfer, or photolithography and physical etching using an ultraviolet ray, a laser, and the like. Examples of a technique for planarizing various organic layers include a laser planarization method and a reflow method.

Two or more of the imaging elements of the first to sixth configurations described above can be appropriately combined as desired.

As described above, the imaging element or the solid-state imaging device may include an on-chip micro lens or a light shielding layer, if necessary, and includes a drive circuit or wiring for driving the imaging element. If necessary, a shutter for controlling incidence of light on the imaging element may be disposed, or an optical cut filter may be disposed according to a purpose of the solid-state imaging device.

Furthermore, each of the solid-state imaging devices of the first and second configurations can have a form in which one on-chip micro lens is disposed above one of the imaging elements and the like of the present disclosure, or can have a form in which an imaging element block is constituted by two of the imaging elements and the like of the present disclosure, and one on-chip micro lens is disposed above the imaging element block.

For example, in a case where the solid-state imaging device is laminated with a readout integrated circuit (ROIC), by superposing a drive substrate on which a readout integrated circuit and a connection portion containing copper (Cu) are formed, and an imaging element in which a connection portion is formed such that the connection portions come into contact with each other, and bonding the connection portions to each other, lamination can be performed, and the connection portions can be bonded to each other using solder bumps and the like.

Furthermore, the driving method for driving the solid-state imaging devices according to the first and second aspects of the present disclosure can be a solid-state imaging device driving method for repeating, discharging charges in the first electrode out of the system while charges are accumulated in the composite oxide layer (or the composite oxide layer and the photoelectric conversion layer) all at once in all the imaging elements, and then transferring the charges accumulated in the composite oxide layer (or the composite oxide layer and the photoelectric conversion layer) to the first electrode all at once in all the imaging elements, and sequentially reading out the charges transferred to the first electrode in each of the imaging elements after completion of the transfer.

In such a method for driving a solid-state imaging device, each of the imaging elements has a structure in which light incident from the second electrode side is not incident on the first electrode, and the charges in the first electrode are discharged out of the system while the charges are accumulated in the composite oxide layer and the like all at once in all the imaging elements. Therefore, the first electrode can be reliably reset simultaneously in all the imaging elements. Then, thereafter, the charges accumulated in the composite oxide layer and the like are transferred to the first electrode all at once in all the imaging elements, and after completion of the transfer, the charges transferred to the first electrode are sequentially read out in each of the imaging elements. Therefore, a so-called global shutter function can be easily implemented.

Examples of the imaging element of the present disclosure include a CCD element, a CMOS image sensor, a contact imaging sensor (CIS), and a charge modulation device (CMD) type signal amplification image sensor. For example, a digital still camera, a video camera, a camcorder, a surveillance camera, a vehicle-mounted camera, a smartphone camera, a game user interface camera, and a biometric authentication camera can be constituted by the solid-state imaging devices according to the first and second aspects of the present disclosure and the solid-state imaging devices of the first and second configurations.

Example 1

Figure 2:
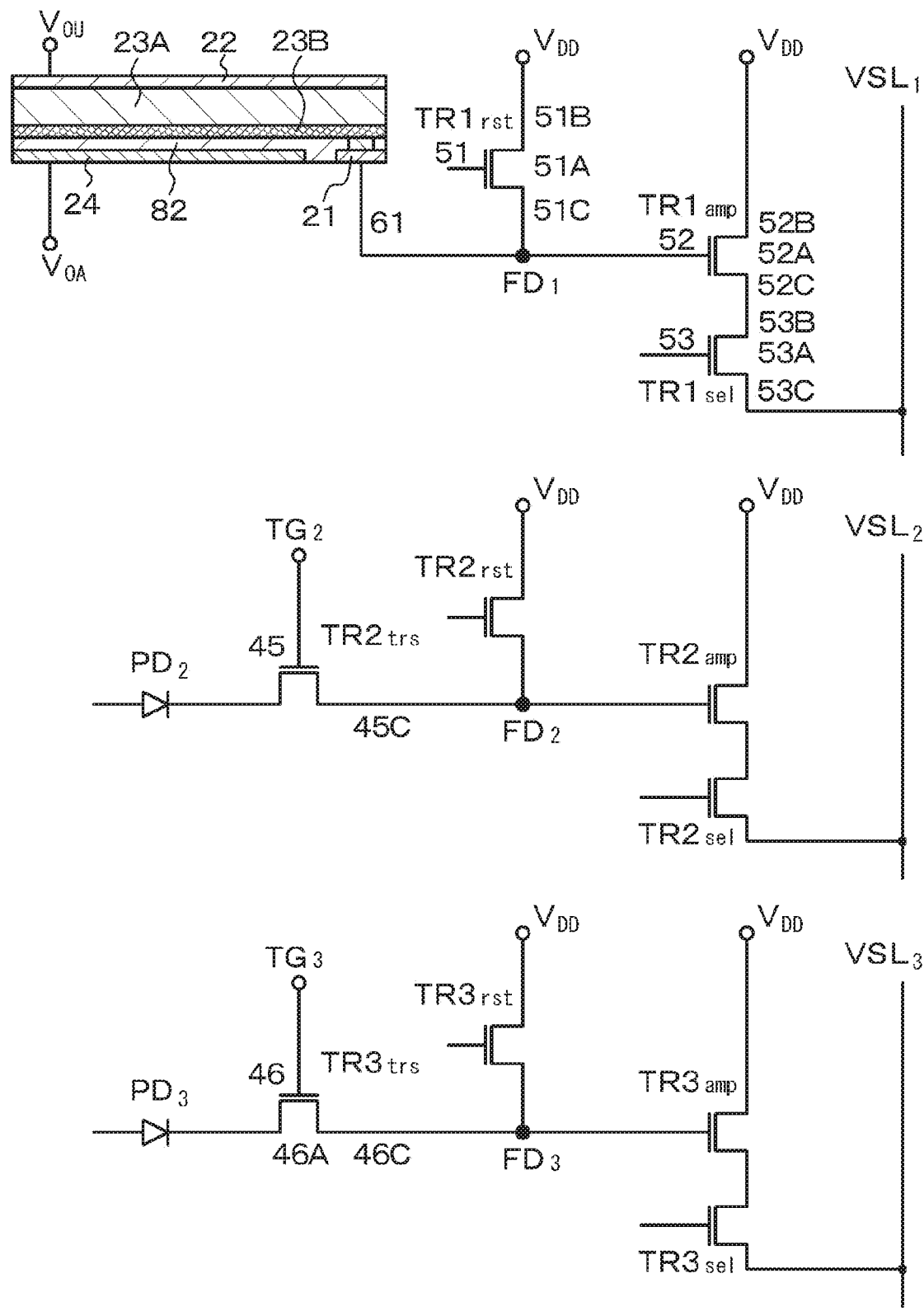
FIG. 2 is an equivalent circuit diagram of the imaging element of Example 1.
Figure 3:
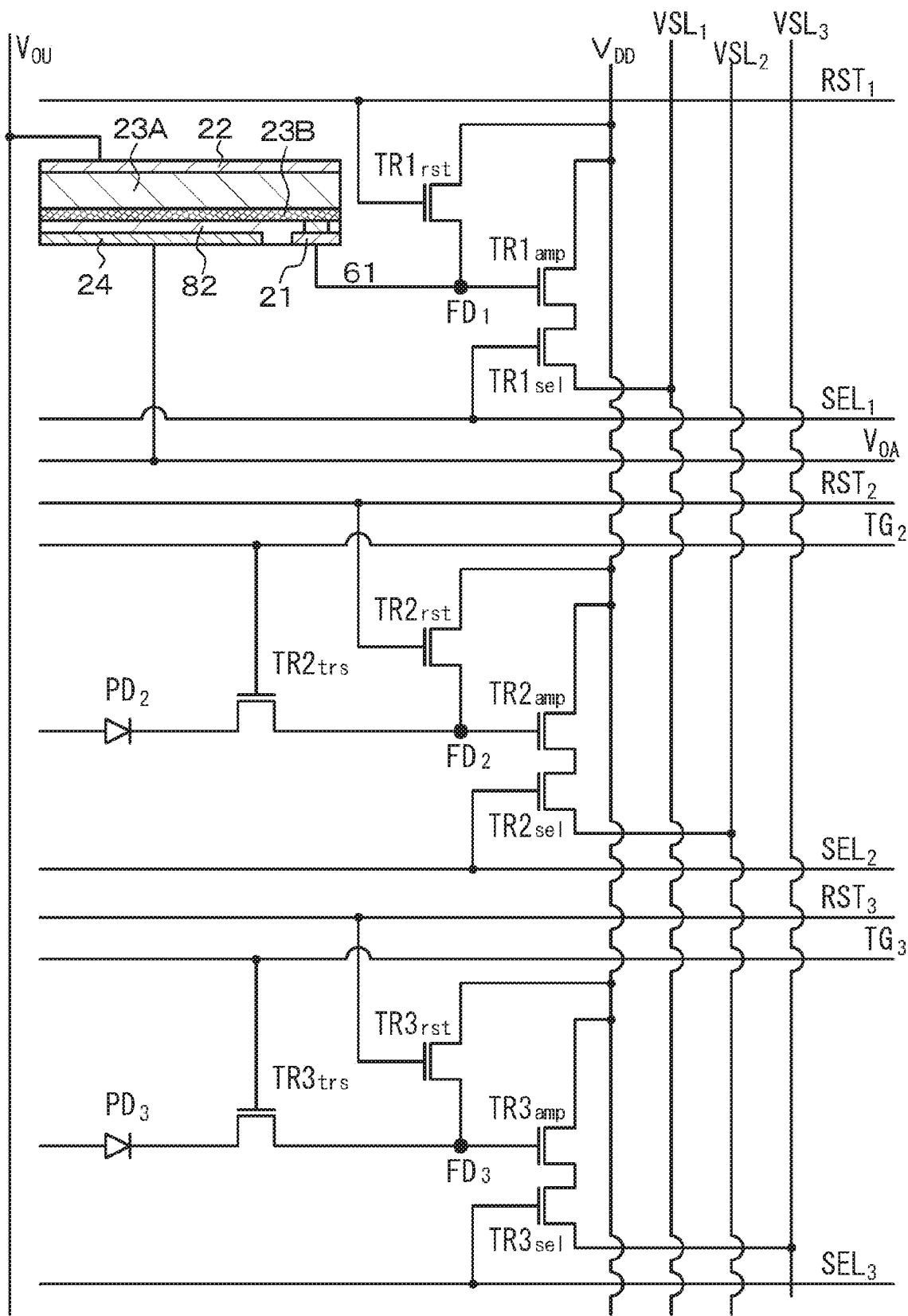
FIG. 3 is an equivalent circuit diagram of the imaging element of Example 1.
Figure 4:
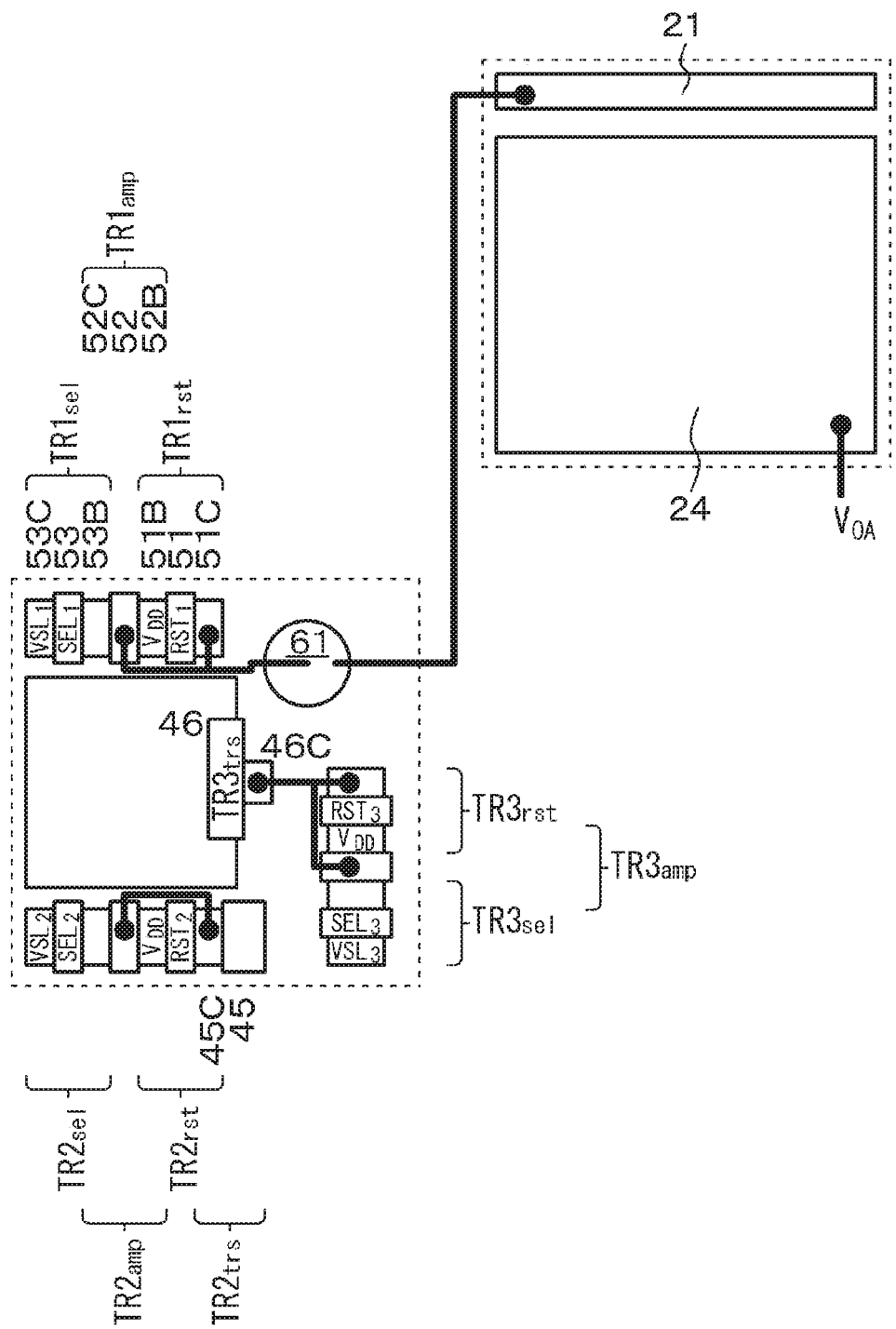
FIG. 4 is a schematic arrangement diagram of a first electrode and a charge accumulation electrode constituting the imaging element of Example 1, and a transistor constituting a control unit.
Figure 5:
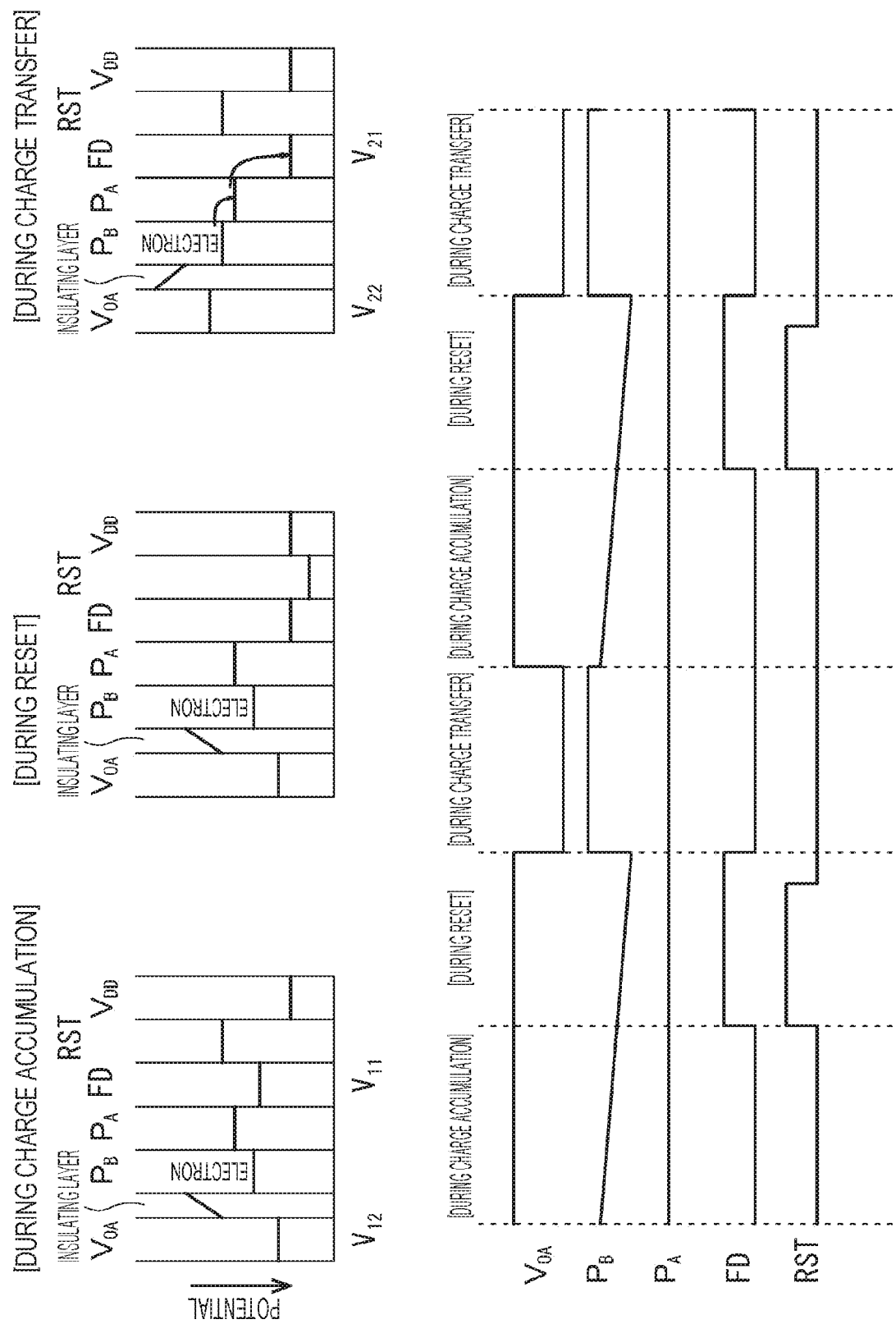
FIG. 5 is a diagram schematically illustrating a potential state at each part during an operation of the imaging element of Example 1.
Figure 6A:
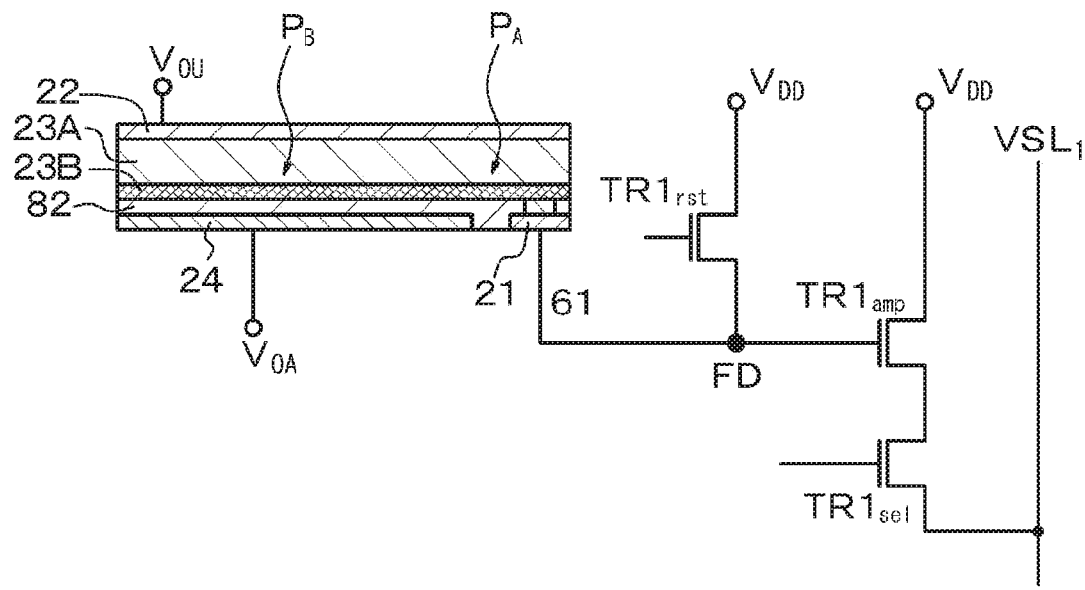
FIGS. 6A, 6B, and 6C are equivalent circuit diagrams of imaging elements of Examples 1, 4, and 6 for explaining each part of FIG. 5 (Example 1), FIGS. 20 and 21 (Example 4), and FIGS. 32 and 33 (Example 6), respectively.
Figure 6B:
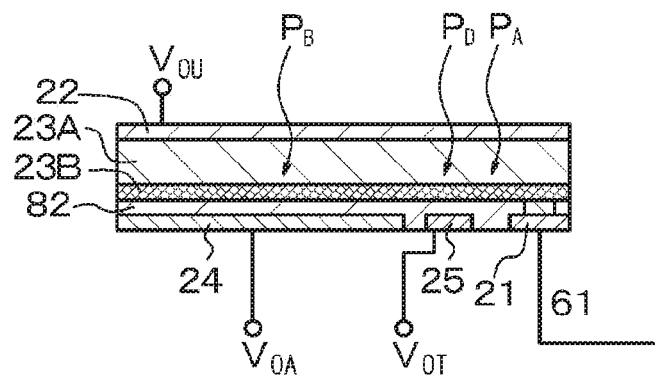
Figure 6C:
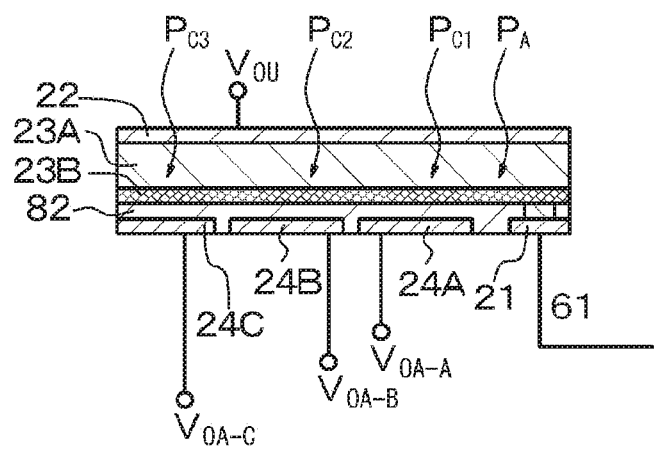
Figure 7:
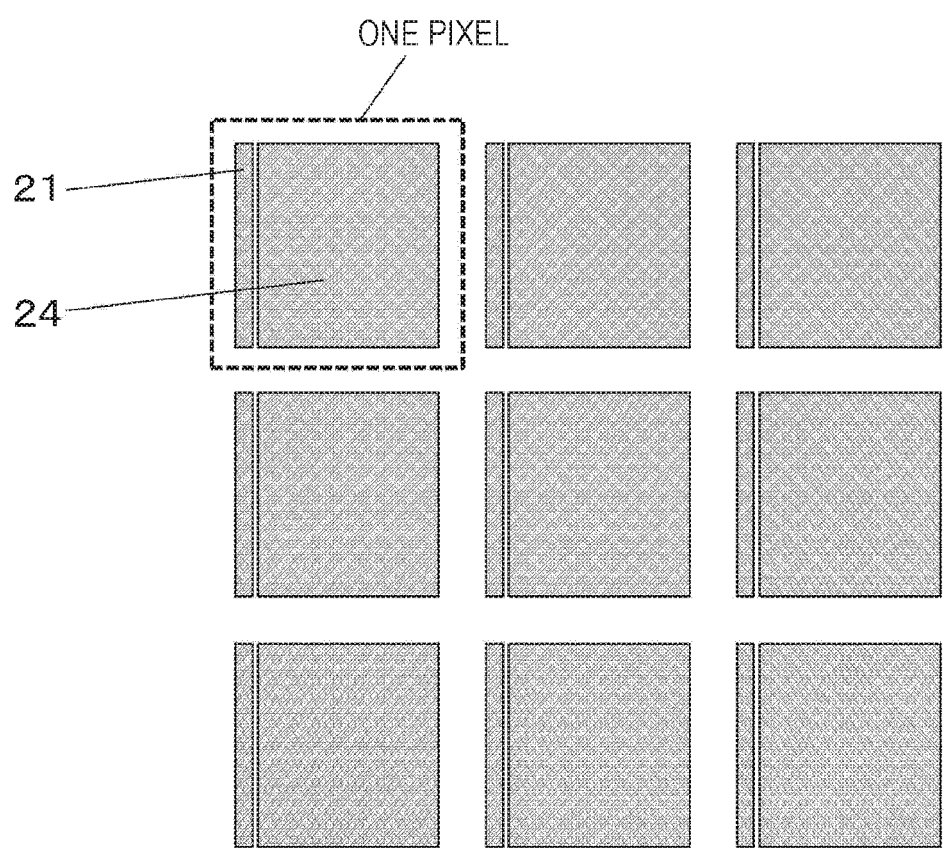
FIG. 7 is a schematic arrangement diagram of a first electrode and a charge accumulation electrode constituting the imaging element of Example 1.
Figure 8:
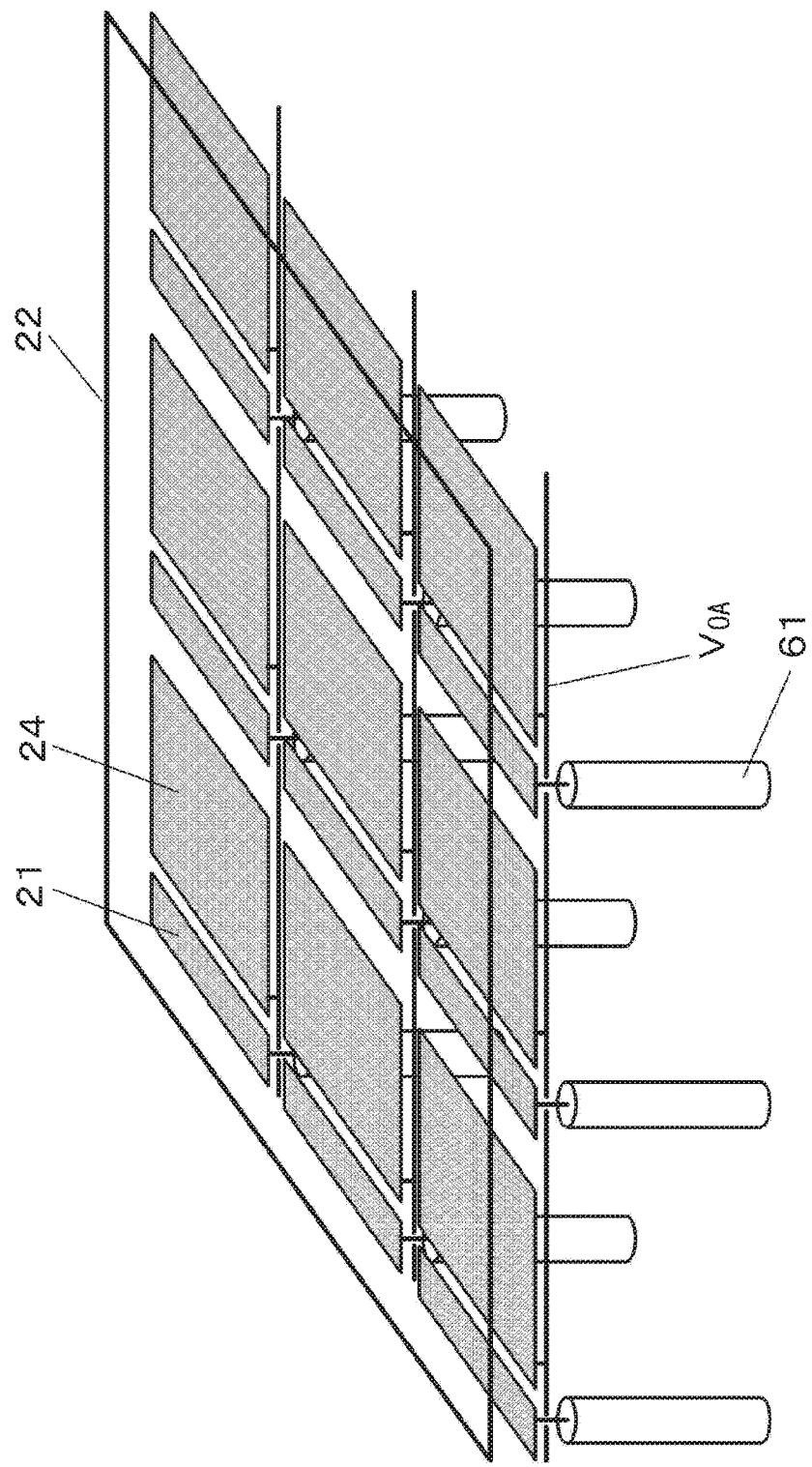
FIG. 8 is a schematic perspective view of a first electrode, a charge accumulation electrode, a second electrode, and a contact hole portion constituting the imaging element of Example 1.
Figure 76:
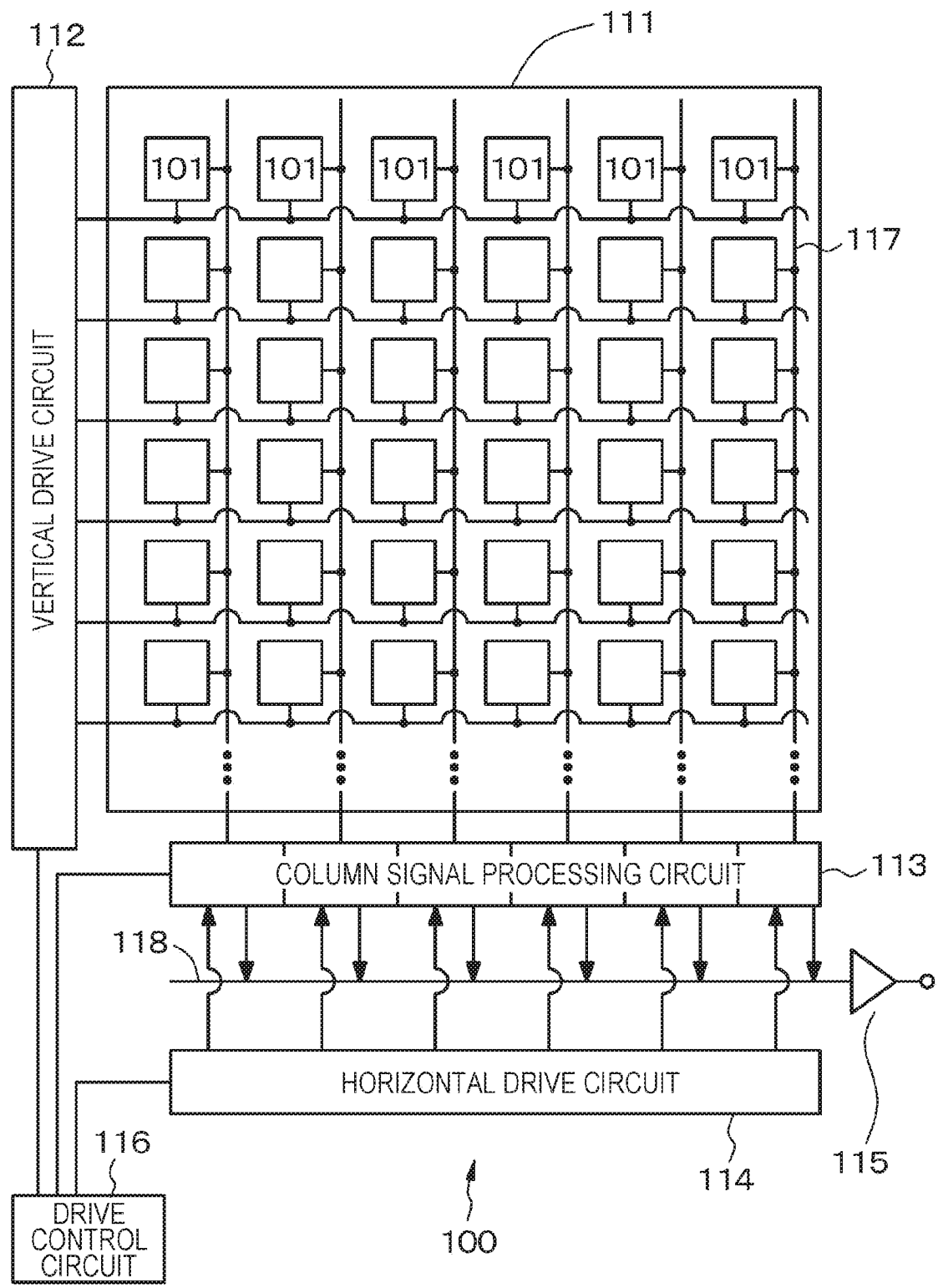
FIG. 76 is a conceptual diagram of a solid-state imaging device of Example 1.

Example 1 relates to imaging elements according to the first to fourth aspects of the present disclosure, the laminated imaging element of the present disclosure, and the solid-state imaging device according to the second aspect of the present disclosure. FIG. 1 illustrates a schematic partial cross-sectional view of the imaging element and the laminated imaging element of Example 1 (hereinafter, these may be collectively referred to as "imaging element and the like"). FIGS. 2 and 3 illustrate an equivalent circuit diagram of the imaging element and the like of Example 1. FIG. 4 illustrates a schematic arrangement diagram of the first electrode and the charge accumulation electrode constituting the photoelectric conversion unit of the imaging element and the like of Example 1, and a transistor constituting a control unit. FIG. 5 schematically illustrates a potential state in each part during operation of the imaging element and the like of Example 1. FIG. 6A illustrates an equivalent circuit diagram for explaining each part of the imaging element and the like of Example 1. Furthermore, FIG. 7 illustrates a schematic arrangement diagram of the first electrode and the charge accumulation electrode constituting the photoelectric conversion unit of the imaging element and the like of Example 1. FIG. 8 illustrates a schematic perspective view of the first electrode, the charge accumulation electrode, the second electrode, and the contact hole portion. Moreover, FIG. 76 illustrates a conceptual diagram of the solid-state imaging device of Example 1. Note that in FIGS. 2, 3, 6A, 6B, 6C, 9, 17, 18, 29, 30, 66A, 66B, and 66C, the composite oxide layer is displayed as one layer.

The imaging element of Example 1 includes a photoelectric conversion unit formed by laminating a first electrode 21, a photoelectric conversion layer 23A, and a second electrode 22. Between the first electrode 21 and the photoelectric conversion layer 23A, a composite oxide layer 23B is formed. Here, the composite oxide layer 23B includes a first layer $23B_1$ adjacent to the first electrode 21 and a second layer $23B_2$ adjacent to the photoelectric conversion layer 23A. Note that the imaging element of Example 1 has a structure in which the first layer $23B_1$ and the second layer $23B_2$ are laminated. In addition, the composite oxide layer 23B contains indium composite oxide, and the indium composition (indium atom content) in the first layer $23B_1$ is higher than that in the second layer $23B_2$. Alternatively, the composite oxide layer 23B contains indium-gallium-zinc composite oxide, the indium composition (indium atom content) in the first layer $23B_1$ is higher than that in the second layer $23B_2$, or the gallium composition (gallium atom content) in the first layer $23B_1$ is lower than that in the second layer $23B_2$, or the zinc composition (zinc atom content) in the first layer $23B_1$ is higher than that in the second layer $23B_2$. Alternatively, the oxygen atom content in the first layer $23B_1$ is lower than that in the second layer $23B_2$. Alternatively, the composite oxide layer 23B contains indium composite oxide (or indium-gallium-zinc composite oxide), and the first layer $23B_1$ has a higher carrier mobility than the second layer $23B_2$. Alternatively, the composite oxide layer 23B contains indium composite oxide (or indium-gallium-zinc composite oxide), and the first layer $23B_1$ has a lower state density than the second layer $23B_2$.

Here, in the imaging element and the like of Example 1, when the indium-gallium-zinc composite oxide is represented by $(ZnO)_X(Ga_2O_3)_{1-X}$, $(Ga_2O_3)_Y(In_2O_3)_{1-Y}$, and $(In_2O_3)_Z(ZnO)_{1-Z}$, a value of X in the first layer $23B_1$ is larger than a value of X in the second layer $23B_2$, or a value of Y in the first layer $23B_1$ is lower than a value of Y in the second layer $23B_2$, or a value of Z in the first layer $23B_1$ is higher than a value of Z in the second layer $23B_2$.

In addition, in this case, $0<X<0.875$, $0<Y<0.875$, and $0.125<Z<0.875$ (where $X+Y+Z=1.000$) are satisfied. For the first layer, $Y<0.5$ is preferably satisfied. For the second layer, $X<0.5$ and $Y>0.5$ are satisfied.

Alternatively, in the imaging element and the like of Example 1, $1\times10^{-6}\leq$(carrier mobility of second layer)/(carrier mobility of first layer)$\leq 0.1$ is preferably satisfied. Furthermore, the carrier mobility of the first layer is not limited, but is preferably 10 $cm^2/V\cdot s$ or more.

Specific values are as follows.
In composition in first layer $23B_1$: 22%
In composition in second layer $23B_2$: 14%
Value of X in first layer $23B_1$: 0.4
Value of X in second layer $23B_2$: 0.25
Value of Y in the first layer $23B_1$: 0.2
Value of Y in second layer $23B_2$: 0.5
Value of Z in first layer $23B_1$: 0.4
Value of Z in second layer $23B_2$: 0.25
Carrier mobility of first layer $23B_1$: 15 $cm^2/V\cdot s$
Carrier mobility of second layer $23B_2$: 0.1 $cm^2/V\cdot s$
Note that the thickness of the composite oxide layer 23B was set to 330 nm, and $T_2/T_1$ was set to 10.

Furthermore, in the imaging element and the like of Example 1, the composite oxide layer 23B was amorphous according to X-ray diffraction analysis. That is, for example, the composite oxide layer 23B was amorphous without a local crystal structure.

In addition, in the imaging element and the like of Example 1, the photoelectric conversion unit further includes an insulating layer 82 and a charge accumulation electrode 24 disposed apart from the first electrode 21 so as to face the composite oxide layer 23B via the insulating layer 82. Note that light is incident from the second electrode side.

The laminated imaging element of Example 1 includes at least one imaging element of Example 1. Furthermore, the solid-state imaging device of Example 1 includes a plurality of the laminated imaging elements of Example 1. In addition, for example, a digital still camera, a video camera, a camcorder, a surveillance camera, a vehicle-mounted camera, a smartphone camera, a game user interface camera, a biometric authentication camera, and the like are constituted by the solid-state imaging device of Example 1.

Hereinafter, the imaging element and the like and the solid-state imaging device of Example 1 will be described specifically.

The imaging element and the like of Example 1 further include a semiconductor substrate (more specifically, a silicon semiconductor layer) 70, and the photoelectric conversion unit is disposed above the semiconductor substrate 70. Furthermore, the imaging element and the like of Example 1 further include a control unit disposed on the semiconductor substrate 70 and having a drive circuit to which the first electrode 21 and the second electrode 22 are connected. Here, a light incident surface in the semiconductor substrate 70 is defined as an upper side, and the opposite side of the semiconductor substrate 70 is defined as a lower side. A wiring layer 62 including a plurality of wiring lines is disposed below the semiconductor substrate 70.

The semiconductor substrate 70 includes at least a floating diffusion layer $FD_1$ and an amplification transistor $TR1_{amp}$ constituting a control unit, and the first electrode 21 is connected to the floating diffusion layer $FD_1$ and a gate portion of the amplification transistor $TR1_{amp}$. The semiconductor substrate 70 further includes a reset transistor $TR1_{rst}$ and a selection transistor $TR1_{sel}$ constituting the control unit. The floating diffusion layer $FD_1$ is connected to one source/drain region of the reset transistor $TR1_{rst}$. One source/drain region of the amplification transistor $TR1_{amp}$ is connected to one source/drain region of the selection transistor $TR1_{sel1}$. The other source/drain region of the selection transistor $TR1_{sel}$ is connected to a signal line $VSL_1$. These amplification transistor $TR1_{amp}$, reset transistor $TR1_{rst}$, and selection transistor $TR1_{sel}$ constitute a drive circuit.

Specifically, the imaging element and the like of Example 1 are backside irradiation type imaging elements, and have a structure formed by laminating three imaging elements of a first type green light imaging element of Example 1, including a first type green light photoelectric conversion layer that absorbs green light and sensitive to green light (hereinafter referred to as "first imaging element"), a second type conventional blue light imaging element including a second type blue light photoelectric conversion layer that absorbs blue light and sensitive to blue light (hereinafter referred to as "second imaging element"), and a second type conventional red light imaging element including a second type red light photoelectric conversion layer that absorbs red light and sensitive to red light (hereinafter referred to as "third imaging element"). Here, the red light imaging element (third imaging element) and the blue light imaging element (second imaging element) are disposed in the semiconductor substrate 70, and the second imaging element is located closer to the light incident side than the third imaging element. Furthermore, the green light imaging element (first imaging element) is disposed above the blue light imaging element (second imaging element). One pixel is constituted by the laminated structure of the first imaging element, the second imaging element, and the third imaging element. No color filter layer is disposed.

In the first imaging element, the first electrode 21 and the charge accumulation electrode 24 are formed on an interlayer insulating layer 81 so as to be separated from each other. The interlayer insulating layer 81 and the charge accumulation electrode 24 are covered with the insulating layer 82. The composite oxide layer 23B and the photoelectric conversion layer 23A are formed on the insulating layer 82, and the second electrode 22 is formed on the photoelectric conversion layer 23A. An insulating layer 83 is formed on the entire surface including the second electrode 22, and an on-chip micro lens 14 is disposed on the insulating layer 83. The first electrode 21, the charge accumulation electrode 24, and the second electrode 22 are each constituted by a transparent electrode containing, for example, ITO (work function: about 4.4 eV). The composite oxide layer 23B contains, for example, IGZO, IWZO, IWO, ZTO, or ITZO. The photoelectric conversion layer 23A is constituted by a layer containing a known organic photoelectric conversion material sensitive to at least green light (for example, an organic material such as a rhodamine-based dye, a meracyanine-based dye, or quinacridone). The interlayer insulating layer 81 and the insulating layers 82 and 83 each contain a known insulating material (for example, $SiO_2$ or SiN). The composite oxide layer 23B and the first electrode 21 are connected to each other by a connection portion 67 disposed in the insulating layer 82. In the connection portion 67, the composite oxide layer 23B extends. That is, the composite oxide layer 23B extends in an opening 85 formed in the insulating layer 82 to be connected to the first electrode 21.

The charge accumulation electrode 24 is connected to a drive circuit. Specifically, the charge accumulation electrode 24 is connected to a vertical drive circuit 112 constituting the drive circuit via a connection hole 66, a pad portion 64, and wiring $V_{OA}$ formed in the interlayer insulating layer 81.

The charge accumulation electrode 24 is larger than the first electrode 21. When the area of the charge accumulation electrode 24 is represented by $S_1'$, and the area of the first electrode 21 is represented by $S_1$, $$4 \leq S_1'/S_1$$

is preferably satisfied although not limited.

In Example 1, for example, $S_1'/S_1$ was set to 8 although not limited. Note that in Examples 7 to 10 described later, the sizes of three photoelectric conversion unit segments $10'_1$, $10'_2$, and $10'_3$ are the same, and the planar shapes thereof are also the same.

An element isolation region 71 is formed on a first surface (front surface) 70A side of the semiconductor substrate 70. Furthermore, an oxide film 72 is formed on the first surface 70A of the semiconductor substrate 70. Moreover, on the first surface side of the semiconductor substrate 70, the reset transistor $TR1_{rst}$, the amplification transistor $TR1_{amp}$, and the selection transistor $TR1_{sel}$ constituting the control unit of the first imaging element are disposed, and the first floating diffusion layer $FD_1$ is further disposed.

The reset transistor $TR1_{rst}$ includes a gate portion 51, a channel formation region 51A, and source/drain regions 51B and 51C. The gate portion 51 of the reset transistor $TR1_{rst}$ is connected to a reset line $RST_1$. One source/drain region 51C of the reset transistor $TR1_{rst}$ also serves as the first floating diffusion layer $FD_1$, and the other source/drain region 51B is connected to a power source $V_{DD}$.

The first electrode 21 is connected to one source/drain region 51C (first floating diffusion layer $FD_1$) of the reset transistor $TR1_{rst}$ via a connection hole 65 and a pad portion 63 formed in the interlayer insulating layer 81, a contact hole portion 61 formed in the semiconductor substrate 70 and the interlayer insulating layer 76, and the wiring layer 62 formed in the interlayer insulating layer 76.

The amplification transistor $TR1_{amp}$ includes a gate portion 52, a channel formation region 52A, and source/drain regions 52B and 52C. The gate portion 52 is connected to the first electrode 21 and one source/drain region 51C (first floating diffusion layer $FD_1$) of the reset transistor $TR1_{rst}$ via the wiring layer 62. Furthermore, one source/drain region 52B is connected to the power source $V_{DD}$.

The selection transistor $TR1_{sel}$ includes a gate portion 53, a channel formation region 53A, and source/drain regions 53B and 53C. The gate portion 53 is connected to a selection line $SEL_1$. Furthermore, one source/drain region 53B shares a region with the other source/drain region 52C constituting the amplification transistor $TR1_{amp}$, and the other source/drain region 53C is connected to a signal line (data output line) $VSL_1$ (117).

The second imaging element includes an n-type semiconductor region 41 disposed on the semiconductor substrate 70 as a photoelectric conversion layer. A gate portion 45 of a transfer transistor $TR2_{trs}$ constituted by a vertical transistor extends to the n-type semiconductor region 41 to be connected to a transfer gate line $TG_2$. Furthermore, the second floating diffusion layer $FD_2$ is disposed in a region 45C of the semiconductor substrate 70 near the gate portion 45 of the transfer transistor $TR2_{trs}$. Charges accumulated in the n-type semiconductor region 41 are read out to the second floating diffusion layer $FD_2$ via a transfer channel formed along the gate portion 45.

In the second imaging element, on the first surface side of the semiconductor substrate 70, the reset transistor $TR2_{rst}$, the amplification transistor $TR2_{amp}$, and the selection transistor $TR2_{sel}$ constituting the control unit of the second imaging element are further disposed.

The reset transistor $TR2_{rst}$ includes a gate portion, a channel formation region, and a source/drain region. The gate portion of the reset transistor $TR2_{rst}$ is connected to a reset line $RST_2$. One source/drain region of the reset transistor $TR2_{rst}$ is connected to the power source $V_{DD}$, and the other source/drain region also serves as the second floating diffusion layer $FD_2$.

The amplification transistor $TR2_{amp}$ includes a gate portion, a channel formation region, and a source/drain region. The gate portion is connected to the other source/drain region (second floating diffusion layer $FD_2$) of the reset transistor $TR2_{rst}$. Furthermore, one source/drain region is connected to the power source $V_{DD}$.

The selection transistor $TR2_{sel}$ includes a gate portion, a channel formation region, and a source/drain region. The gate portion is connected to a selection line $SEL_2$. Furthermore, one source/drain region shares a region with the other source/drain region constituting the amplification transistor $TR2_{amp}$, and the other source/drain region is connected to a signal line (data output line) $VSL_2$.

The third imaging element includes an n-type semiconductor region 43 disposed on the semiconductor substrate 70 as a photoelectric conversion layer. A gate portion 46 of the transfer transistor $TR3_{trs}$ is connected to a transfer gate line $TG_3$. Furthermore, the third floating diffusion layer $FD_3$ is disposed in a region 46C of the semiconductor substrate 70 near the gate portion 46 of the transfer transistor $TR3_{trs}$. Charges accumulated in the n-type semiconductor region 43 are read out to the third floating diffusion layer $FD_3$ via a transfer channel 46A formed along the gate portion 46.

In the third imaging element, on the first surface side of the semiconductor substrate 70, the reset transistor $TR3_{rst}$, the amplification transistor $TR3_{amp}$, and the selection transistor $TR3_{sel}$ constituting the control unit of the third imaging element are further disposed.

The reset transistor $TR3_{rst}$ includes a gate portion, a channel formation region, and a source/drain region. The gate portion of the reset transistor $TR3_{rst}$ is connected to a reset line $RST_3$. One source/drain region of the reset transistor $TR3_{rst}$ is connected to the power source $V_{DD}$, and the other source/drain region also serves as the third floating diffusion layer $FD_3$.

The amplification transistor $TR3_{amp}$ includes a gate portion, a channel formation region, and a source/drain region. The gate portion is connected to the other source/drain region (third floating diffusion layer $FD_3$) of the reset transistor $TR3_{rst}$. Furthermore, one source/drain region is connected to the power source $V_{DD}$.

The selection transistor $TR3_{sel}$ includes a gate portion, a channel formation region, and a source/drain region. The gate portion is connected to the selection line $SEL_3$. Furthermore, one source/drain region shares a region with the other source/drain region constituting the amplification transistor $TR3_{amp}$, and the other source/drain region is connected to a signal line (data output line) $VSL_3$.

The reset lines $RST_1$, $RST_2$, and $RST_3$, the selection lines $SEL_1$, $SEL_2$, and $SEL_3$, and the transfer gate lines $TG_2$ and $TG_3$ are connected to the vertical drive circuit 112 constituting a drive circuit, and the signal lines (data output lines) $VSL_1$, $VSL_2$, and $VSL_3$ are connected to a column signal processing circuit 113 constituting a drive circuit.

A $p^+$ layer 44 is disposed between the n-type semiconductor region 43 and the front surface 70A of the semiconductor substrate 70 to suppress generation of a dark current. A $p^+$ layer 42 is formed between the n-type semiconductor region 41 and the n-type semiconductor region 43, and moreover, a part of a side surface of the n-type semiconductor region 43 is surrounded by the $p^+$ layer 42. A $p^+$ layer 73 is formed on a back surface 70B side of the semiconductor substrate 70. An $HfO_2$ film 74 and an insulating material film 75 are formed from the $p^+$ layer 73 to a portion where the contact hole portion 61 is to be formed inside the semiconductor substrate 70. In the interlayer insulating layer 76, wiring is formed in a plurality of layers, but not illustrated.

The $HfO_2$ film 74 has negative fixed charges. By forming such a film, generation of a dark current can be suppressed. Instead of the $HfO_2$ film, an aluminum oxide ($Al_2O_3$) film, a zirconium oxide ($ZrO_2$) film, a tantalum oxide ($Ta_2O_5$) film, a titanium oxide ($TiO_2$) film, a lanthanum oxide ($La_2O_3$) film, a praseodymium oxide ($Pr_2O_3$) film, a cerium oxide ($CeO_2$) film, a neodymium oxide ($Nd_2O_3$) film, a promethium oxide ($Pm_2O_3$) film, a samarium oxide ($Sm_2O_3$) film, an europium oxide ($Eu_2O_3$) film, a gadolinium oxide (($Gd_2O_3$) film, a terbium oxide ($Tb_2O_3$) film, a dysprosium oxide ($Dy_2O_3$) film, a holmium oxide ($Ho_2O_3$) film, a thulium oxide ($Tm_2O_3$) film, a ytterbium oxide ($Yb_2O_3$) film, a lutetium oxide ($Lu_2O_3$) film, a yttrium oxide ($Y_2O_3$) film, a hafnium nitride film, an aluminum nitride film, a hafnium oxynitride film, or an aluminum oxynitride film can be used. Examples of a method for forming these films include a CVD method, a PVD method, and an ALD method.

Hereinafter, with reference to FIGS. 5 and 6A, operation of the imaging element and the like (first imaging element) including the charge accumulation electrode of Example 1 will be described. Here, the potential of the first electrode 21 was set to be higher than the potential of the second electrode 22. That is, for example, the first electrode 21 is set to a positive potential, and the second electrode 22 is set to a negative potential. Electrons generated by photoelectric conversion in the photoelectric conversion layer 23A are read out to the floating diffusion layer. This applies to the other Examples similarly. Note that in the form in which the first electrode 21 is set to a negative potential, the second electrode is set to a positive potential, and holes generated on the basis of photoelectric conversion in the photoelectric conversion layer 23A are read out to the floating diffusion layer, a potential level described below only needs to be reversed.

Figure 20:
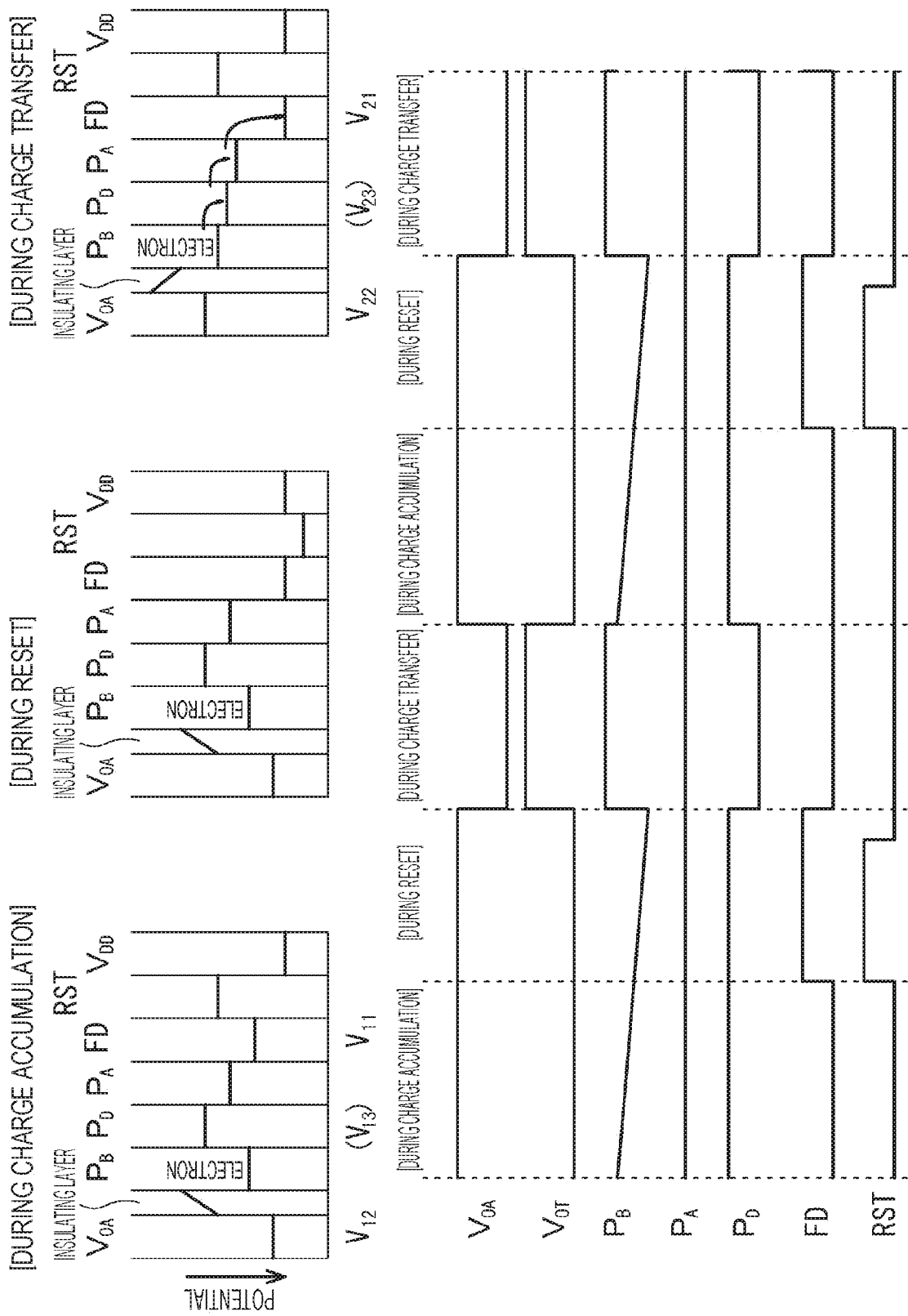
FIG. 20 is a diagram schematically illustrating a potential state at each part during an operation of the imaging element of Example 4.
Figure 21:
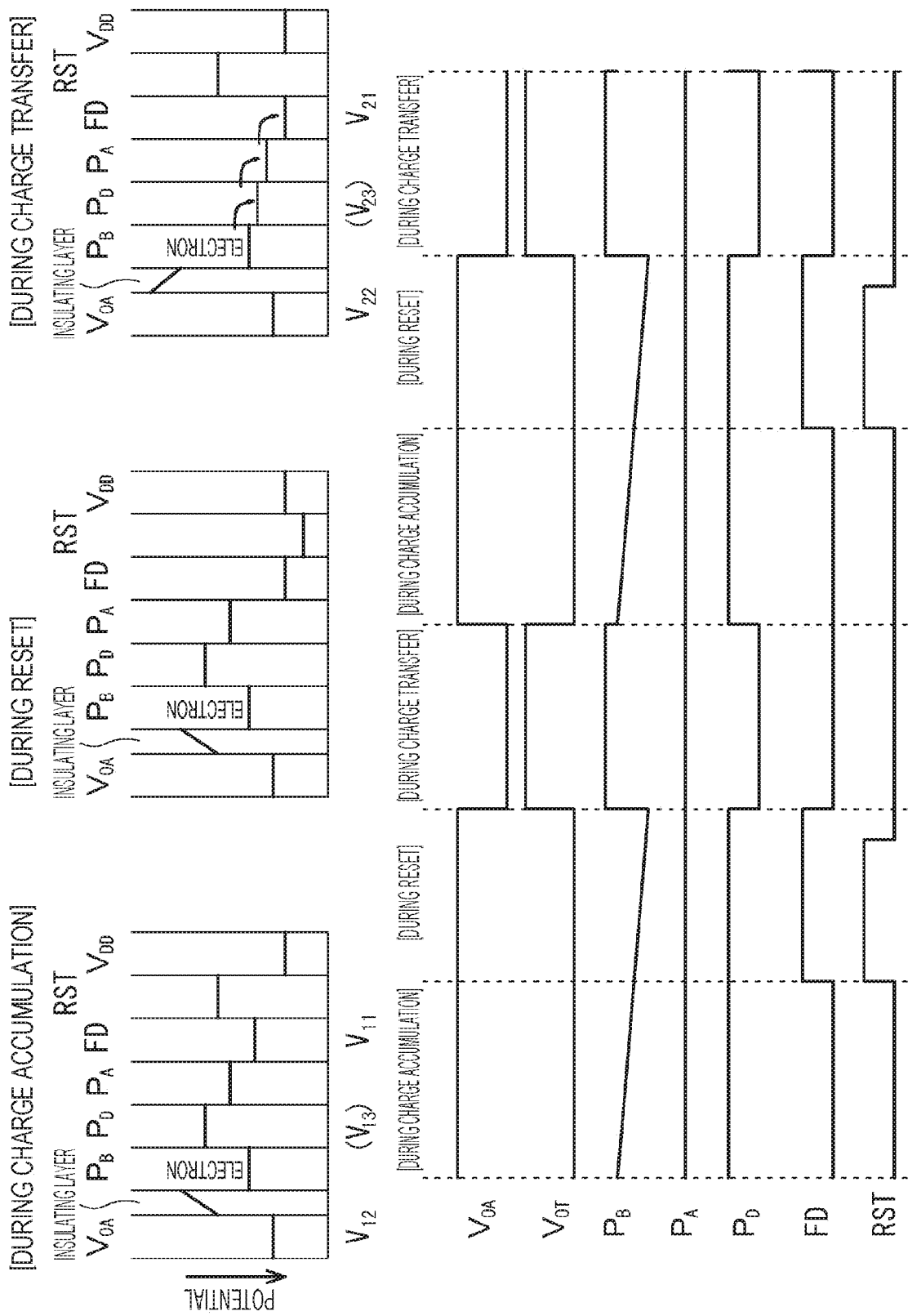
FIG. 21 is a diagram schematically illustrating a potential state at each part during another operation of the imaging element of Example 4.

Reference numerals used in FIG. 5, FIGS. 20 and 21 in Example 4 described later, and FIGS. 32 and 33 in Example 6 are as follows.

$P_A$: Potential at point $P_A$ of the composite oxide layer 23B facing a region located between the charge accumulation electrode 24 or the transfer control electrode (charge transfer electrode) 25 and the first electrode 21

$P_B$: Potential at point $P_B$ in a region of the composite oxide layer 23B facing the charge accumulation electrode 24

$P_{C1}$: Potential at point $P_{C1}$ in a region of the composite oxide layer 23B facing the charge accumulation electrode segment 24A $P_{C2}$: Potential at point $P_{C2}$ in a region of the composite oxide layer 23B facing the charge accumulation electrode segment 24B $P_{C3}$: Potential at point $P_{C3}$ in a region of the composite oxide layer 23B facing the charge accumulation electrode segment 24C $P_D$: Potential at point $P_D$ in a region of the composite oxide layer 23B facing the transfer control electrode (charge transfer electrode) 25

FD: Potential in the first floating diffusion layer $FD_1$ $V_{OA}$: Potential in the charge accumulation electrode 24

$V_{OA-A}$: Potential in the charge accumulation electrode segment 24A $V_{OA-B}$: Potential in the charge accumulation electrode segment 24B $V_{OA-C}$: Potential in the charge accumulation electrode segment 24C $V_{OT}$: Potential in the transfer control electrode (charge transfer electrode) 25

RST: Potential in the gate portion 51 of the reset transistor $TR1_{rst}$ $V_{DD}$: Potential of power source $VSL_1$: Signal line (data output line) $VSL_1$ $TR1_{rst}$: Reset transistor $TR1_{rst}$ $TR1_{amp}$: Amplification transistor $TR1_{amp}$ $TR1_{sel1}$: Selection transistor $TR1_{sel}$ In a charge accumulation period, the potential $V_{11}$ is applied to the first electrode 21 and the potential $V_{12}$ is applied to the charge accumulation electrode 24 from a drive circuit. Photoelectric conversion occurs in the photoelectric conversion layer 23A by light incident on the photoelectric conversion layer 23A. Holes generated by the photoelectric conversion are sent from the second electrode 22 to a drive circuit via the wiring $V_{OU}$. Meanwhile, the potential of the first electrode 21 is set to be higher than the potential of the second electrode 22, that is, for example, a positive potential is applied to the first electrode 21, and a negative potential is applied to the second electrode 22. Therefore, $V_{12} \geq V_{11}$ is satisfied, preferably $V_{12} > V_{11}$ is satisfied. As a result, electrons generated by the photoelectric conversion are attracted to the charge accumulation electrode 24, and stop in a region of the composite oxide layer 23B or the composite oxide layer 23B and the photoelectric conversion layer 23A (hereinafter collectively referred to as "composite oxide layer 23B and the like") facing the charge accumulation electrode 24. That is, charges are accumulated in the composite oxide layer 23B and the like. Since $V_{12} > V_{11}$ is satisfied, electrons generated inside the photoelectric conversion layer 23A are not transferred toward the first electrode 21. As the time for the photoelectric conversion elapses, the potential in the region of the composite oxide layer 23B and the like facing the charge accumulation electrode 24 becomes a more negative value.

In a later stage of the charge accumulation period, a reset operation is performed. As a result, the potential of the first floating diffusion layer $FD_1$ is reset, and the potential of the first floating diffusion layer $FD_1$ becomes the potential $V_{DD}$ of the power source.

After the reset operation is completed, charges are read out. That is, in a charge transfer period, the potential $V_{21}$ is applied to the first electrode 21 and the potential $V_{22}$ is applied to the charge accumulation electrode 24 from a drive circuit. Here, $V_{22} < V_{21}$ is satisfied. As a result, electrons that have stopped in the region of the composite oxide layer 23B and the like facing the charge accumulation electrode 24 are read out to the first electrode 21 and further to the first floating diffusion layer $FD_1$. That is, the charge accumulated in the composite oxide layer 23B and the like is read out to the control unit.

In this way, a series of operations including charge accumulation, reset operation, and charge transfer are completed.

The operations of the amplification transistor $TR1_{amp}$ and the selection transistor $TR1_{sel}$ after electrons are read out to the first floating diffusion layer $FD_1$ are the same as the conventional operations of these transistors. Furthermore, a series of operations including charge accumulation, reset operation, and charge transfer of the second imaging element and the third imaging element are similar to a conventional series of operations including charge accumulation, reset operation, and charge transfer. Furthermore, a reset noise of the first floating diffusion layer $FD_1$ can be removed by a correlated double sampling (CDS) process as in prior art.

As described above, in Example 1, since the charge accumulation electrode is included which is disposed apart from the first electrode so as to face the photoelectric conversion layer via the insulating layer, when the photoelectric conversion layer is irradiated with light, and the light is photoelectrically converted in the photoelectric conversion layer, the composite oxide layer and the like, the insulating layer, and the charge accumulation electrode form a kind of capacitor, and charges can be stored in the composite oxide layer and the like. Therefore, at the time of start of exposure, a charge accumulation portion can be completely depleted and the charge can be erased. As a result, it is possible to suppress occurrence of a phenomenon that a kTC noise increases, a random noise deteriorates, and the quality of an imaged image deteriorates. Furthermore, since all the pixels can be reset all at once, a so-called global shutter function can be achieved.

FIG. 76 illustrates a conceptual diagram of the solid-state imaging device of Example 1. A solid-state imaging device 100 of Example 1 includes an imaging region 111 in which the laminated imaging elements 101 are arrayed two-dimensionally, and the vertical drive circuit 112, the column signal processing circuit 113, a horizontal drive circuit 114, an output circuit 115, a drive control circuit 116, and the like as drive circuits (peripheral circuits) of the laminated imaging elements 101. It goes without saying that these circuits can be constituted by well-known circuits, and also can be constituted using other circuit configurations (for example, various circuits used in a conventional CCD imaging device or CMOS imaging device). In FIG. 76, the reference number "101" of the laminated imaging element 101 is displayed only in one row.

The drive control circuit 116 generates a clock signal or a control signal as a reference of operations of the vertical drive circuit 112, the column signal processing circuit 113, and the horizontal drive circuit 114 on the basis of a vertical synchronizing signal, a horizontal synchronizing signal, and a master clock. Then, the generated clock signal or control signal is input to the vertical drive circuit 112, the column signal processing circuit 113, and the horizontal drive circuit 114.

For example, the vertical drive circuit 112 is constituted by a shift register, and sequentially selects and scans the laminated imaging elements 101 in the imaging region 111 in a row unit in the vertical direction. Then, a pixel signal (image signal) based on a current (signal) generated according to the amount of light received by each of the laminated imaging elements 101 is sent to the column signal processing circuit 113 via a signal line (data output line) 117, VSL.

For example, the column signal processing circuit 113 is disposed for each column of the laminated imaging elements 101. Image signals output from the laminated imaging elements 101 in one row are subjected to signal processing such as noise removal or signal amplification with a signal from a black reference pixel (not illustrated, but formed around an effective pixel region) for each of the imaging elements. In an output stage of the column signal processing circuit 113, a horizontal selection switch (not illustrated) is connected and disposed between the column signal processing circuit 113 and a horizontal signal line 118.

For example, the horizontal drive circuit 114 is constituted by a shift register. By sequentially outputting a horizontal scanning pulse, the horizontal drive circuit 114 sequentially selects each of the column signal processing circuits 113, and outputs a signal from each of the column signal processing circuits 113 to the horizontal signal line 118.

The output circuit 115 performs signal processing to a signal sequentially supplied from each of the column signal processing circuits 113 via the horizontal signal line 118, and outputs the signal.

Figure 9:
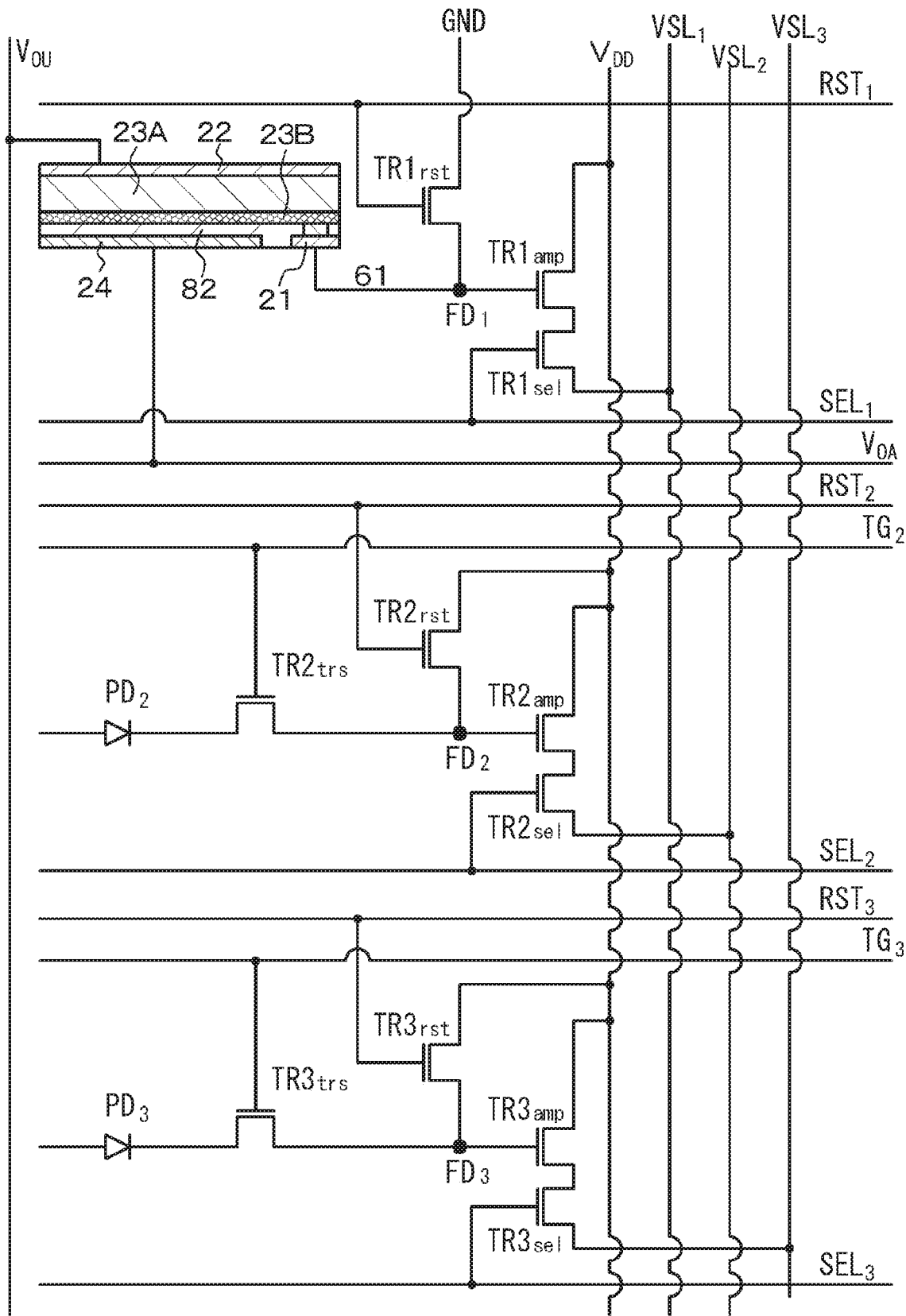
FIG. 9 is an equivalent circuit diagram of a modification of the imaging element of Example 1.
Figure 10:
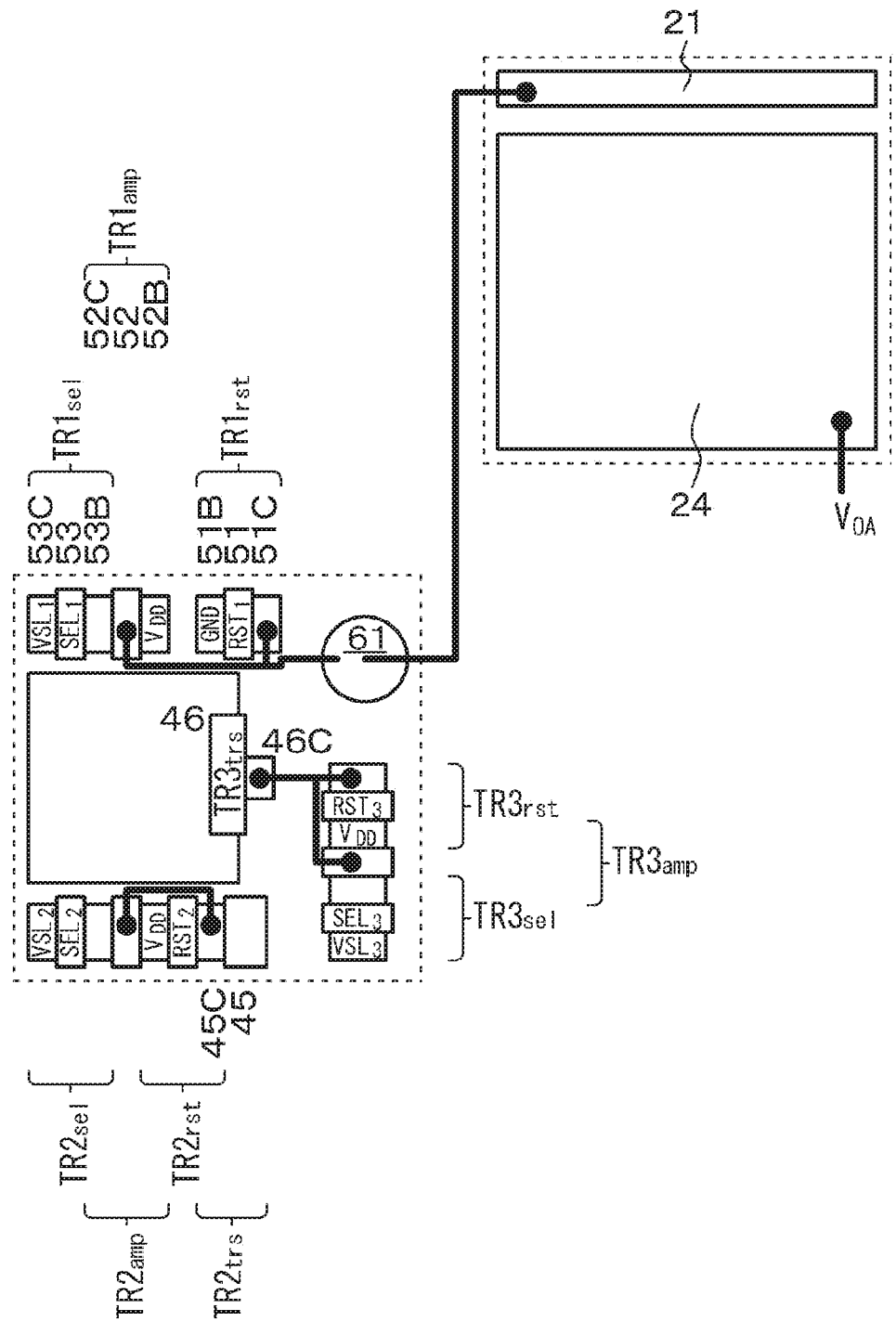
FIG. 10 is a schematic arrangement diagram of a first electrode and a charge accumulation electrode constituting the modification of the imaging element of Example 1 illustrated in FIG. 9, and a transistor constituting a control unit.

As FIG. 9 illustrates an equivalent circuit diagram of a modification of the imaging element and the like of Example 1, and FIG. 10 illustrates a schematic arrangement diagram of the first electrode, the charge accumulation electrode, and a transistor constituting the control unit, the other source/drain region 51B of the reset transistor $TR1_{rst}$ may be grounded instead of being connected to the power source $V_{DD}$.

The imaging element and the like of Example 1 can be manufactured, for example, by the following method. That is, first, an SOI substrate is prepared. Then, a first silicon layer is formed on a surface of the SOI substrate on the basis of an epitaxial growth method, and the $p^+$ layer 73 and the n-type semiconductor region 41 are formed on the first silicon layer. Subsequently, a second silicon layer is formed on the first silicon layer on the basis of an epitaxial growth method, and the element isolation region 71, the oxide film 72, $p^+$ layer 42, the n-type semiconductor region 43, and the $p^+$ layer 44 are formed on the second silicon layer. Furthermore, various transistors and the like constituting the control unit of the imaging element are formed on the second silicon layer. The wiring layer 62, the interlayer insulating layer 76, and various wiring lines are further formed thereon, and then the interlayer insulating layer 76 is bonded to a support substrate (not illustrated). Thereafter, the SOI substrate is removed to expose the first silicon layer. The surface of the second silicon layer corresponds to the front surface 70A of the semiconductor substrate 70, and the surface of the first silicon layer corresponds to the back surface 70B of the semiconductor substrate 70. Furthermore, the first silicon layer and the second silicon layer are collectively expressed as the semiconductor substrate 70. Subsequently, an opening for forming the contact hole portion 61 is formed on the back surface 70B side of the semiconductor substrate 70. The $HfO_2$ film 74, the insulating material film 75, and the contact hole portion 61 are formed. The pad portions 63 and 64, the interlayer insulating layer 81, the connection holes 65 and 66, the first electrode 21, the charge accumulation electrode 24, and the insulating layer 82 are further formed. Next, the connection portion 67 is opened, and the composite oxide layer 23B, the photoelectric conversion layer 23A, the second electrode 22, the insulating layer 83, and the on-chip micro lens 14 are formed. As a result, the imaging element and the like of Example 1 can be obtained.

Here, the composite oxide layer 23B was formed as follows. Specifically, the first layer 23B$_1$ was formed using a target of IGZO (In:Ga:Zn:O=2:1:1:6) on the basis of a magnetron sputtering method or a pulsed laser deposition method, and the second layer 23B$_2$ was formed using a target of IGZO (In:Ga:Zn:O=1:1:1:3) on the basis of a magnetron sputtering method or a pulsed laser deposition method.

Furthermore, although not illustrated, the insulating layer 82 can have a two-layer configuration of an insulating layer/lower layer and an insulating layer/upper layer. That is, it is only required to form the insulating layer/lower layer at least on the charge accumulation electrode 24 and in a region between the charge accumulation electrode 24 and the first electrode 21 (more specifically, to form the insulating layer/lower layer on the interlayer insulating layer 81 including the charge accumulation electrode 24), to planarize the insulating layer/lower layer, and then to form an insulating layer/upper layer on the insulating layer/lower layer and the charge accumulation electrode 24. As a result, the insulating layer 82 can be reliably planarized. Then, it is only required to open the connection portion 67 in the insulating layer 82 thus obtained.

In the imaging element and the like of Example 1, the composition of each layer is defined in the composite oxide layer having at least two layers, or a relationship of carrier mobility or state density of each layer is defined in the composite oxide layer having at least two layers. Therefore, when carriers (for example, photoelectrons) generated by photoelectric conversion flow into the composite oxide layer from the photoelectric conversion layer, carrier stagnation hardly occurs at an interface between the photoelectric conversion layer and the composite oxide layer. As a result, it is possible to provide an imaging element and the like having no adverse effect on photoresponsiveness of the imaging element and the like and having excellent transfer characteristics of charges accumulated in the photoelectric conversion layer. In addition, the imaging element and the like of Example 1 have a two-layer structure of the composite oxide layer and the photoelectric conversion layer. Therefore, recombination during charge accumulation can be prevented, transfer efficiency of charges accumulated in the photoelectric conversion layer to the first electrode can be increased, and generation of a dark current can be suppressed.

Example 2

Figure 11:
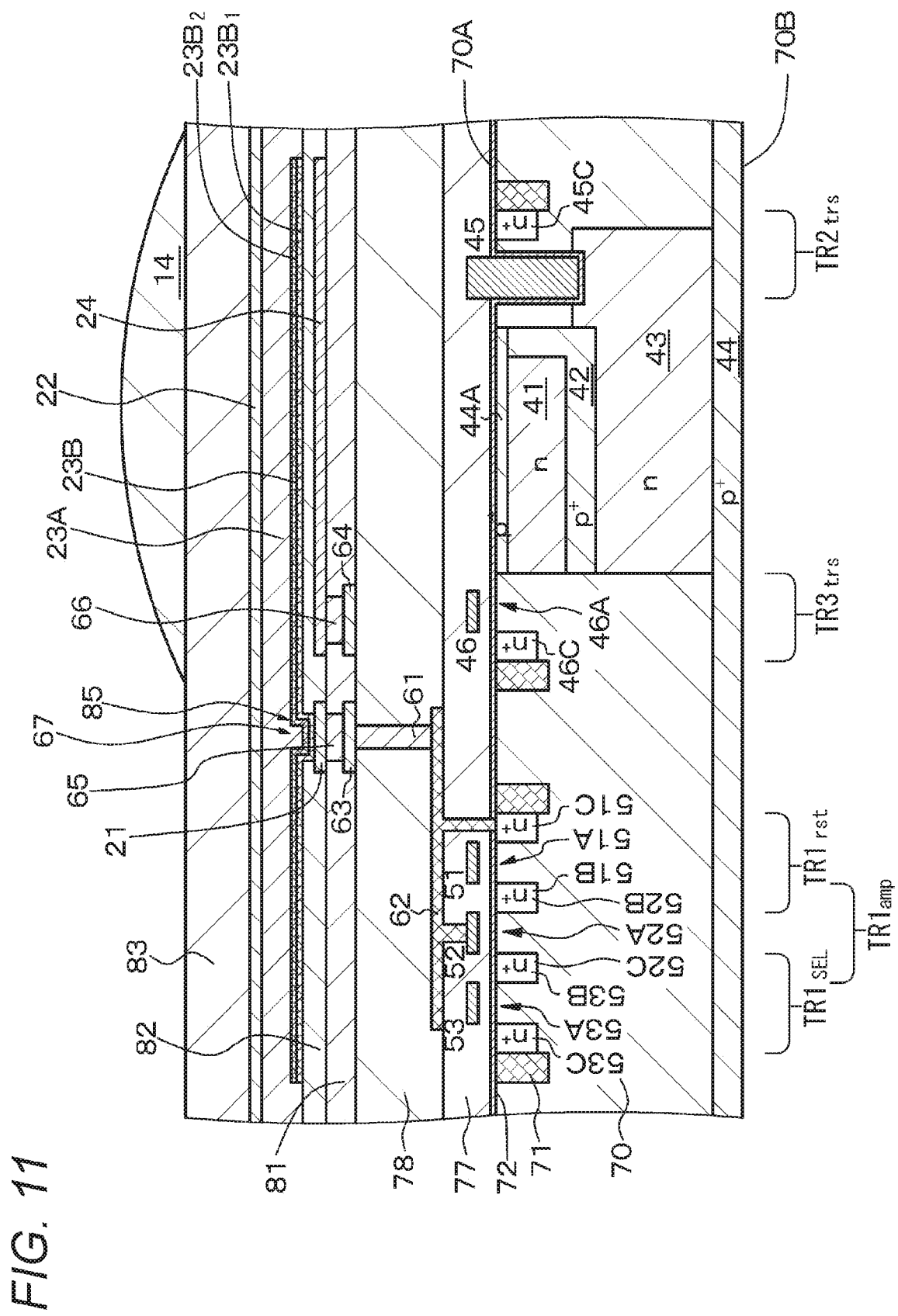
FIG. 11 is a schematic partial cross-sectional view of an imaging element of Example 2.

Example 2 is a modification of Example 1. An imaging element and the like of Example 2, illustrated in the schematic partial cross-sectional view of FIG. 11, are frontside irradiation type imaging elements, and have a structure formed by laminating three imaging elements of a first type green light imaging element of Example 1, including a first type green light photoelectric conversion layer that absorbs green light and sensitive to green light (first imaging element), a second type conventional blue light imaging element including a second type blue light photoelectric conversion layer that absorbs blue light and sensitive to blue light (second imaging element), and a second type conventional red light imaging element including a second type red light photoelectric conversion layer that absorbs red light and sensitive to red light (third imaging element). Here, the red light imaging element (third imaging element) and the blue light imaging element (second imaging element) are disposed in the semiconductor substrate 70, and the second imaging element is located closer to the light incident side than the third imaging element. Furthermore, the green light imaging element (first imaging element) is disposed above the blue light imaging element (second imaging element).

On the front surface 70A side of the semiconductor substrate 70, various transistors constituting a control unit are disposed as in Example 1. These transistors can have substantially similar configurations and structures to the transistors described in Example 1. Furthermore, the semiconductor substrate 70 includes the second imaging element and the third imaging element, and these imaging elements can have substantially similar configurations and structures to the second imaging element and the third imaging element described in Example 1.

The interlayer insulating layer 81 is formed above the front surface 70A of the semiconductor substrate 70. Above the interlayer insulating layer 81, the photoelectric conversion unit (first electrode 21, composite oxide layer 23B, photoelectric conversion layer 23A, second electrode 22, charge accumulation electrode 24, and the like) including the charge accumulation electrode and constituting the imaging element and the like of Example 1 is disposed.

In this way, the configuration and structure of the imaging element and the like of Example 2 can be similar to the configuration and structure of the imaging element and the like of Example 1 except for being the frontside irradiation type. Therefore, detailed description thereof is omitted.

Example 3

Example 3 is a modification of Examples 1 and 2.

Figure 12:
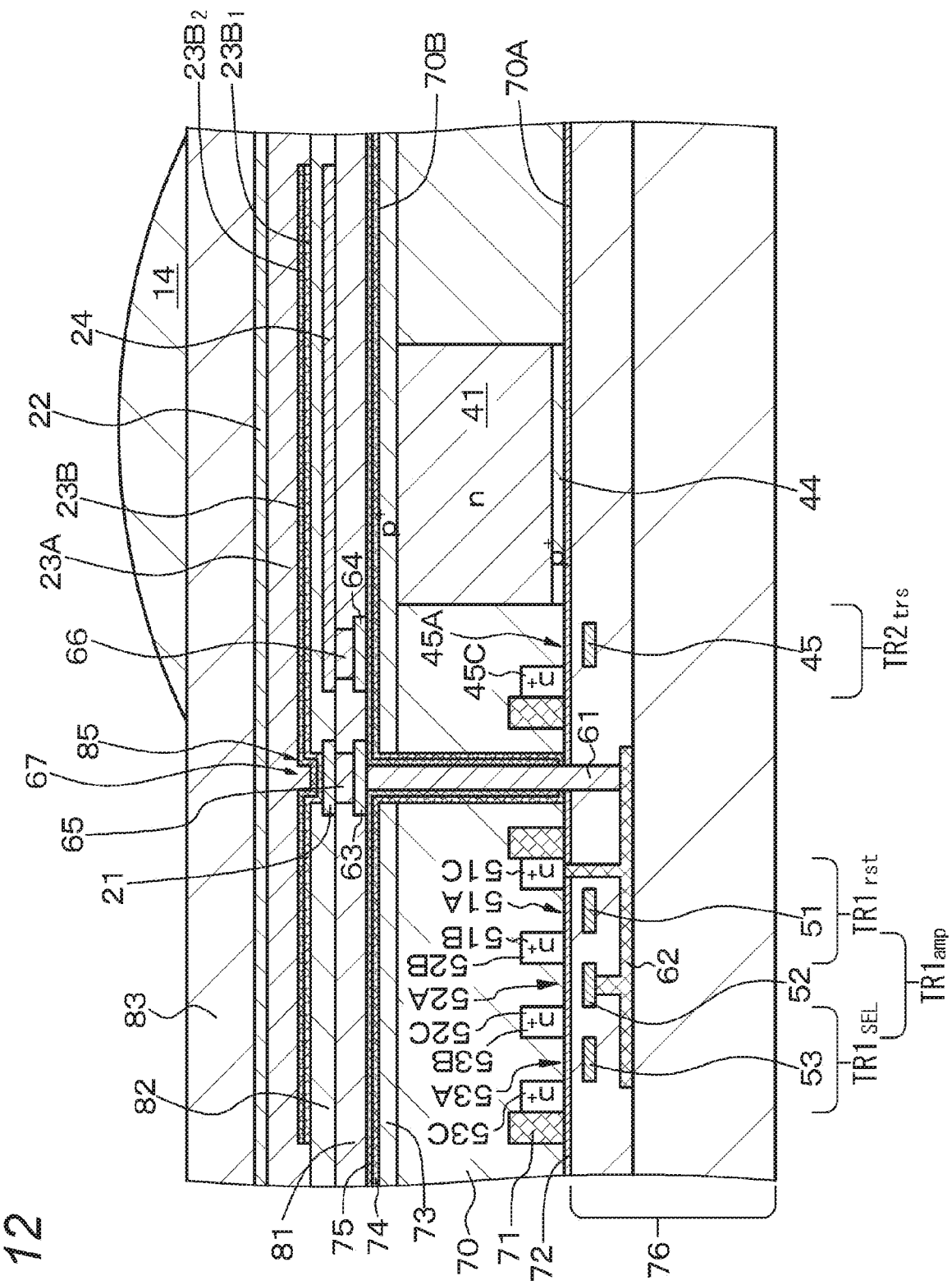
FIG. 12 is a schematic partial cross-sectional view of an imaging element of Example 3.
Figure 13:
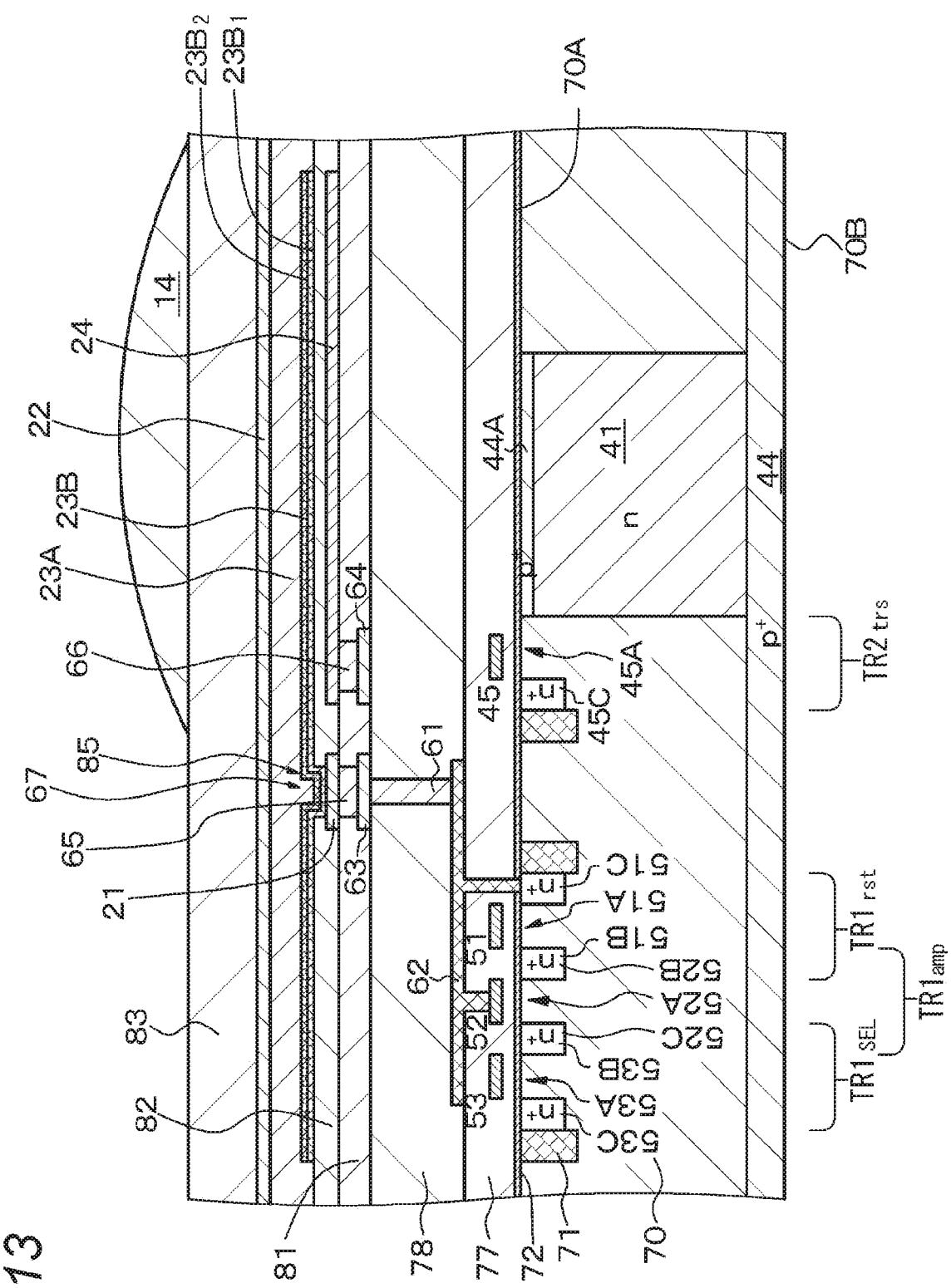
FIG. 13 is a schematic partial cross-sectional view of a modification of the imaging element of Example 3.

An imaging element and the like of Example 3, illustrated in the schematic partial cross-sectional view of FIG. 12, is a backside irradiation type imaging element, and has a structure formed by laminating two imaging elements of the first type first imaging element of Example 1 and the second type second imaging element. Furthermore, a modification of the imaging element and the like of Example 3, illustrated in the schematic partial cross-sectional view of FIG. 13, is a frontside irradiation type imaging element, and has a structure formed by laminating two imaging elements of the first type first imaging element of Example 1 and the second type second imaging element. Here, the first imaging element absorbs primary color light, and the second imaging element absorbs complementary color light. Alternatively, the first imaging element absorbs white light, and the second imaging element absorbs infrared rays.

Figure 14:
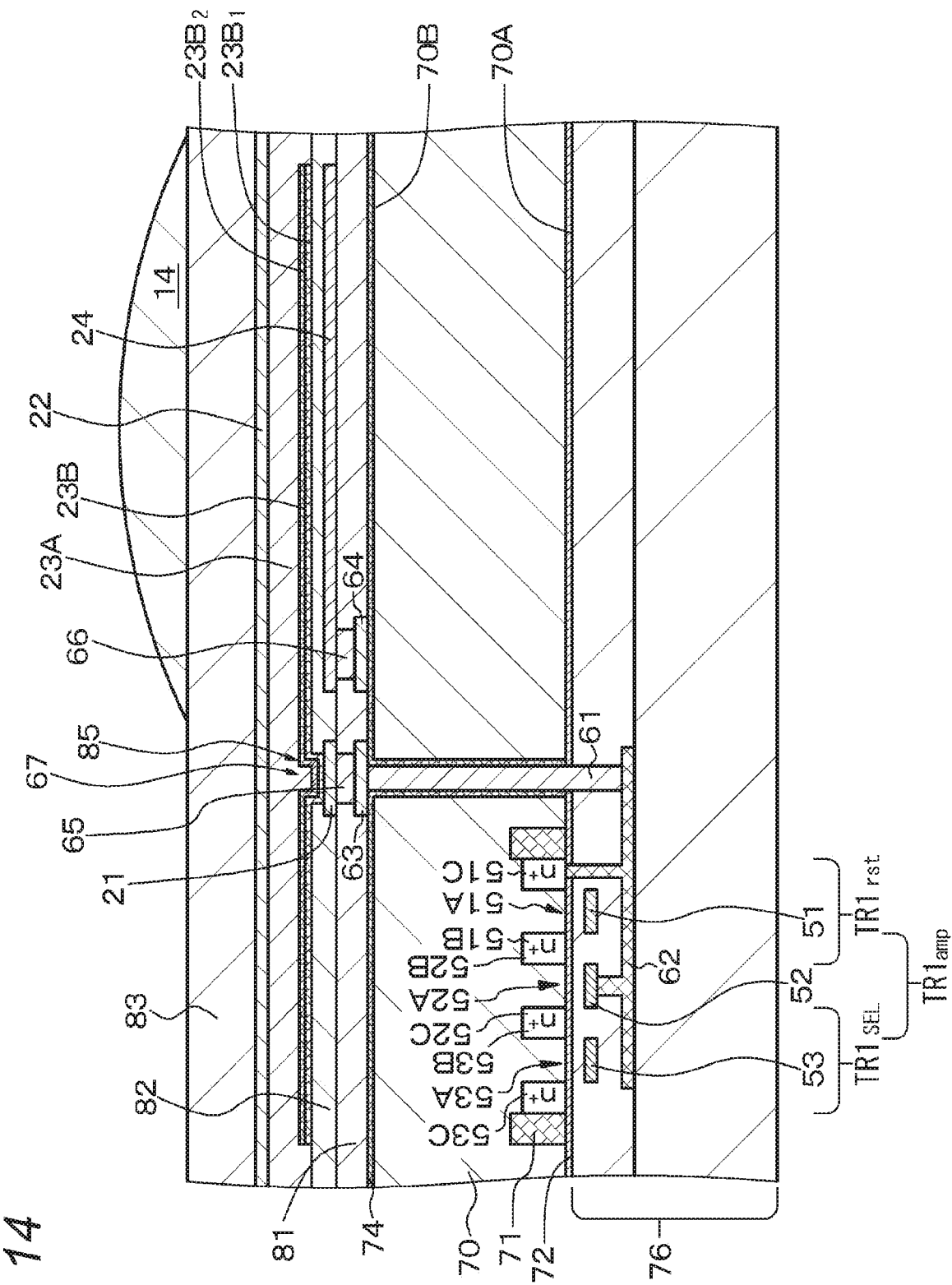
FIG. 14 is a schematic partial cross-sectional view of another modification of the imaging element of Example 3.
Figure 15:
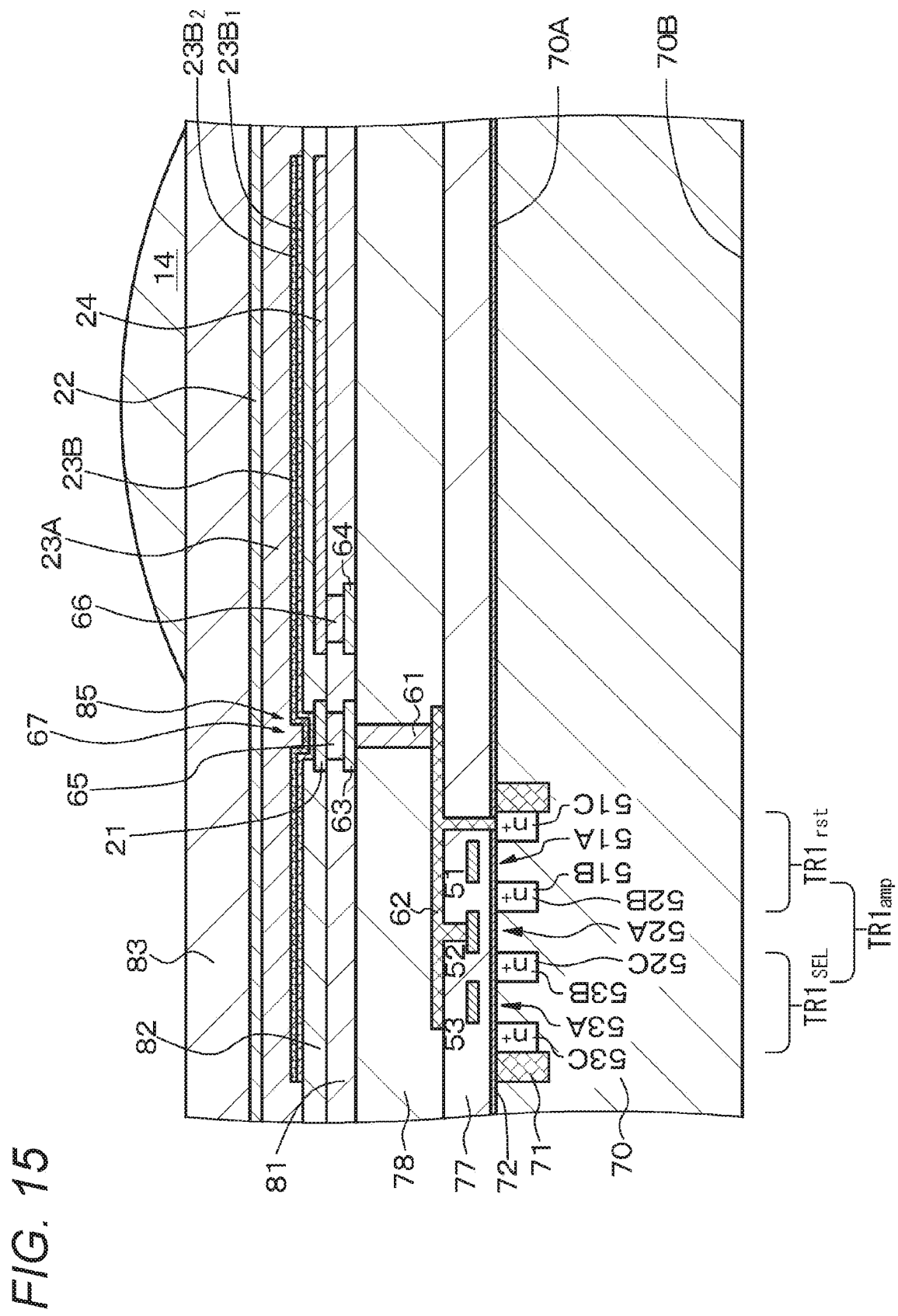
FIG. 15 is a schematic partial cross-sectional view of still another modification of the imaging element of Example 3.

A modification of the imaging element and the like of Example 3, illustrated in the schematic partial cross-sectional view of FIG. 14, is a backside irradiation type imaging element, and is constituted by the first type first imaging element of Example 1. Furthermore, a modification of the imaging element of Example 3, illustrated in the schematic partial cross-sectional view of FIG. 15, is a frontside irradiation type imaging element, and is constituted by the first type first imaging element of Example 1. Here, the first imaging element is constituted by three types of imaging elements of an imaging element that absorbs red light, an imaging element that absorbs green light, and an imaging element that absorbs blue light. Moreover, the solid-state imaging device according to the first aspect of the present disclosure is constituted by a plurality of these imaging elements. As an arrangement of the plurality of imaging elements, a Bayer array can be cited. On the light incident side of each imaging element, a color filter layer for performing blue, green, and red spectroscopy is disposed as necessary.

Instead of disposing one first type photoelectric conversion unit including the charge accumulation electrode of Example 1, a form can be adopted in which two first type photoelectric conversion units are laminated (that is, a form in which two photoelectric conversion units each including the charge accumulation electrode are laminated, and a control unit for the two photoelectric conversion units is disposed on a semiconductor substrate), or a form can be adopted in which three first type photoelectric conversion units are laminated (that is, a form in which three photoelectric conversion units each including the charge accumulation electrode are laminated, and a control unit for the three photoelectric conversion units is disposed on a semiconductor substrate). Examples of the laminated structure of the first type imaging element and the second type imaging element are illustrated in the following table.

|  | First type | Second type |
|---|---|---|
| Backside irradiation type and Frontside irradiation type | 1<br>Green<br>1<br>Primary color<br>1<br>White<br>1<br>Blue, Green, or Red<br>2<br>Green + Infrared rays<br>2<br>Green + Blue<br>2<br>White + Infrared rays<br>3<br>Green + Blue + Red<br>3<br>Green + Blue + Red<br>3<br>Blue + Green + Red | 2<br>Blue + Red<br>1<br>Complementary color<br>1<br>Infrared rays<br>0<br><br>2<br>Blue + Red<br>1<br>Red<br>0<br>2<br>Bluegreen (Emerald color) + Infrared rays<br>1<br>Infrared rays<br>0 |

Example 4

Figure 16:
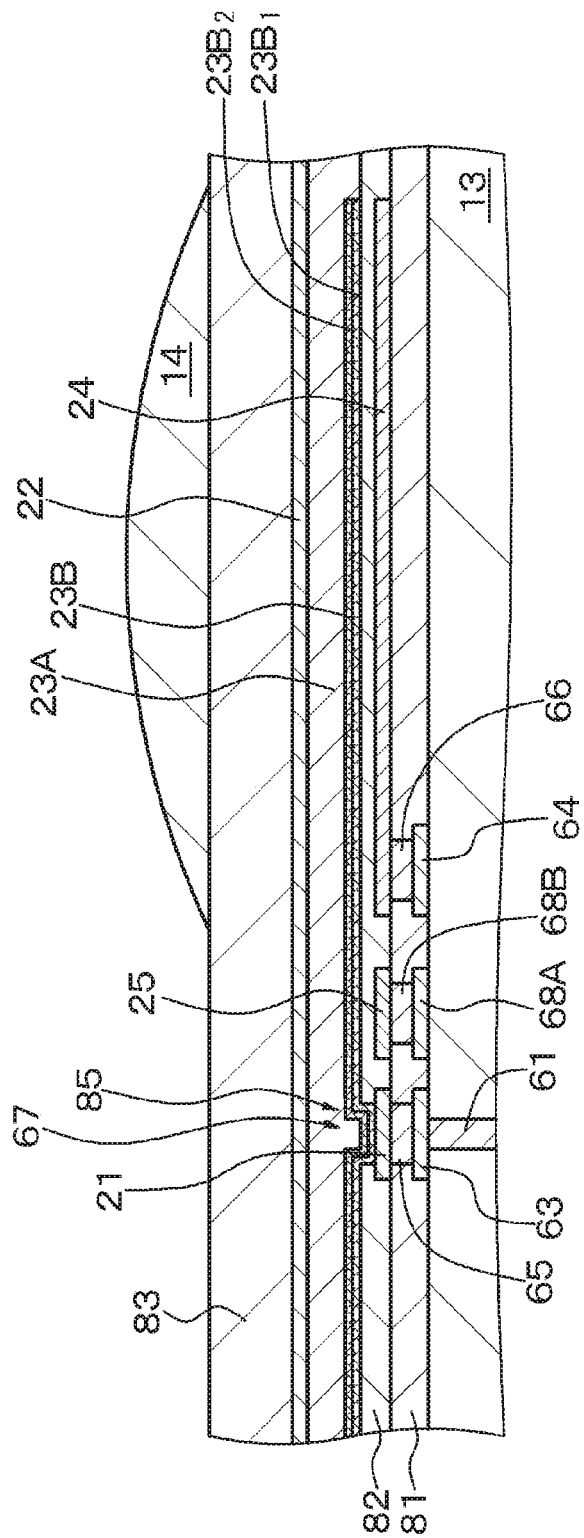
FIG. 16 is a schematic partial cross-sectional view of a part of an imaging element of Example 4.
Figure 17:
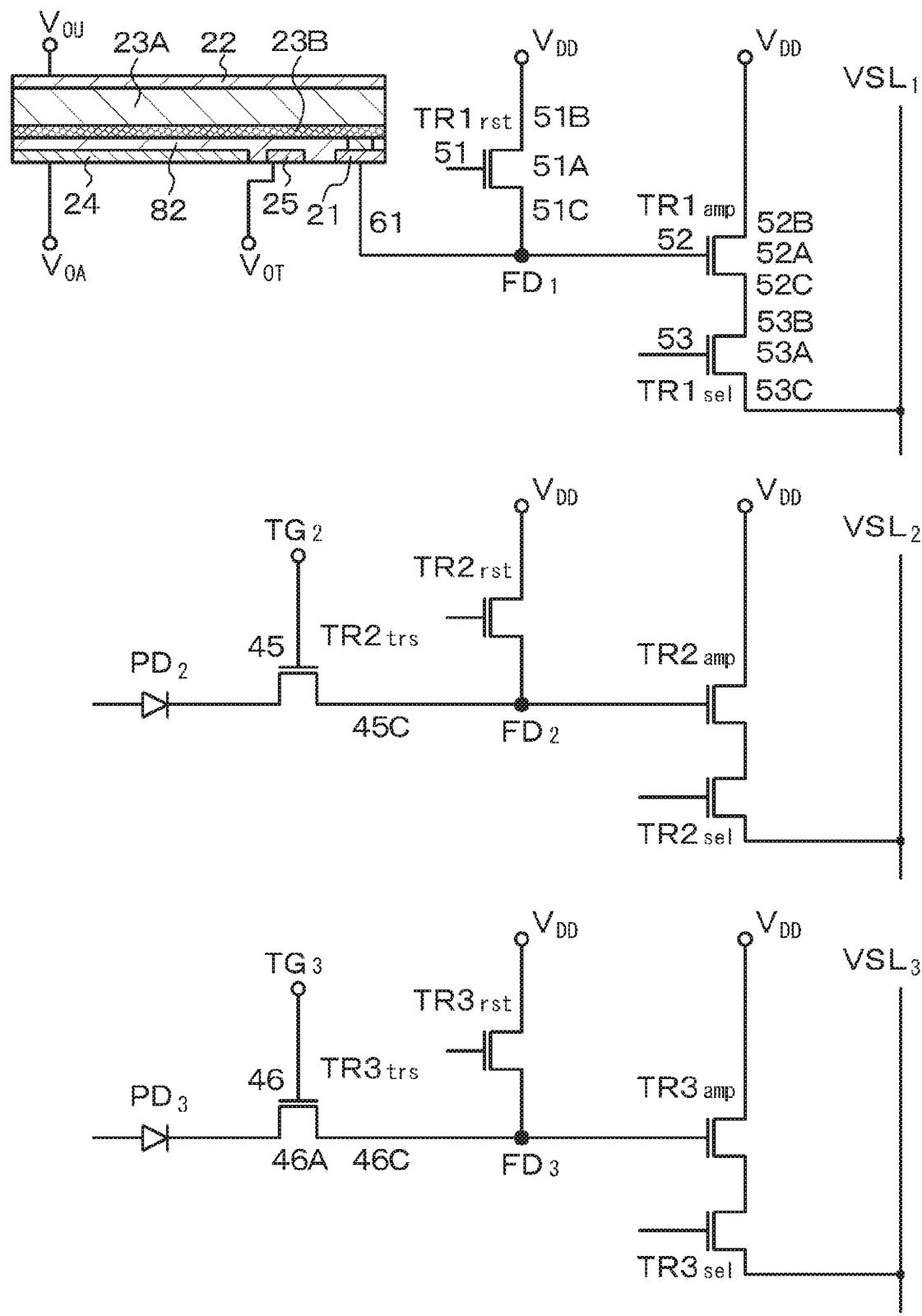
FIG. 17 is an equivalent circuit diagram of the imaging element of Example 4.
Figure 18:
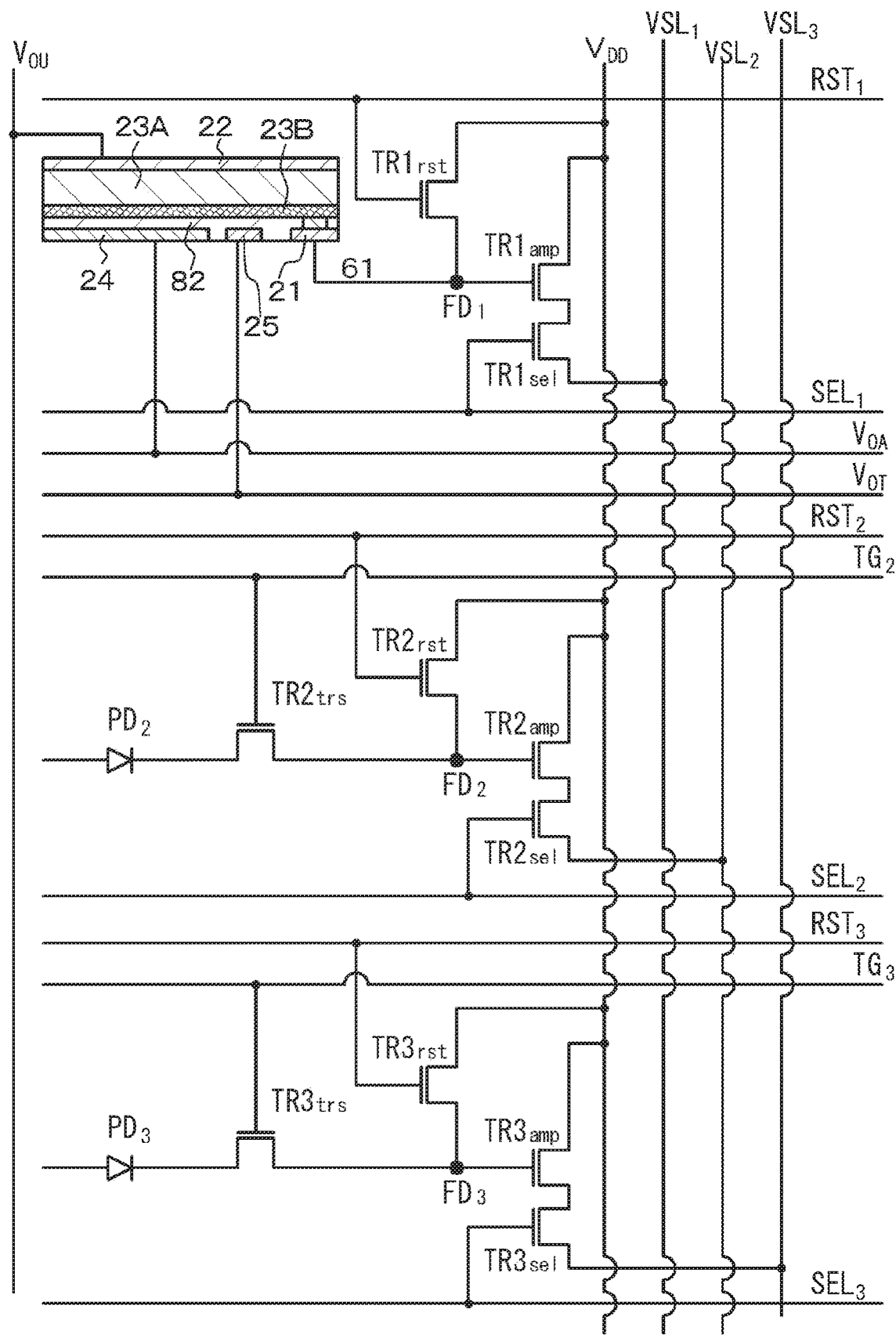
FIG. 18 is an equivalent circuit diagram of the imaging element of Example 4.
Figure 19:
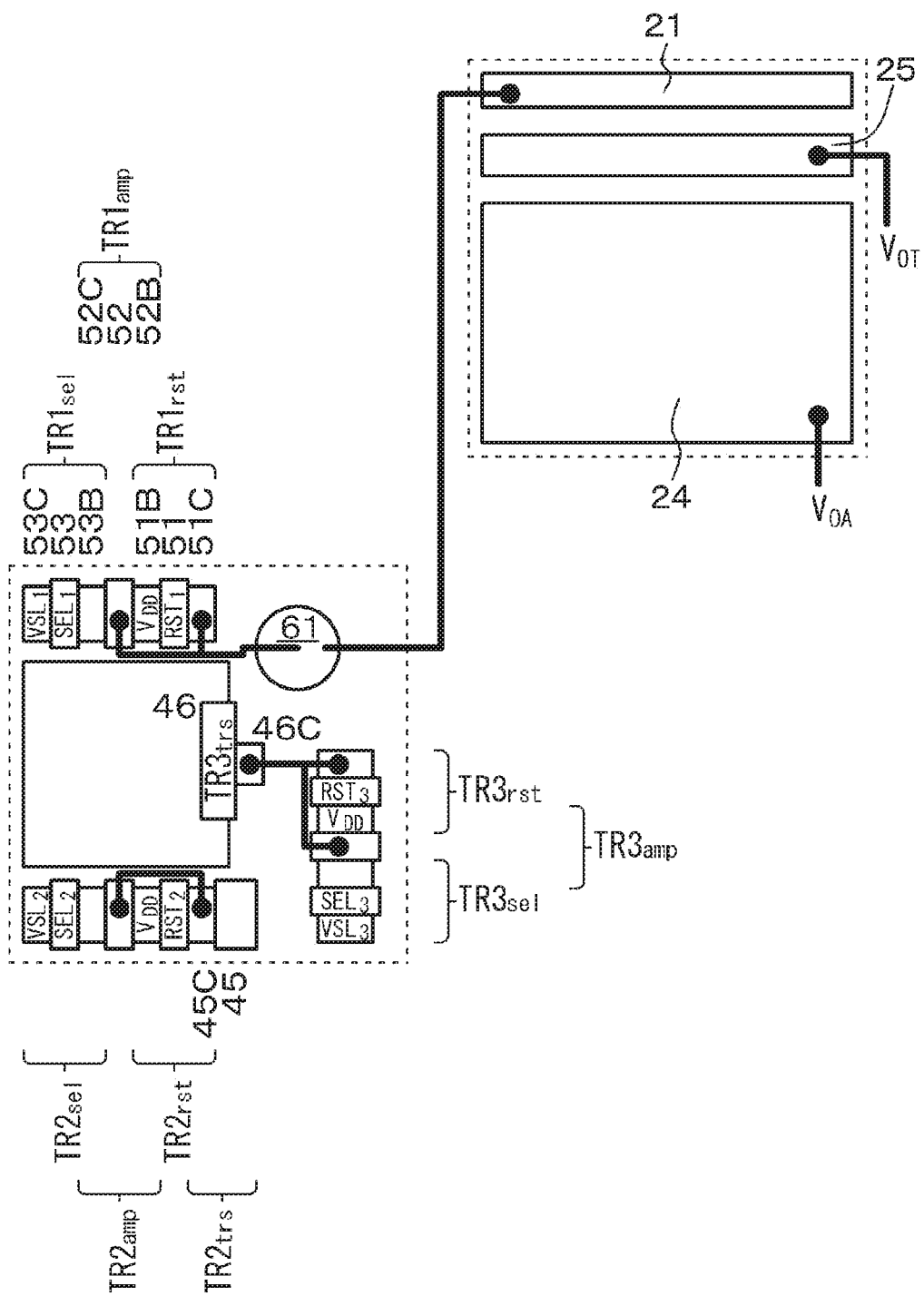
FIG. 19 is a schematic arrangement diagram of a first electrode, a transfer control electrode, and a charge accumulation electrode constituting the imaging element of Example 4, and a transistor constituting a control unit.
Figure 22:
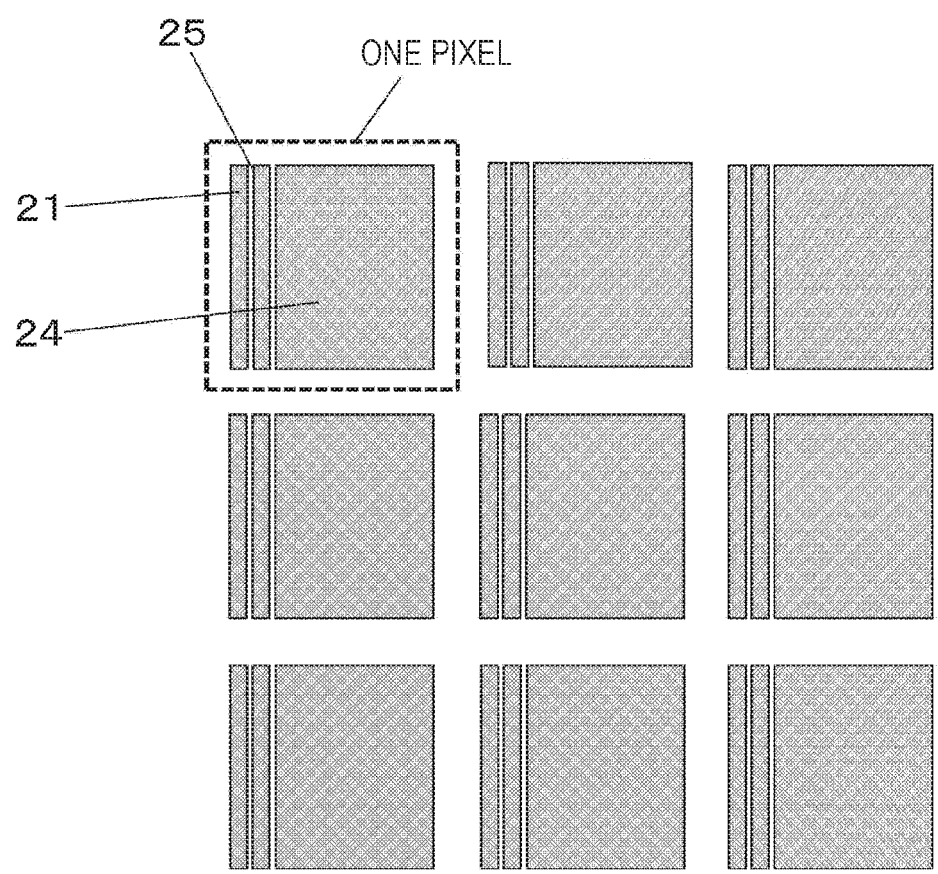
FIG. 22 is a schematic arrangement diagram of a first electrode, a transfer control electrode, and a charge accumulation electrode constituting the imaging element of Example 4.
Figure 23:
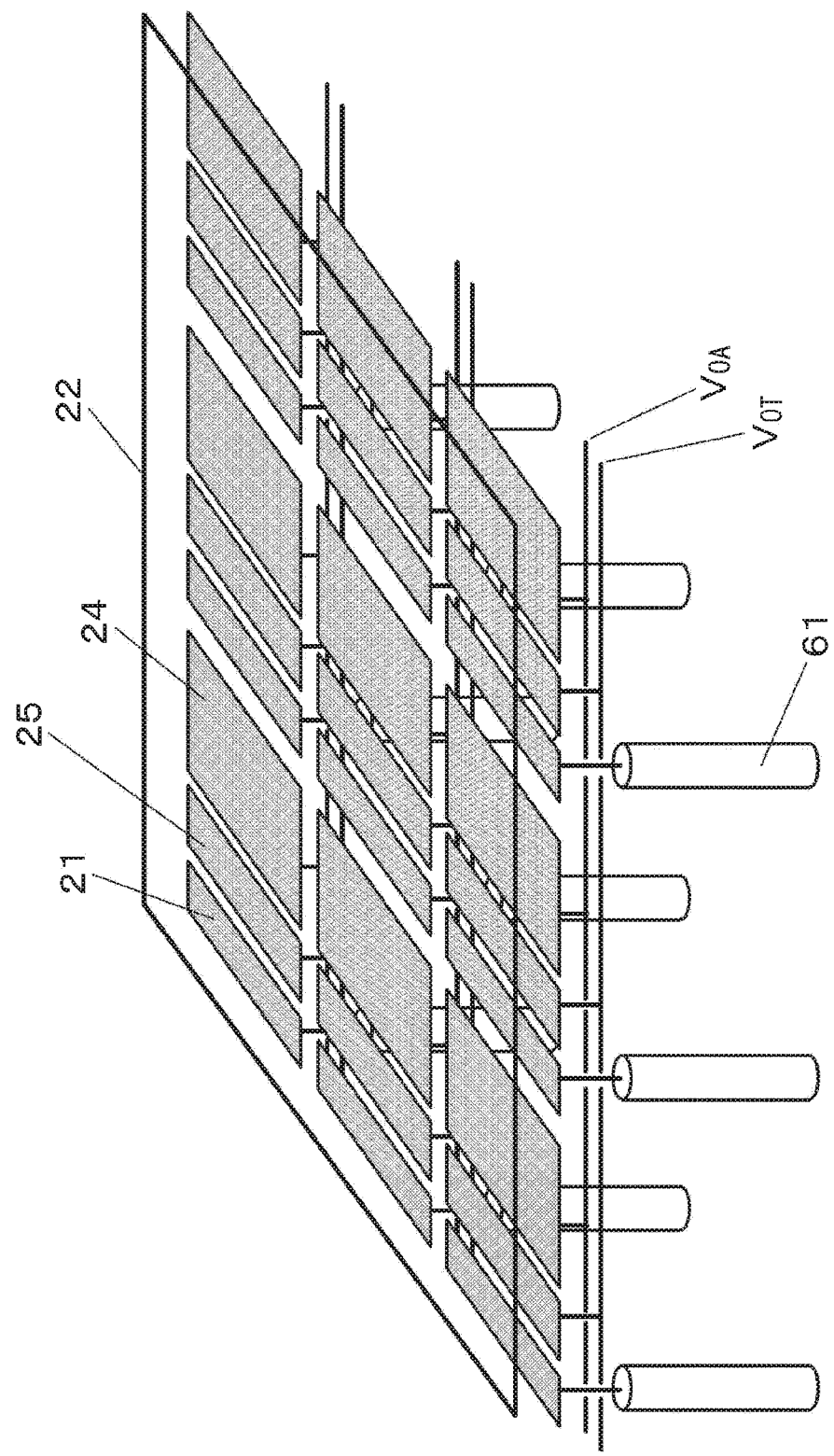
FIG. 23 is a schematic perspective view of a first electrode, a transfer control electrode, a charge accumulation electrode, a second electrode, and a contact hole portion constituting the imaging element of Example 4.

Example 4 is a modification of Examples 1 to 3, and relates to an imaging element and the like of the present disclosure including a transfer control electrode (charge transfer electrode). FIG. 16 illustrates a schematic partial cross-sectional view of a part of the imaging element and the like of Example 4. FIGS. 17 and 18 illustrate an equivalent circuit diagram of the imaging element and the like of Example 4. FIG. 19 illustrates a schematic arrangement diagram of a first electrode, a transfer control electrode, and a charge accumulation electrode constituting a photoelectric conversion unit of the imaging element and the like of Example 4, and a transistor constituting a control unit. FIGS. 20 and 21 schematically illustrate a potential state in each part during operation of the imaging element and the like of Example 4. FIG. 6B illustrates an equivalent circuit diagram for explaining each part of the imaging element and the like of Example 4. Furthermore, FIG. 22 illustrates a schematic arrangement diagram of the first electrode, the transfer control electrode, and the charge accumulation electrode constituting the photoelectric conversion unit of the imaging element and the like of Example 4. FIG. 23 illustrates a schematic perspective view of the first electrode, the transfer control electrode, the charge accumulation electrode, the second electrode, and the contact hole portion.

The imaging element and the like of Example 4 further include the transfer control electrode (charge transfer electrode) 25 disposed apart from the first electrode 21 and the charge accumulation electrode 24 so as to face the composite oxide layer 23B via the insulating layer 82 between the first electrode 21 and the charge accumulation electrode 24. The transfer control electrode 25 is connected to a pixel drive circuit constituting a drive circuit via a connection hole 68B, a pad portion 68A, and wiring $V_{OT}$ formed in the interlayer insulating layer 81. Note that various imaging element components located below the interlayer insulating layer 81 are collectively denoted by reference numeral 13 for convenience in order to simplify the drawing.

Hereinafter, with reference to FIGS. 20 and 21, operation of the imaging element and the like (first imaging element) of Example 4 will be described. Note that a value of the potential applied to the charge accumulation electrode 24 and a value of the potential at the point $P_D$ are particularly different between FIGS. 20 and 21.

In a charge accumulation period, the potential $V_{11}$ is applied to the first electrode 21, the potential $V_{12}$ is applied to the charge accumulation electrode 24, and the potential $V_{13}$ is applied to the transfer control electrode 25 from a drive circuit. Photoelectric conversion occurs in the photoelectric conversion layer 23A by light incident on the photoelectric conversion layer 23A. Holes generated by the photoelectric conversion are sent from the second electrode 22 to a drive circuit via the wiring $V_{OU}$. Meanwhile, the potential of the first electrode 21 is set to be higher than the potential of the second electrode 22, that is, for example, a positive potential is applied to the first electrode 21, and a negative potential is applied to the second electrode 22. Therefore, $V_{12}>V_{13}$ (for example, $V_{12}>V_{11}>V_{13}$ or $V_{11}>V_{12}>V_{13}$) is satisfied. As a result, electrons generated by the photoelectric conversion are attracted to the charge accumulation electrode 24 and stop in a region of the composite oxide layer 23B and the like facing the charge accumulation electrode 24. That is, charges are accumulated in the composite oxide layer 23B and the like. Since $V_{12}>V_{13}$ is satisfied, transfer of electrons generated inside the photoelectric conversion layer 23A toward the first electrode 21 can be prevented reliably. As the time for the photoelectric conversion elapses, the potential in the region of the composite oxide layer 23B and the like facing the charge accumulation electrode 24 becomes a more negative value.

In a later stage of the charge accumulation period, a reset operation is performed. As a result, the potential of the first floating diffusion layer $FD_1$ is reset, and the potential of the first floating diffusion layer $FD_1$ becomes the potential $V_{DD}$ of the power source.

After the reset operation is completed, charges are read out. That is, in a charge transfer period, the potential $V_{21}$ is applied to the first electrode 21, the potential $V_{22}$ is applied to the charge accumulation electrode 24, and the potential $V_{23}$ is applied to the transfer control electrode 25 from a drive circuit. Here, $V_{22} \leq V_{23} \leq V_{21}$ (preferably $V_{22}<V_{23}<V_{21}$) is satisfied. In a case where the potential $V_{13}$ is applied to the transfer control electrode 25, it is only required to satisfy $V_{22} \leq V_{13} \leq V_{21}$ (preferably $V_{22}<V_{13}<V_{21}$). As a result, electrons that have stopped in the region of the composite oxide layer 23B and the like facing the charge accumulation electrode 24 are reliably read out to the first electrode 21 and further to the first floating diffusion layer $FD_1$. That is, the charge accumulated in the composite oxide layer 23B and the like is read out to the control unit.

In this way, a series of operations including charge accumulation, reset operation, and charge transfer are completed.

The operations of the amplification transistor $TR1_{amp}$ and the selection transistor $TR1_{sel}$ after electrons are read out to the first floating diffusion layer $FD_1$ are the same as the conventional operations of these transistors. Furthermore, for example, a series of operations including charge accumulation, reset operation, and charge transfer of the second imaging element and the third imaging element are similar to a conventional series of operations including charge accumulation, reset operation, and charge transfer.

Figure 24:
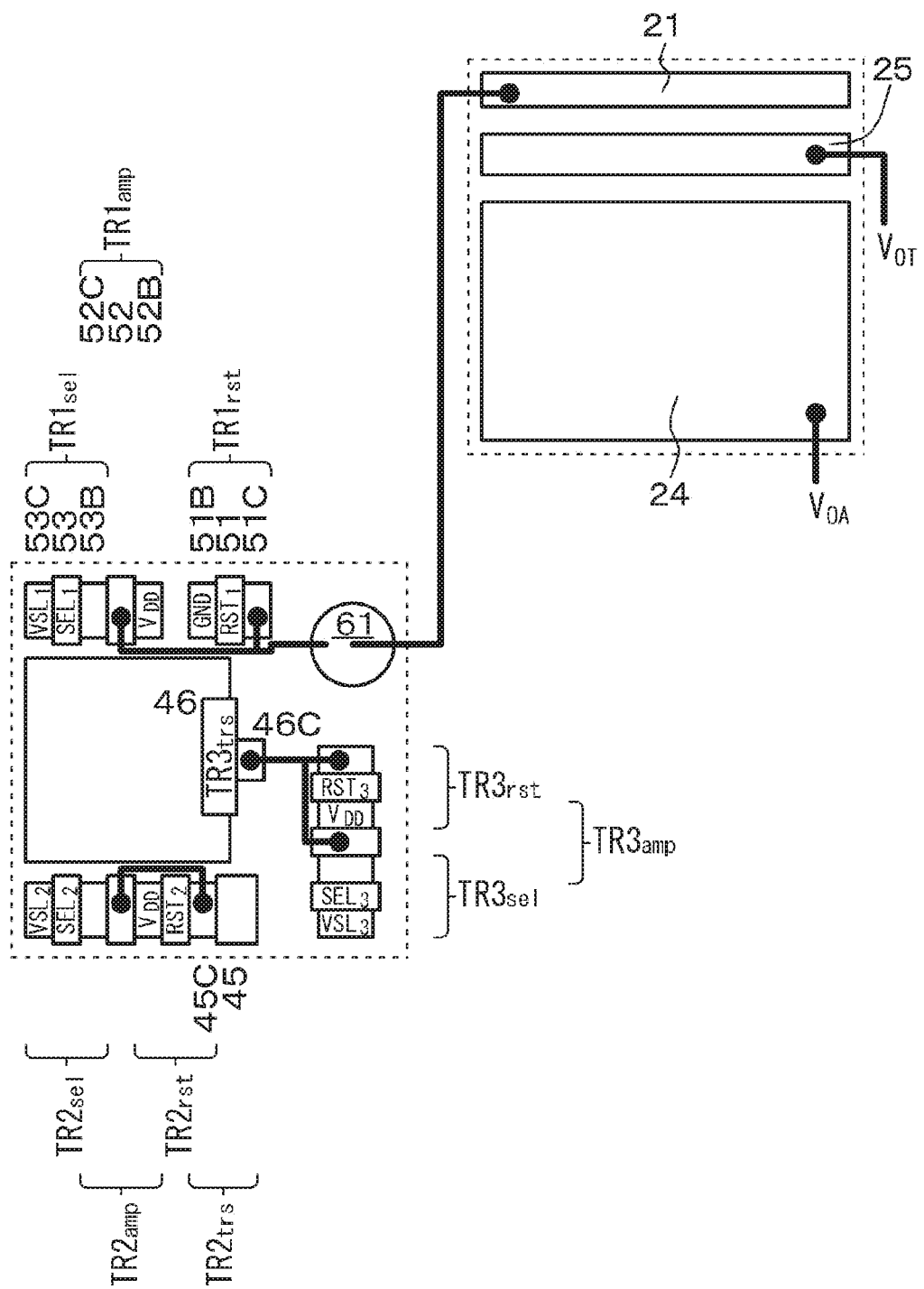
FIG. 24 is a schematic arrangement diagram of a first electrode, a transfer control electrode, and a charge accumulation electrode constituting a modification of the imaging element of Example 4, and a transistor constituting a control unit.

As FIG. 24 illustrates a schematic arrangement diagram of the first electrode and the charge accumulation electrode constituting a modification of the imaging element and the like of Example 4, and a transistor constituting the control unit, the other source/drain region 51B of the reset transistor $TR1_{rst}$ may be grounded instead of being connected to the power source $V_{DD}$.

Example 5

Figure 25:
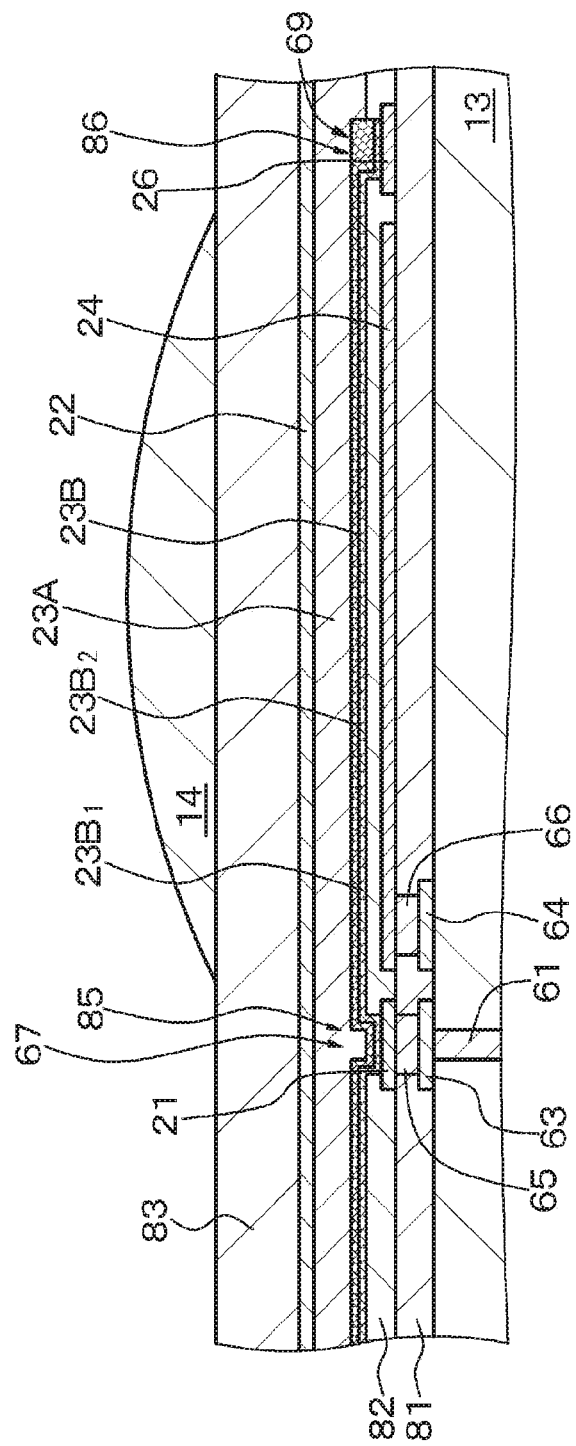
FIG. 25 is a schematic partial cross-sectional view of a part of an imaging element of Example 5.
Figure 26:
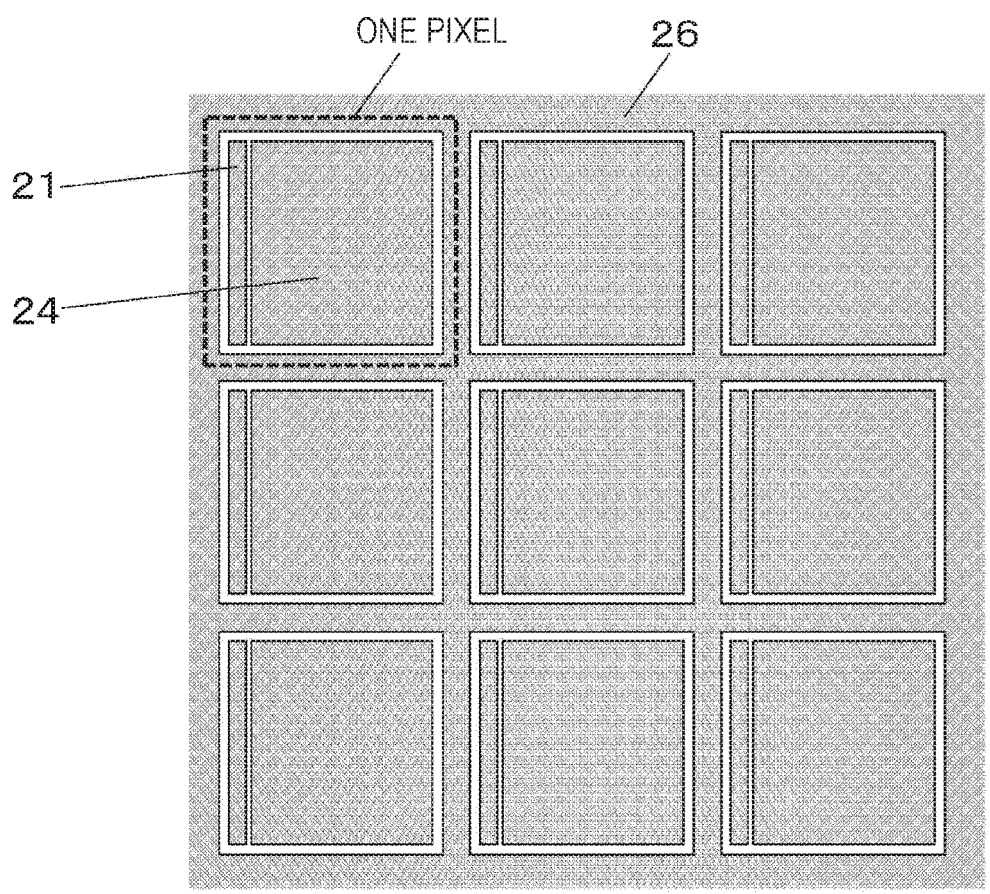
FIG. 26 is a schematic arrangement diagram of a first electrode, a charge accumulation electrode, and a charge discharge electrode constituting the imaging element of Example 5.
Figure 27:
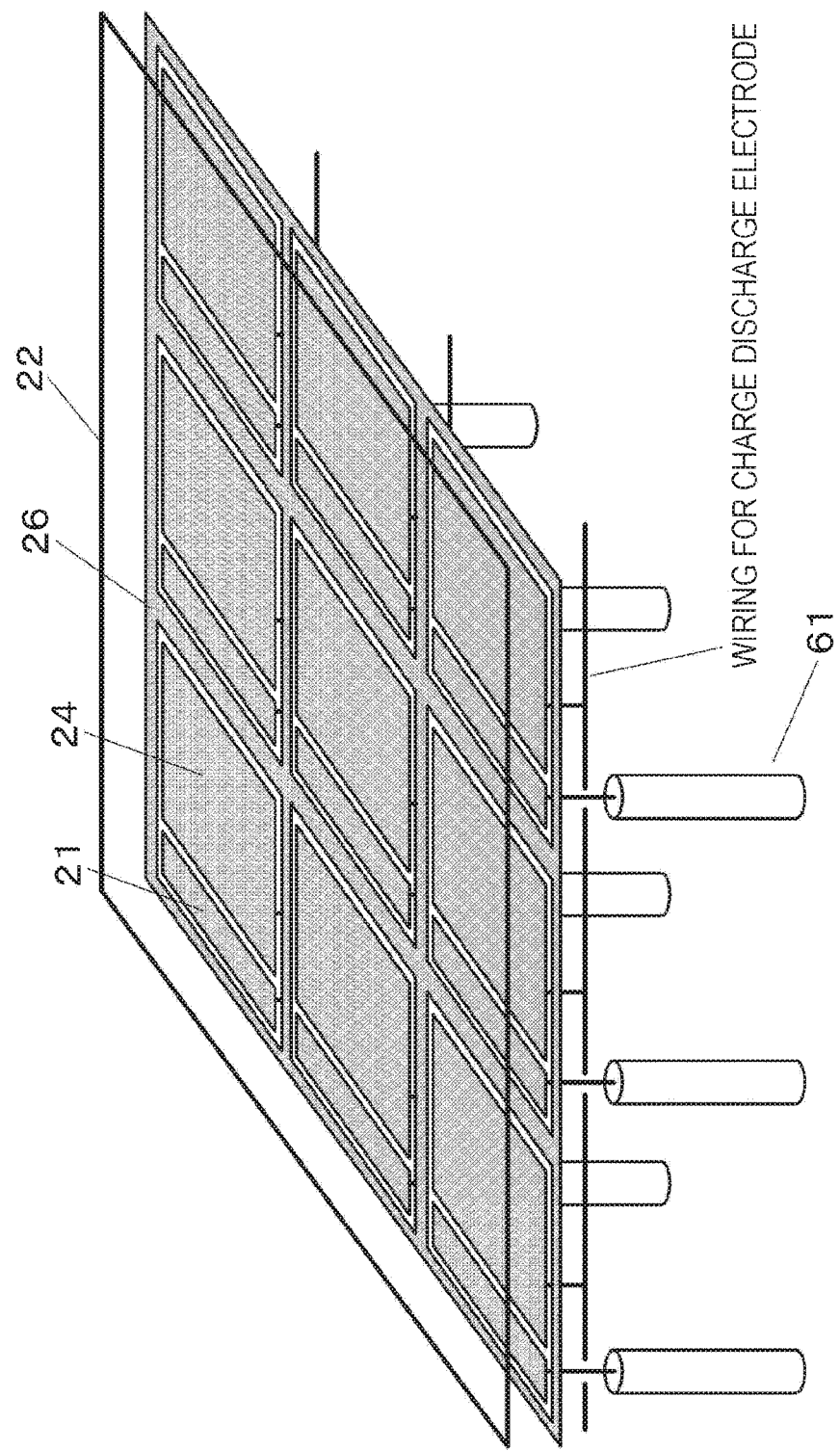
FIG. 27 is a schematic perspective view of a first electrode, a charge accumulation electrode, a charge discharge electrode, a second electrode, and a contact hole portion constituting the imaging element of Example 5.

Example 5 is a modification of Examples 1 to 4, and relates to an imaging element and the like of the present disclosure including a charge discharge electrode. FIG. 25 illustrates a schematic partial cross-sectional view of a part of the imaging element and the like of Example 5. FIG. 26 illustrates a schematic arrangement diagram of a first electrode, a charge accumulation electrode, and a charge discharge electrode constituting a photoelectric conversion unit including the charge accumulation electrode of the imaging element and the like of Example 5. FIG. 27 illustrates a schematic perspective view of a first electrode, a charge accumulation electrode, a charge discharge electrode, a second electrode, and a contact hole portion.

The imaging element and the like of Example 5 further include a charge discharge electrode 26 connected to the composite oxide layer 23B via the connection portion 69 and disposed apart from the first electrode 21 and the charge accumulation electrode 24. Here, the charge discharge electrode 26 is disposed so as to surround the first electrode 21 and the charge accumulation electrode 24 (that is, in a frame shape). The charge discharge electrode 26 is connected to a pixel drive circuit constituting a drive circuit. In the connection portion 69, the composite oxide layer 23B extends. That is, the composite oxide layer 23B extends in a second opening 86 formed in the insulating layer 82 to be connected to the charge discharge electrode 26. The charge discharge electrode 26 is shared by (common to) a plurality of imaging elements.

In Example 5, in a charge accumulation period, the potential $V_{11}$ is applied to the first electrode 21, the potential $V_{12}$ is applied to the charge accumulation electrode 24, and the potential $V_{14}$ is applied to the charge discharge electrode 26 from a drive circuit, and charges are accumulated in the composite oxide layer 23B and the like. Photoelectric conversion occurs in the photoelectric conversion layer 23A by light incident on the photoelectric conversion layer 23A. Holes generated by the photoelectric conversion are sent from the second electrode 22 to a drive circuit via the wiring $V_{OU}$. Meanwhile, the potential of the first electrode 21 is set to be higher than the potential of the second electrode 22, that is, for example, a positive potential is applied to the first electrode 21, and a negative potential is applied to the second electrode 22. Therefore, $V_{14}>V_{11}$ (for example, $V_{12}>V_{14}>V_{11}$) is satisfied. As a result, electrons generated by the photoelectric conversion are attracted to the charge accumulation electrode 24 and stop in a region of the composite oxide layer 23B and the like facing the charge accumulation electrode 24. Transfer of the electrons toward the first electrode 21 can be prevented reliably. However, electrons that are not sufficiently attracted to the charge accumulation electrode 24 or cannot be accumulated in the composite oxide layer 23B and the like (so-called overflowed electrons) are sent to a drive circuit via the charge discharge electrode 26.

In a later stage of the charge accumulation period, a reset operation is performed. As a result, the potential of the first floating diffusion layer $FD_1$ is reset, and the potential of the first floating diffusion layer $FD_1$ becomes the potential $V_{DD}$ of the power source.

After the reset operation is completed, charges are read out. That is, in a charge transfer period, the potential $V_{21}$ is applied to the first electrode 21, the potential $V_{22}$ is applied to the charge accumulation electrode 24, and the potential $V_{24}$ is applied to the charge discharge electrode 26 from a drive circuit. Here, $V_{24}<V_{21}$ (for example, $V_{24}<V_{22}<V_{21}$) is satisfied. As a result, electrons that have stopped in the region of the composite oxide layer 23B and the like facing the charge accumulation electrode 24 are reliably read out to the first electrode 21 and further to the first floating diffusion layer $FD_1$. That is, the charge accumulated in the composite oxide layer 23B and the like is read out to the control unit.

In this way, a series of operations including charge accumulation, reset operation, and charge transfer are completed.

The operations of the amplification transistor $TR1_{amp}$ and the selection transistor $TR1_{sel}$ after electrons are read out to the first floating diffusion layer $FD_1$ are the same as the conventional operations of these transistors. Furthermore, for example, a series of operations including charge accumulation, reset operation, and charge transfer of the second imaging element and the third imaging element are similar to a conventional series of operations including charge accumulation, reset operation, and charge transfer.

In Example 5, so-called overflowed electrons are sent to a drive circuit via the charge discharge electrode 26. Therefore, leakage to a charge accumulation portion of an adjacent pixel can be suppressed, and occurrence of blooming can be suppressed. In addition, this can improve imaging performance of the imaging element.

Example 6

Example 6 is a modification of Examples 1 to 5, and relates to an imaging element and the like of the present disclosure including a plurality of charge accumulation electrode segments.

Figure 28:
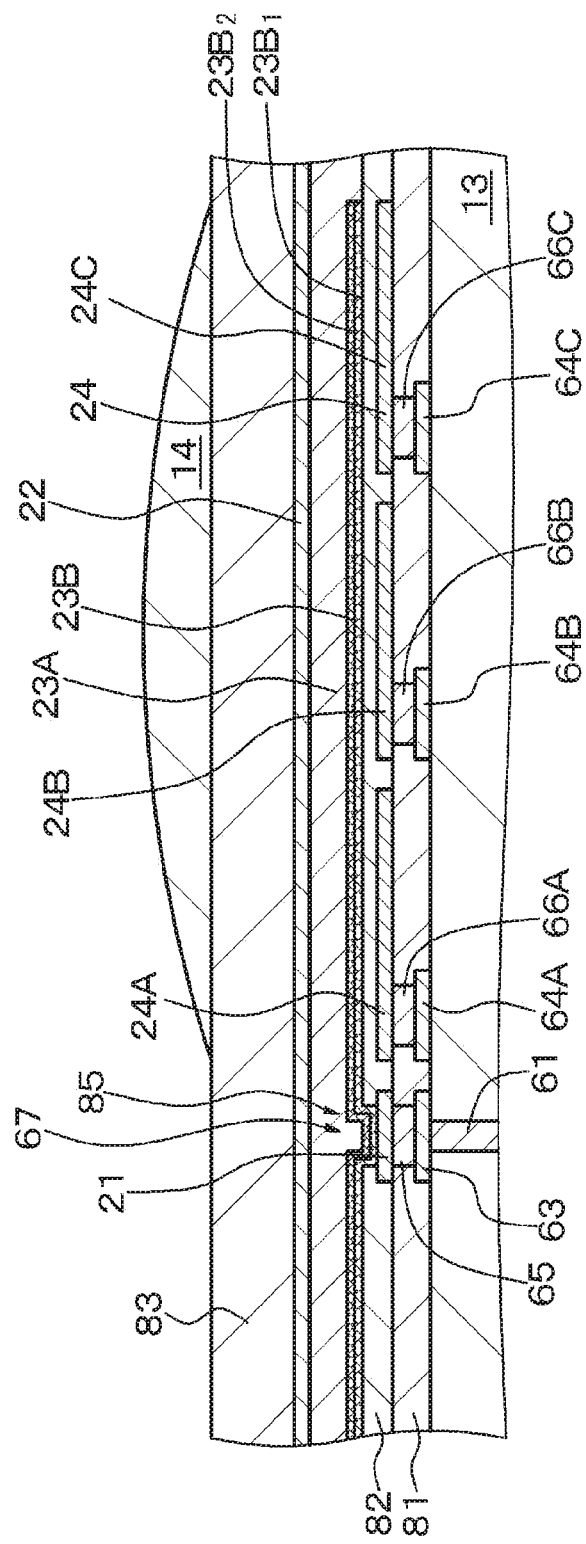
FIG. 28 is a schematic partial cross-sectional view of an imaging element of Example 6.
Figure 29:
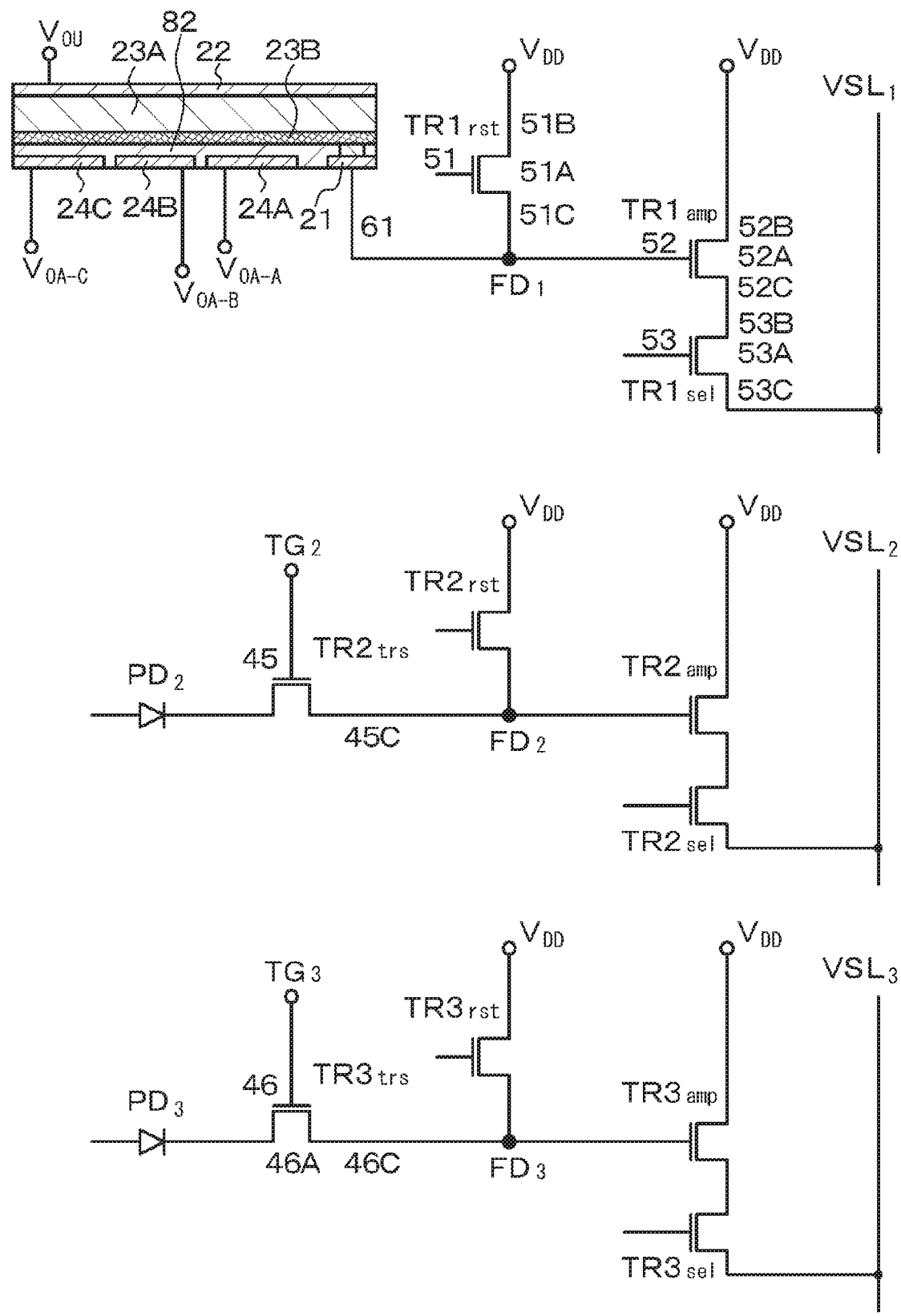
FIG. 29 is an equivalent circuit diagram of the imaging element of Example 6.
Figure 30:
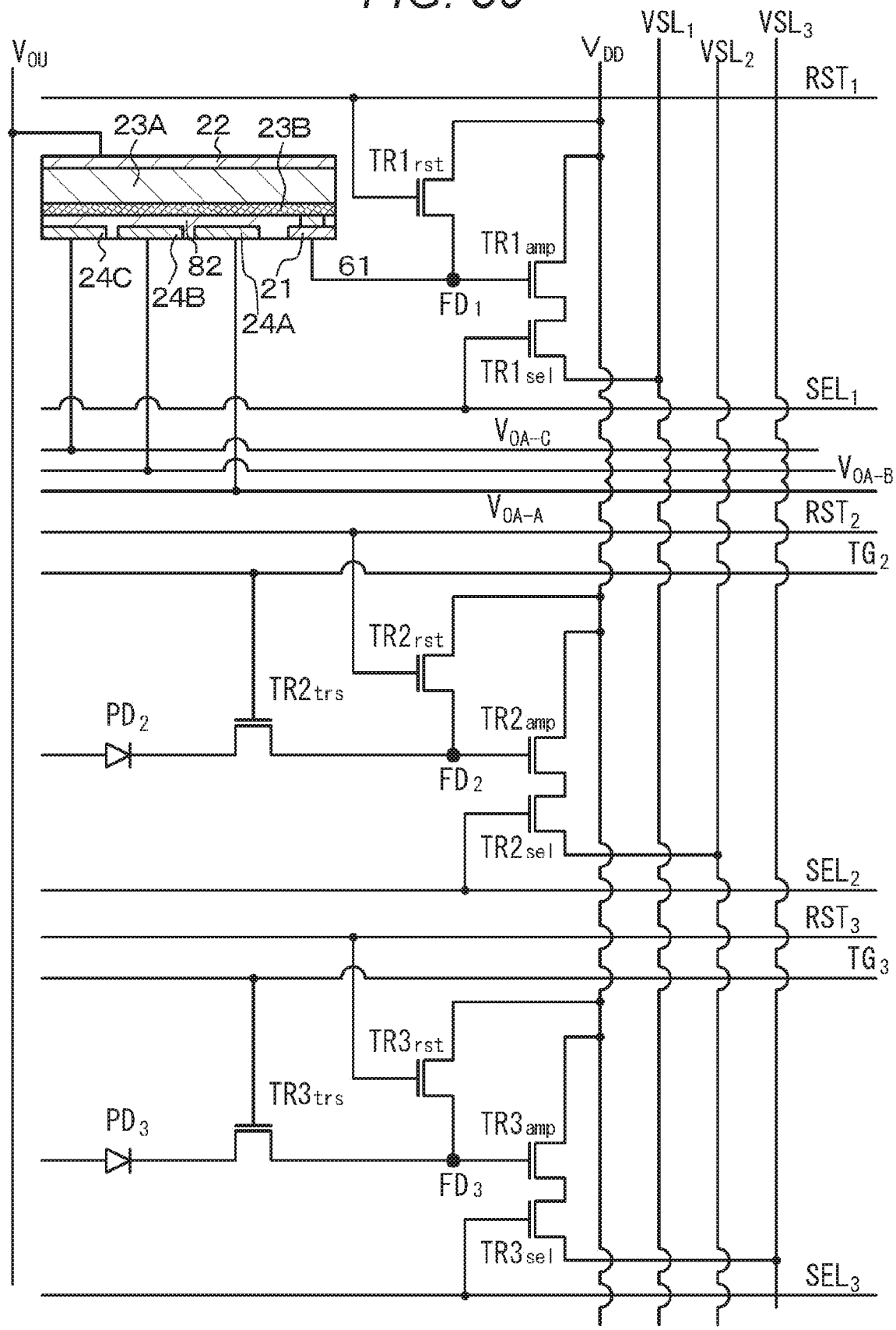
FIG. 30 is an equivalent circuit diagram of the imaging element of Example 6.
Figure 31:
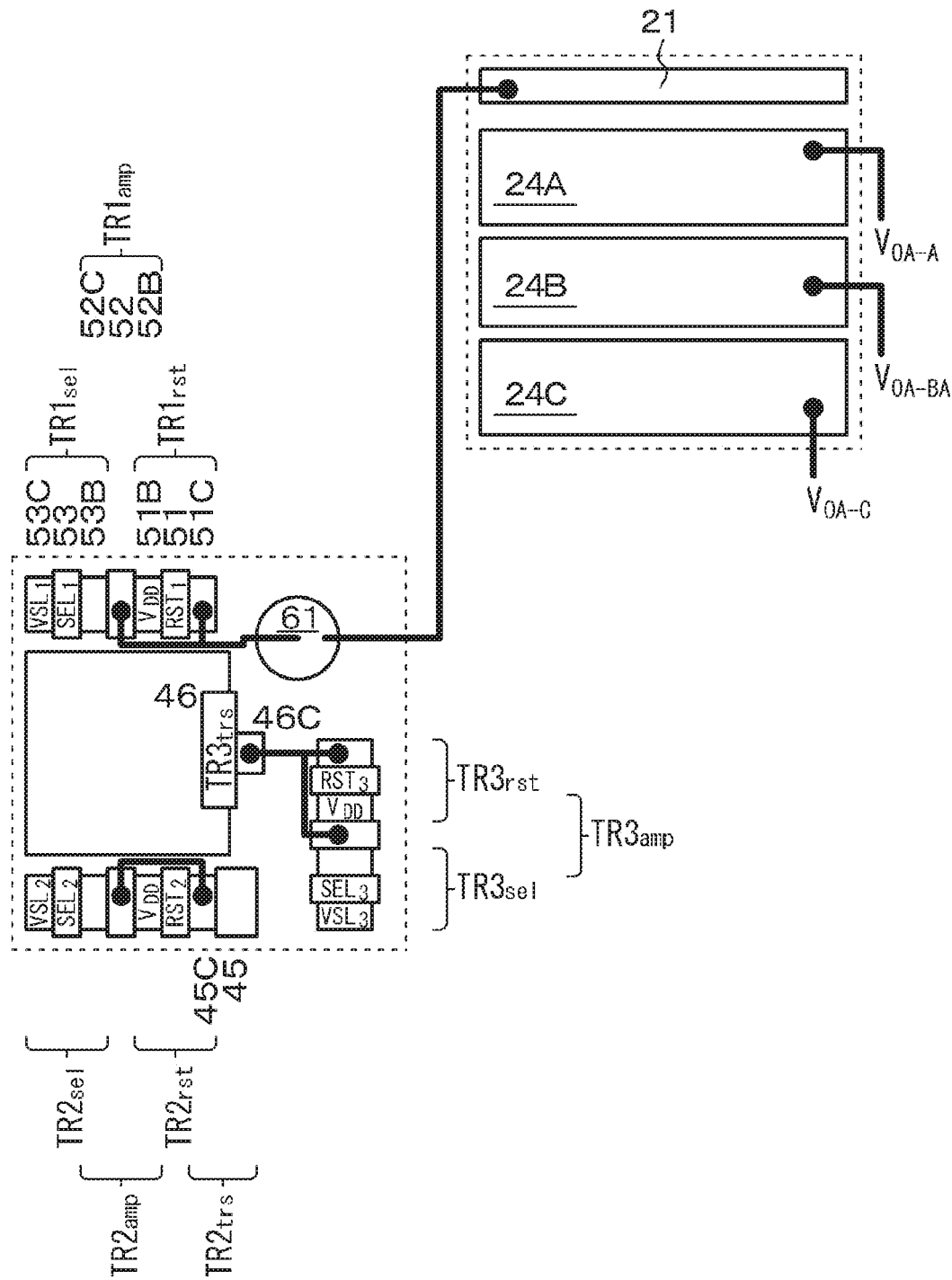
FIG. 31 is a schematic arrangement diagram of a first electrode and a charge accumulation electrode constituting the imaging element of Example 6, and a transistor constituting a control unit.
Figure 33:
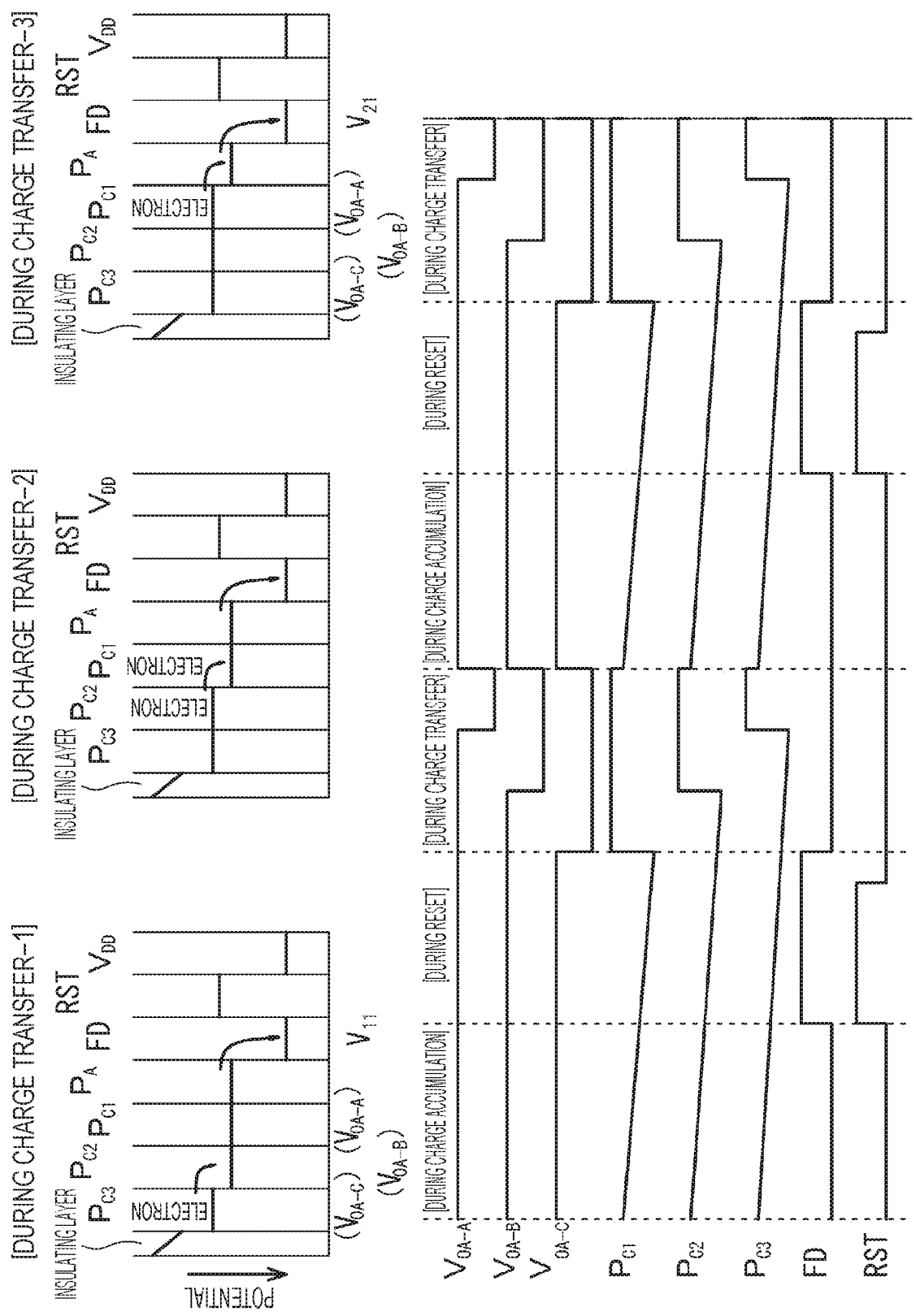
FIG. 33 is a diagram schematically illustrating a potential state at each part during another operation (during transfer) of the imaging element of Example 6.
Figure 34:
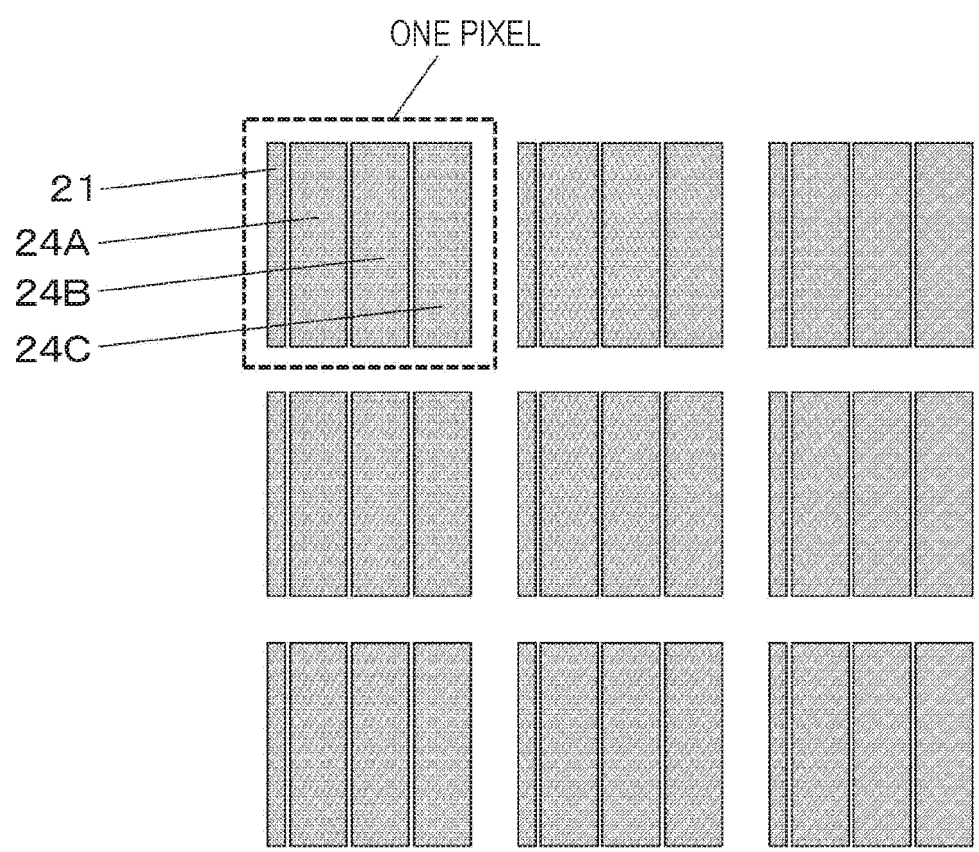
FIG. 34 is a schematic arrangement diagram of a first electrode and a charge accumulation electrode constituting the imaging element of Example 6.
Figure 35:
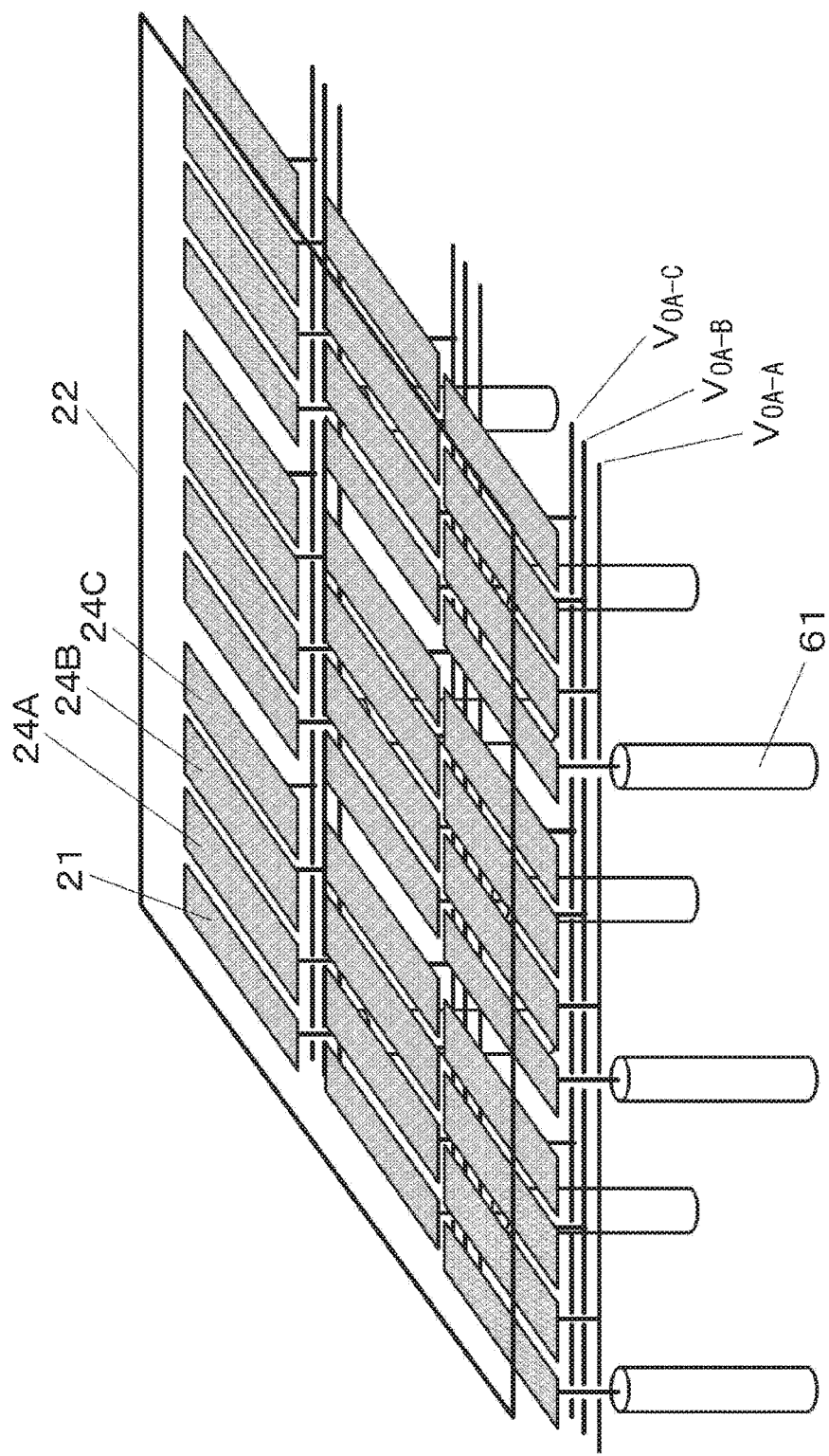
FIG. 35 is a schematic perspective view of a first electrode, a charge accumulation electrode, a second electrode, and a contact hole portion constituting the imaging element of Example 6.

FIG. 28 illustrates a schematic partial cross-sectional view of a part of the imaging element and the like of Example 6. FIGS. 29 and 30 illustrate an equivalent circuit diagram of the imaging element and the like of Example 6. FIG. 31 illustrates a schematic arrangement diagram of a first electrode and a charge accumulation electrode constituting a photoelectric conversion unit including a charge accumulation electrode of the imaging element and the like of Example 6, and a transistor constituting a control unit. FIGS. 32 and 33 schematically illustrate a potential state in each part during operation of the imaging element and the like of Example 6. FIG. 6C illustrates an equivalent circuit diagram for explaining each part of the imaging element and the like of Example 6. Furthermore, FIG. 34 illustrates a schematic arrangement diagram of the first electrode and the charge accumulation electrode constituting the photoelectric conversion unit including the charge accumulation electrode of the imaging element and the like of Example 6. FIG. 35 illustrates a schematic perspective view of the first electrode, the charge accumulation electrode, a second electrode, and a contact hole portion.

In Example 6, the charge accumulation electrode 24 includes a plurality of charge accumulation electrode segments 24A, 24B, and 24C. The number of charge accumulation electrode segments only needs to be two or more, and is set to "three" in Example 6. In addition, in the imaging element and the like of Example 6, the potential of the first electrode 21 is higher than the potential of the second electrode 22. Therefore, that is, for example, a positive potential is applied to the first electrode 21, and a negative potential is applied to the second electrode 22. In addition, in a charge transfer period, the potential applied to the charge accumulation electrode segment 24A located closest to the first electrode 21 is higher than the potential applied to the charge accumulation electrode segment 24C located farthest from the first electrode 21. In this way, by applying a potential gradient to the charge accumulation electrode 24, electrons that have stopped in the region of the composite oxide layer 23B and the like facing the charge accumulation electrode 24 are more reliably read out to the first electrode 21 and further to the first floating diffusion layer $FD_1$. That is, the charge accumulated in the composite oxide layer 23B and the like is read out to the control unit.

Figure 32:
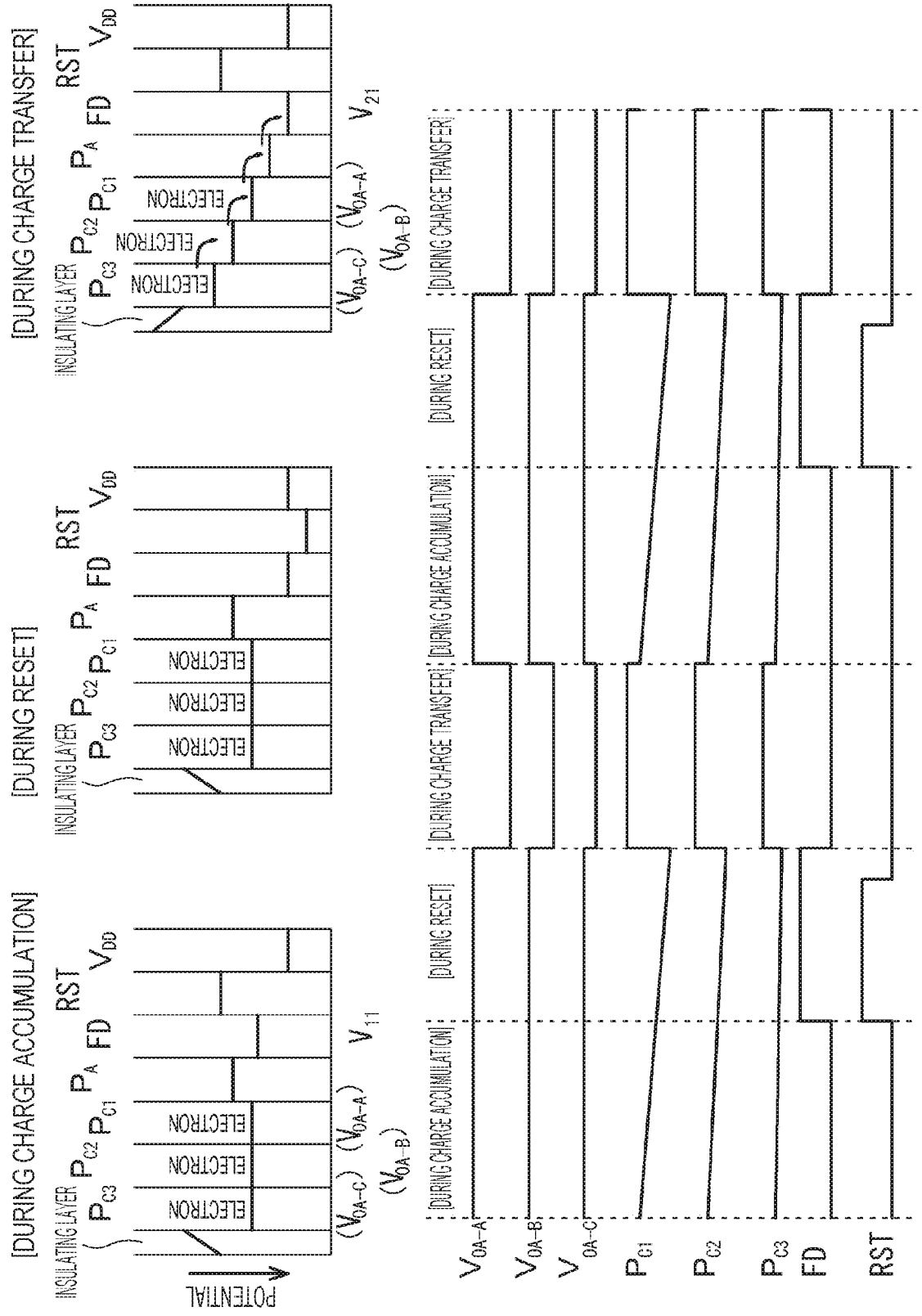
FIG. 32 is a diagram schematically illustrating a potential state at each part during an operation of the imaging element of Example 6.

In the example illustrated in FIG. 32, in a charge transfer period, by satisfying the potential of the charge accumulation electrode segment 24C<the potential of the charge accumulation electrode segment 24B<the potential of the charge accumulation electrode segment 24A, electrons that have stopped in the region of the composite oxide layer 23B and the like are read out to the first floating diffusion layer $FD_1$ all at once. Meanwhile, in the example illustrated in FIG. 33, in a charge transfer period, by gradually changing the potential of the charge accumulation electrode segment 24C, the potential of the charge accumulation electrode segment 24B, and the potential of the charge accumulation electrode segment 24A (that is, by changing the potential of the charge accumulation electrode segment 24C, the potential of the charge accumulation electrode segment 24B, and the potential of the charge accumulation electrode segment 24A in a step shape or a slope shape), electrons that have stopped in the region of the composite oxide layer 23B and the like facing the charge accumulation electrode segment 24C are transferred to the region of the composite oxide layer 23B and the like facing the charge accumulation electrode segment 24B. Subsequently, electrons that have stopped in the region of the composite oxide layer 23B and the like facing the charge accumulation electrode segment 24B are transferred to the region of the composite oxide layer 23B and the like facing the charge accumulation electrode segment 24A. Subsequently, electrons that have stopped in the region of the composite oxide layer 23B and the like facing the charge accumulation electrode segment 24A are reliably read out to the first floating diffusion layer $FD_1$.

Figure 36:
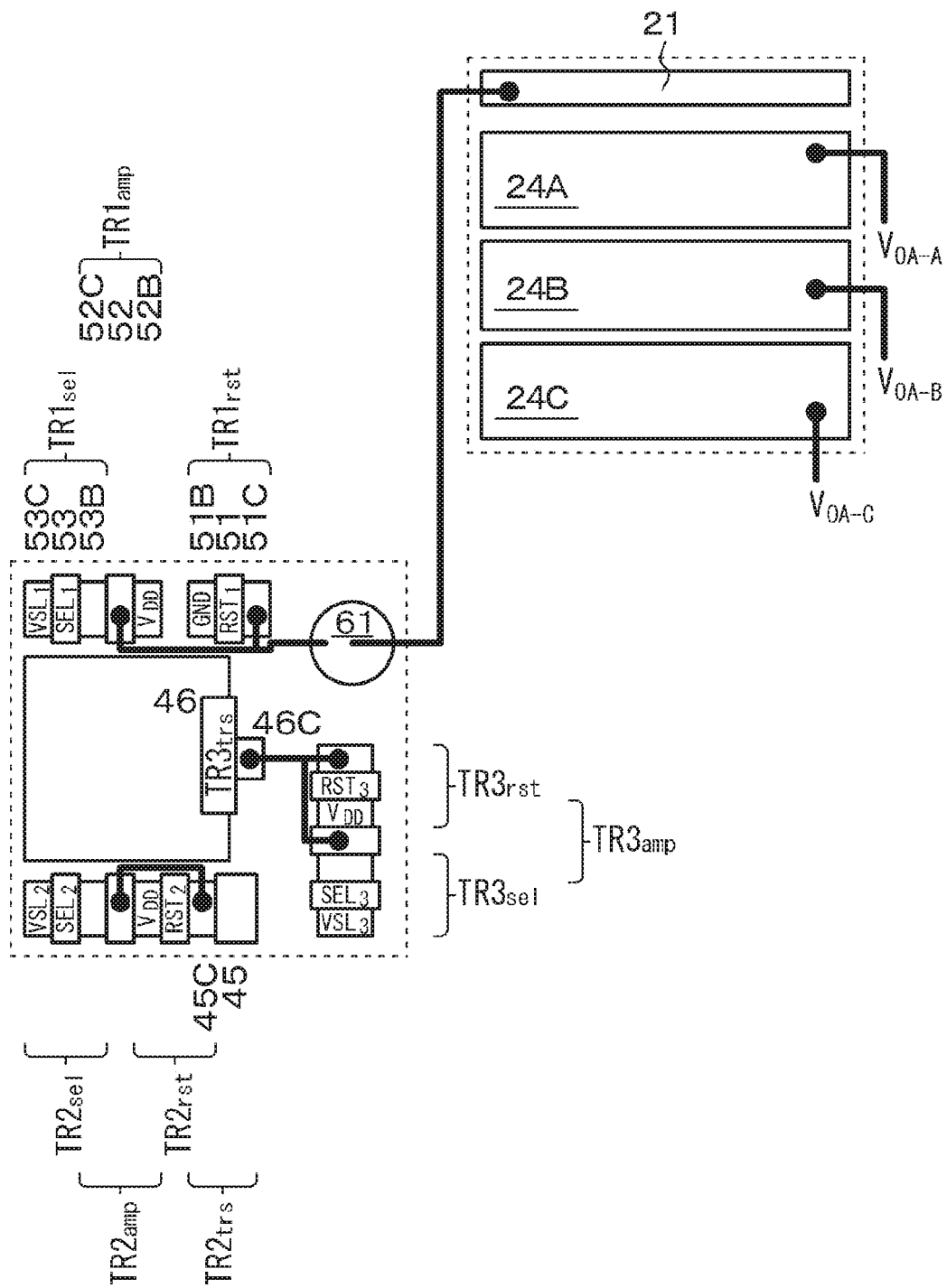
FIG. 36 is a schematic arrangement diagram of a first electrode and a charge accumulation electrode constituting a modification of the imaging element of Example 6.

As FIG. 36 illustrates a schematic arrangement diagram of the first electrode and the charge accumulation electrode constituting a modification of the imaging element and the like of Example 6, and a transistor constituting the control unit, the other source/drain region 51B of the reset transistor $TR1_{rst}$ may be grounded instead of being connected to the power source $V_{DD}$.

Example 7

Example 7 is a modification of Examples 1 to 6, and relates to the imaging elements of the first and sixth configurations.

Figure 37:
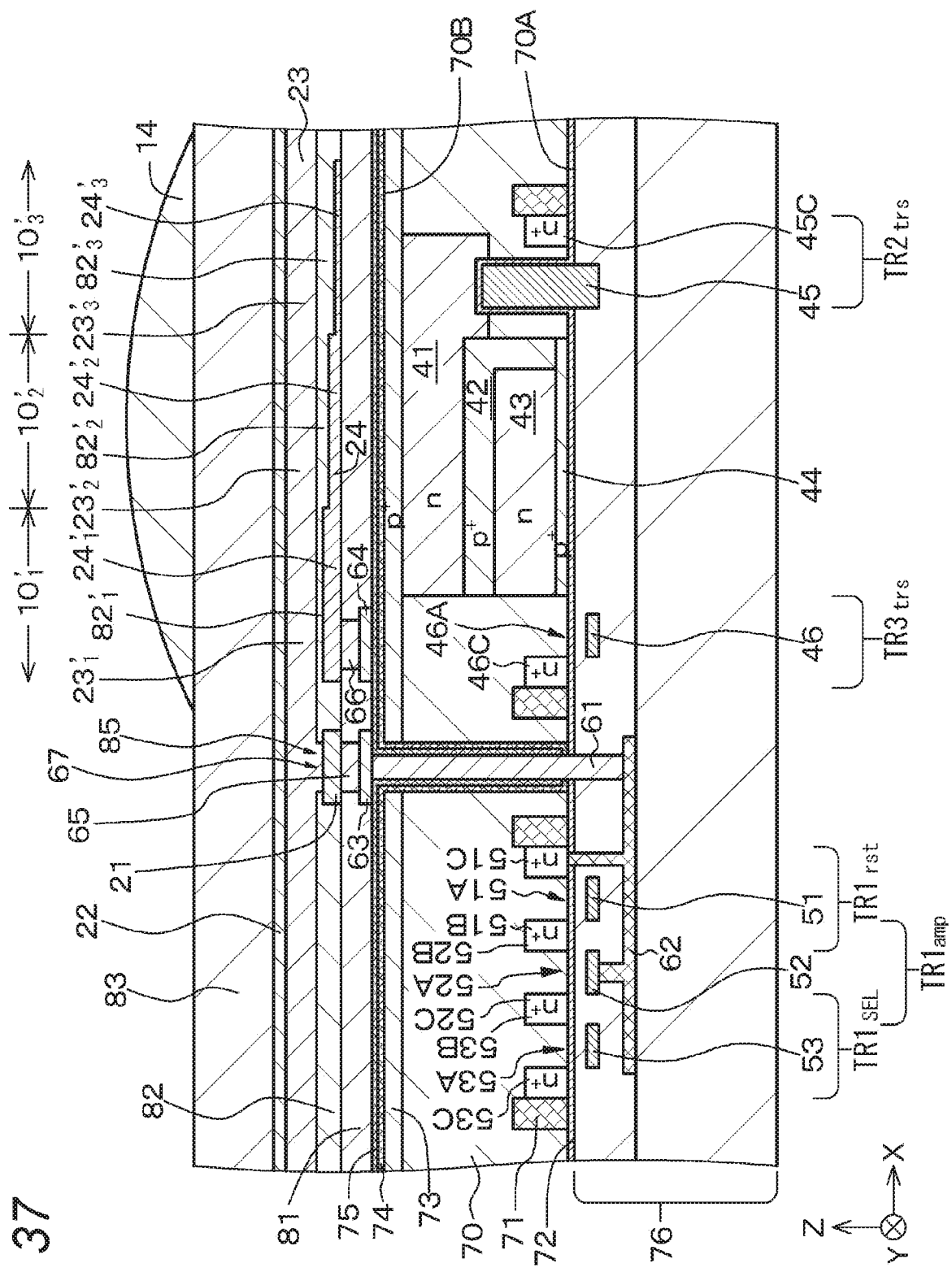
FIG. 37 is a schematic partial cross-sectional view of an imaging element of Example 7.
Figure 38:
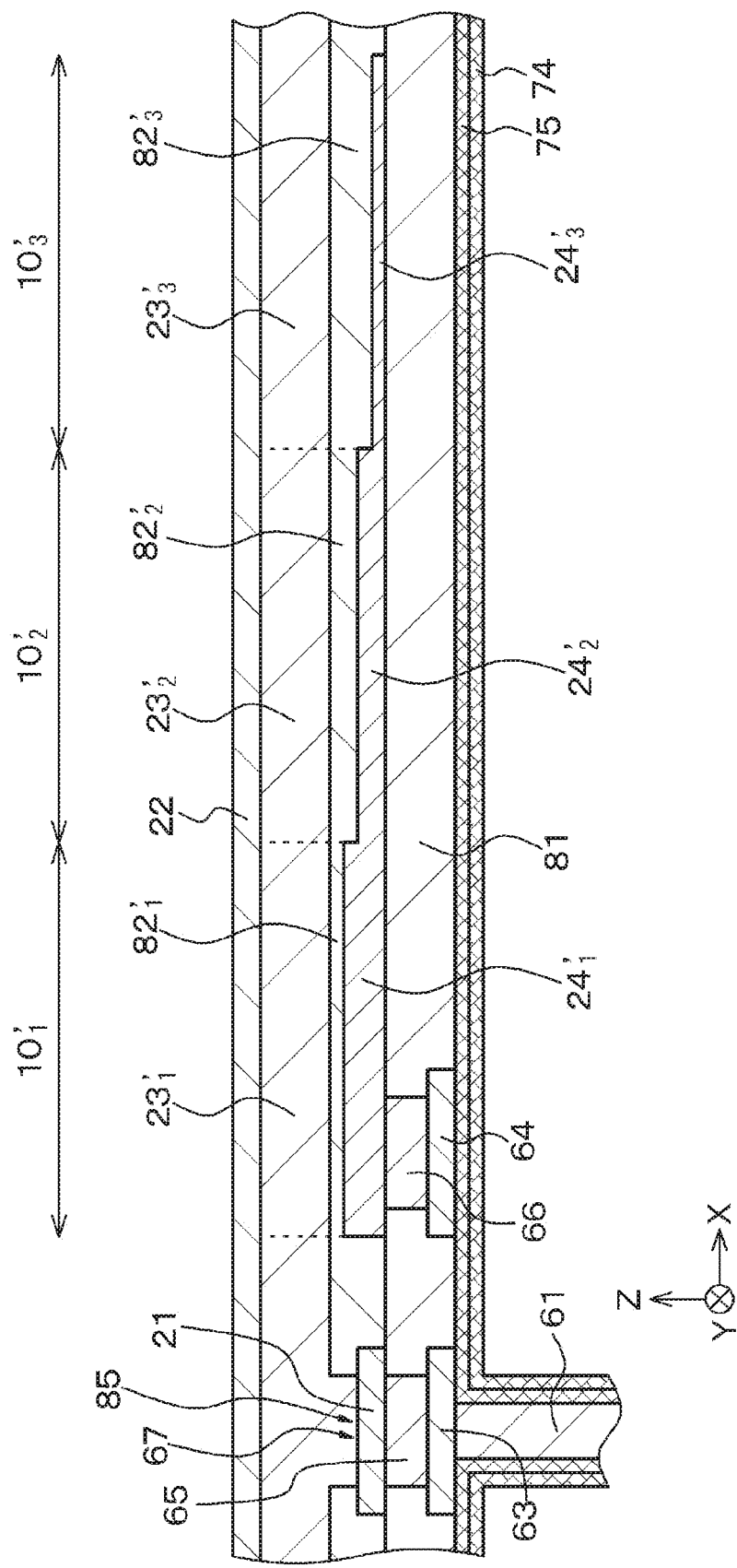
FIG. 38 is a schematic partial cross-sectional view obtained by enlarging a portion where a charge accumulation electrode, a photoelectric conversion layer, and a second electrode are laminated in the imaging element of Example 7.

FIG. 37 illustrates a schematic partial cross-sectional view of the imaging element and the like of Example 7. FIG. 38 illustrates a schematic partial cross-sectional view obtained by enlarging a portion where a charge accumulation electrode, a composite oxide layer, a photoelectric conversion layer, and a second electrode are laminated. The equivalent circuit diagram of the imaging element and the like of Example 7 is similar to the equivalent circuit diagram of the imaging element and the like of Example 1 described in FIGS. 2 and 3. The schematic arrangement diagram of the first electrode and the charge accumulation electrode constituting the photoelectric conversion unit including the charge accumulation electrode of the imaging element and the like of Example 7 and a transistor constituting a control unit is similar to that of the imaging element and the like of Example 1 described in FIG. 4. Moreover, the operation of the imaging element and the like (first imaging element) of Example 7 is substantially similar to the operation of the imaging element and the like of Example 1.

Here, in the imaging element and the like of Example 7 or the imaging elements and the like of Examples 8 to 12 described later, the photoelectric conversion unit includes N (where N≥2) photoelectric conversion unit segments (specifically, three photoelectric conversion unit segments $10'_1$, $10'_2$, and $10'_3$), the composite oxide layer 23B and the photoelectric conversion layer 23A include N photoelectric conversion layer segments (specifically, three photoelectric conversion layer segments $23'_1$, $23'_2$, and $23'_3$), the insulating layer 82 includes N insulating layer segments (specifically, three insulating layer segments $82'_1$, $82'_2$, and $82'_3$), in Examples 7 to 9, the charge accumulation electrode 24 includes N charge accumulation electrode segments (specifically, three charge accumulation electrode segments $24'_1$, $24'_2$, and $24'_3$ in each of the Examples), in Examples 10 and 11, in some cases, in Example 9, the charge accumulation electrode 24 includes N charge accumulation electrode segments (specifically, three charge accumulation electrode segments $24'_1$, $24'_2$, and $24'_3$) disposed apart from one another, the n-th (where n=1, 2, 3 . . . N) photoelectric conversion unit segment $10'_n$ includes the n-th charge accumulation electrode segment $24'_n$, the n-th insulating layer segment $82'_n$, and the n-th photoelectric conversion layer segment $23'_n$, and a photoelectric conversion unit segment with a larger value of n is located farther from the first electrode 21. Here, the photoelectric conversion layer segments $23'_1$, $23'_2$, and $23'_3$ indicate segments formed by laminating the composite oxide layer and the photoelectric conversion layer, and are expressed by one layer in the drawings for simplifying the drawings. This also applies to the following.

Note that in a photoelectric conversion layer segment, the thickness of the photoelectric conversion layer segment may be changed by changing the thickness of the photoelectric conversion layer portion and keeping the thickness of the composite oxide layer portion constant. Furthermore, the thickness of the photoelectric conversion layer segment may be changed by keeping the thickness of the photoelectric conversion layer portion constant and changing the thickness of the composite oxide layer portion. Furthermore, the thickness of the photoelectric conversion layer segment may be changed by changing the thickness of the photoelectric conversion layer portion and changing the thickness of the composite oxide layer portion.

Alternatively, the imaging element and the like of Example 7 or the imaging elements and the like of Examples 8 and 11 described later include, a photoelectric conversion unit formed by laminating the first electrode 21, the composite oxide layer 23B, the photoelectric conversion layer 23A, and the second electrode 22.

The photoelectric conversion unit further includes the charge accumulation electrode 24 disposed apart from the first electrode 21 so as to face the composite oxide layer 23B via the insulating layer 82.

If a lamination direction of the charge accumulation electrode 24, the insulating layer 82, the composite oxide layer 23B, and the photoelectric conversion layer 23A is defined as a Z direction, and a direction of separating from the first electrode 21 is defined as an X direction, when a laminated portion where the charge accumulation electrode 24, the insulating layer 82, the composite oxide layer 23B, and the photoelectric conversion layer 23A are laminated is cut with a YZ virtual plane, the cross-sectional area of the laminated portion changes depending on a distance from the first electrode.

Moreover, in the imaging element and the like of Example 7, the thickness of an insulating layer segment gradually changes from the first photoelectric conversion unit segment $10'_1$ to the N-th photoelectric conversion unit segment $10'_N$. Specifically, the thickness of an insulating layer segment gradually increases. Alternatively, in the imaging element and the like of Example 7, the width of the cross section of the laminated portion is constant, and the thickness of the cross section of the laminated portion, specifically, the thickness of an insulating layer segment gradually increases depending on a distance from the first electrode 21. Note that the thickness of an insulating layer segment increases stepwise. The thickness of the insulating layer segment $82'_n$ in the n-th photoelectric conversion unit segment $10'_n$ is constant. When the thickness of the insulating layer segment $82'_n$ in the n-th photoelectric conversion unit segment $10'_n$ is "1", examples of the thickness of the insulating layer segment $82'_{(n+1)}$ in the (n+1)-th photoelectric conversion unit segment $10'_{(n+1)}$ include 2 to 10, but are not limited to such values. In Example 7, by gradually reducing the thicknesses of the charge accumulation electrode segments $24'_1$, $24'_2$, and $24'_3$, the thicknesses of the insulating layer segments $82'_1$, $82'_2$, and $82'_3$ are gradually increased. The thicknesses of the photoelectric conversion layer segments $23'_1$, $23'_2$, and $23'_3$ are constant.

Hereinafter, the operation of the imaging element and the like of Example 7 will be described.

In a charge accumulation period, the potential $V_{11}$ is applied to the first electrode 21 and the potential $V_{12}$ is applied to the charge accumulation electrode 24 from a drive circuit. Photoelectric conversion occurs in the photoelectric conversion layer 23A by light incident on the photoelectric conversion layer 23A. Holes generated by the photoelectric conversion are sent from the second electrode 22 to a drive circuit via the wiring $V_{OU}$. Meanwhile, the potential of the first electrode 21 is set to be higher than the potential of the second electrode 22, that is, for example, a positive potential is applied to the first electrode 21, and a negative potential is applied to the second electrode 22. Therefore, $V_{12} \geq V_{11}$ is satisfied, preferably $V_{12} > V_{11}$ is satisfied. As a result, electrons generated by the photoelectric conversion 24 and stop in a region of the composite oxide layer 23B and the like facing the charge accumulation electrode 24. That is, charges are accumulated in the composite oxide layer 23B and the like.

Since $V_{12} > V_{11}$ is satisfied, electrons generated inside the photoelectric conversion layer 23A are not transferred toward the first electrode 21. As the time for the photoelectric conversion elapses, the potential in the region of the composite oxide layer 23B and the like facing the charge accumulation electrode 24 becomes a more negative value.

In the imaging element and the like of Example 7, the configuration is adopted in which the thickness of an insulating layer segment gradually increases. Therefore, when a state of $|V_{12}| \geq |V_{11}|$ is reached in a charge accumulation period, the n-th photoelectric conversion unit segment $10'_n$ can accumulate more charges than the (n+1)-th photoelectric conversion unit segment $10'_{(n+1)}$, a stronger electric field is applied to the n-th photoelectric conversion unit segment $10'_n$ than to the (n+1)-th photoelectric conversion unit segment $10'_{(n+1)}$, and a flow of charges from the first photoelectric conversion unit segment $10'_1$ to the first electrode 21 can be reliably prevented.

In a later stage of the charge accumulation period, a reset operation is performed. As a result, the potential of the first floating diffusion layer $FD_1$ is reset, and the potential of the first floating diffusion layer $FD_1$ becomes the potential $V_{DD}$ of the power source.

After the reset operation is completed, charges are read out. That is, in a charge transfer period, the potential $V_{21}$ is applied to the first electrode 21 and the potential $V_{22}$ is applied to the charge accumulation electrode 24 from a drive circuit. Here, $V_{21} > V_{22}$ is satisfied. As a result, electrons that have stopped in the region of the composite oxide layer 23B and the like facing the charge accumulation electrode 24 are read out to the first electrode 21 and further to the first floating diffusion layer $FD_1$. That is, the charge accumulated in the composite oxide layer 23B and the like is read out to the control unit.

More specifically, when a state of $V_{21} > V_{22}$ is reached in a charge transfer period, a flow of charges from the first photoelectric conversion unit segment $10'_1$ to the first electrode 21, and a flow of charges from the (n+1)-th photoelectric conversion unit segment $10'_{(n+1)}$ to the n-th photoelectric conversion unit segment $10'_n$ can be reliably ensured.

In this way, a series of operations including charge accumulation, reset operation, and charge transfer are completed.

In the imaging element and the like of Example 7, the thickness of an insulating layer segment gradually changes from the first photoelectric conversion unit segment to the N-th photoelectric conversion unit segment. Alternatively, when a laminated portion where the charge accumulation electrode, the insulating layer, the composite oxide layer, and the photoelectric conversion layer are laminated is cut with a YZ virtual plane, the cross-sectional area of the laminated portion changes depending on a distance from the first electrode. Therefore, a kind of charge transfer gradient is formed, and charges generated by photoelectric conversion can be transferred more easily and reliably.

Since the imaging element and the like of Example 7 can be manufactured by a substantially similar method to the imaging element and the like of Example 1, detailed description thereof is omitted.

Note that in the imaging element and the like of Example 7, in formation of the first electrode 21, the charge accumulation electrode 24, and the insulating layer 82, first, a conductive material layer for forming the charge accumulation electrode $24'_3$ is formed on the interlayer insulating layer 81. The conductive material layer is patterned to leave the conductive material layer in a region where the photoelectric conversion unit segments $10'_1$, $10'_2$, and $10'_3$ and the first electrode 21 are to be formed. Thus, a part of the first electrode 21 and the charge accumulation electrode $24'_3$ can be obtained. Next, an insulating layer for forming the insulating layer segment $82'_3$ is formed on the entire surface. The insulating layer is patterned and planarized to obtain the insulating layer segment $82'_3$. Next, a conductive material layer for forming the charge accumulation electrode $24'_2$ is formed on the entire surface. The conductive material layer is patterned to leave the conductive material layer in a region where the photoelectric conversion unit segments $10'_1$ and $10'_2$ and the first electrode 21 are to be formed. Thus, a part of the first electrode 21 and the charge accumulation electrode $24'_2$ can be obtained. Next, an insulating layer for forming the insulating layer segment $82'_2$ is formed on the entire surface. The insulating layer is patterned and planarized to obtain the insulating layer segment $82'_2$. Next, a conductive material layer for forming the charge accumulation electrode $24'_1$ is formed on the entire surface. The conductive material layer is patterned to leave the conductive material layer in a region where the photoelectric conversion unit segment $10'_1$ and the first electrode 21 are to be formed. Thus, the first electrode 21 and the charge accumulation electrode $24'_1$ can be obtained. Next, an insulating layer is formed on the entire surface. The insulating layer is planarized to obtain the insulating layer segment $82'_1$ (insulating layer 82). Then, the composite oxide layer 23B and the photoelectric conversion layer 23A are formed on the insulating layer 82. In this way, the photoelectric conversion unit segments $10'_1$, $10'_2$, and $10'_3$ can be obtained.

Figure 39:
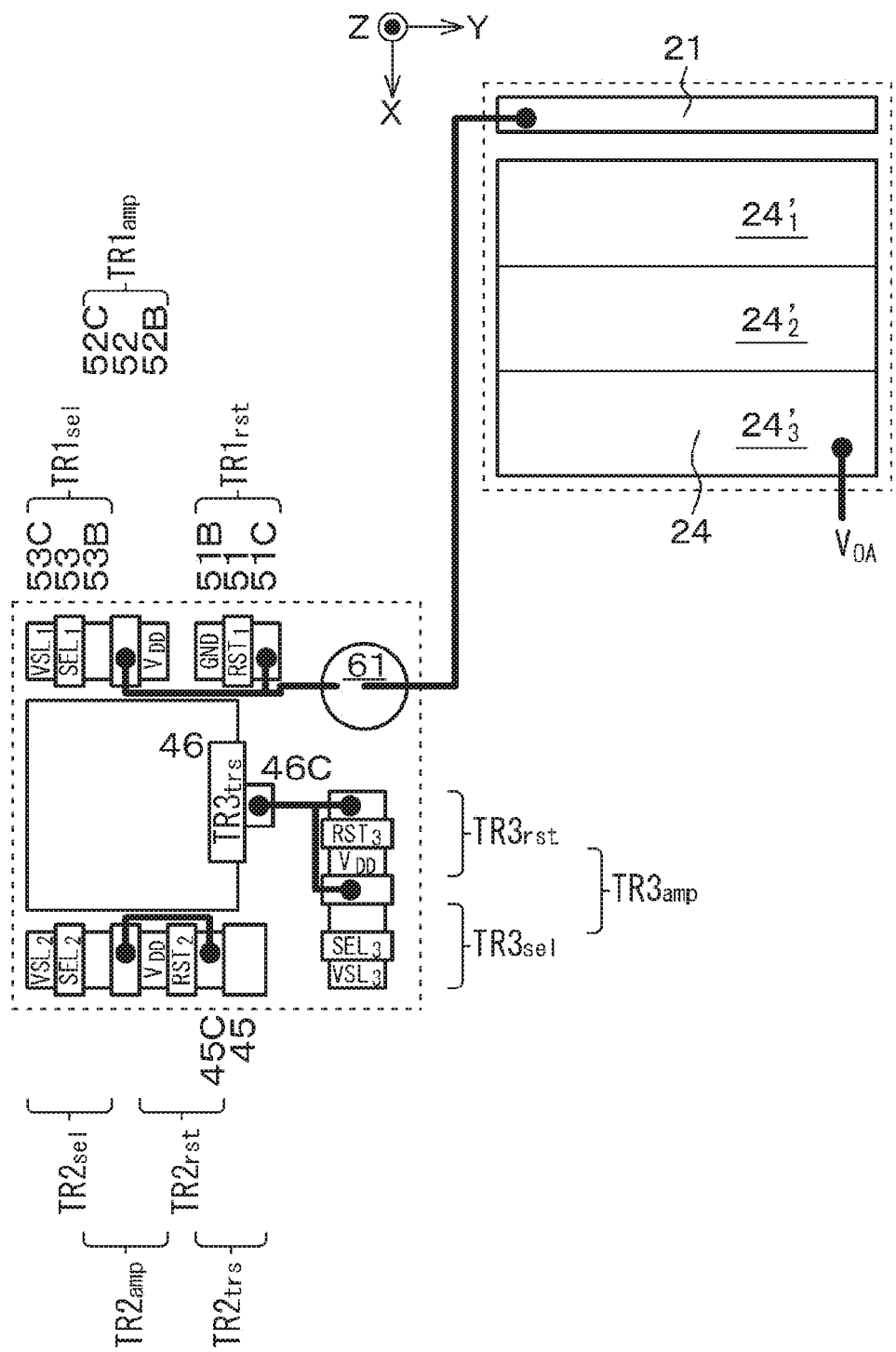
FIG. 39 is a schematic arrangement diagram of a first electrode and a charge accumulation electrode constituting a modification of the imaging element of Example 7, and a transistor constituting a control unit.

As FIG. 39 illustrates a schematic arrangement diagram of the first electrode and the charge accumulation electrode constituting a modification of the imaging element and the like of Example 7, and a transistor constituting the control unit, the other source/drain region 51B of the reset transistor $TR1_{rst}$ may be grounded instead of being connected to the power source $V_{DD}$.

Example 8

Figure 40:
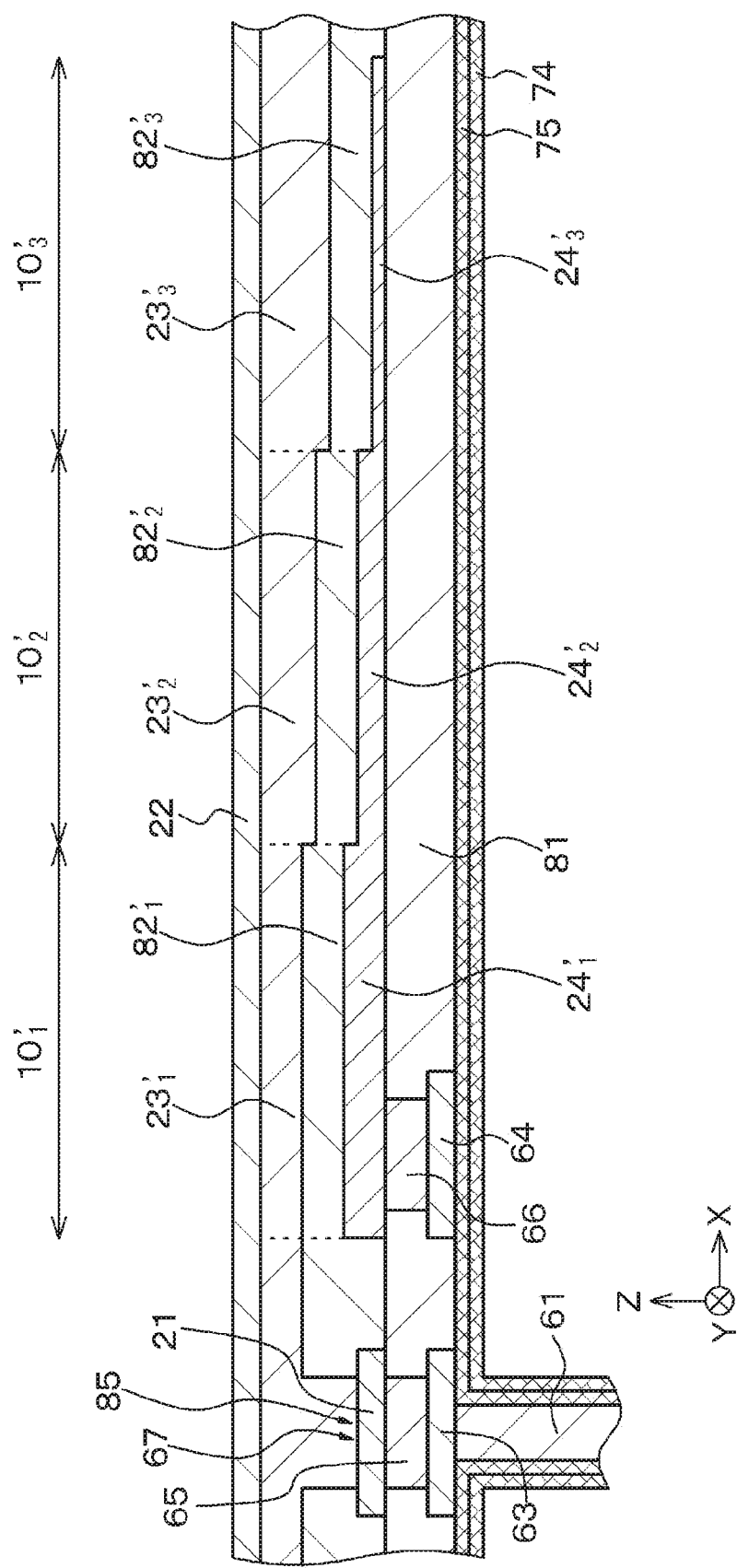
FIG. 40 is a schematic partial cross-sectional view obtained by enlarging a portion where a charge accumulation electrode, a photoelectric conversion layer, and a second electrode are laminated in an imaging element of Example 8.

The imaging element and the like of Example 8 relate to the imaging elements of the second and sixth configurations of the present disclosure. As FIG. 40 illustrates a schematic partial cross-sectional view in which a portion where the charge accumulation electrode, the composite oxide layer, the photoelectric conversion layer, and the second electrode are laminated is enlarged, in the imaging element and the like of Example 8, the thickness of a photoelectric conversion layer segment gradually changes from the first photoelectric conversion unit segment $10'_1$ to the N-th photoelectric conversion unit segment $10'_N$. Alternatively, in the imaging element and the like of Example 8, the width of the cross section of the laminated portion is constant, and the thickness of the cross section of the laminated portion, specifically, the thickness of a photoelectric conversion layer segment gradually increases depending on a distance from the first electrode 21. More specifically, the thickness of a photoelectric conversion layer segment gradually increases. Note that the thickness of a photoelectric conversion layer segment increases stepwise. The thickness of the photoelectric conversion layer segment $23'_n$ in the n-th photoelectric conversion unit segment $10'_n$ is constant. When the thickness of the photoelectric conversion layer segment $23'_n$ in the n-th photoelectric conversion unit segment $10'_n$ is "1", examples of the photoelectric conversion layer segment $23'_{(n+1)}$ in the (n+1)-th photoelectric conversion unit segment $10'_{(n+1)}$ include 2 to 10, but are not limited to such values. In Example 8, by gradually reducing the thicknesses of the charge accumulation electrode segments $24'_1$, $24'_2$, and $24'_3$, the thicknesses of the photoelectric conversion layer segments $23'_1$, $23'_2$, and $23'_3$ are gradually increased. The thicknesses of the insulating layer segments $82'_1$, $82'_2$, and $82'_3$ are constant. Furthermore, in a photoelectric conversion layer segment, it is only required to change the thickness of the photoelectric conversion layer segment, for example, by changing the thickness of the portion of the photoelectric conversion layer while the thickness of the portion of the composite oxide layer is constant.

In the imaging element and the like of Example 8, the thickness of a photoelectric conversion layer segment gradually increases. Therefore, when a state of $|V_{12}| \geq |V_{11}|$ is reached in a charge accumulation period, a stronger electric field is applied to the n-th photoelectric conversion unit segment $10'_n$ than to the (n+1)-th photoelectric conversion unit segment $10'_{(n+1)}$, and a flow of charges from the first photoelectric conversion unit segment $10'_1$ to the first electrode 21 can be reliably prevented. Then, when a state of $V_{22} < V_{21}$ is reached in a charge transfer period, a flow of charges from the first photoelectric conversion unit segment $10'_1$ to the first electrode 21, and a flow of charges from the (n+1)-th photoelectric conversion unit segment $10'_{(n+1)}$ to the n-th photoelectric conversion unit segment $10'_n$ can be reliably ensured.

In this way, in the imaging element and the like of Example 8, the thickness of a photoelectric conversion layer segment gradually changes from the first photoelectric conversion unit segment to the N-th photoelectric conversion unit segment. Alternatively, when a laminated portion where the charge accumulation electrode, the insulating layer, the composite oxide layer, and the photoelectric conversion layer are laminated is cut with a YZ virtual plane, the cross-sectional area of the laminated portion changes depending on a distance from the first electrode. Therefore, a kind of charge transfer gradient is formed, and charges generated by photoelectric conversion can be transferred more easily and reliably.

In the imaging element and the like of Example 8, in formation of the first electrode 21, the charge accumulation electrode 24, the insulating layer 82, the composite oxide layer 23B, and the photoelectric conversion layer 23A, first, a conductive material layer for forming the charge accumulation electrode $24'_3$ is formed on the interlayer insulating layer 81. The conductive material layer is patterned to leave the conductive material layer in a region where the photoelectric conversion unit segments $10'_1$, $10'_2$, and $10'_3$ and the first electrode 21 are to be formed. Thus, a part of the first electrode 21 and the charge accumulation electrode $24'_3$ can be obtained. Subsequently, a conductive material layer for forming the charge accumulation electrode $24'_2$ is formed on the entire surface. The conductive material layer is patterned to leave the conductive material layer in a region where the photoelectric conversion unit segments $10'_1$ and $10'_2$ and the first electrode 21 are to be formed. Thus, a part of the first electrode 21 and the charge accumulation electrode $24'_2$ can be obtained. Subsequently, a conductive material layer for forming the charge accumulation electrode $24'_1$ is formed on the entire surface. The conductive material layer is patterned to leave the conductive material layer in a region where the photoelectric conversion unit segment $10'_1$ and the first electrode 21 are to be formed. Thus, the first electrode 21 and the charge accumulation electrode $24'_1$ can be obtained. Next, the insulating layer 82 is conformally formed on the entire surface. Then, the composite oxide layer 23B and the photoelectric conversion layer 23A are formed on the insulating layer 82, and the photoelectric conversion layer 23A is planarized. In this way, the photoelectric conversion unit segments $10'_1$, $10'_2$, and $10'_3$ can be obtained.

Example 9

Figure 41:
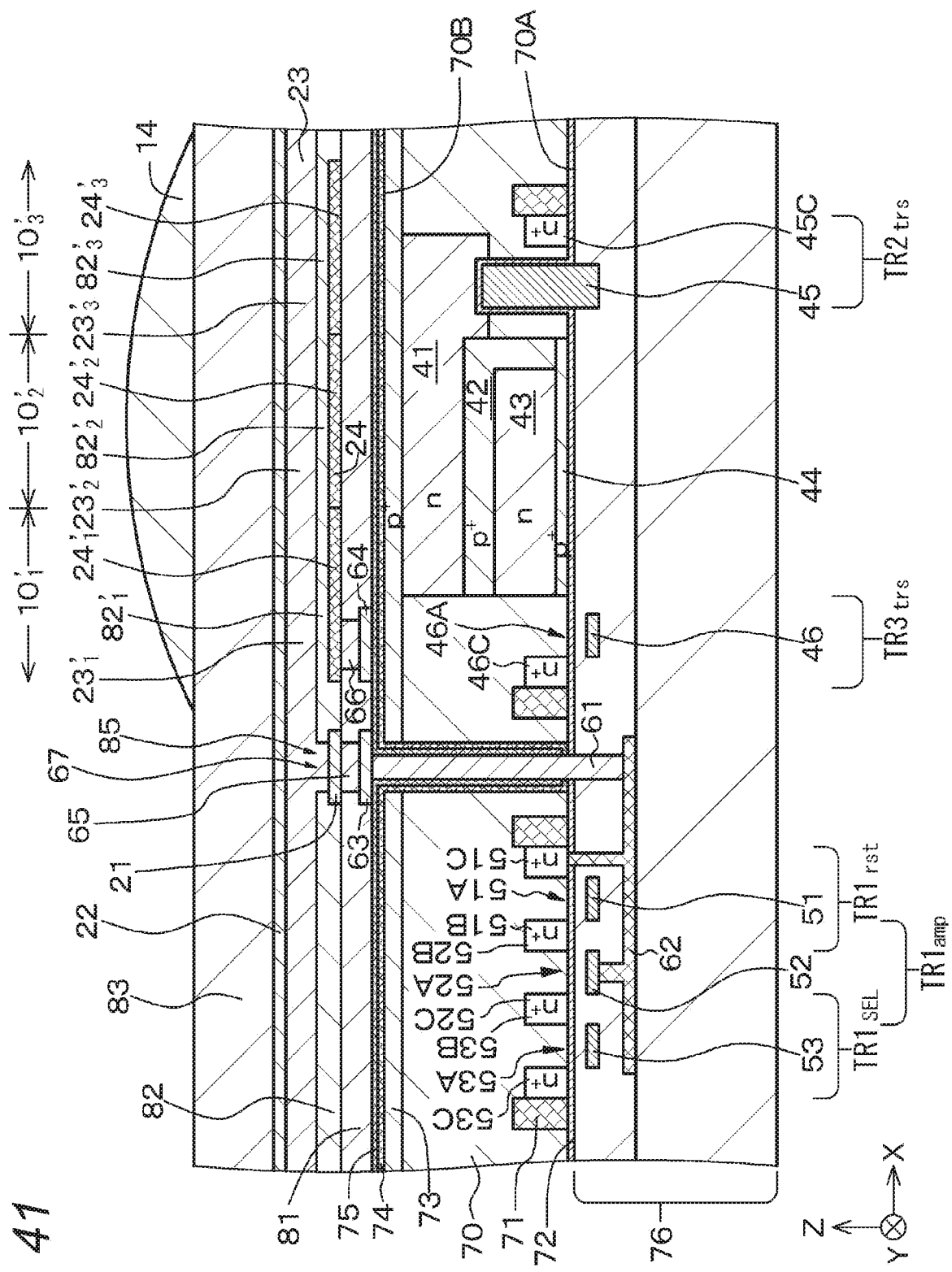
FIG. 41 is a schematic partial cross-sectional view of an imaging element of Example 9.

Example 9 relates to the imaging element of the third configuration. FIG. 41 illustrates a schematic partial cross-sectional view of the imaging element and the like of Example 9. In the imaging element and the like of Example 9, materials constituting an insulating layer segment are different between adjacent photoelectric conversion unit segments. Here, a value of the relative dielectric constant of a material constituting an insulating layer segment is gradually reduced from the first photoelectric conversion unit segment $10'_1$ to the N-th photoelectric conversion unit segment $10'_N$. In the imaging element and the like of Example 9, the same potential may be applied to all the N charge accumulation electrode segments, or different potentials may be applied to the respective N charge accumulation electrode segments. In the latter case, as described in Example 10, the charge accumulation electrode segments $24'_1$, $24'_2$, and $24'_3$ disposed apart from one another only need to be connected to the vertical drive circuit 112 constituting a drive circuit via pad portions $64_1$, $64_2$, and $64_3$.

Then, by adopting such a configuration, a kind of charge transfer gradient is formed. In a charge accumulation period, when a state of $V_{12} \geq V_{11}$ is reached, the n-th photoelectric conversion unit segment can accumulate more charges than the (n+1)-th photoelectric conversion unit segment. Then, when a state of $V_{22} < V_{21}$ is reached in a charge transfer period, a flow of charges from the first photoelectric conversion unit segment to the first electrode, and a flow of charges from the (n+1)-th photoelectric conversion unit segment to the n-th photoelectric conversion unit segment can be reliably ensured.

Example 10

Figure 42:
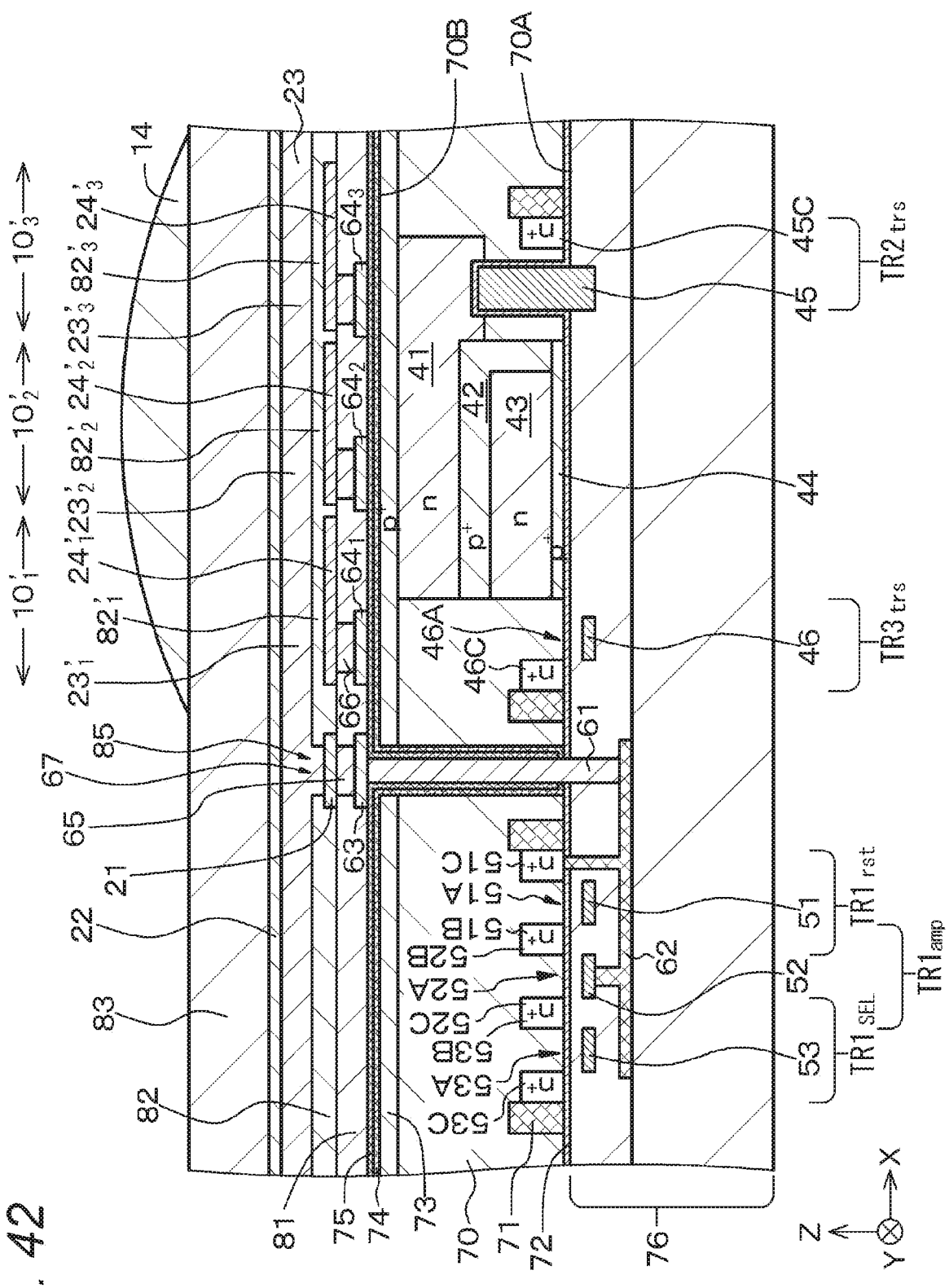
FIG. 42 is a schematic partial cross-sectional view of an imaging element of Examples 10 and 11.
Figure 43A:
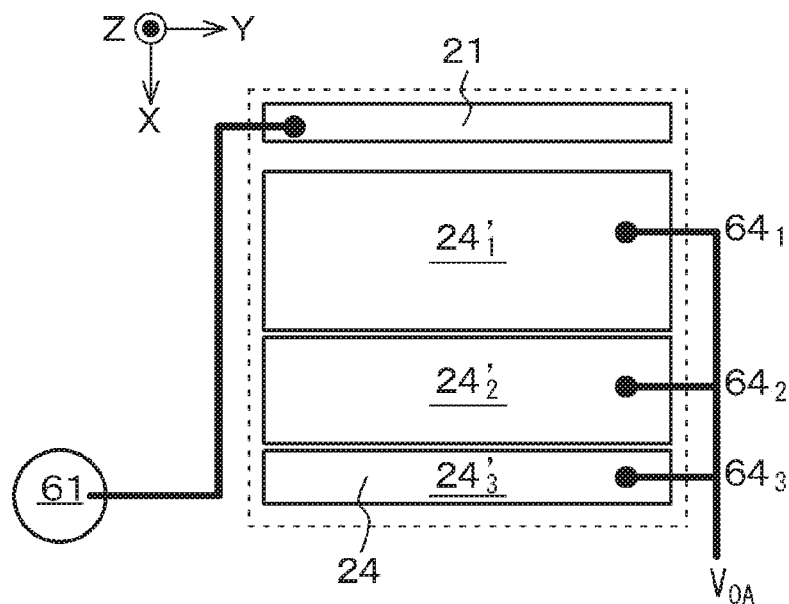
FIGS. 43A and 43B are schematic plan views of charge accumulation electrode segments in Example 11.
Figure 43B:
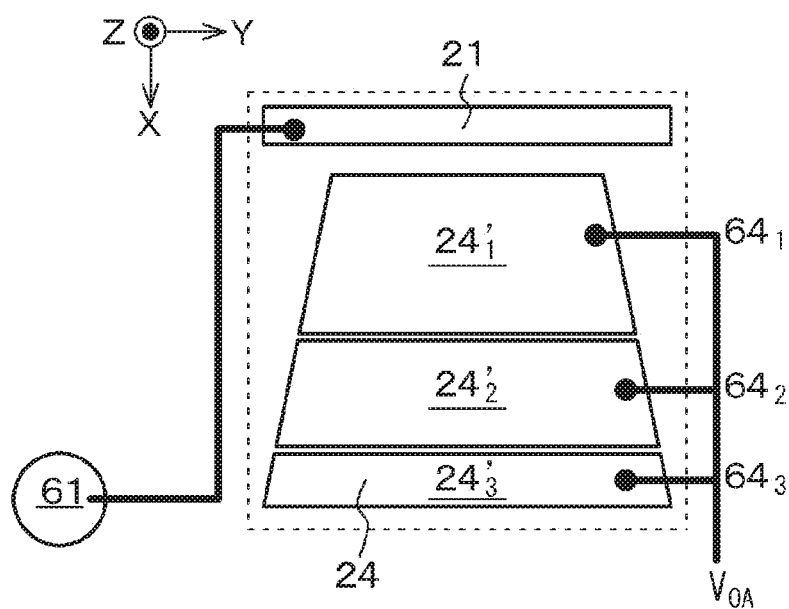
Figure 44A:
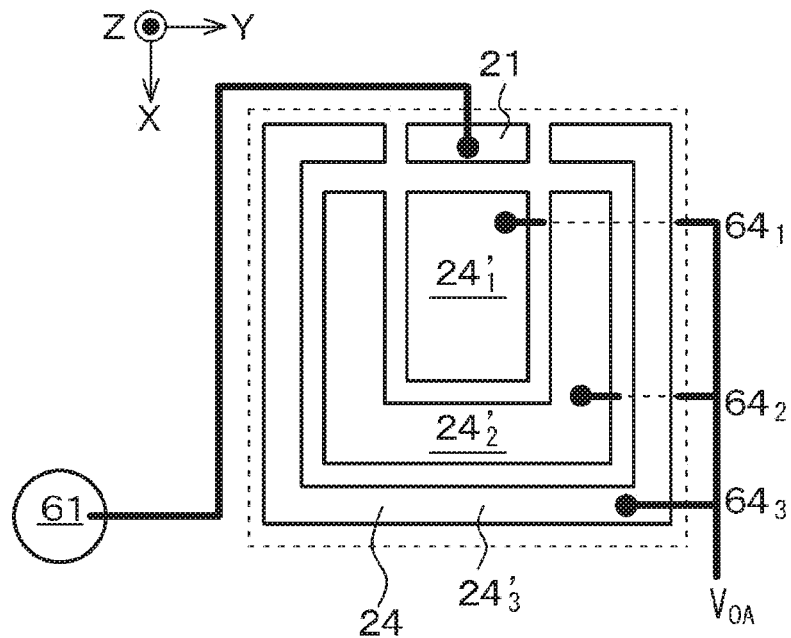
FIGS. 44A and 44B are schematic plan views of charge accumulation electrode segments in Example 11.
Figure 44B:
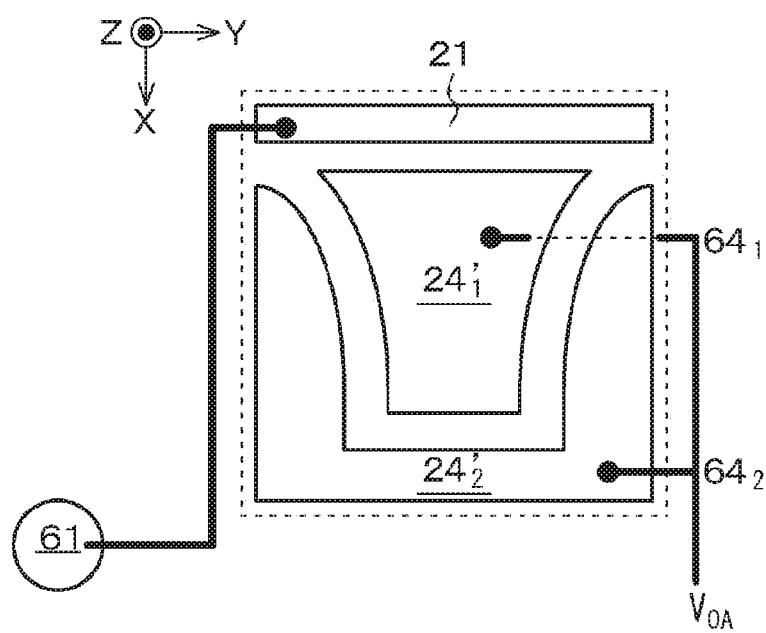

Example 10 relates to the imaging element of the fourth configuration. FIG. 42 illustrates a schematic partial cross-sectional view of the imaging element and the like of Example 10. In the imaging element and the like of Example 10, materials constituting a charge accumulation electrode segment are different between adjacent photoelectric conversion unit segments. Here, a value of work function of a material constituting an insulating layer segment is gradually increased from the first photoelectric conversion unit segment $10'_1$ to the N-th photoelectric conversion unit segment $10'_N$. In the imaging element and the like of Example 10, the same potential may be applied to all the N charge accumulation electrode segments, or different potentials may be applied to the respective N charge accumulation electrode segments. In the latter case, the charge accumulation electrode segments $24'_1$, $24'_2$, and $24'_3$ are connected to the vertical drive circuit 112 constituting a drive circuit via pad portions $64_1$, $64_2$, and $64_3$.

Example 11

Figure 45:
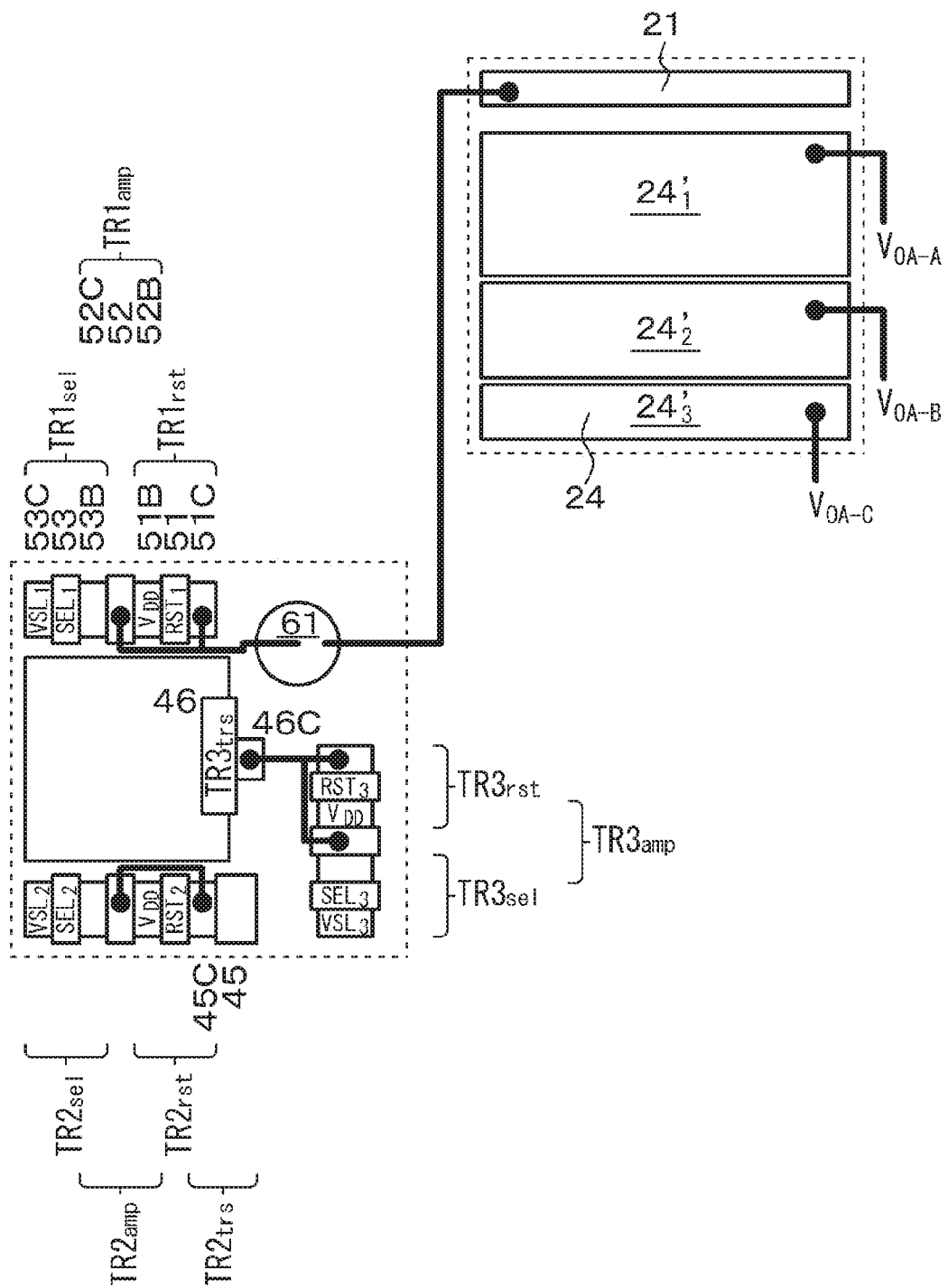
FIG. 45 is a schematic arrangement diagram of a first electrode and a charge accumulation electrode constituting the imaging element of Example 11, and a transistor constituting a control unit.

The imaging element and the like of Example 11 relate to the imaging element of the fifth configuration. FIGS. 43A, 43B, 44A, and 44B illustrate schematic plan views of charge accumulation electrode segments in Example 11. FIG. 45 illustrates a schematic arrangement diagram of the first electrode and the charge accumulation electrode constituting the photoelectric conversion unit including the charge accumulation electrode of the imaging element and the like of Example 11, and a transistor constituting the control unit. A schematic partial cross-sectional view of the imaging element and the like of Example 11 is similar to that illustrated in FIG. 42 or 47. In the imaging element and the like of Example 11, the area of the charge accumulation electrode segment is gradually reduced from the first photoelectric conversion unit segment $10'_1$ to the N-th photoelectric conversion unit segment $10'_N$. In the imaging element and the like of Example 11, the same potential may be applied to all the N charge accumulation electrode segments, or different potentials may be applied to the respective N charge accumulation electrode segments. Specifically, as described in Example 10, the charge accumulation electrode segments $24'_1$, $24'_2$, and $24'_3$ disposed apart from one another only need to be connected to the vertical drive circuit 112 constituting a drive circuit via pad portions $64_1$, $64_2$, and $64_3$.

In Example 11, the charge accumulation electrode 24 includes a plurality of charge accumulation electrode segments $24'_1$, $24'_2$, and $24'_3$. The number of charge accumulation electrode segments only needs to be two or more, and is set to "three" in Example 11. In addition, in the imaging element and the like of Example 11, the potential of the first electrode 21 is higher than the potential of the second electrode 22. Therefore, that is, for example, a positive potential is applied to the first electrode 21, and a negative potential is applied to the second electrode 22. Therefore, in a charge transfer period, the potential applied to the charge accumulation electrode segment $24'_1$ located closest to the first electrode 21 is higher than the potential applied to the charge accumulation electrode segment $24'_3$ located farthest from the first electrode 21. In this way, by applying a potential gradient to the charge accumulation electrode 24, electrons that have stopped in the region of the composite oxide layer 23B and the like facing the charge accumulation electrode 24 are more reliably read out to the first electrode 21 and further to the first floating diffusion layer $FD_1$. That is, the charge accumulated in the composite oxide layer 23B and the like is read out to the control unit.

Then, in a charge transfer period, by satisfying the potential of the charge accumulation electrode segment $24'_3$ < the potential of the charge accumulation electrode segment $24'_2$ < the potential of the charge accumulation electrode segment $24'_1$, electrons that have stopped in the region of the composite oxide layer 23B and the like can be read out to the first floating diffusion layer $FD_1$ all at once. Meanwhile, in a charge transfer period, by gradually changing the potential of the charge accumulation electrode segment $24'_3$, the potential of the charge accumulation electrode segment $24'_2$, and the potential of the charge accumulation electrode segment $24'_1$ (that is, by changing the potential of the charge accumulation electrode segment $24'_3$, the potential of the charge accumulation electrode segment $24'_2$, and the potential of the charge accumulation electrode segment $24'_1$ in a step shape or a slope shape), electrons that have stopped in the region of the composite oxide layer 23B and the like facing the charge accumulation electrode segment $24'_3$ can be transferred to the region of the composite oxide layer 23B and the like facing the charge accumulation electrode segment $24'_2$. Subsequently, electrons that have stopped in the region of the composite oxide layer 23B and the like facing the charge accumulation electrode segment $24'_2$ can be transferred to the region of the composite oxide layer 23B and the like facing the charge accumulation electrode segment $24'_1$. Subsequently, electrons that have stopped in the region of the composite oxide layer 23B and the like facing the charge accumulation electrode segment $24'_1$ can be reliably read out to the first floating diffusion layer $FD_1$.

Figure 46:
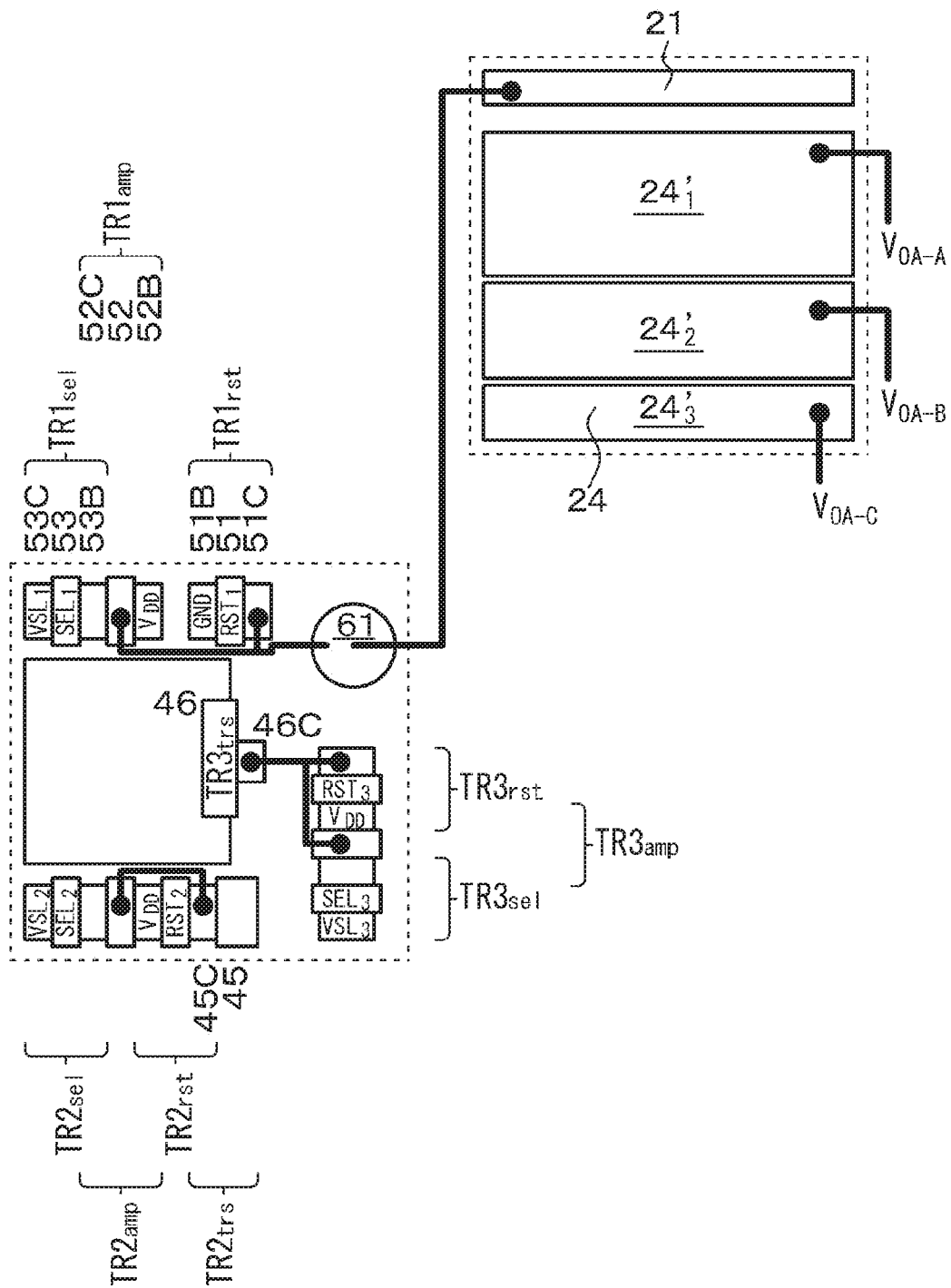
FIG. 46 is a schematic arrangement diagram of a first electrode and a charge accumulation electrode constituting a modification of the imaging element of Example 11.

As FIG. 46 illustrates a schematic arrangement diagram of the first electrode and the charge accumulation electrode constituting a modification of the imaging element and the like of Example 11, and a transistor constituting the control unit, the other source/drain region 51B of the reset transistor $TR3_{rst}$ may be grounded instead of being connected to the power source $V_{DD}$.

Also in the imaging element and the like of Example 11, by adopting such a configuration, a kind of charge transfer gradient is formed. That is, the area of a charge accumulation electrode segment is gradually reduced from the first photoelectric conversion unit segment $10'_1$ to the N-th photoelectric conversion unit segment $10'_N$. Therefore, when a state of $V_{12} \geq V_{11}$ is reached in a charge accumulation period, the n-th photoelectric conversion unit segment can accumulate more charges than the (n+1)-th photoelectric conversion unit segment. Then, when a state of $V_{22} < V_{21}$ is reached in a charge transfer period, a flow of charges from the first photoelectric conversion unit segment to the first electrode, and a flow of charges from the (n+1)-th photoelectric conversion unit segment to the n-th photoelectric conversion unit segment can be reliably ensured.

Example 12

Figure 47:
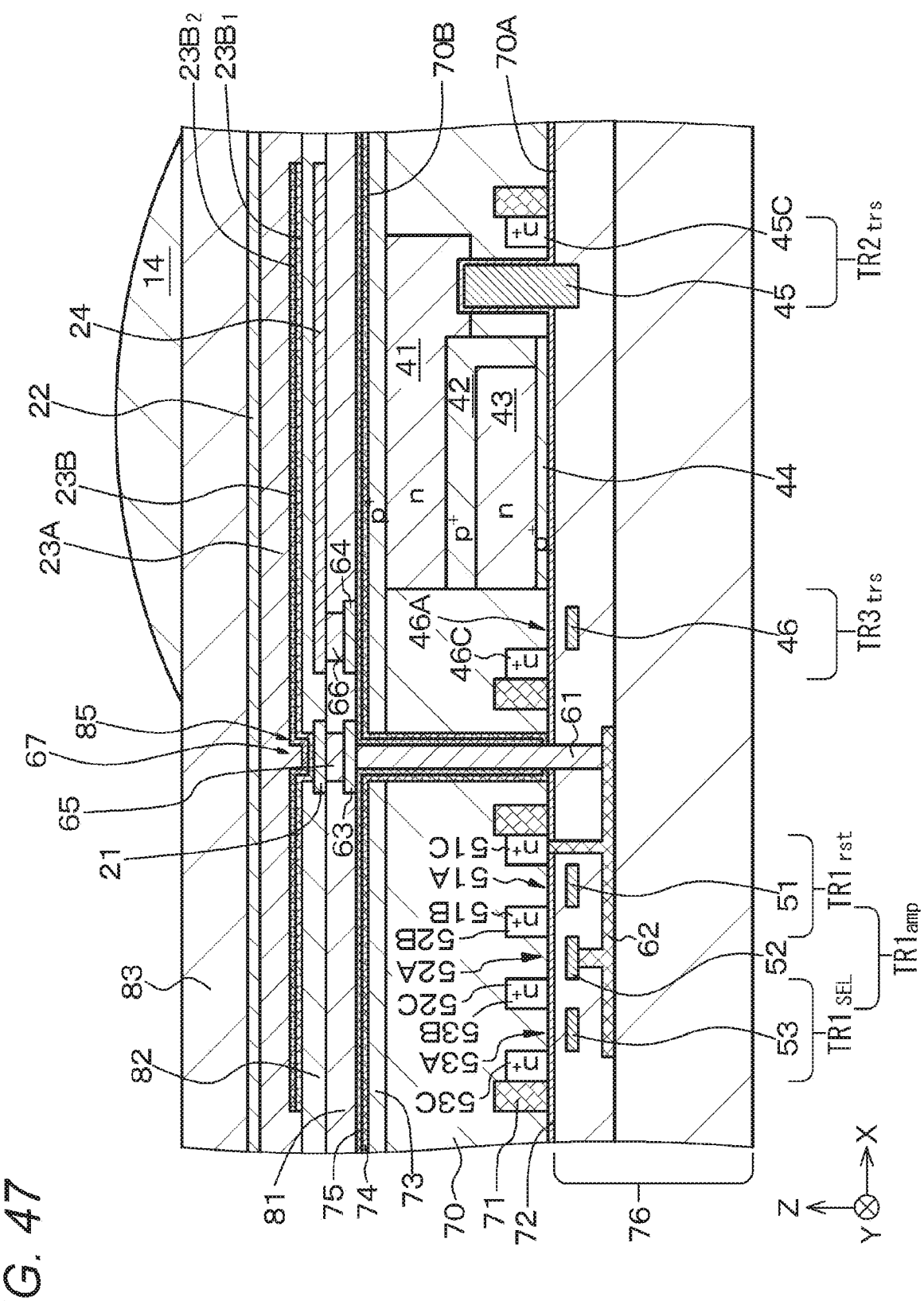
FIG. 47 is a schematic partial cross-sectional view of an imaging element of Examples 12 and 11.
Figure 48A:
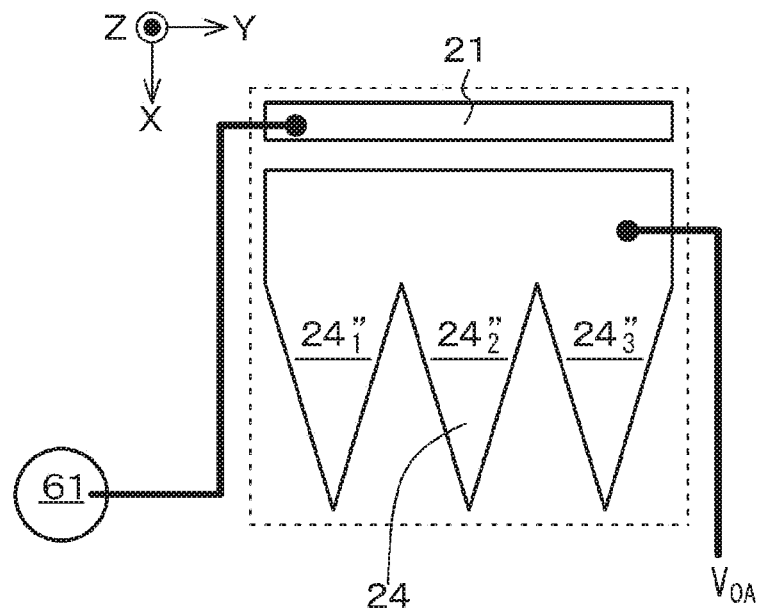
FIGS. 48A and 48B are schematic plan views of charge accumulation electrode segments in Example 12.
Figure 48B:
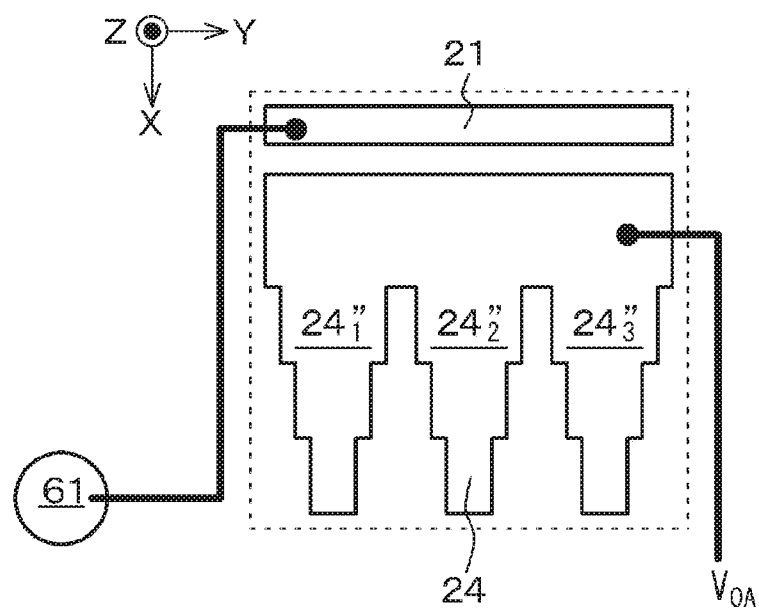

Example 12 relates to the imaging element of the sixth configuration. FIG. 47 illustrates a schematic partial cross-sectional view of the imaging element and the like of Example 12. Furthermore, FIGS. 48A and 48B illustrate schematic plan views of charge accumulation electrode segments in Example 12. The imaging element and the like of Example 12 include a photoelectric conversion unit formed by laminating the first electrode 21, the composite oxide layer 23B, the photoelectric conversion layer 23A, and the second electrode 22.

The photoelectric conversion unit further includes the charge accumulation electrode 24 ($24''_1$, $24''_2$, and $24''_3$) disposed apart from the first electrode 21 so as to face the composite oxide layer 23B via the insulating layer 82. In addition, if a lamination direction of the charge accumulation electrode 24 ($24''_1$, $24''_2$, and $24''_3$), the insulating layer 82, the composite oxide layer 23B, and the photoelectric conversion layer 23A is defined as a Z direction, and a direction of separating from the first electrode 21 is defined as an X direction, when a laminated portion where the charge accumulation electrode 24 ($24''_1$, $24''_2$, and $24''_3$), the insulating layer 82, the composite oxide layer 23B, and the photoelectric conversion layer 23A are laminated is cut with a YZ virtual plane, the cross-sectional area of the laminated portion changes depending on a distance from the first electrode 21.

Specifically, in the imaging element and the like of Example 12, the thickness of the cross section of the laminated portion is constant, and the width of the cross section of the laminated portion becomes narrower as the laminated portion goes away from the first electrode 21. Note that the width may be continuously narrowed (see FIG. 48A), or may be narrowed stepwise (see FIG. 48B).

In this way, in the imaging element and the like of Example 12, when a laminated portion where the charge accumulation electrode 24 ($24''_1$, $24''_2$, and $24''_3$), the insulating layer 82, and the photoelectric conversion layer 23A are laminated is cut with a YZ virtual plane, the cross-sectional area of the laminated portion changes depending on a distance from the first electrode. Therefore, a kind of charge transfer gradient is formed, and charges generated by photoelectric conversion can be transferred more easily and reliably.

Example 13

Example 13 relates to solid-state imaging devices of first and second configurations.

The solid-state imaging device of Example 13 includes a photoelectric conversion unit formed by laminating the first electrode 21, the composite oxide layer 23B, the photoelectric conversion layer 23A, and the second electrode 22.

The solid-state imaging device of Example 13 includes a plurality of imaging elements in each of which the photoelectric conversion unit further includes the charge accumulation electrode 24 disposed apart from the first electrode 21 so as to face the composite oxide layer 23B via the insulating layer 82.

The plurality of imaging elements constitutes an imaging element block.

The first electrode 21 is shared by the plurality of imaging elements constituting the imaging element block.

Alternatively, the solid-state imaging device of Example 13 includes a plurality of the imaging elements and the like described in Examples 1 to 12.

In Example 13, one floating diffusion layer is disposed for the plurality of imaging elements. In addition, by appropriately controlling the timing of a charge transfer period, a plurality of imaging elements can share one floating diffusion layer. In addition, in this case, the plurality of imaging elements can share one contact hole portion.

Note that the solid-state imaging device of Example 13 has substantially a similar configuration and structure to the solid-state imaging devices described in Examples 1 to 12 except that the first electrode 21 is shared by the plurality of imaging elements constituting an imaging element block.

Figure 49:
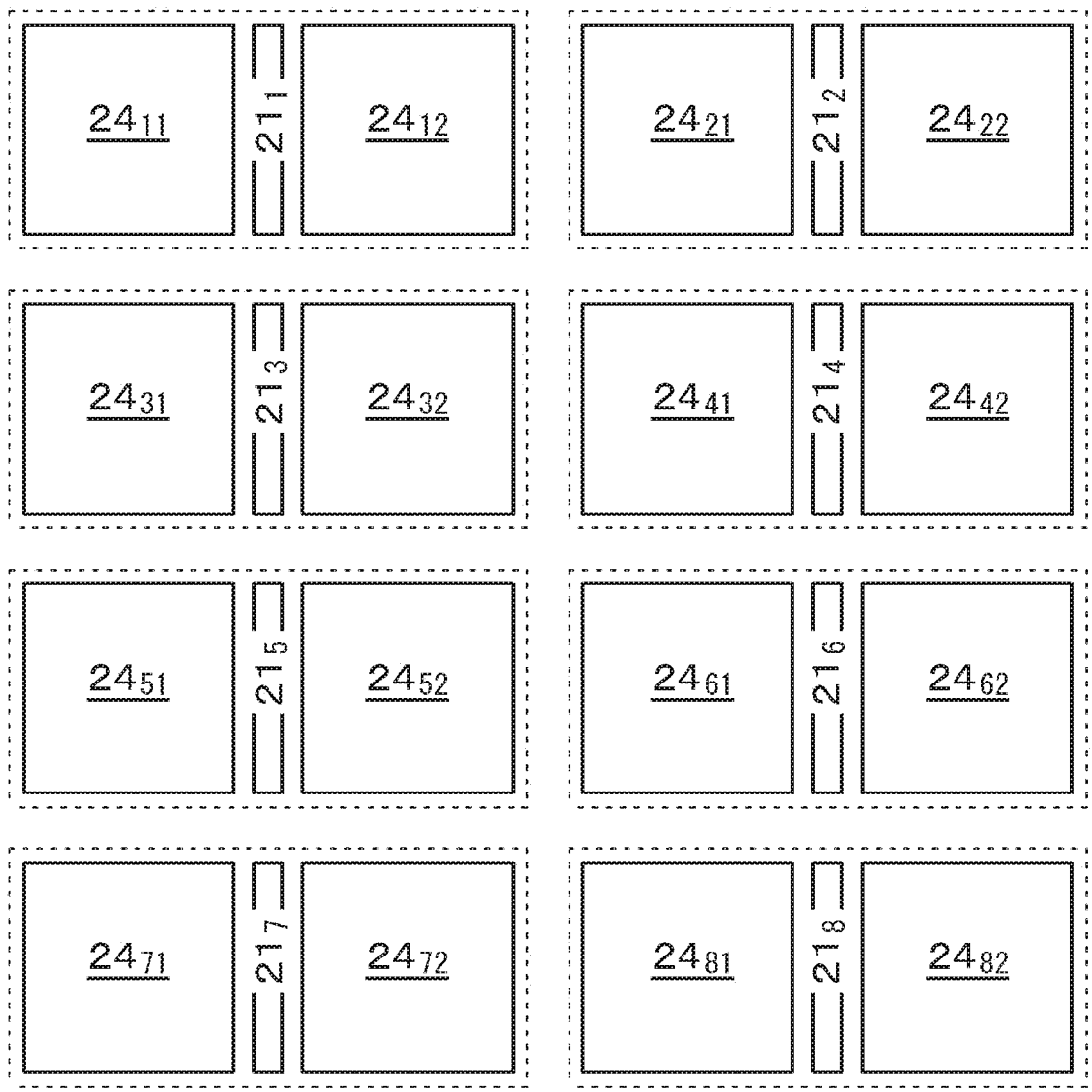
FIG. 49 is a schematic plan view of first electrodes and charge accumulation electrode segments in a solid-state imaging device of Example 13.
Figure 50:
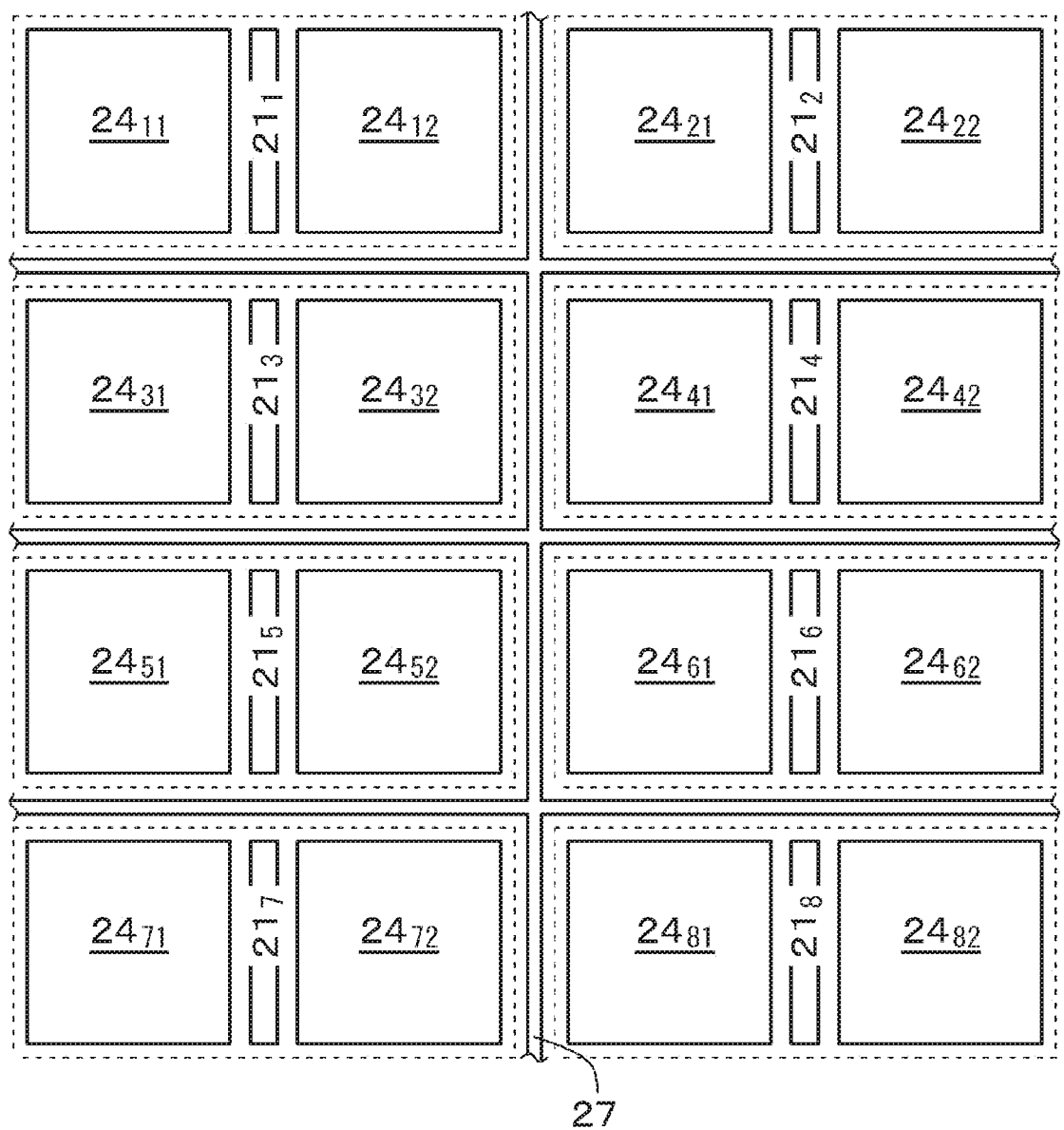
FIG. 50 is a schematic plan view of first electrodes and charge accumulation electrode segments in a first modification of the solid-state imaging device of Example 13.
Figure 51:
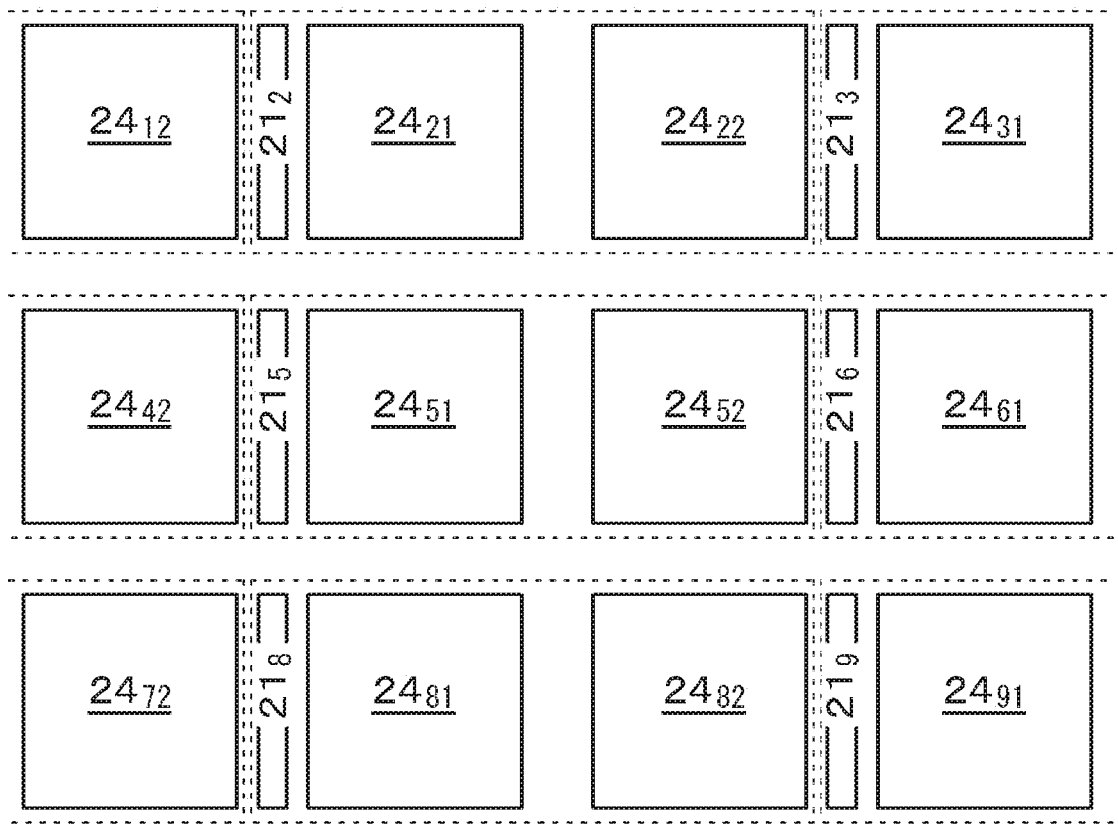
FIG. 51 is a schematic plan view of first electrodes and charge accumulation electrode segments in a second modification of the solid-state imaging device of Example 13.
Figure 52:
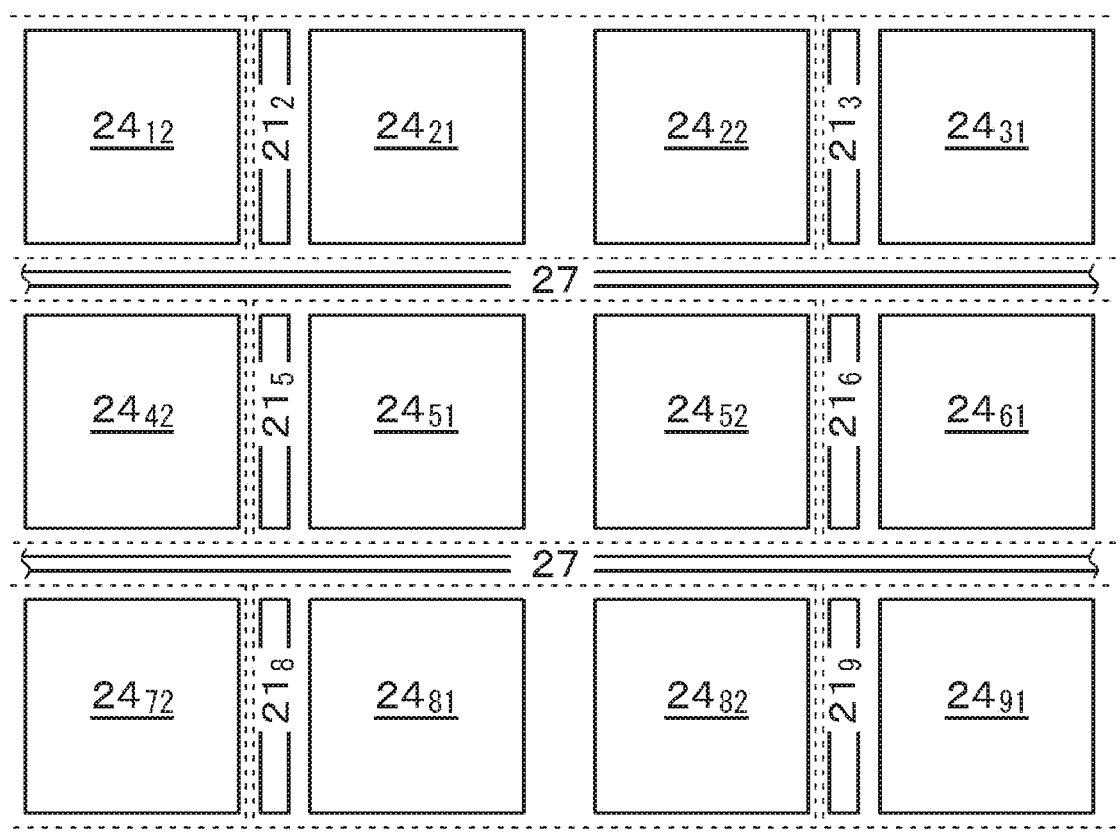
FIG. 52 is a schematic plan view of first electrodes and charge accumulation electrode segments in a third modification of the solid-state imaging device of Example 13.
Figure 53:
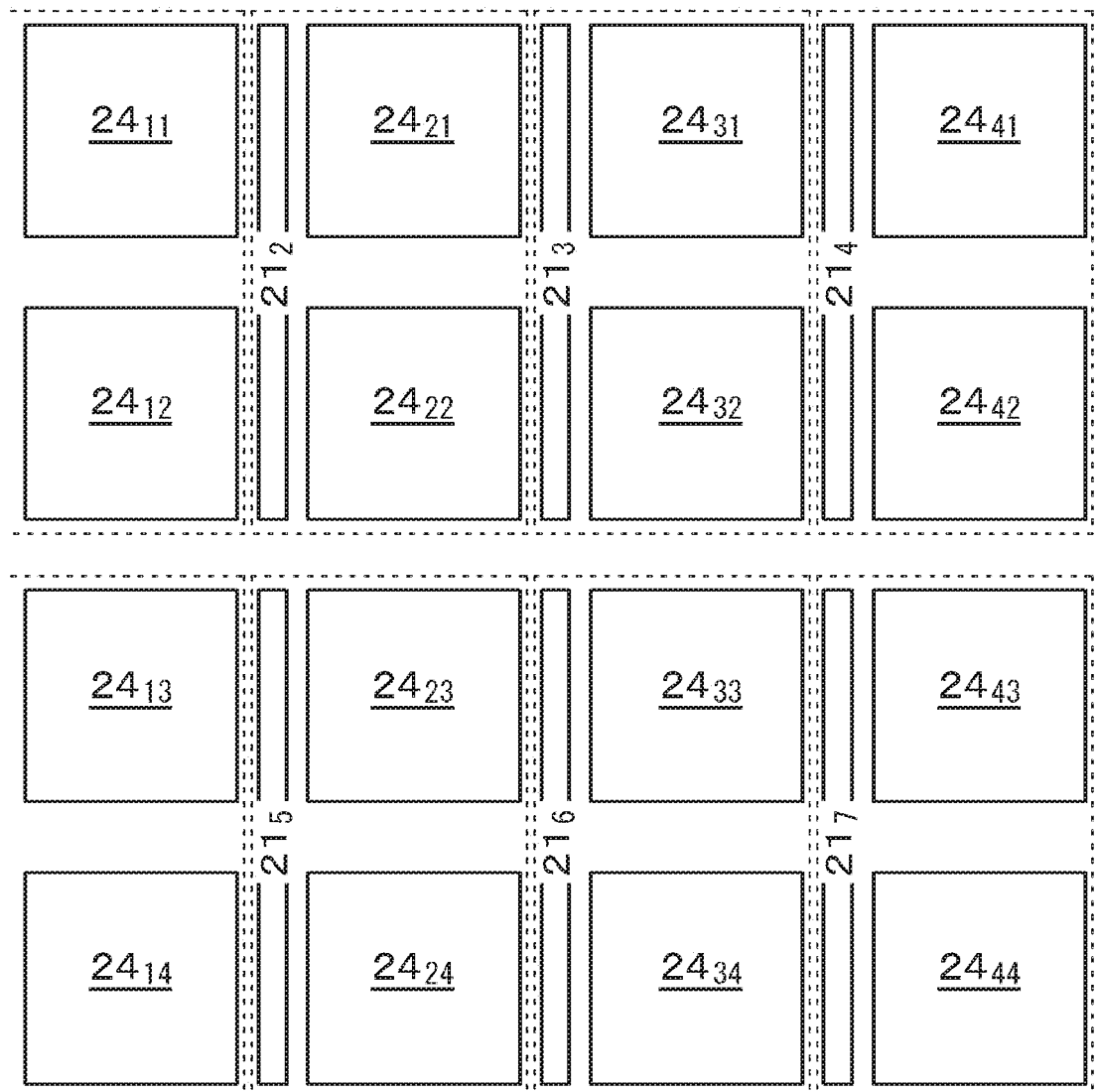
FIG. 53 is a schematic plan view of first electrodes and charge accumulation electrode segments in a fourth modification of the solid-state imaging device of Example 13.
Figure 54:
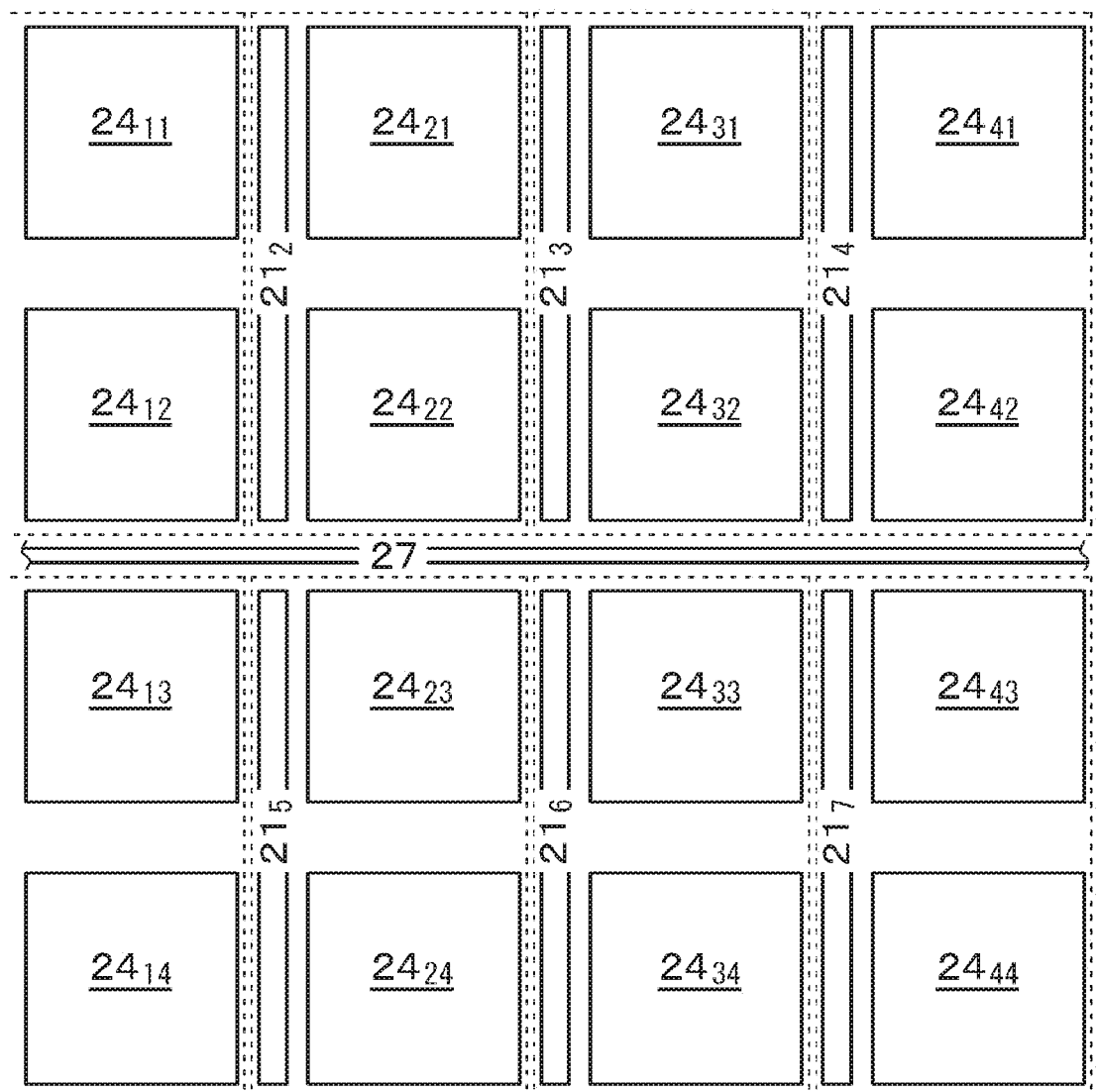
FIG. 54 is a schematic plan view of first electrodes and charge accumulation electrode segments in a fifth modification of the solid-state imaging device of Example 13.

The arrangement state of the first electrode 21 and the charge accumulation electrode 24 in the solid-state imaging device of Example 13 is schematically illustrated in FIG. 49 (Example 13), FIG. 50 (first modification of Example 13), FIG. 51 (second modification of Example 13), FIG. 52 (third modification of Example 13), and FIG. 53 (fourth modification of Example 13). FIGS. 49, 50, 53, and 54 illustrate 16 imaging elements and the like, and FIGS. 51 and 52 each illustrate 12 imaging elements and the like. In addition, two imaging elements and the like constitute an imaging element block. The imaging element block is surrounded by a dotted line. The subscripts attached to the first electrodes 21 and the charge accumulation electrodes 24 are described in order to distinguish the first electrodes 21 and the charge accumulation electrodes 24 from one another, respectively. This applies to the following description similarly. Furthermore, one on-chip micro lens (not illustrated in FIGS. 49 to 58) is disposed above one imaging element and the like. In addition, in one imaging element block, two charge accumulation electrodes 24 are disposed with the first electrode 21 interposed therebetween (see FIGS. 49 and 50). Alternatively, one first electrode 21 is disposed so as to face two charge accumulation electrodes 24 arranged in parallel (see FIGS. 53 and 54). That is, the first electrode is disposed adjacent to the charge accumulation electrode of each imaging element and the like. Alternatively, the first electrode is disposed adjacent to some of the charge accumulation electrodes of the plurality of imaging elements and the like, and is not disposed adjacent to the remaining charge accumulation electrodes of the plurality of imaging elements and the like (see FIGS. 51 and 52). In this case, transfer of charges from the rest of the plurality of imaging elements and the like to the first electrode is transfer via some of the plurality of imaging elements and the like. The distance A between a charge accumulation electrode constituting an imaging element and the like and a charge accumulation electrode constituting an imaging element and the like is preferably longer than the distance B between a first electrode and a charge accumulation electrode in an imaging element and the like adjacent to the first electrode in order to ensure the transfer of charges from each of the imaging elements and the like to the first electrode. Furthermore, a value of the distance A is preferably longer as the imaging element and the like are located farther from the first electrode. Furthermore, in examples illustrated in FIGS. 50, 52, and 54, the charge transfer control electrode 27 is disposed among a plurality of imaging elements and the like constituting an imaging element block. By disposing the charge transfer control electrode 27, it is possible to reliably suppress transfer of charges in the imaging element blocks located with the charge transfer control electrode 27 interposed therebetween. Note that when a potential applied to the charge transfer control electrode 27 is referred to as $V_{17}$, $V_{12} > V_{17}$ only needs to be satisfied.

The charge transfer control electrode 27 may be formed, on the first electrode side, at the same level as the first electrode 21 or the charge accumulation electrode 24 or at a different level (specifically, at a level lower than the first electrode 21 or the charge accumulation electrode 24). In the former case, since a distance between the charge transfer control electrode 27 and the photoelectric conversion layer can be shortened, the potential can be easily controlled. Meanwhile, the latter case is advantageous for miniaturization because a distance between the charge transfer control electrode 27 and the charge accumulation electrode 24 can be shortened.

Hereinafter, an operation of an imaging element block constituted by the first electrode $21_2$ and the two charge accumulation electrodes $24_{21}$ and $24_{22}$ will be described.

In a charge accumulation period, a potential $V_a$ is applied to the first electrode $21_2$ and a potential $V_A$ is applied to the charge accumulation electrodes $24_{21}$ and $24_{22}$ from a drive circuit. Photoelectric conversion occurs in the photoelectric conversion layer 23A by light incident on the photoelectric conversion layer 23A. Holes generated by the photoelectric conversion are sent from the second electrode 22 to a drive circuit via the wiring $V_{OU}$. Meanwhile, the potential of the first electrode $21_2$ is set to be higher than the potential of the second electrode 22, that is, for example, a positive potential is applied to the first electrode $21_2$, and a negative potential is applied to the second electrode 22. Therefore, $V_A \geq V_a$ is satisfied, preferably $V_A > V_a$ is satisfied. As a result, electrons generated by the photoelectric conversion are attracted to the charge accumulation electrodes $24_{21}$ and $24_{22}$ and stop in a region of the composite oxide layer 23B and the like facing the charge accumulation electrodes $24_{21}$ and $24_{22}$. That is, charges are accumulated in the composite oxide layer 23B and the like. Since $V_A > V_a$ is satisfied, electrons generated inside the photoelectric conversion layer 23A are not transferred toward the first electrode $21_2$. As the time for the photoelectric conversion elapses, the potential in the region of the composite oxide layer 23B and the like facing the charge accumulation electrodes $24_{21}$ and $24_{22}$ becomes a more negative value.

In a later stage of the charge accumulation period, a reset operation is performed. As a result, the potential of the first floating diffusion layer is reset, and the potential of the first floating diffusion layer becomes the potential $V_{DD}$ of the power source.

After the reset operation is completed, charges are read out. That is, in a charge transfer period, a potential $V_b$ is applied to the first electrode $21_2$, a potential $V_{21\text{-}B}$ is applied to the charge accumulation electrode $24_{21}$, and a potential $V_{22\text{-}B}$ is applied to the charge accumulation electrode $24_{22}$ from a drive circuit. Here, $V_{21\text{-}B} < V_b < V_{22\text{-}B}$ is satisfied. As a result, electrons that have stopped in the region of the composite oxide layer 23B and the like facing the charge accumulation electrode $24_{21}$ are read out to the first electrode $21_2$ and further to the first floating diffusion layer. That is, the charges accumulated in the region of the composite oxide layer 23B and the like facing the charge accumulation electrode $24_{21}$ are read out to the control unit. When readout is completed, $V_{22\text{-}B} \leq V_{21\text{-}B} < V_b$ is satisfied. Note that in examples illustrated in FIGS. 53 and 54, $V_{22\text{-}B} < V_b < V_{21\text{-}B}$ may be satisfied. As a result, electrons that have stopped in the region of the composite oxide layer 23B and the like facing the charge accumulation electrode $24_{22}$ are read out to the first electrode $21_2$ and further to the first floating diffusion layer. Furthermore, in the examples illustrated in FIGS. 51 and 52, the electrons that have stopped in the region of the composite oxide layer 23B and the like facing the charge accumulation electrode $24_{22}$ may be read out to the first floating diffusion layer via the first electrode $21_3$ adjacent to the charge accumulation electrode $24_{22}$. In this way, the charges accumulated in the region of the composite oxide layer 23B and the like facing the charge accumulation electrode $24_{22}$ are read out to the control unit. Note that when readout of the charges accumulated in the region of the composite oxide layer 23B and the like facing the charge accumulation electrode $24_{21}$ is completed, the potential of the first floating diffusion layer may be reset.

Figure 59A:
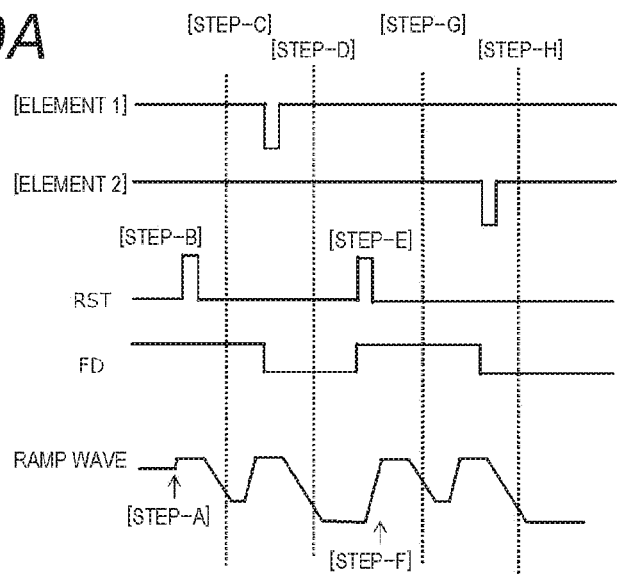
FIGS. 59A, 59B, and 59C are charts each illustrating a readout driving example in an imaging element block of Example 13.

FIG. 59A illustrates a reading out drive example in the imaging element block of the Example 13.

Through the following steps A to H, signals from two imaging elements and the like corresponding to the charge accumulation electrode $24_{21}$ and the charge accumulation electrode $24_{22}$ are read out.

[Step-A]

Input of an auto zero signal to a comparator

[Step-B]

Reset operation of one shared floating diffusion layer

[Step-C]

P-phase readout and transfer of charges to the first electrode $21_2$ in an imaging element and the like corresponding to the charge accumulation electrode $24_{21}$

[Step-D]

D-phase readout and transfer of charge to the first electrode $21_2$ in an imaging element and the like corresponding to the charge accumulation electrode $24_{21}$

[Step-E]

Reset operation of one shared floating diffusion layer

[Step-F]

Input of an auto zero signal to a comparator

[Step-G]

P-phase readout and transfer of charges to the first electrode $21_2$ in an imaging element and the like corresponding to the charge accumulation electrode $24_{22}$

[Step-H]

D-phase readout and transfer of charges to the first electrode $21_2$ in an imaging element and the like corresponding to the charge accumulation electrode $24_{22}$ On the basis of a correlated double sampling (CDS) process, a difference between the P-phase readout in [step- C] and the D-phase readout in [step-D] is a signal from an imaging element and the like corresponding to the charge accumulation electrode $24_{21}$, and a difference between the P-phase readout in [step-G] and the D-phase readout in [step-H] is a signal from an imaging element and the like corresponding to the charge accumulation electrode $24_{22}$.

Figure 59B:
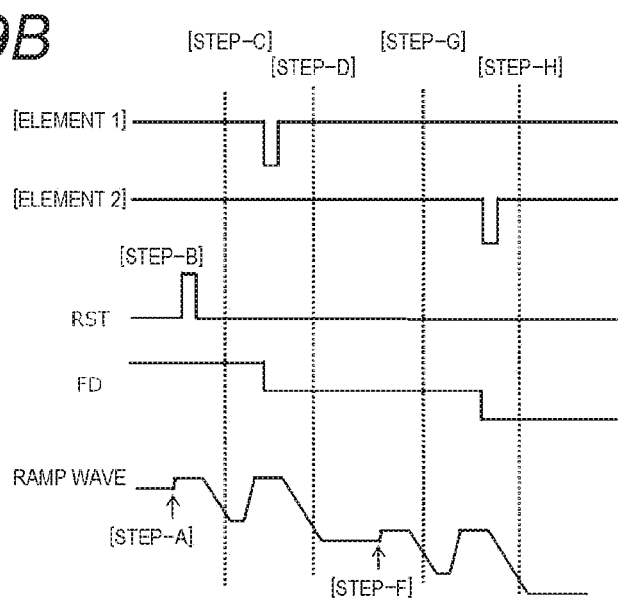
Figure 59C:
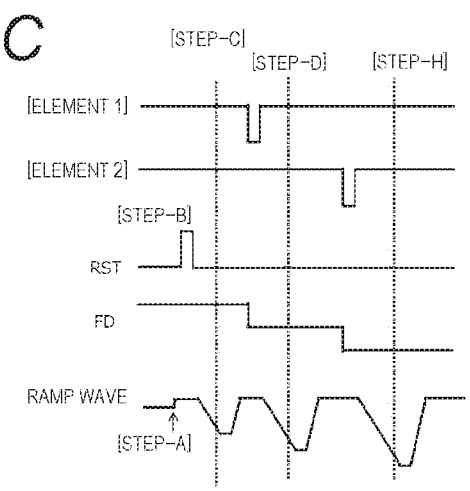
Figure 60:
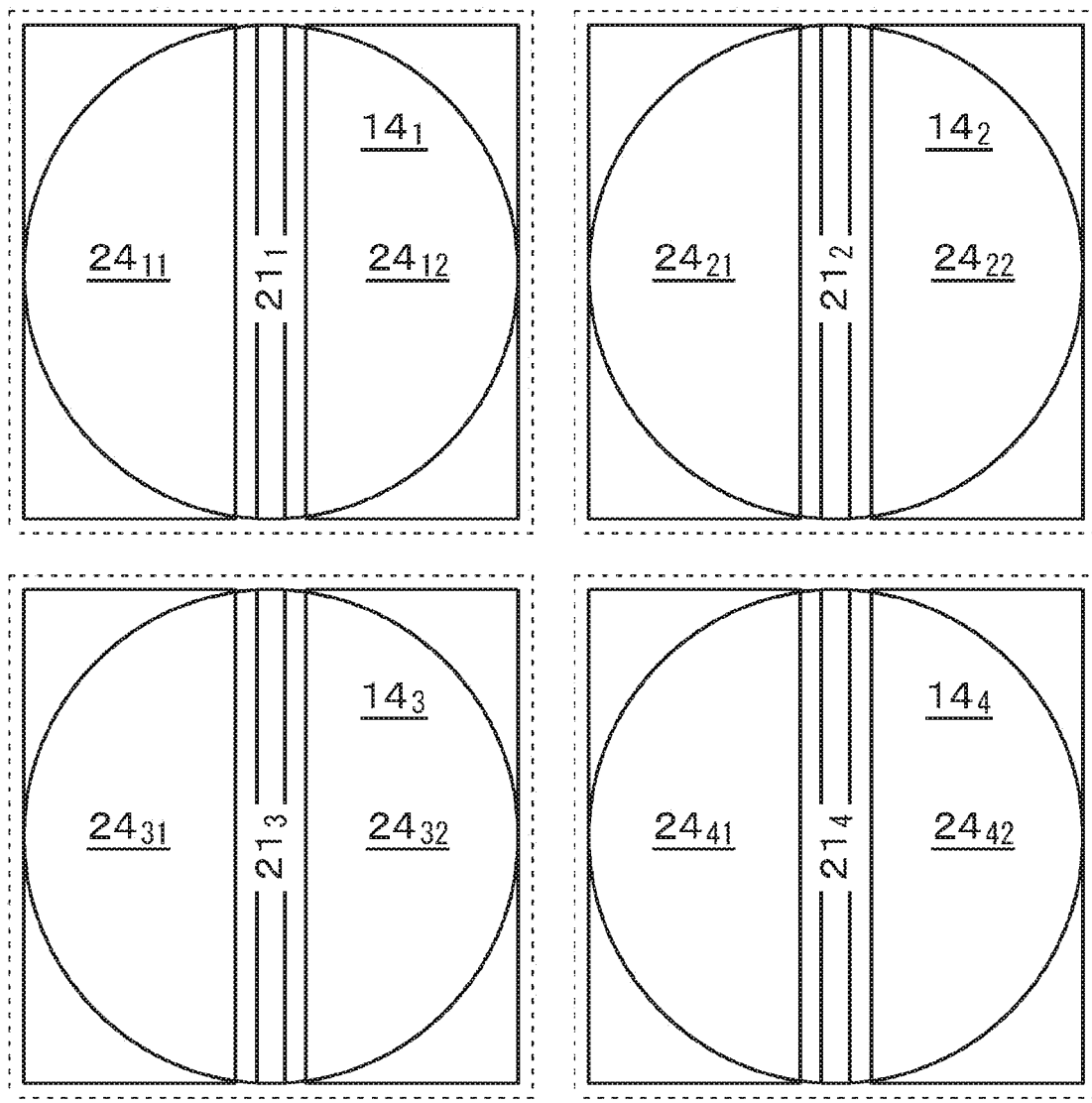
FIG. 60 is a schematic plan view of first electrodes and charge accumulation electrode segments in a solid-state imaging device of Example 14.
Figure 61:
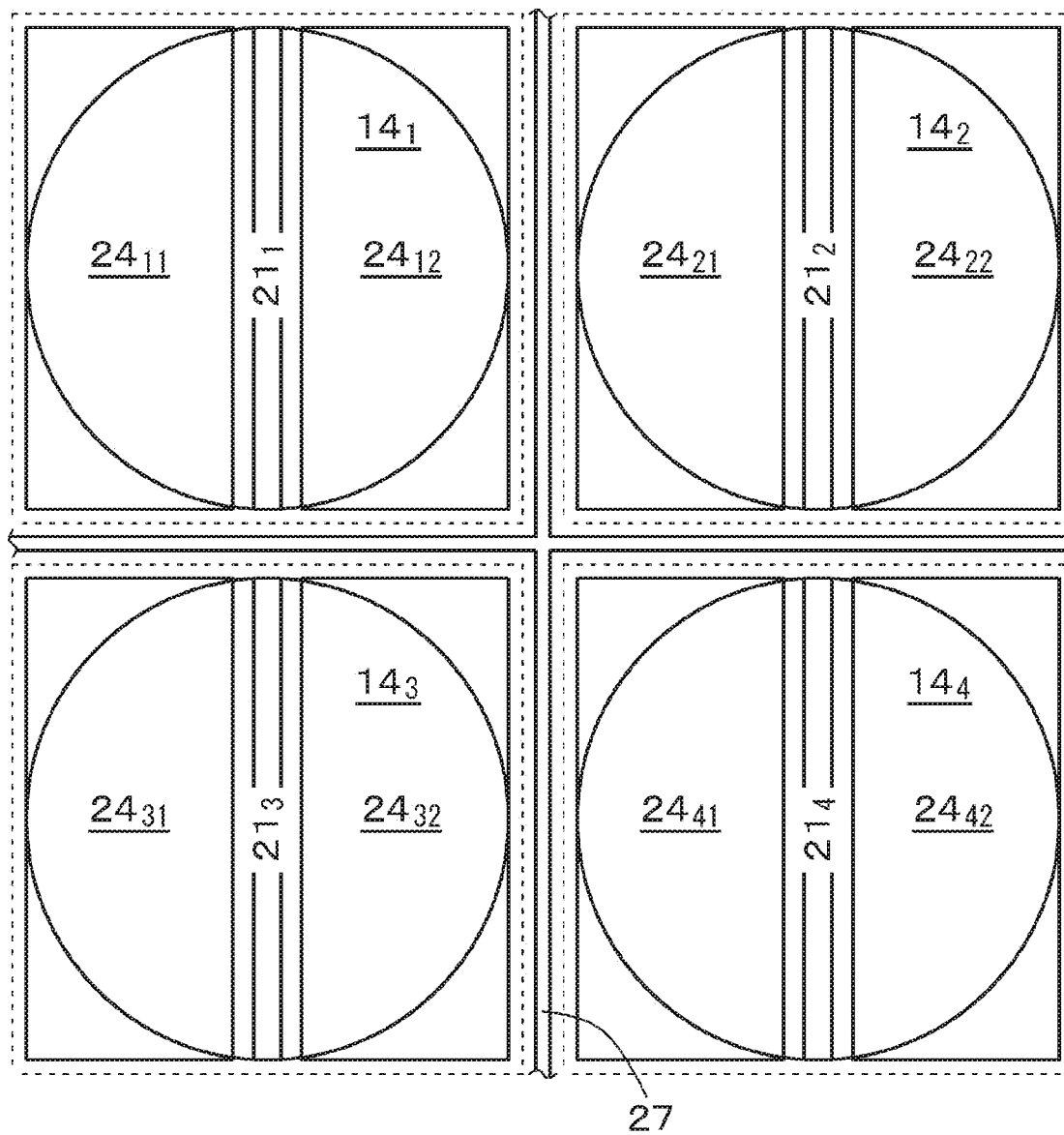
FIG. 61 is a schematic plan view of first electrodes and charge accumulation electrode segments in a modification of the solid-state imaging device of Example 14.
Figure 62:
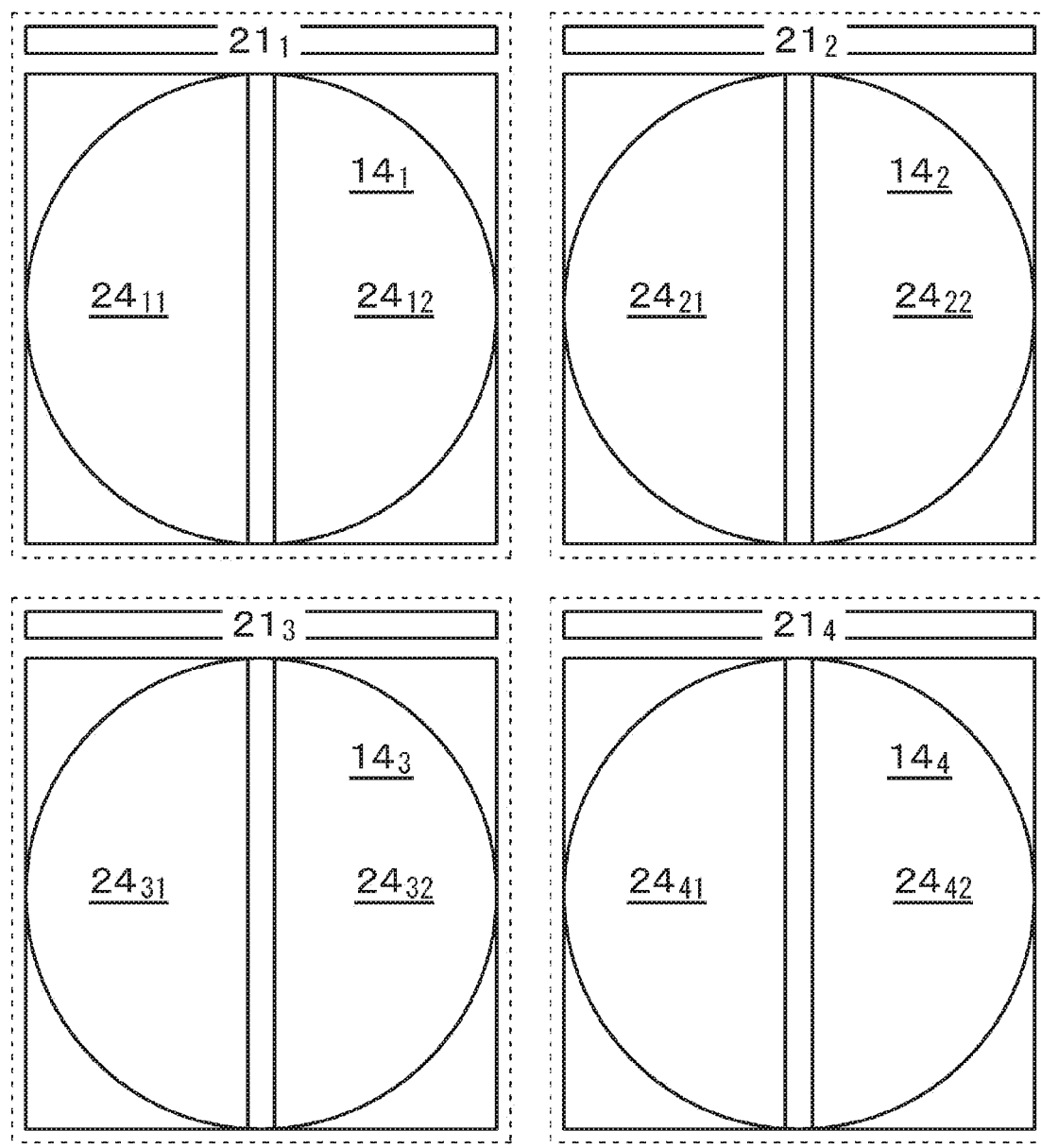
FIG. 62 is a schematic plan view of first electrodes and charge accumulation electrode segments in a modification of the solid-state imaging device of Example 14.
Figure 63:
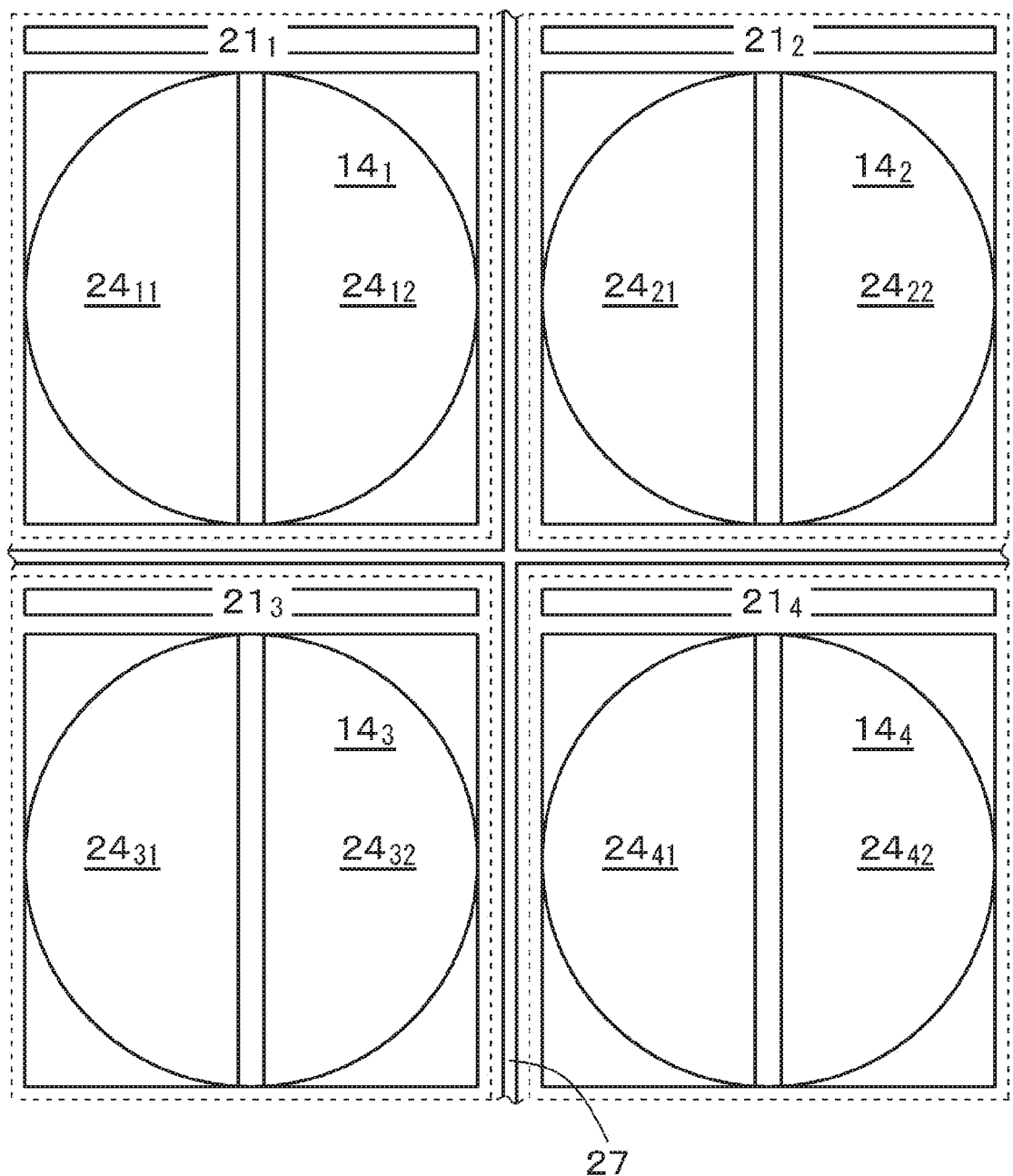
FIG. 63 is a schematic plan view of first electrodes and charge accumulation electrode segments in a modification of the solid-state imaging device of Example 14.

Note that the operation of [Step-E] may be omitted (see FIG. 59B). Furthermore, the operation of [Step-F] may be omitted. In this case, the operation of [Step-G] can be further omitted (see FIG. 59C). A difference between the P-phase readout in [step-C] and the D-phase readout in [step-D] is a signal from an imaging element and the like corresponding to the charge accumulation electrode $24_{21}$, and a difference between the D-phase readout in [step-D] and the D-phase readout in [step-H] is a signal from an imaging element and the like corresponding to the charge accumulation electrode $24_{22}$.

Figure 55:
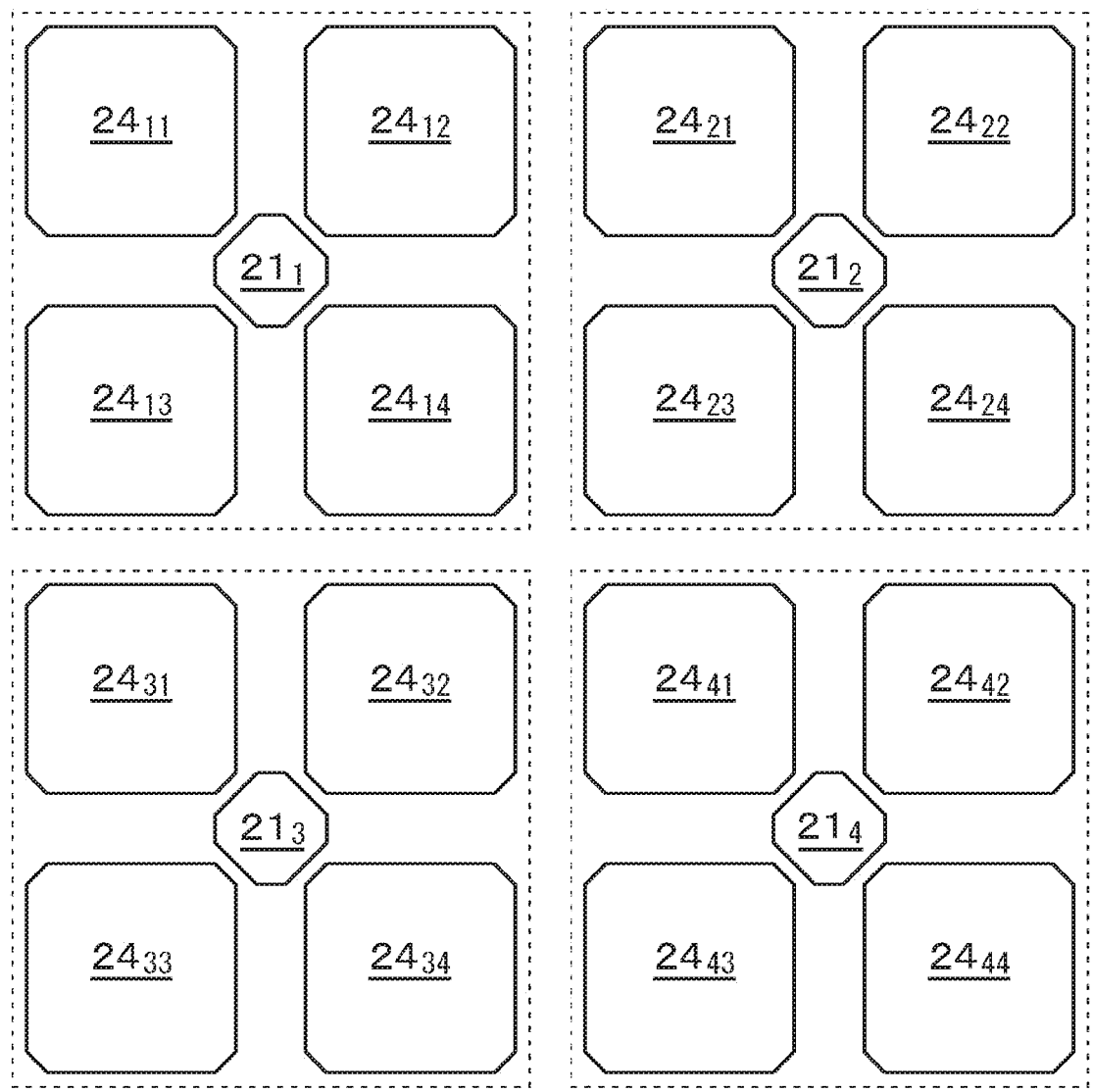
FIG. 55 is a schematic plan view of first electrodes and charge accumulation electrode segments in a sixth modification of the solid-state imaging device of Example 13.
Figure 56:
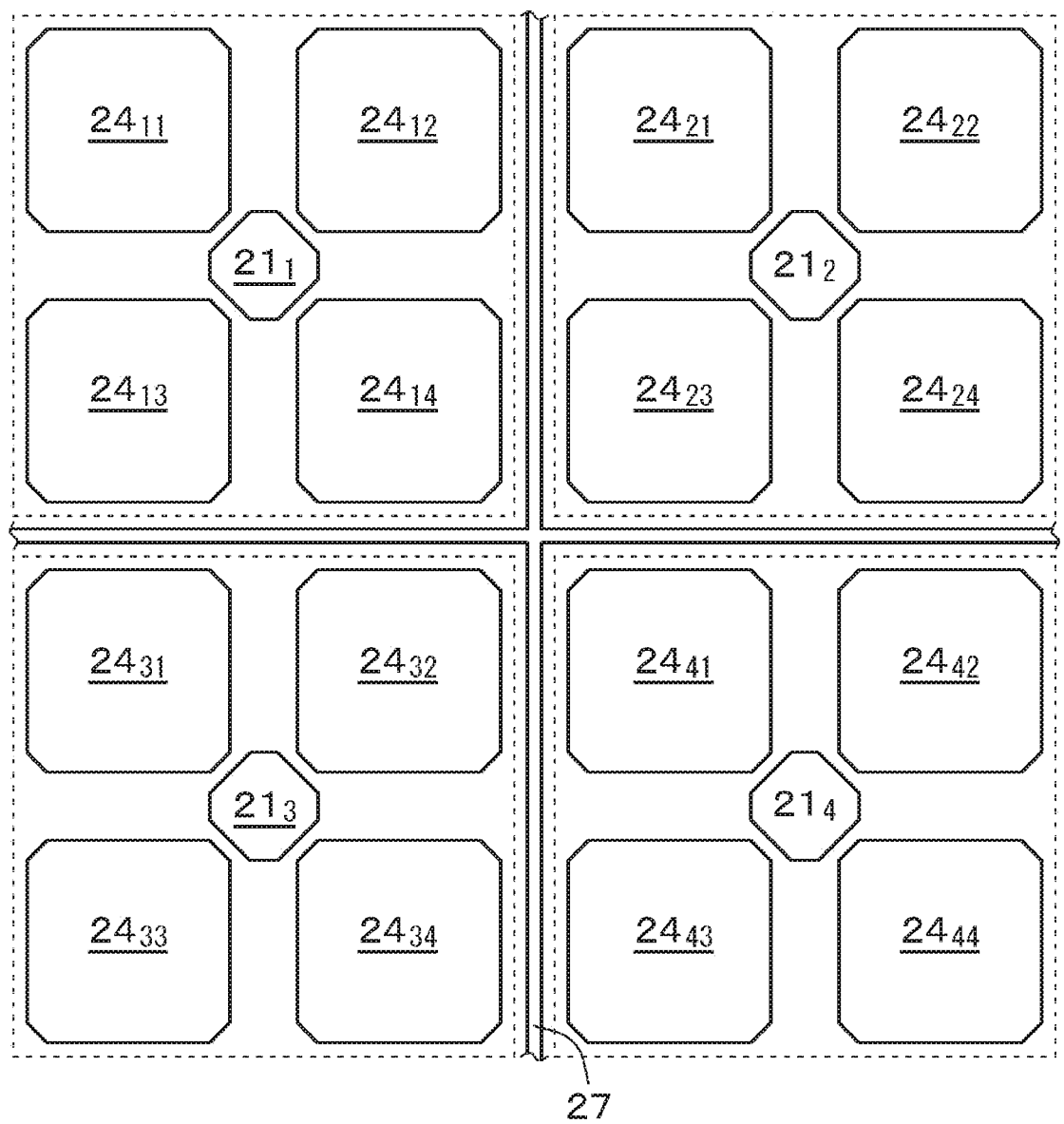
FIG. 56 is a schematic plan view of first electrodes and charge accumulation electrode segments in a seventh modification of the solid-state imaging device of Example 13.

In the modifications illustrated in FIG. 55 (sixth modification of Example 13) and FIG. 56 (seventh modification of Example 13) schematically illustrating the arrangement state of the first electrode 21 and the charge accumulation electrode 24, an imaging element block includes four imaging elements and the like. The operations of these solid-state imaging devices can be substantially similar to the operations of the solid-state imaging devices illustrated in FIGS. 49 to 54.

Figure 57:
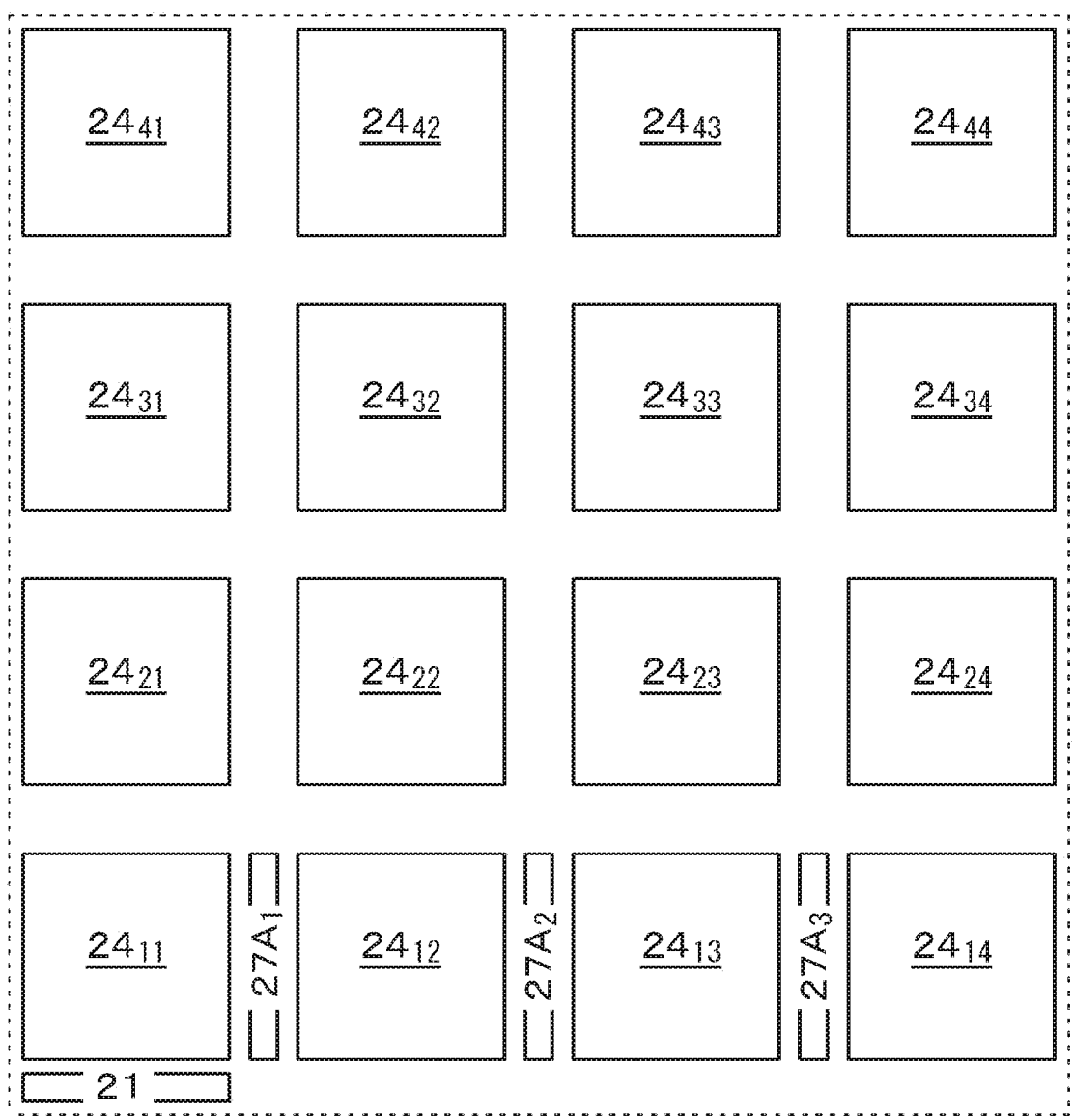
FIG. 57 is a schematic plan view of a first electrode and charge accumulation electrode segments in an eighth modification of the solid-state imaging device of Example 13.
Figure 58:
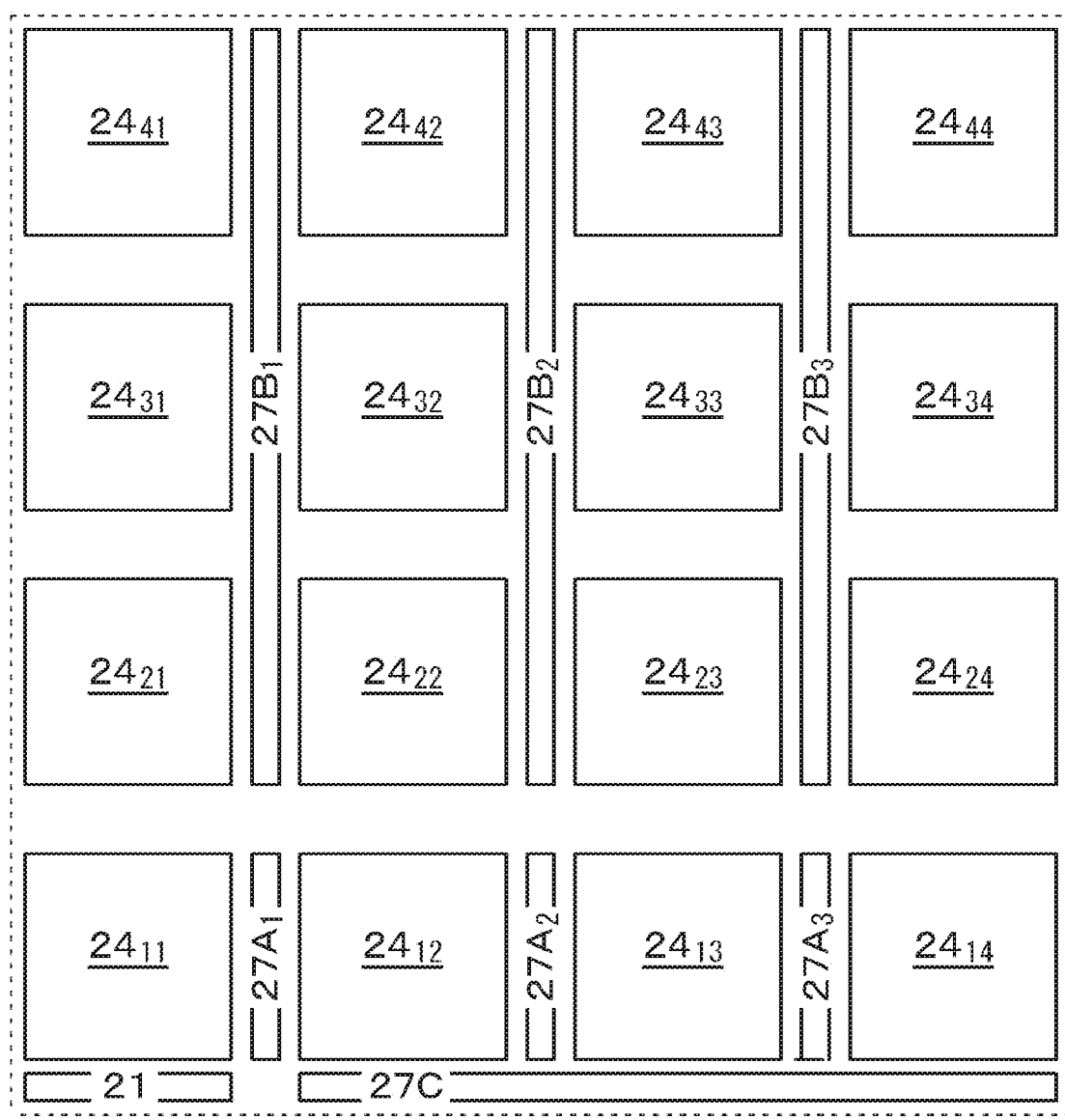
FIG. 58 is a schematic plan view of a first electrode and charge accumulation electrode segments in a ninth modification of the solid-state imaging device of Example 13.

In the eighth and ninth modifications illustrated in FIGS. 57 and 58 schematically illustrating the arrangement state of the first electrode 21 and the charge accumulation electrode 24, an imaging element block includes sixteen imaging elements and the like. As illustrated in FIGS. 57 and 58, charge transfer control electrodes $27A_1$, $27A_2$, and $27A_3$ are disposed between the charge accumulation electrode $24_{11}$ and the charge accumulation electrode $24_{12}$, between the charge accumulation electrode $24_{12}$ and the charge accumulation electrode $24_{13}$, and between the charge accumulation electrode $24_{13}$ and the charge accumulation electrode $24_{14}$, respectively. Furthermore, as illustrated in FIG. 58, charge transfer control electrodes $27B_1$, $27B_2$, and $27B_3$ are disposed between the charge accumulation electrodes $24_{21}$, $24_{31}$, and $24_{41}$ and the charge accumulation electrodes $24_{22}$, $24_{32}$, and $24_{42}$, between the charge accumulation electrodes $24_{22}$, $24_{32}$, and $24_{42}$ and the charge accumulation electrodes $24_{23}$, $24_{33}$, and $24_{43}$, and between the charge accumulation electrodes $24_{23}$, $24_{33}$, and $24_{43}$ and the charge accumulation electrodes $24_{24}$, $24_{34}$, and $24_{44}$, respectively. Moreover, a charge transfer control electrode 27C is disposed between imaging element blocks. In addition, in these solid-state imaging devices, by controlling the 16 charge accumulation electrodes 24, the charges accumulated in the composite oxide layer 23B can be read out from the first electrode 21.

[Step-10]

Specifically, first, the charges accumulated in the region of the composite oxide layer 23B facing the charge accumulation electrode $24_{11}$ are read out from the first electrode 21. Next, the charges accumulated in the region of the composite oxide layer 23B facing the charge accumulation electrode $24_{12}$ are read out from the first electrode 21 via the region of the composite oxide layer 23B facing the charge accumulation electrode $24_{11}$. Next, the charges accumulated in the region of the composite oxide layer 23B facing the charge accumulation electrode $24_{13}$ are read out from the first electrode 21 via the region of the composite oxide layer 23B facing the charge accumulation electrode $24_{12}$ and the charge accumulation electrode $24_{11}$.

[Step-20]

Thereafter, the charges accumulated in the region of the composite oxide layer 23B facing the charge accumulation electrode $24_{21}$ are transferred to the region of the composite oxide layer 23B facing the charge accumulation electrode $24_{11}$. The charges accumulated in the region of the composite oxide layer 23B facing the charge accumulation electrode $24_{22}$ are transferred to the region of the composite oxide layer 23B facing the charge accumulation electrode $24_{12}$. The charges accumulated in the region of the composite oxide layer 23B facing the charge accumulation electrode $24_{23}$ are transferred to the region of the composite oxide layer 23B facing the charge accumulation electrode $24_{13}$. The charges accumulated in the region of the composite oxide layer 23B facing the charge accumulation electrode $24_{24}$ are transferred to the region of the composite oxide layer 23B facing the charge accumulation electrode $24_{14}$.

[Step-21]

The charges accumulated in the region of the composite oxide layer 23B facing the charge accumulation electrode $24_{31}$ are transferred to the region of the composite oxide layer 23B facing the charge accumulation electrode $24_{21}$. The charges accumulated in the region of the composite oxide layer 23B facing the charge accumulation electrode $24_{32}$ are transferred to the region of the composite oxide layer 23B facing the charge accumulation electrode $24_{22}$. The charges accumulated in the region of the composite oxide layer 23B facing the charge accumulation electrode $24_{33}$ are transferred to the region of the composite oxide layer 23B facing the charge accumulation electrode $24_{23}$. The charges accumulated in the region of the composite oxide layer 23B facing the charge accumulation electrode $24_{34}$ are transferred to the region of the composite oxide layer 23B facing the charge accumulation electrode $24_{24}$.

[Step-22]

The charges accumulated in the region of the composite oxide layer 23B facing the charge accumulation electrode $24_{41}$ are transferred to the region of the composite oxide layer 23B facing the charge accumulation electrode $24_{31}$. The charges accumulated in the region of the composite oxide layer 23B facing the charge accumulation electrode $24_{42}$ are transferred to the region of the composite oxide layer 23B facing the charge accumulation electrode $24_{32}$. The charges accumulated in the region of the composite oxide layer 23B facing the charge accumulation electrode $24_{43}$ are transferred to the region of the composite oxide layer 23B facing the charge accumulation electrode $24_{33}$. The charges accumulated in the region of the composite oxide layer 23B facing the charge accumulation electrode $24_{44}$ are transferred to the region of the composite oxide layer 23B facing the charge accumulation electrode $24_{34}$.

[Step-30]

Then, by executing [step-10] again, the charges accumulated in the region of the composite oxide layer 23B facing the charge accumulation electrode $24_{21}$, the charges accumulated in the region of the composite oxide layer 23B facing the charge accumulation electrode $24_{22}$, the charges accumulated in the region of the composite oxide layer 23B facing the charge accumulation electrode $24_{23}$, and the charges accumulated in the region of the composite oxide layer 23B facing the charge accumulation electrode $24_{24}$ can be read out via the first electrode 21.

[Step-40]

Thereafter, the charges accumulated in the region of the composite oxide layer 23B facing the charge accumulation electrode $24_{21}$ are transferred to the region of the composite oxide layer 23B facing the charge accumulation electrode $24_{11}$. The charges accumulated in the region of the composite oxide layer 23B facing the charge accumulation electrode $24_{22}$ are transferred to the region of the composite oxide layer 23B facing the charge accumulation electrode $24_{12}$. The charges accumulated in the region of the composite oxide layer 23B facing the charge accumulation electrode $24_{23}$ are transferred to the region of the composite oxide layer 23B facing the charge accumulation electrode $24_{13}$. The charges accumulated in the region of the composite oxide layer 23B facing the charge accumulation electrode $24_{24}$ are transferred to the region of the composite oxide layer 23B facing the charge accumulation electrode $24_{14}$.

[Step-41]

The charges accumulated in the region of the composite oxide layer 23B facing the charge accumulation electrode $24_{31}$ are transferred to the region of the composite oxide layer 23B facing the charge accumulation electrode $24_{21}$. The charges accumulated in the region of the composite oxide layer 23B facing the charge accumulation electrode $24_{32}$ are transferred to the region of the composite oxide layer 23B facing the charge accumulation electrode $24_{22}$. The charges accumulated in the region of the composite oxide layer 23B facing the charge accumulation electrode $24_{33}$ are transferred to the region of the composite oxide layer 23B facing the charge accumulation electrode $24_{23}$. The charges accumulated in the region of the composite oxide layer 23B facing the charge accumulation electrode $24_{34}$ are transferred to the region of the composite oxide layer 23B facing the charge accumulation electrode $24_{24}$.

[Step-50]

Then, by executing [step-10] again, the charges accumulated in the region of the composite oxide layer 23B facing the charge accumulation electrode $24_{31}$, the charges accumulated in the region of the composite oxide layer 23B facing the charge accumulation electrode $24_{32}$, the charges accumulated in the region of the composite oxide layer 23B facing the charge accumulation electrode $24_{33}$, and the charges accumulated in the region of the composite oxide layer 23B facing the charge accumulation electrode $24_{34}$ can be read out via the first electrode 21.

[Step-60]

Thereafter, the charges accumulated in the region of the composite oxide layer 23B facing the charge accumulation electrode $24_{21}$ are transferred to the region of the composite oxide layer 23B facing the charge accumulation electrode $24_{11}$. The charges accumulated in the region of the composite oxide layer 23B facing the charge accumulation electrode $24_{22}$ are transferred to the region of the composite oxide layer 23B facing the charge accumulation electrode $24_{12}$. The charges accumulated in the region of the composite oxide layer 23B facing the charge accumulation electrode $24_{23}$ are transferred to the region of the composite oxide layer 23B facing the charge accumulation electrode $24_{13}$. The charges accumulated in the region of the composite oxide layer 23B facing the charge accumulation electrode $24_{24}$ are transferred to the region of the composite oxide layer 23B facing the charge accumulation electrode $24_{14}$.

[Step-70]

Then, by executing [step-10] again, the charges accumulated in the region of the composite oxide layer 23B facing the charge accumulation electrode $24_{41}$, the charges accumulated in the region of the composite oxide layer 23B facing the charge accumulation electrode $24_{42}$, the charges accumulated in the region of the composite oxide layer 23B facing the charge accumulation electrode $24_{43}$, and the charges accumulated in the region of the composite oxide layer 23B facing the charge accumulation electrode $24_{44}$ can be read out via the first electrode 21.

In the solid-state imaging device of Example 13, since the first electrode is shared by the plurality of imaging elements and the like constituting the imaging element block, the configuration and structure in a pixel region in which a plurality of imaging elements and the like is arrayed can be simplified and miniaturized. Note that the plurality of imaging elements and the like disposed for one floating diffusion layer may be constituted by a plurality of first type imaging elements, or may be constituted by at least one first type imaging element and one or more second type imaging elements.

Example 14

Example 14 is a modification of Example 13. In the solid-state imaging device of Example 14 illustrated in FIGS. 60, 61, 62, and 63 schematically illustrating the arrangement state of the first electrode 21 and the charge accumulation electrode 24, an imaging element block includes two imaging elements and the like. In addition, one on-chip micro lens 14 is disposed above an imaging element block. Note that in the examples illustrated in FIGS. 61 and 63, the charge transfer control electrode 27 is disposed among the plurality of imaging elements and the like constituting an imaging element block.

For example, photoelectric conversion layers corresponding to the charge accumulation electrodes $24_{11}$, $24_{21}$, $24_{31}$, and $24_{41}$ constituting an imaging element block are highly sensitive to incident light from the upper right in the drawings. Furthermore, photoelectric conversion layers corresponding to the charge accumulation electrodes $24_{12}$, $24_{22}$, $24_{32}$, and $24_{42}$ constituting an imaging element block are highly sensitive to incident light from the upper left in the drawing. Therefore, for example, by combining an imaging element and the like including the charge accumulation electrode $24_{11}$ with an imaging element and the like including the charge accumulation electrode $24_{12}$, an image plane phase difference signal can be acquired. Furthermore, if a signal from an imaging element and the like including the charge accumulation electrode $24_{11}$ is added to a signal from an imaging element and the like including the charge accumulation electrode $24_{12}$, one imaging element and the like can be constituted by a combination with these imaging elements and the like. In the example illustrated in FIG. 60, the first electrode $21_1$ is disposed between the charge accumulation electrode $24_{11}$ and the charge accumulation electrode $24_{12}$. However, as in the example illustrated in FIG. 62, by disposing one first electrode $21_1$ so as to face the two charge accumulation electrodes $24_{11}$ and $24_{12}$ arranged in parallel, the sensitivity can be further improved.

Hitherto, the present disclosure has been described on the basis of preferable Examples. However, the present disclosure is not limited to these Examples. The structures and configurations, the manufacturing conditions, the manufacturing methods, and the used materials of the imaging element, the laminated imaging element, and the solid-state imaging device described in Examples are illustrative and can be modified appropriately. The imaging elements and the like of Examples can be combined appropriately. For example, the imaging element and the like of Example 7, the imaging element and the like of Example 8, the imaging element and the like of Example 9, the imaging element and the like of Example 10, and the imaging element and the like of Example 11 can be arbitrarily combined. The imaging element and the like of Example 7, the imaging element and the like of Example 8, the imaging element and the like of Example 9, the imaging element and the like of Example 10, and the imaging element and the like of Example 12 can be arbitrarily combined.

In some cases, the floating diffusion layers $FD_1$, $FD_2$, $FD_3$, 51C, 45C, and 46C can be shared.

In Examples, the composite oxide layer exclusively contains IGZO. However, alternatively, the composite oxide layer (inorganic oxide semiconductor material layer) can contain at least two elements selected from the group consisting of indium, tungsten, tin, and zinc. Specifically, the first semiconductor material layer can contain indium-tungsten oxide (IWO), indium-tungsten-zinc oxide (IWZO), indium-tin-zinc oxide (ITZO), or zinc-tin oxide (ZTO). More specifically, the composite oxide layer can contain In—W oxide, In—Sn oxide, In—Zn oxide, W—Sn oxide, W—Zn oxide, Sn—Zn oxide, In—W—Sn oxide, In—W—Zn oxide, In—Sn—Zn oxide, or In—W—Sn—Zn oxide. Note that in these configurations, by performing composition modulation at the time of formation (that is, by changing the composition in an inclined state or a stepped state), it is only required to form the composite oxide layer (or the first layer and the second layer constituting the composite oxide layer). In addition, also with these configurations, similarly to the case where the composite oxide layer contains IGZO, when carriers (for example, photoelectrons) generated by photoelectric conversion flow into the composite oxide layer from the photoelectric conversion layer, carrier stagnation hardly occurs at an interface between the photoelectric conversion layer and the composite oxide layer. Furthermore, carrier transport capability of the photoelectric conversion layer and the composite oxide layer as a whole can be improved. As a result, it is possible to provide an imaging element and the like having no adverse effect on photoresponsiveness of the imaging element and having excellent transfer characteristics of charges accumulated in the photoelectric conversion layer.

Furthermore, an intermediate layer can be formed between the first layer $23B_1$ and the second layer $23B_2$.

Figure 64:
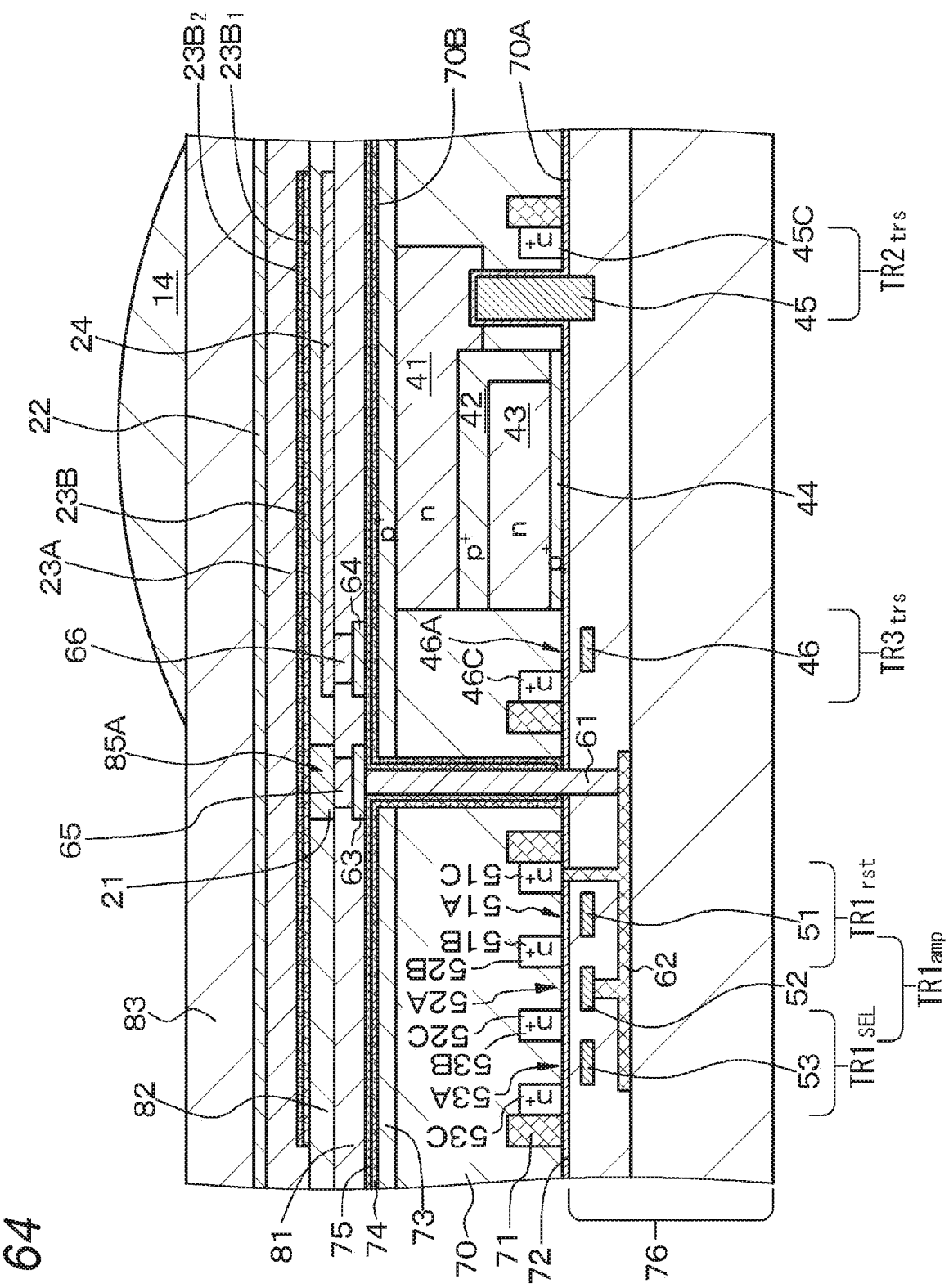
FIG. 64 is a schematic partial cross-sectional view of another modification of the imaging element of Example 1.

For example, as FIG. 64 illustrates a modification of the imaging element and the like described in Example 1, the first electrode 21 can extend in an opening 85A formed in the insulating layer 82 to be connected to the composite oxide layer 23B.

Figure 65:
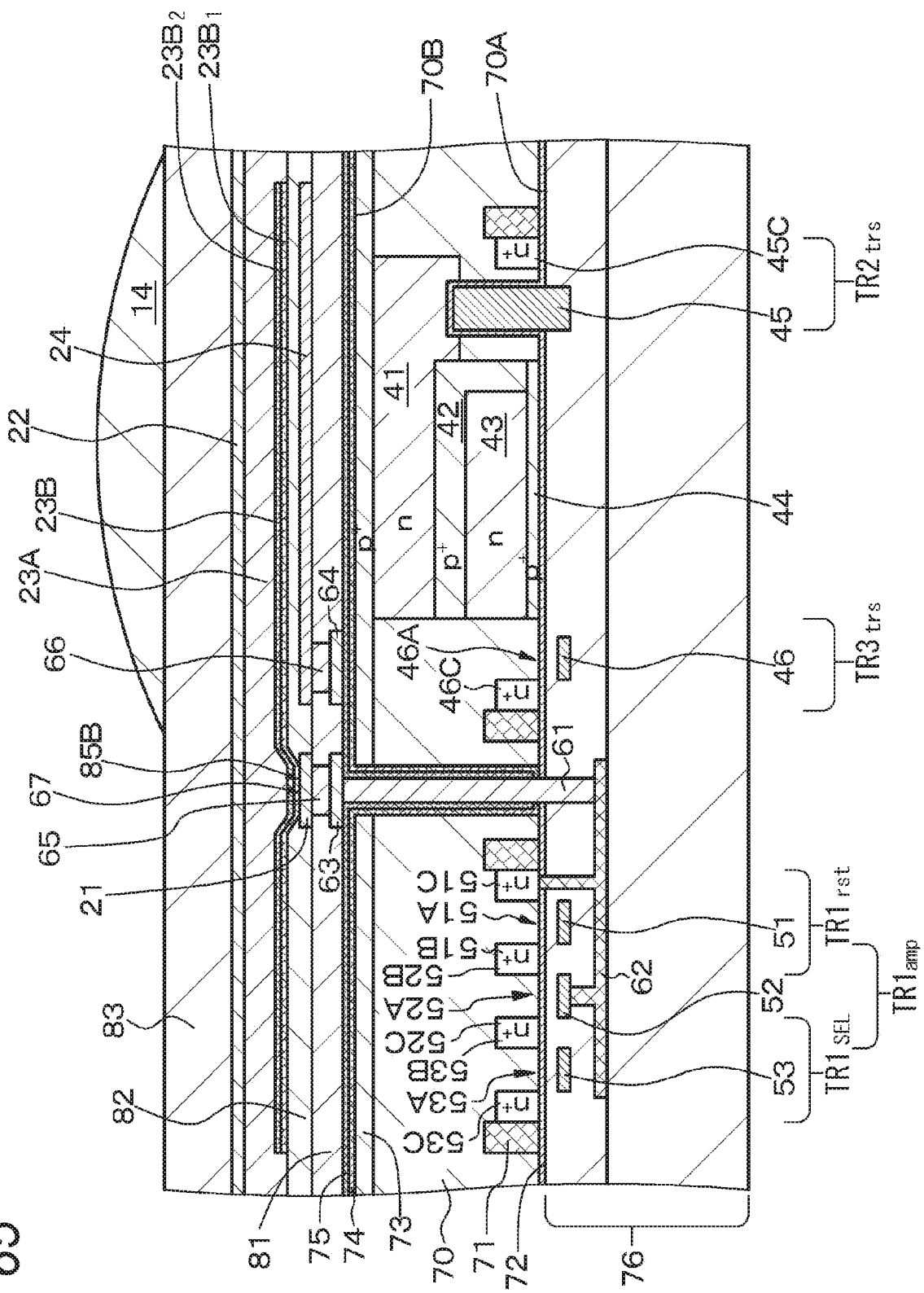
FIG. 65 is a schematic partial cross-sectional view of still another modification of the imaging element of Example 1.
Figure 66A:
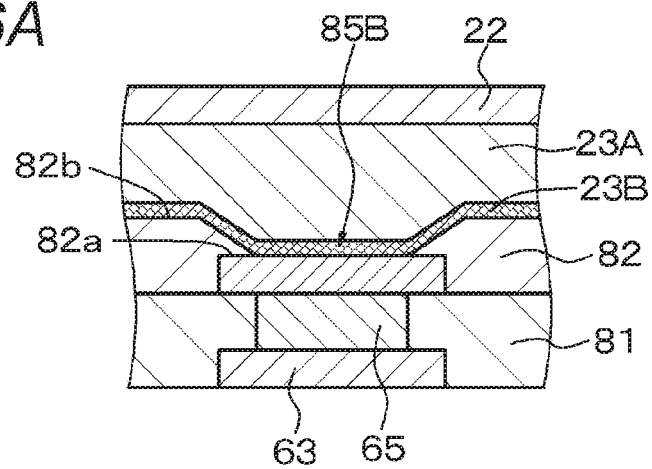
FIGS. 66A, 66B, and 66C are each an enlarged schematic partial cross-sectional view of a first electrode portion and the like of still another modification of the imaging element of Example 1.
Figure 66B:
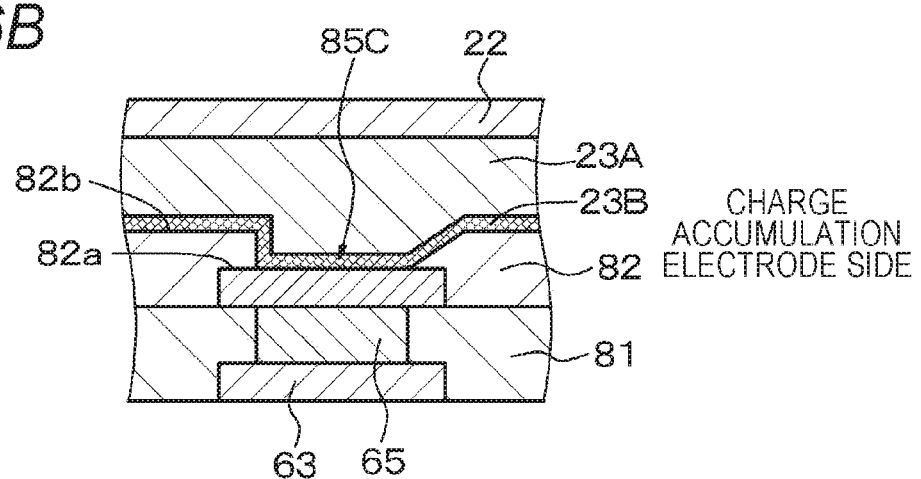
Figure 66C:
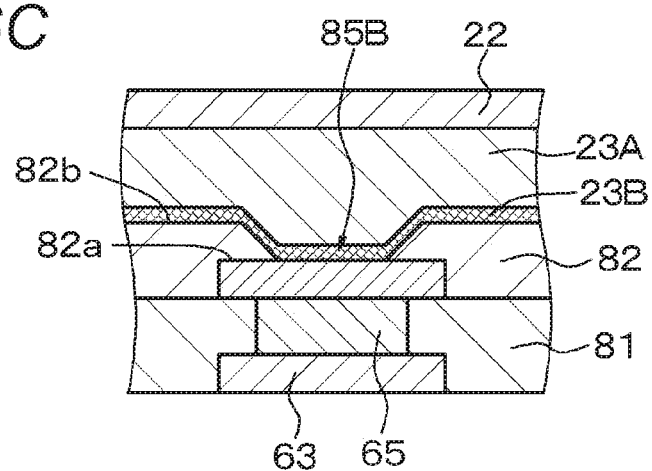

Alternatively, for example, as FIG. 65 illustrates a modification of the imaging element and the laminated imaging element described in Example 1, and FIG. 66A illustrates an enlarged schematic partial cross-sectional view of the first electrode portion and the like, an edge of a top surface of the first electrode 21 is covered with the insulating layer 82, the first electrode 21 is exposed on a bottom surface of an opening 85B, and when a surface of the insulating layer 82 in contact with the top surface of the first electrode 21 is referred to as a first surface 82a and a surface of the insulating layer 82 in contact with a portion of the composite oxide layer 23B facing the charge accumulation electrode 24 is referred to as a second surface 82b, a side surface of the opening 85B has an inclination widening from the first surface 82a toward the second surface 82b. In this way, by inclining the side surface of the opening 85B, transfer of charges from the composite oxide layer 23B to the first electrode 21 becomes smoother. Note that in the example illustrated in FIG. 66A, side surfaces of the opening 85B are rotationally symmetric with each other about the axis of the opening 85B. However, as illustrated in FIG. 66B, an opening 85C may be formed such that a side surface of the opening 85C having an inclination widening from the first surface 82a toward the second surface 82b is located on the charge accumulation electrode 24 side. As a result, transfer of charges from a portion of the composite oxide layer 23B opposite to the charge accumulation electrode 24 across the opening 85C is difficult. Furthermore, the side surface of the opening 85B has an inclination widening from the first surface 82a toward the second surface 82b. However, an edge of the side surface of the opening 85B in the second surface 82b may be located outside an edge of the first electrode 21 as illustrated in FIG. 66A, or may be located inside the edge of the first electrode 21 as illustrated in FIG. 66C. By adopting the former configuration, transfer of charges is further facilitated. By adopting the latter configuration, variation in shape at the time of forming an opening can be reduced.

These openings 85B and 85C can be formed by reflowing an etching mask containing a resist material to be formed when an opening is formed in the insulating layer on the basis of an etching method to incline the opening side surface of the etching mask, and etching the insulating layer 82 using the etching mask.

Figure 67:
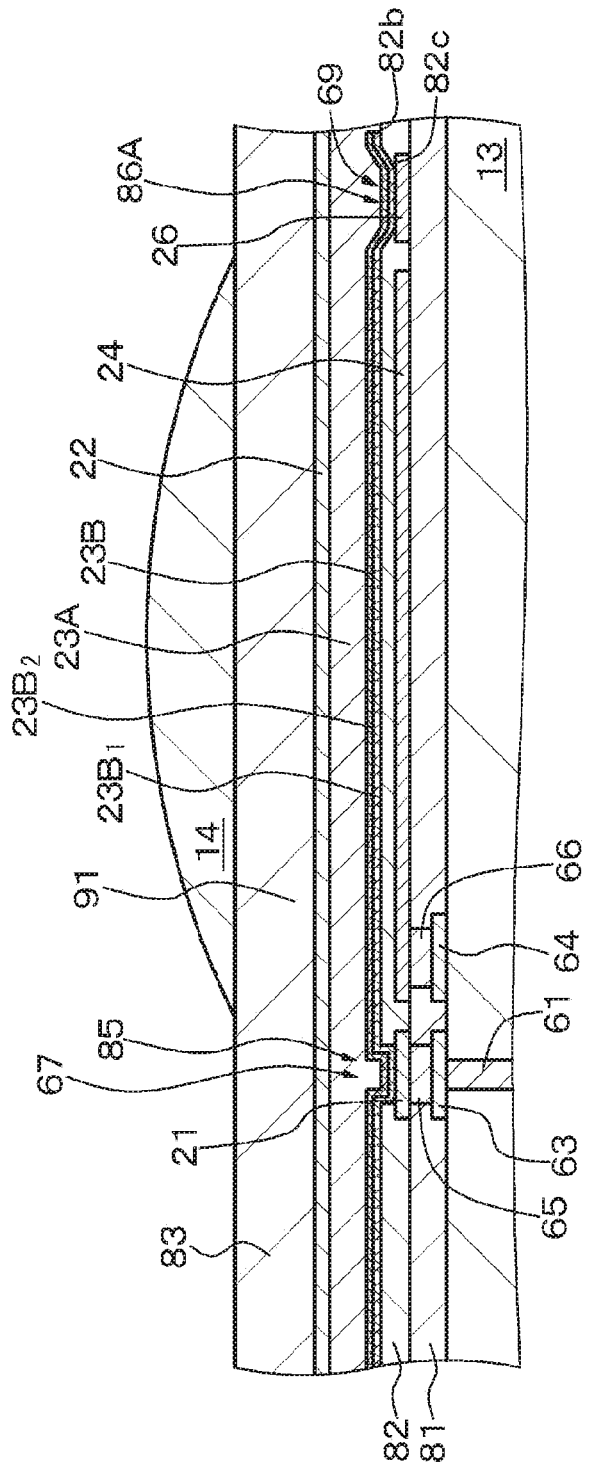
FIG. 67 is an enlarged schematic partial cross-sectional view of a charge discharge electrode portion and the like of another modification of the imaging element of Example 5.

Alternatively, regarding the charge discharge electrode 26 described in Example 5, as illustrated in FIG. 67, a form can be adopted in which the composite oxide layer 23B extends in the second opening 86A formed in the insulating layer 82 to be connected to the charge discharge electrode 26, an edge of a top surface of the charge discharge electrode 26 is covered with the insulating layer 82, the charge discharge electrode 26 is exposed on a bottom surface of the second opening 86A, and when a surface of the insulating layer 82 in contact with the top surface of the charge discharge electrode 26 is referred to as a third surface 82c and a surface of the insulating layer 82 in contact with a portion of the composite oxide layer 23B facing the charge accumulation electrode 24 is referred to as a second surface 82b, a side surface of the second opening 86A has an inclination widening from the third surface 82c toward the second surface 82b.

Figure 68:
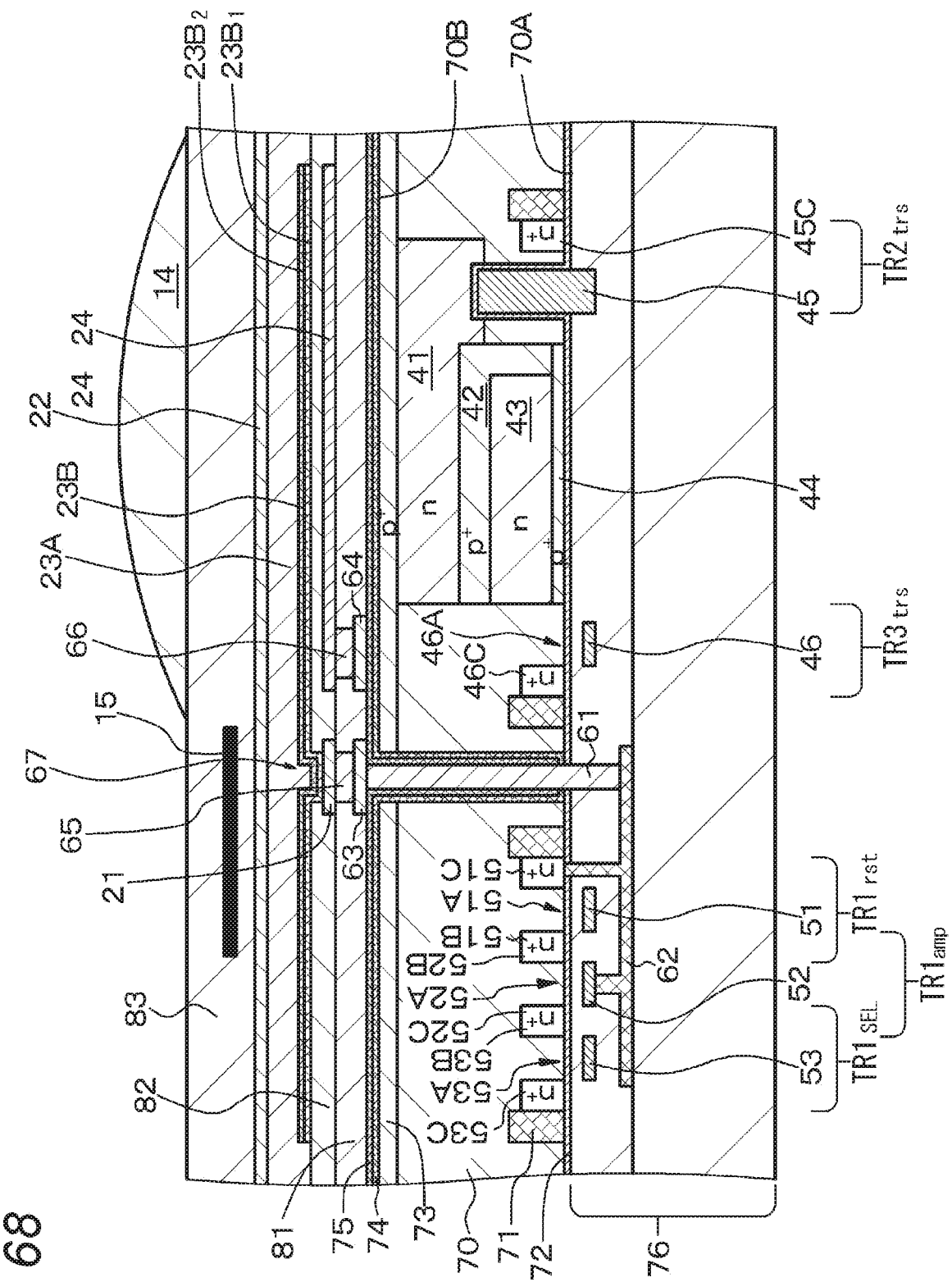
FIG. 68 is a schematic partial cross-sectional view of still another modification of the imaging element of Example 1.

Furthermore, for example, as FIG. 68 illustrates a modification of the imaging element and the laminated imaging element described in Example 1, a configuration can be adopted in which light is incident from the second electrode 22 side, and a light shielding layer 15 is formed on the light incident side of the second electrode 22. Note that various wiring lines disposed on the light incident side of the photoelectric conversion layer can function as a light shielding layer.

Figure 69:
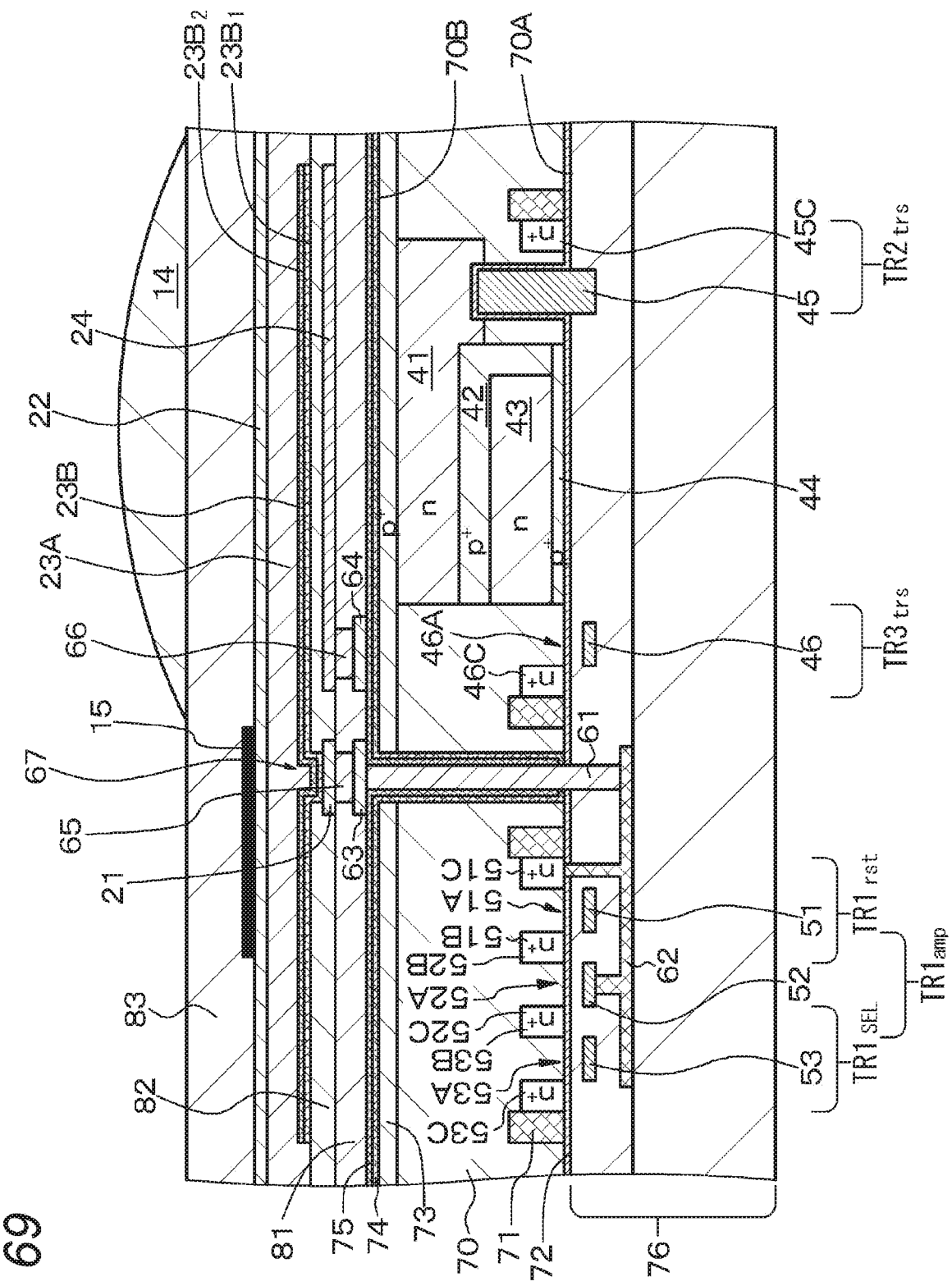
FIG. 69 is a schematic partial cross-sectional view of still another modification of the imaging element of Example 1.
Figure 70:
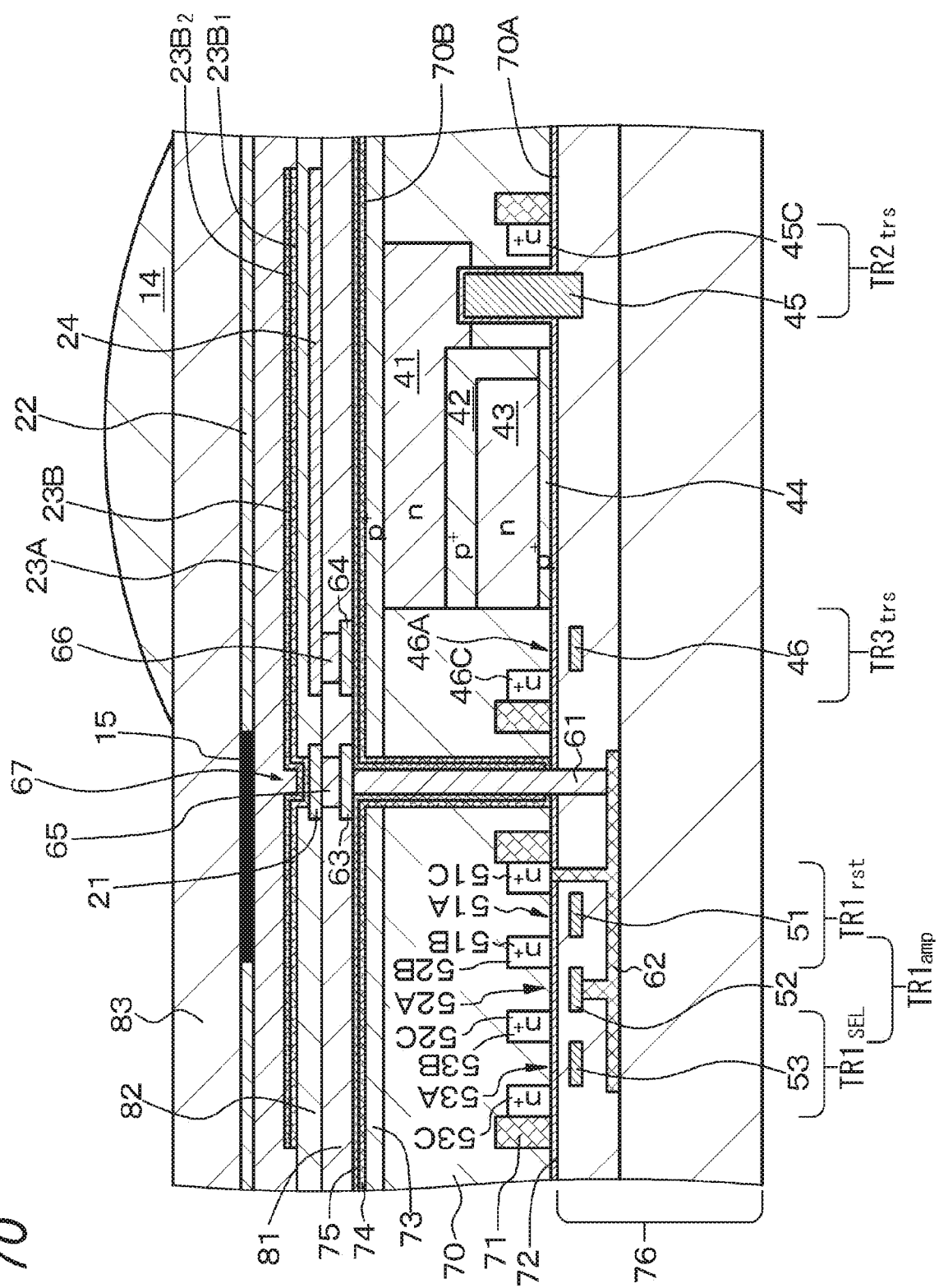
FIG. 70 is a schematic partial cross-sectional view of still another modification of the imaging element of Example 1.

Note that in the example illustrated in FIG. 68, the light shielding layer 15 is formed above the second electrode 22, that is, the light shielding layer 15 is formed on the light incident side of the second electrode 22 and above the first electrode 21. However, as illustrated in FIG. 69, the light shielding layer 15 may be disposed on the light incident side surface of the second electrode 22. Furthermore, in some cases, the light shielding layer 15 may be formed in the second electrode 22 as illustrated in FIG. 70.

Figure 71:
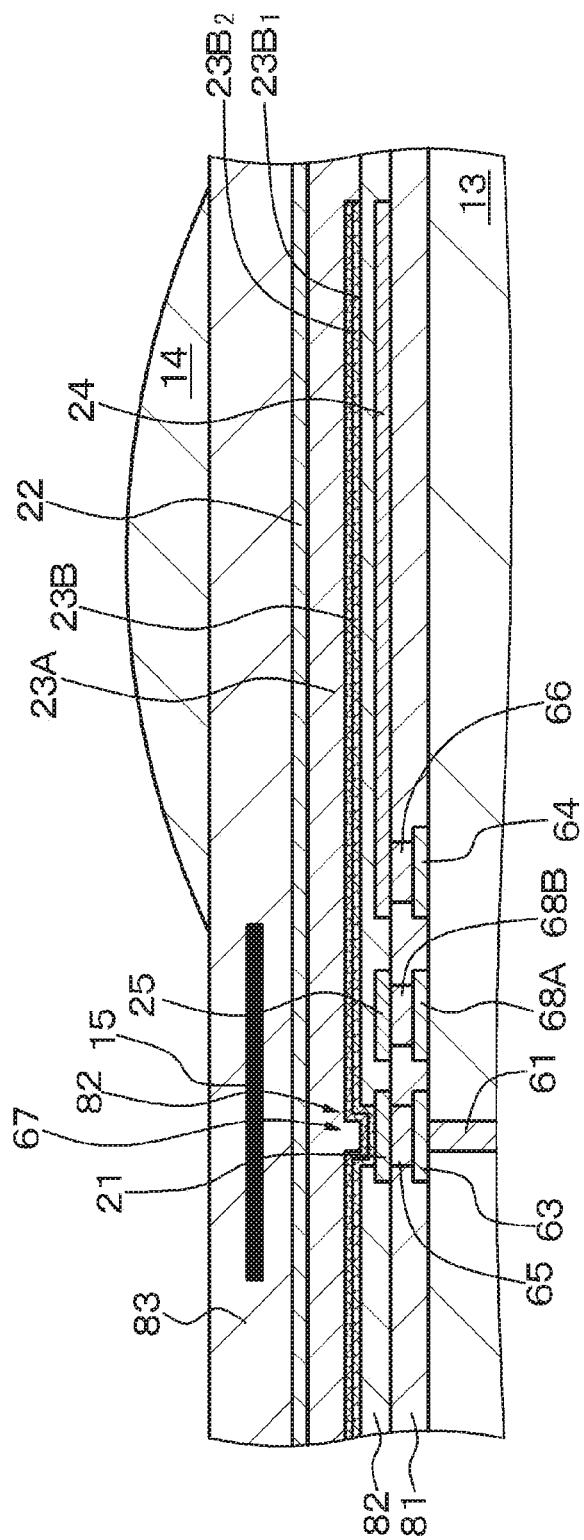
FIG. 71 is a schematic partial cross-sectional view of another modification of the imaging element of Example 4.
Figure 72:
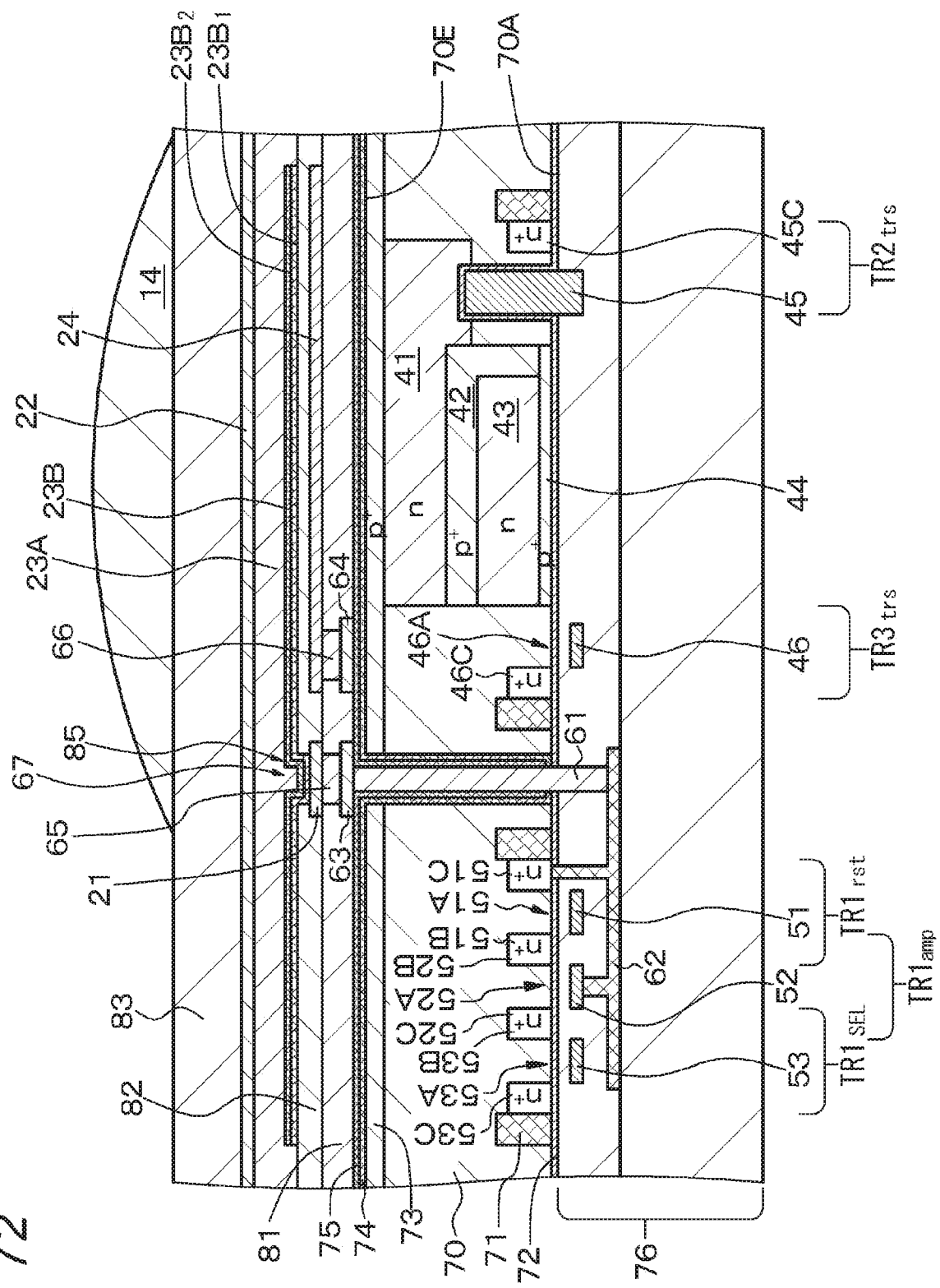
FIG. 72 is a schematic partial cross-sectional view of still another modification of the imaging element of Example 1.

Alternatively, a structure can be adopted in which light is incident from the second electrode 22 side and light is not incident on the first electrode 21. Specifically, as illustrated in FIG. 68, the light shielding layer 15 is formed on the light incident side of the second electrode 22 and above the first electrode 21. Alternatively, as illustrated in FIG. 72, a structure can be adopted in which the on-chip micro lens 14 is disposed above the charge accumulation electrode 24 and the second electrode 22, and light incident on the on-chip micro lens 14 is collected by the charge accumulation electrode 24 and does not reach the first electrode 21. Note that as described in Example 4, in a case where the transfer control electrode 25 is disposed, a structure can be adopted in which light is not incident on the first electrode 21 and the transfer control electrode 25. Specifically, as illustrated in FIG. 71, the light shielding layer 15 can be formed above the first electrode 21 and the transfer control electrode 25. Alternatively, a structure can be adopted in which light incident on the on-chip micro lens 14 does not reach the first electrode 21 or the first electrode 21 and the transfer control electrode 25.

By adopting these configurations and structures, or alternatively by disposing the light shielding layer 15 such that light is incident only on a portion of the photoelectric conversion layer 23A located above the charge accumulation electrode 24, or alternatively by designing the on-chip micro lens 14, a portion of the photoelectric conversion layer 23A located above the first electrode 21 (or above the first electrode 21 and the transfer control electrode 25) does not contribute to photoelectric conversion. Therefore, all the pixels can be reset more reliably all at once, and a global shutter function can be achieved more easily. That is, a method for driving a solid-state imaging device including the plurality of imaging elements and the like having these configurations and structures repeats, discharging charges in the first electrode 21 out of the system while charges are accumulated in the composite oxide layer 23B and the like all at once in all the imaging elements and the like, and then transferring the charges accumulated in the composite oxide layer 23B and the like to the first electrode 21 all at once in all the imaging elements and the like, and sequentially reading out the charges transferred to the first electrode 21 in each of the imaging elements and the like after completion of the transfer.

In such a method for driving a solid-state imaging device, each of the imaging elements and the like has a structure in which light incident from the second electrode side is not incident on the first electrode, and the charges in the first electrode are discharged out of the system while the charges are accumulated in the composite oxide layer and the like all at once in all the imaging elements and the like. Therefore, the first electrode can be reliably reset simultaneously in all the imaging elements and the like. Then, thereafter, the charges accumulated in the composite oxide layer and the like are transferred to the first electrode all at once in all the imaging elements and the like, and after completion of the transfer, the charges transferred to the first electrode are sequentially read out in each of the imaging elements and the like. Therefore, a so-called global shutter function can be easily implemented.

Figure 73:
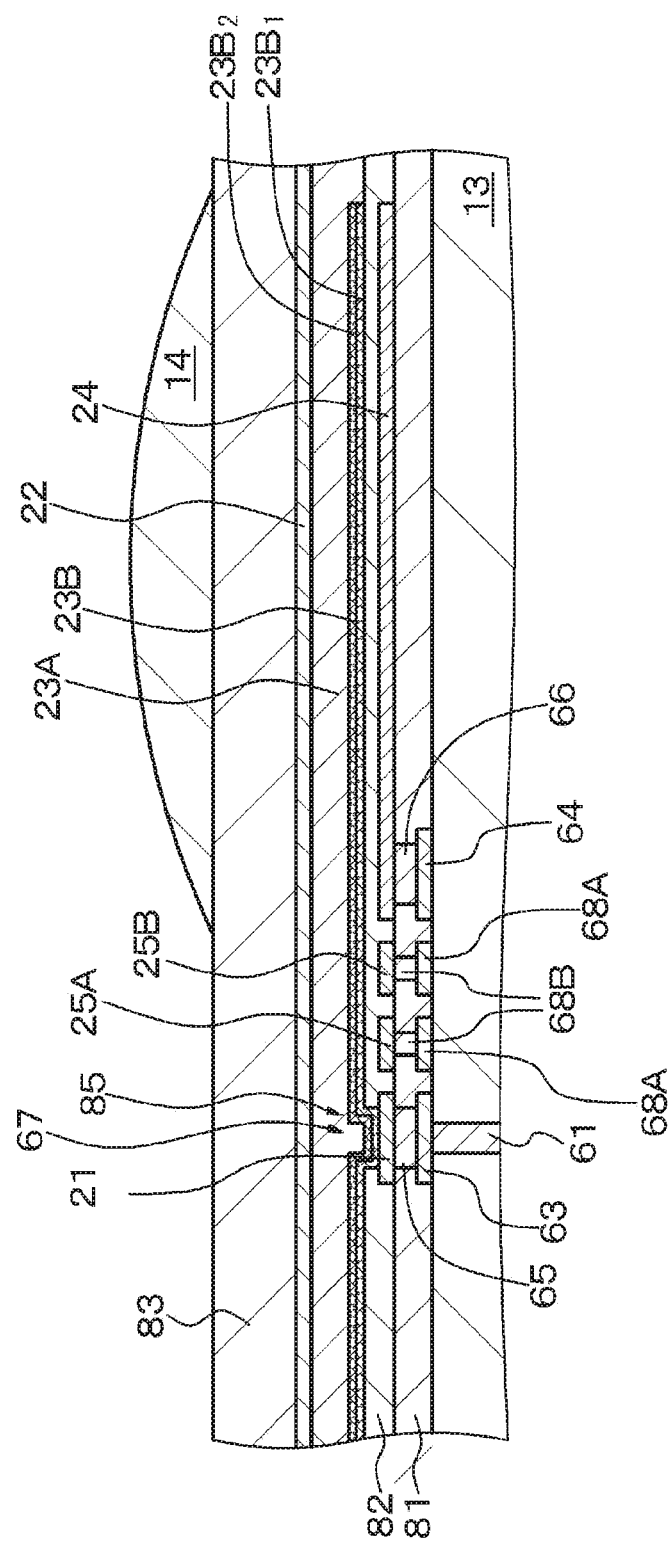
FIG. 73 is a schematic partial cross-sectional view of still another modification of the imaging element of Example 4.

Furthermore, as a modification of Example 4, as illustrated in FIG. 73, a plurality of transfer control electrodes may be disposed from a position closest to the first electrode 21 toward the charge accumulation electrode 24. Note that FIG. 73 illustrates an example in which two transfer control electrodes 25A and 25B are disposed. In addition, a structure can be adopted in which the on-chip micro lens 14 is disposed above the charge accumulation electrode 24 and the second electrode 22, and light incident on the on-chip micro lens 14 is collected by the charge accumulation electrode 24 and does not reach the first electrode 21 and the transfer control electrodes 25A and 25B.

Figure 74:
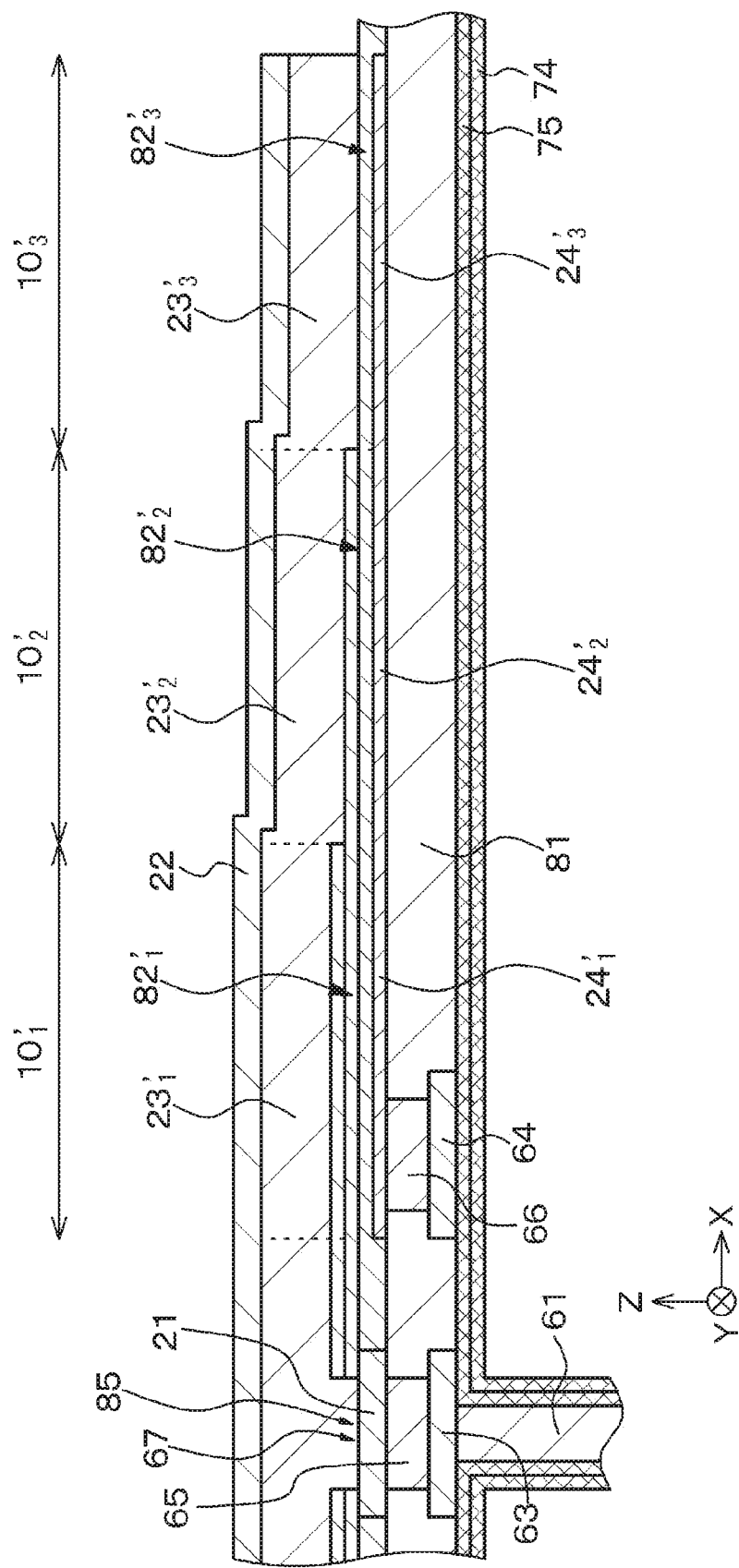
FIG. 74 is a schematic partial cross-sectional view obtained by enlarging a portion where a charge accumulation electrode, a photoelectric conversion layer, and a second electrode are laminated in a modification of the imaging element of Example 7.

In Example 7 illustrated in FIGS. 37 and 38, by gradually reducing the thicknesses of the charge accumulation electrode segments $24'_1$, $24'_2$, and $24'_3$, the thicknesses of the insulating layer segments $82'_1$, $82'_2$, and $82'_3$ are gradually increased. Meanwhile, as FIG. 74 illustrates a schematic partial cross-sectional view obtained by enlarging a portion where a charge accumulation electrode, a composite oxide layer, a photoelectric conversion layer, and a second electrode are laminated in a modification of the of Example 7, the thicknesses of the charge accumulation electrode segments $24'_1$, $24'_2$, and $24'_3$ may be constant, and the thicknesses of the insulating layer segments $82'_1$, $82'_2$, and $82'_3$ may be gradually increased. Note that the thicknesses of the photoelectric conversion layer segments $23'_1$, $23'_2$, and $23'_3$ are constant.

Figure 75:
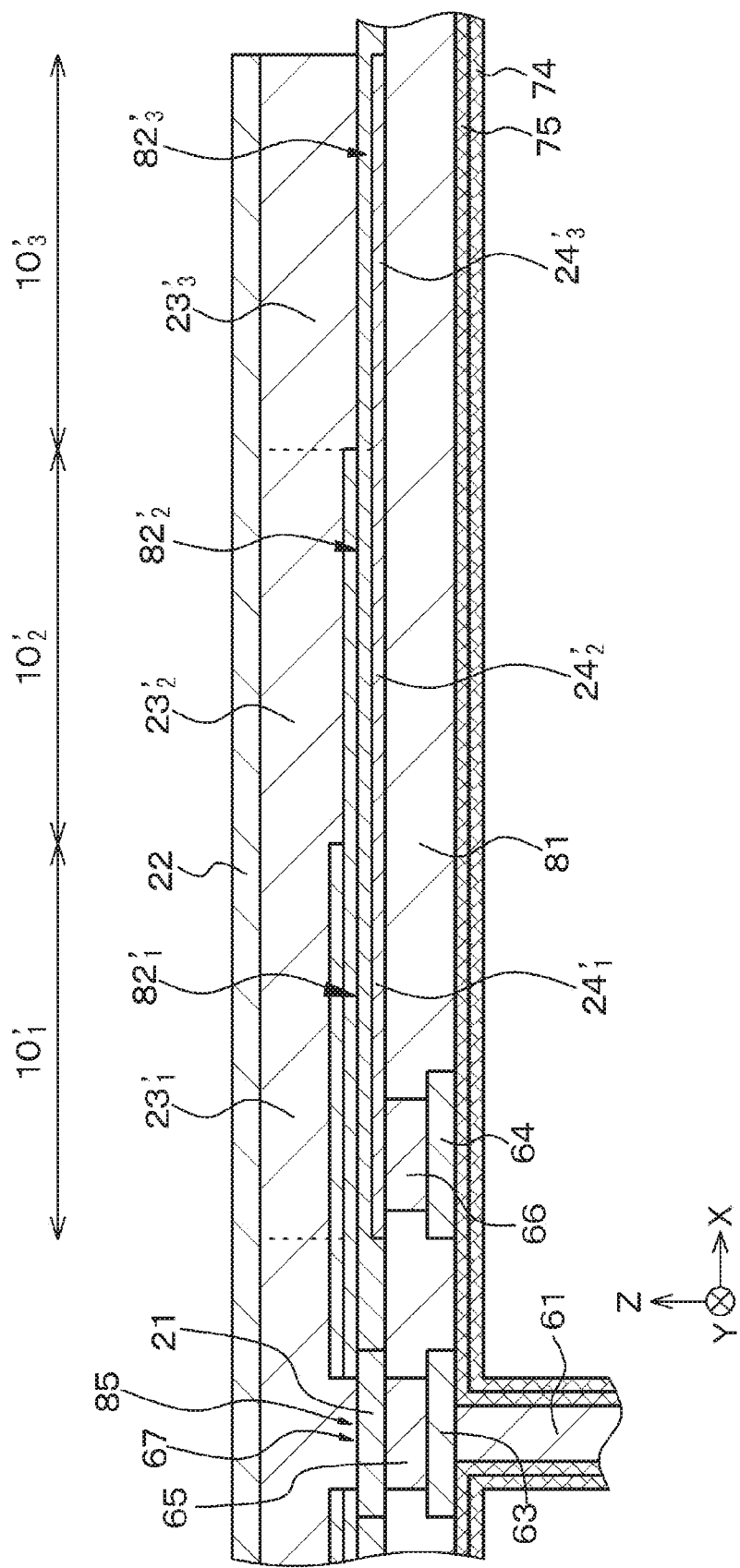
FIG. 75 is a schematic partial cross-sectional view obtained by enlarging a portion where a charge accumulation electrode, a photoelectric conversion layer, and a second electrode are laminated in a modification of the imaging element of Example 8.

Furthermore, in Example 8 illustrated in FIG. 40, by gradually reducing the thicknesses of the charge accumulation electrode segments $24'_1$, $24'_2$, and $24'_3$, the thicknesses of the photoelectric conversion layer segments $23'_1$, $23'_2$, and $23'_3$ are gradually increased. Meanwhile, as FIG. 75 illustrates a schematic partial cross-sectional view obtained by enlarging a portion where a charge accumulation electrode, a photoelectric conversion layer, and a second electrode are laminated in a modification of the of Example 8, by making the thicknesses of the charge accumulation electrode segments $24'_1$, $24'_2$, and $24'_3$ constant, and gradually reducing the thicknesses of the insulating layer segments $82'_1$, $82'_2$, and $82'_3$, the thicknesses of the photoelectric conversion layer segments $23'_1$, $23'_2$, and $23'_3$ may be gradually increased.

It goes without saying that the various modifications described above can also be applied to Examples 2 to 14.

In Examples, electrons are used as signal charges, and the conductivity type of the photoelectric conversion layer formed on the semiconductor substrate is n-type. However, the present disclosure can also be applied to a solid-state imaging device using holes as signal charges. In this case, each semiconductor region only needs to be constituted by a semiconductor region having the opposite conductivity type, and the conductivity type of the photoelectric conversion layer formed on the semiconductor substrate only needs to be p-type.

In Examples, the case where the present disclosure is applied to a CMOS type solid-state imaging device in which unit pixels that detect signal charges corresponding to the amount of incident light as physical quantities are arranged in a matrix has been described as an example. However, the present disclosure is not limited to application to the CMOS type solid-state imaging device, and can also be applied to a CCD type solid-state imaging device. In the latter case, signal charges are transferred in the vertical direction by a vertical transfer register having a CCD type structure, transferred in the horizontal direction by a horizontal transfer register, and amplified to output a pixel signal (image signal). Furthermore, the present disclosure is not limited to a general column type solid-state imaging device in which pixels are formed in a two-dimensional matrix and a column signal processing circuit is disposed for each pixel column.

Moreover, in some cases, the selection transistor can be omitted.

Moreover, the imaging element and the laminated imaging element of the present disclosure are not limited to application to a solid-state imaging device that detects distribution of the amount of incident visible light and images the distribution as an image, but can also be applied to a solid-state imaging device that images distribution of the incident amount of infrared rays, X-rays, particles, and the like as an image. Furthermore, in a broad sense, the present disclosure can be applied to a general solid-state imaging device (physical quantity distribution detection device) such as a fingerprint detection sensor that detects distribution of other physical quantities such as pressure and capacitance, and images the physical quantities as an image.

Moreover, the present disclosure is not limited to a solid-state imaging device that sequentially scans each unit pixel of an imaging region in row units and reads out a pixel signal from each unit pixel. The present disclosure can also be applied to an X-Y address type solid-state imaging device that selects an arbitrary pixel in pixel units and reads out a pixel signal in pixel units from a selected pixel. The solid-state imaging device may be formed as one chip, or may be a modular form having an imaging function in which an imaging region and a drive circuit or an optical system are packaged collectively.

Furthermore, the present disclosure is not limited to application to a solid-state imaging device, but can also be applied to an imaging device. Here, the imaging device refers to a camera system such as a digital still camera or a digital video camera, or an electronic device having an imaging function, such as a mobile phone. There is a case where a module form mounted on an electronic device, that is, a camera module is used as an imaging device.

Figure 77:
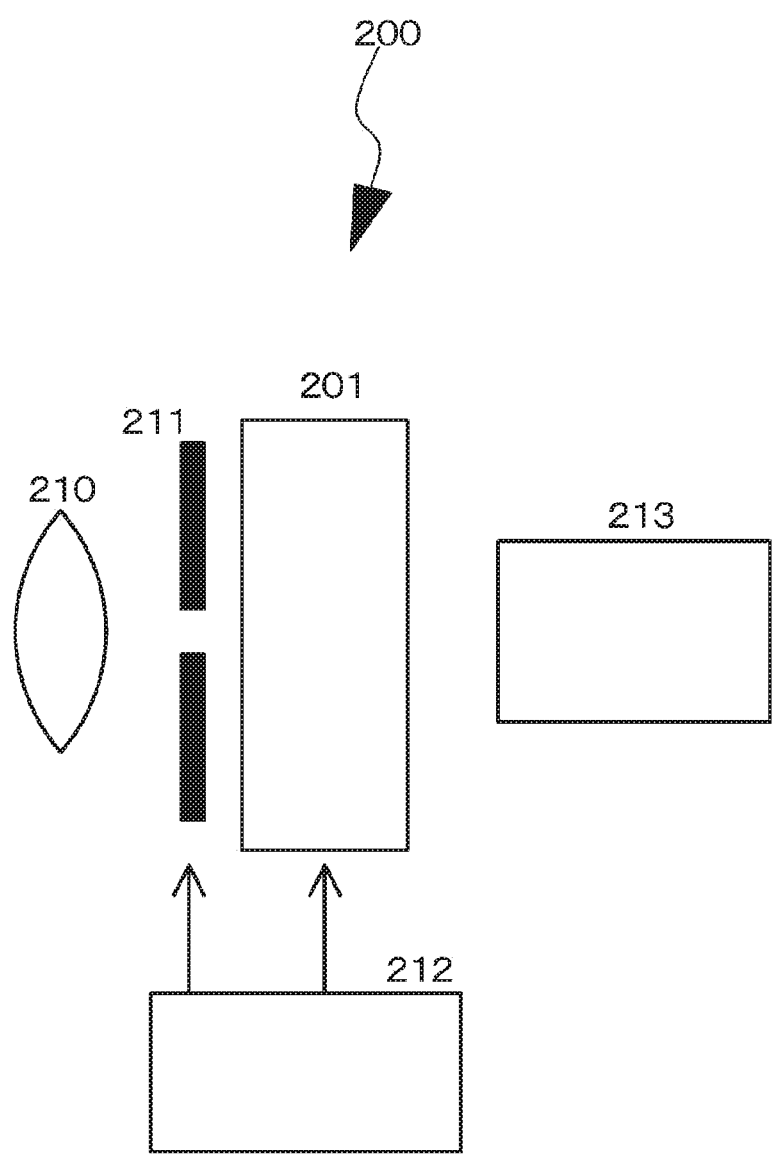
FIG. 77 is a conceptual diagram of an example in which a solid-state imaging device including the imaging element and the like of the present disclosure is used for an electronic device (camera).

FIG. 77 illustrates an example in which a solid-state imaging device 201 including the imaging element and the laminated imaging element of the present disclosure is used for an electronic device (camera) 200 as a conceptual diagram. The electronic device 200 includes the solid-state imaging device 201, an optical lens 210, a shutter device 211, a drive circuit 212, and a signal processing circuit 213. The optical lens 210 forms an image of image light (incident light) from a subject on an imaging surface of the solid-state imaging device 201. As a result, signal charges are accumulated in the solid-state imaging device 201 for a certain period of time. The shutter device 211 controls a light irradiation period and a light shielding period for the solid-state imaging device 201. The drive circuit 212 supplies a driving signal for controlling a transfer operation and the like of the solid-state imaging device 201 and a shutter operation of the shutter device 211. The solid-state imaging device 201 transfers a signal by a driving signal (timing signal) supplied from the drive circuit 212. The signal processing circuit 213 performs various signal processes. A video signal that has been subjected to signal processing is stored in a storage medium such as a memory or is output to a monitor. In such an electronic device 200, the pixel size in the solid-state imaging device 201 can be reduced and the transfer efficiency can be improved, and therefore the electronic device 200 with improved pixel characteristics can be obtained. The electronic device 200 to which the solid-state imaging device 201 can be applied is not limited to a camera, and can be applied to an imaging device such as a digital still camera or a camera module for a mobile device such as a mobile phone.

Note that the present disclosure can have the following configurations.

[A01]<<Imaging element: first aspect>>

An imaging element including a photoelectric conversion unit formed by laminating a first electrode, a photoelectric conversion layer, and a second electrode, in which between the first electrode and the photoelectric conversion layer, a composite oxide layer containing indium composite oxide is formed, the composite oxide layer includes a first layer adjacent to the first electrode and a second layer adjacent to the photoelectric conversion layer, and the first layer has a higher indium composition (indium atom content) than the second layer.

[A02]<<Imaging element: second aspect>>

An imaging element including a photoelectric conversion unit formed by laminating a first electrode, a photoelectric conversion layer, and a second electrode, in which between the first electrode and the photoelectric conversion layer, a composite oxide layer containing indium-gallium-zinc composite oxide is formed, the composite oxide layer includes a first layer adjacent to the first electrode and a second layer adjacent to the photoelectric conversion layer, the first layer has a higher indium composition (indium atom content) than the second layer, or the first layer has a higher gallium composition (gallium atom content) than the second layer, or the first layer has a higher zinc composition (zinc atom content) than the second layer.

[A03] The imaging element according to [A02], in which when the indium-gallium-zinc composite oxide is represented by $(ZnO)_X(Ga_2O_3)_{1-X}$, $(Ga_2O_3)_Y(In_2O_3)_{1-Y}$, and $(In_2O_3)_Z(ZnO)_{1-Z}$, a value of X in the first layer is larger than a value of X in the second layer, or a value of Y in the first layer is lower than a value of Y in the second layer, or a value of Z in the first layer is higher than a value of Z in the second layer.

[A04] The imaging element according to [A03], satisfying $0<X<0.875$, $0<Y<0.875$, and $0.125<Z<0.875$ (where $X+Y+Z=1.000$).

[A05]<<Imaging element: third aspect>>

An imaging element including a photoelectric conversion unit formed by laminating a first electrode, a photoelectric conversion layer, and a second electrode, between the first electrode and the photoelectric conversion layer, a composite oxide layer containing indium composite oxide is formed, the composite oxide layer includes a first layer adjacent to the first electrode and a second layer adjacent to the photoelectric conversion layer, and the first layer has a higher carrier mobility than the second layer.

[A06] The imaging element according to [A05], satisfying $1 \times 10^{-6} \geq$(carrier mobility of second layer)/(carrier mobility of first layer)$\leq 0.1$.

[A07]<<Imaging element: fourth aspect>>

An imaging element including a photoelectric conversion unit formed by laminating a first electrode, a photoelectric conversion layer, and a second electrode, in which between the first electrode and the photoelectric conversion layer, a composite oxide layer containing indium composite oxide is formed, the composite oxide layer includes a first layer adjacent to the first electrode and a second layer adjacent to the photoelectric conversion layer, and the first layer has a lower state density than the second layer.

[A08] The imaging element according to any one of [A01] to [A07], in which the composite oxide layer is amorphous.

[A09]<<Charge accumulation electrode>>

The imaging element according to any one of [A01] to [A08], in which the photoelectric conversion unit further includes an insulating layer and a charge accumulation electrode disposed apart from the first electrode so as to face the composite oxide layer via the insulating layer.

[A10] The imaging element according to [A09], further including a semiconductor substrate, in which the photoelectric conversion unit is disposed above the semiconductor substrate.

[A11] The imaging element according to [A09] or [A10], in which the first electrode extends in an opening formed in the insulating layer to be connected to the composite oxide layer.

[A12] The imaging element according to [A09] or [A10], in which the composite oxide layer extends in an opening formed in the insulating layer to be connected to the first electrode.

[A13] The imaging element according to [A12], in which
an edge of a top surface of the first electrode is covered with the insulating layer,
the first electrode is exposed on a bottom surface of the opening, and
when a surface of the insulating layer in contact with the top surface of the first electrode is referred to as a first surface, and a surface of the insulating layer in contact with a portion of the composite oxide layer facing the charge accumulation electrode is referred to as a second surface, a side surface of the opening has an inclination widening from the first surface toward the second surface.

[A14] The imaging element according to [A13], in which the side surface of the opening having an inclination widening from the first surface toward the second surface is located on the charge accumulation electrode side.

[A15]<<Control of potentials of first electrode and charge accumulation electrode>>
The imaging element according to any one of [A09] to [A14], further including a control unit disposed on the semiconductor substrate and having a drive circuit, in which
the first electrode and the charge accumulation electrode are connected to the drive circuit,
in a charge accumulation period, the drive circuit applies a potential $V_{11}$ to the first electrode and applies a potential $V_{12}$ to the charge accumulation electrode, and charges are accumulated in the composite oxide layer, and
in a charge transfer period, the drive circuit applies a potential $V_{21}$ to the first electrode and applies a potential $V_{22}$ to the charge accumulation electrode, and the charges accumulated in the composite oxide layer are read out by the control unit via the first electrode.
However, in a case where the potential of the first electrode is higher than that of the second electrode,
$V_{12} \geq V_{11}$ and $V_{22} < V_{21}$ are satisfied, and
in a case where the potential of the first electrode is lower than that of the second electrode,
$V_{12} \leq V_{11}$ and $V_{22} > V_{21}$ are satisfied.

[A16]<<Transfer control electrode>>
The imaging element according to any one of [A09] to [A15], further including a transfer control electrode disposed apart from the first electrode and the charge accumulation electrode so as to face the composite oxide layer via the insulating layer between the first electrode and the charge accumulation electrode.

[A17]<<Control of potentials of first electrode, charge accumulation electrode, and transfer control electrode>>
The imaging element according to [A16], further including a control unit disposed on a semiconductor substrate and having a drive circuit, in which
the first electrode, the charge accumulation electrode, and the transfer control electrode are connected to the drive circuit,
in a charge accumulation period, the drive circuit applies a potential $V_{11}$ to the first electrode, applies a potential $V_{12}$ to the charge accumulation electrode, and applies a potential $V_{13}$ to the transfer control electrode, and charges are accumulated in the composite oxide layer, and
in a charge transfer period, the drive circuit applies a potential $V_{21}$ to the first electrode, applies a potential $V_{22}$ to the charge accumulation electrode, and applies a potential $V_{23}$ to the transfer control electrode, and the charges accumulated in the composite oxide layer are read out by the control unit via the first electrode.
However, in a case where the potential of the first electrode is higher than that of the second electrode,
$V_{12} > V_{13}$ and $V_{22} \leq V_{23} \leq V_{21}$ are satisfied, and
in a case where the potential of the first electrode is lower than that of the second electrode,
$V_{12} < V_{13}$ and $V_{22} \geq V_{23} \geq V_{21}$ are satisfied.

[A18]<<Charge discharge electrode>>
The imaging element according to any one of [A09] to [A17], further including a charge discharge electrode connected to the composite oxide layer and disposed apart from the first electrode and the charge accumulation electrode.

[A19] The imaging element according to [A18], in which the charge discharge electrode is disposed so as to surround the first electrode and the charge accumulation electrode.

[A20] The imaging element according to [A18] or [A19], in which the composite oxide layer extends in a second opening formed in the insulating layer to be connected to the charge discharge electrode,
an edge of a top surface of the charge discharge electrode is covered with the insulating layer,
the charge discharge electrode is exposed on a bottom surface of the second opening, and
when a surface of the insulating layer in contact with the top surface of the charge discharge electrode is referred to as a third surface, and a surface of the insulating layer in contact with a portion of the composite oxide layer facing the charge accumulation electrode is referred to as a second surface, a side surface of the second opening has an inclination widening from the third surface toward the second surface.

[A21]<<Control of potentials of first electrode, charge accumulation electrode, and charge discharge electrode>>
The imaging element according to any one of [A18] to [A20], further including a control unit disposed on a semiconductor substrate and having a drive circuit, in which
the first electrode, the charge accumulation electrode, and the charge discharge electrode are connected to the drive circuit,
in a charge accumulation period, the drive circuit applies a potential $V_{11}$ to the first electrode, applies a potential $V_{12}$ to the charge accumulation electrode, and applies a potential $V_{14}$ to the charge discharge electrode, and charges are accumulated in the composite oxide layer, and
in a charge transfer period, the drive circuit applies a potential $V_{21}$ to the first electrode, applies a potential $V_{22}$ to the charge accumulation electrode, and applies a potential $V_{24}$ to the charge discharge electrode, and the charges accumulated in the composite oxide layer are read out by the control unit via the first electrode.
However, in a case where the potential of the first electrode is higher than that of the second electrode,
$V_{14} > V_{11}$ and $V_{24} < V_{21}$ are satisfied, and
in a case where the potential of the first electrode is lower than that of the second electrode,
$V_{14} < V_{11}$ and $V_{24} > V_{21}$ are satisfied.

[A22]<<Charge accumulation electrode segment>>
The imaging element according to any one of [A09] to [A21], in which the charge accumulation electrode includes a plurality of charge accumulation electrode segments.

[A23] The imaging element according to [A22], in which
in a case where the potential of the first electrode is higher than that of the second electrode, in a charge transfer period, a potential applied to a charge accumulation electrode segment located closest to the first electrode is higher than a potential applied to a charge accumulation electrode segment located farthest from the first electrode, and
in a case where the potential of the first electrode is lower than that of the second electrode, in the charge transfer period, the potential applied to the charge accumulation electrode segment located closest to the first electrode is lower than the potential applied to the charge accumulation electrode segment located farthest from the first electrode.

[A24] The imaging element according to any one of [A01] to [A23], in which the composite oxide layer has a thickness of $2 \times 10^{-8}$ m to $1 \times 10^{-7}$ m.

[A25] The imaging element according to any one of [A01] to [A24], in which
light is incident from the second electrode,
surface roughness Ra of the composite oxide layer at an interface between the photoelectric conversion layer and the composite oxide layer is 1.5 nm or less, and a value of root mean square roughness Rq of the composite oxide layer is 2.5 nm or less.

[A26] The imaging element according to any one of [A09] to [A25], in which
on the semiconductor substrate, at least a floating diffusion layer and an amplification transistor constituting a control unit are disposed, and
the first electrode is connected to the floating diffusion layer and a gate portion of the amplification transistor.

[A27] The imaging element according to [A26], in which
on the semiconductor substrate, a reset transistor and a selection transistor constituting the control unit are further disposed,
the floating diffusion layer is connected to one source/drain region of the reset transistor, and
one source/drain region of the amplification transistor is connected to one source/drain region of the selection transistor, and the other source/drain region of the selection transistor is connected to a signal line.

[A28] The imaging element according to any one of [A09] to [A27], in which the charge accumulation electrode is larger than the first electrode.

[A29] The imaging element according to any one of [A09] to [A28], in which light is incident from the second electrode side, and a light shielding layer is formed on a light incident side of the second electrode.

[A30] The imaging element according to any one of [A09] to [A28], in which light is incident from the second electrode side, and light is not incident on the first electrode.

[A31] The imaging element according to [A30], in which a light shielding layer is formed on the light incident side of the second electrode and above the first electrode.

[A32] The imaging element according to [A30], in which
an on-chip micro lens is disposed above the charge accumulation electrode and the second electrode, and
light incident on the on-chip micro lens is collected by the charge accumulation electrode.

[A33]<<Imaging element: first configuration>>
The imaging element according to any one of [A09] to [A32], in which
the photoelectric conversion unit includes N (where N>2) photoelectric conversion unit segments,
the composite oxide layer and the photoelectric conversion layer include N photoelectric conversion layer segments,
the insulating layer includes N insulating layer segments,
the charge accumulation electrode includes N charge accumulation electrode segments,
the n-th (where n=1, 2, 3 . . . N) photoelectric conversion unit segment includes the n-th charge accumulation electrode segment, the n-th insulating layer segment, and the n-th photoelectric conversion layer segment,
a photoelectric conversion unit segment with a larger value of n is located farther from the first electrode, and
the thickness of an insulating layer segment gradually changes from the first photoelectric conversion unit segment to the N-th photoelectric conversion unit segment.

[A34]<<Imaging element: second configuration>>
The imaging element according to any one of [A09] to [A32], in which
the photoelectric conversion unit includes N (where N≥2) photoelectric conversion unit segments,
the composite oxide layer and the photoelectric conversion layer include N photoelectric conversion layer segments,
the insulating layer includes N insulating layer segments,
the charge accumulation electrode includes N charge accumulation electrode segments,
the n-th (where n=1, 2, 3 . . . N) photoelectric conversion unit segment includes the n-th charge accumulation electrode segment, the n-th insulating layer segment, and the n-th photoelectric conversion layer segment,
a photoelectric conversion unit segment with a larger value of n is located farther from the first electrode, and
the thickness of a photoelectric conversion layer segment gradually changes from the first photoelectric conversion unit segment to the N-th photoelectric conversion unit segment.

[A35]<<Imaging element: third configuration>>
The imaging element according to any one of [A09] to [A32], in which the photoelectric conversion unit includes N (where N≥2) photoelectric conversion unit segments,
the composite oxide layer and the photoelectric conversion layer include N photoelectric conversion layer segments,
the insulating layer includes N insulating layer segments,
the charge accumulation electrode includes N charge accumulation electrode segments, the n-th (where n=1, 2, 3 . . . N) photoelectric conversion unit segment includes the n-th charge accumulation electrode segment, the n-th insulating layer segment, and the n-th photoelectric conversion layer segment,
a photoelectric conversion unit segment with a larger value of n is located farther from the first electrode, and
materials constituting an insulating layer segment are different between adjacent photoelectric conversion unit segments.

[A36]<<Imaging element: fourth configuration>>
The imaging element according to any one of [A09] to [A32], in which the photoelectric conversion unit includes N (where N≥2) photoelectric conversion unit segments,
the composite oxide layer and the photoelectric conversion layer include N photoelectric conversion layer segments,
the insulating layer includes N insulating layer segments,
the charge accumulation electrode includes N charge accumulation electrode segments disposed apart from one another, the n-th (where n=1, 2, 3 ... N) photoelectric conversion unit segment includes the n-th charge accumulation electrode segment, the n-th insulating layer segment, and the n-th photoelectric conversion layer segment, a photoelectric conversion unit segment with a larger value of n is located farther from the first electrode, and materials constituting a charge accumulation electrode segment are different between adjacent photoelectric conversion unit segments.

[A37]<<Imaging element: fifth configuration>>

The imaging element according to any one of [A09] to [A32], in which the photoelectric conversion unit includes N (where N>2) photoelectric conversion unit segments, the composite oxide layer and the photoelectric conversion layer include N photoelectric conversion layer segments, the insulating layer includes N insulating layer segments, the charge accumulation electrode includes N charge accumulation electrode segments disposed apart from one another, the n-th (where n=1, 2, 3 ... N) photoelectric conversion unit segment includes the n-th charge accumulation electrode segment, the n-th insulating layer segment, and the n-th photoelectric conversion layer segment, a photoelectric conversion unit segment with a larger value of n is located farther from the first electrode, and the area of a charge accumulation electrode segment is gradually reduced from the first photoelectric conversion unit segment to the N-th photoelectric conversion unit segment.

[A38]<<Imaging element: sixth configuration>>

The imaging element according to any one of [A09] to [A32], in which, if a lamination direction of the charge accumulation electrode, the insulating layer, the composite oxide layer, and the photoelectric conversion layer is defined as a Z direction, and a direction of separating from the first electrode is defined as an X direction, when a laminated portion where the charge accumulation electrode, the insulating layer, the composite oxide layer, and the photoelectric conversion layer are laminated is cut with a YZ virtual plane, the cross-sectional area of the laminated portion changes depending on a distance from the first electrode.

[B01]<<Laminated imaging element>>

A laminated imaging element including at least one of the imaging elements according to any one of [A01] to [A38].

[C01]<<Solid-state imaging device: first aspect>>

A solid-state imaging device including a plurality of the imaging elements according to any one of [A01] to [A38].

[C02]<<Solid-state imaging device: second aspect>>

A solid-state imaging device including a plurality of the laminated imaging elements according to [B01].

[D01]<<Solid-state imaging device: first configuration>>

A solid-state imaging device including a photoelectric conversion unit formed by laminating a first electrode, a photoelectric conversion layer, and a second electrode, in which the photoelectric conversion unit includes a plurality of the imaging elements according to any one of [A01] to [A38], the plurality of imaging elements constitutes an imaging element block, and the first electrode is shared by the plurality of imaging elements constituting the imaging element block.

[D02]<<Solid-state imaging device: second configuration>>

A solid-state imaging device including a plurality of the imaging elements according to any one of [A01] to [A38], the plurality of imaging elements constitutes an imaging element block, and the first electrode is shared by the plurality of imaging elements constituting the imaging element block.

[D03] The solid-state imaging device according to [D01] or [D02], in which one on-chip micro lens is disposed above one of the imaging elements.

[D04] The solid-state imaging device according to [D01] or [D02], in which two of the imaging elements constitute an imaging element block, and one on-chip micro lens is disposed above the imaging element block.

[D05] The solid-state imaging device according to any one of [D01] to [D04], in which one floating diffusion layer is disposed for the plurality of imaging elements.

[D06] The solid-state imaging device according to any one of [D01] to [D05], in which the first electrode is disposed adjacent to the charge accumulation electrode of each of the imaging elements.

[D07] The solid-state imaging device according to any one of [D01] to [D06], in which the first electrode is disposed adjacent to some of the charge accumulation electrodes of the plurality of imaging elements, and is not disposed adjacent to the remaining charge accumulation electrodes of the plurality of imaging elements.

[D08] The solid-state imaging device according to [D07], in which a distance between a charge accumulation electrode constituting an imaging element and a charge accumulation electrode constituting an imaging element is longer than a distance between a first electrode and a charge accumulation electrode in an imaging element adjacent to the first electrode.

[E01]<<Method for driving solid-state imaging device>>

A method for driving a solid-state imaging device including a plurality of imaging elements according to any one of [A01] to [A38], each of the imaging elements having a structure in which light is incident from the second electrode side, and light is not incident on the first electrode, in which the method repeats discharging charges in the first electrode out of the system while charges are accumulated in the composite oxide layer all at once in all the imaging elements, and then transferring the charges accumulated in the composite oxide layer to the first electrode all at once in all the imaging elements, and sequentially reading out the charges transferred to the first electrode in each of the imaging elements after completion of the transfer.

REFERENCE SIGNS LIST $10'_1$, $10'_2$, $10'_3$ Photoelectric conversion unit segment
13 Various imaging element components located below interlayer insulating layer
14 On-chip micro lens (OCL)
15 Light shielding layer
21 First electrode
22 Second electrode
23A Photoelectric conversion layer
23B Composite oxide layer
$23B_1$ First layer of composite oxide layer
$23B_2$ Second layer of composite oxide layer
$23'_1$, $23'_2$, $23'_3$ Photoelectric conversion layer segment
24, $24''_1$, $24''_2$, $24''_3$ Charge accumulation electrode 24A, 24B, 24C, 24'$_1$, 24'$_2$, 24'$_3$ Charge accumulation electrode segment
25, 25A, 25B Transfer control electrode (charge transfer electrode)
26 Charge discharge electrode
27, 27A$_1$, 27A$_2$, 27A$_3$, 27B$_1$, 27B$_2$, 27B$_3$, 27C Charge transfer control electrode
31, 33, 41, 43 n-Type semiconductor region
32, 34, 42, 44, 73 p+ layer
35, 36, 45, 46 Gate portion of transfer transistor
35C, 36C Region of semiconductor substrate
36A Transfer channel
51 Gate portion of reset transistor TR1$_{rst}$
51A Channel formation region of reset transistor TR1$_{rst}$
51B, 51C Source/drain region of reset transistor TR1$_{rst}$
52 Gate portion of amplification transistor TR1$_{amp}$
52A Channel formation region of amplification transistor TR1$_{amp}$
52B, 52C Source/drain region of amplification transistor TR1$_{amp}$
53 Gate portion of selection transistor TR1$_{sel}$
53A Channel formation region of selection transistor TR1$_{sel}$
53B, 53C Source/drain region of selection transistor TR1$_{sel}$
61 Contact hole portion
62 Wiring layer
63, 64, 68A Pad portion
65, 68B Connection hole
66, 67, 69 Connection portion
70 Semiconductor substrate
70A First surface (front surface) of semiconductor substrate
70B Second side (back surface) of semiconductor substrate
71 Element isolation region
72 Oxide film
74 HfO$_2$ film
75 Insulating material film
76, 81 Interlayer insulating layer
82 Insulating layer
82'$_1$, 82'$_2$, 82'$_3$ Insulating layer segment
82a First surface of insulating layer
82b Second surface of insulating layer
82c Third surface of insulating layer
83 Insulating layer
85, 85A, 85B, 85C Opening
86, 86A Second opening
100 Solid-state imaging device
101 Laminated imaging element
111 Imaging region
112 Vertical drive circuit
113 Column signal processing circuit
114 Horizontal drive circuit
115 Output circuit
116 Drive control circuit
117 Signal line (data output line)
118 Horizontal signal line
200 Electronic device (camera)
201 Solid-state imaging device
210 Optical lens
211 Shutter apparatus
212 Drive circuit
213 Signal processing circuit
FD$_1$, FD$_2$, FD$_3$, 45C, 46C Floating diffusion layer
TR1$_{trs}$, TR2$_{trs}$, TR3$_{trs}$ Transfer transistor
TR1$_{rst}$, TR2$_{rst}$, TR3$_{rst}$ Reset transistor
TR1$_{amp}$, TR2$_{amp}$, TR3$_{amp}$ Amplification transistor
TR1$_{sel}$, TR3$_{sel}$, TR3$_{sel}$ Selection transistor
V$_{DD}$ Power source
TG$_1$, TG$_2$, TG$_3$ Transfer gate line
RST$_1$, RST$_2$, RST$_3$ Reset line
SEL$_1$, SEL$_2$, SEL$_3$ Selection line
VSL, VSL$_1$, VSL$_2$, VSL$_3$ Signal line (data output line)
V$_{OA}$, V$_{OT}$, V$_{OU}$ Wiring

The invention claimed is:

1. An imaging element comprising a photoelectric conversion unit formed by laminating a first electrode, a photoelectric conversion layer, and a second electrode,
   between the first electrode and the photoelectric conversion layer, a composite oxide layer containing indium composite oxide is formed,
   the composite oxide layer includes a first layer adjacent to the first electrode and a second layer adjacent to the photoelectric conversion layer, and
   the first layer has a higher indium composition than the second layer.

2. A laminated imaging element comprising at least one of the imaging elements according to claim 1.

3. A solid-state imaging device comprising a plurality of the imaging elements according to claim 1.

4. A solid-state imaging device comprising a plurality of the laminated imaging elements according to claim 2.

5. An imaging element comprising a photoelectric conversion unit formed by laminating a first electrode, a photoelectric conversion layer, and a second electrode, wherein
   between the first electrode and the photoelectric conversion layer, a composite oxide layer containing indium-gallium-zinc composite oxide is formed,
   the composite oxide layer includes a first layer adjacent to the first electrode and a second layer adjacent to the photoelectric conversion layer,
   the first layer has a higher indium composition than the second layer, or
   the first layer has a higher gallium composition than the second layer, or
   the first layer has a higher zinc composition than the second layer.

6. The imaging element according to claim 5, wherein
   when the indium-gallium-zinc composite oxide is represented by $(ZnO)_X(Ga_2O_3)_{1-X}$, $(Ga_2O_3)_Y(In_2O_3)_{1-Y}$, and $(In_2O_3)_Z(ZnO)_{1-Z}$,
   a value of X in the first layer is larger than a value of X in the second layer, or
   a value of Y in the first layer is lower than a value of Y in the second layer, or
   a value of Z in the first layer is higher than a value of Z in the second layer.

7. The imaging element according to claim 6, satisfying $0<X<0.875$, $0<Y<0.875$, and $0.125<Z<0.875$ (where $X+Y+Z=1.000$).

8. An imaging element comprising a photoelectric conversion unit formed by laminating a first electrode, a photoelectric conversion layer, and a second electrode, wherein
   between the first electrode and the photoelectric conversion layer, a composite oxide layer containing indium composite oxide is formed,
   the composite oxide layer includes a first layer adjacent to the first electrode and a second layer adjacent to the photoelectric conversion layer, and
   the first layer has a higher carrier mobility than the second layer.

9. The imaging element according to claim 8, satisfying $1\times10^{-6}\leq$(carrier mobility of second layer)/(carrier mobility of first layer)$\leq0.1$.

10. An imaging element comprising a photoelectric conversion unit formed by laminating a first electrode, a photoelectric conversion layer, and a second electrode, wherein between the first electrode and the photoelectric conversion layer, a composite oxide layer containing indium composite oxide is formed, the composite oxide layer includes a first layer adjacent to the first electrode and a second layer adjacent to the photoelectric conversion layer, and the first layer has a lower state density than the second layer.

11. The imaging element according to claim 10, wherein the composite oxide layer is amorphous.

12. The imaging element according to claim 10, wherein the photoelectric conversion unit further includes an insulating layer and a charge accumulation electrode disposed apart from the first electrode so as to face the composite oxide layer via the insulating layer.

13. The imaging element according to claim 12, further comprising a transfer control electrode disposed apart from the first electrode and the charge accumulation electrode so as to face the composite oxide layer via the insulating layer between the first electrode and the charge accumulation electrode.

14. The imaging element according to claim 12, further comprising a charge discharge electrode connected to the composite oxide layer and disposed apart from the first electrode and the charge accumulation electrode.

15. The imaging element according to claim 12, wherein the charge accumulation electrode includes a plurality of charge accumulation electrode segments.

* * * * *